United States Patent
Idei et al.

(10) Patent No.: US 10,216,083 B2
(45) Date of Patent: Feb. 26, 2019

(54) RADIATION-SENSITIVE COLORED COMPOSITIONS, CURED COLORED FILMS, COLOR FILTERS, PROCESSES FOR FORMING COLORED PATTERNS, PROCESSES FOR PREPARING COLOR FILTERS, SOLID-STATE IMAGE SENSORS AND LIQUID CRYSTAL DISPLAY DEVICES

(71) Applicant: FUJIFILM Corporation, Tokyo (JP)

(72) Inventors: Hiroaki Idei, Haibara-gun (JP); Kazuya Oota, Haibara-gun (JP); Masayuki Harada, Haibara-gun (JP); Akiyoshi Gotou, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 658 days.

(21) Appl. No.: 14/853,306

(22) Filed: Sep. 14, 2015

(65) Prior Publication Data
US 2016/0004154 A1    Jan. 7, 2016

Related U.S. Application Data

(63) Continuation of application No. PCT/JP2014/056410, filed on Mar. 12, 2014.

(30) Foreign Application Priority Data

Mar. 15, 2013 (JP) .................. 2013-054234

(51) Int. Cl.
| | |
|---|---|
| G02B 5/20 | (2006.01) |
| G03F 7/004 | (2006.01) |
| G03F 7/00 | (2006.01) |
| G02B 5/22 | (2006.01) |
| G03F 7/16 | (2006.01) |
| G03F 7/20 | (2006.01) |
| G03F 7/32 | (2006.01) |
| G03F 7/027 | (2006.01) |
| G03F 7/033 | (2006.01) |
| G03F 7/038 | (2006.01) |
| G03F 7/105 | (2006.01) |

(52) U.S. Cl.
CPC .......... G03F 7/0007 (2013.01); G02B 5/223 (2013.01); G03F 7/0048 (2013.01); G03F 7/027 (2013.01); G03F 7/033 (2013.01); G03F 7/0388 (2013.01); G03F 7/105 (2013.01); G03F 7/16 (2013.01); G03F 7/20 (2013.01); G03F 7/32 (2013.01)

(58) Field of Classification Search
CPC ........ G03F 7/0007; G03F 7/028; G03F 7/031; G03F 7/033; G03F 7/0048; G02B 5/223
USPC .................................. 430/7, 281.1
See application file for complete search history.

(56) References Cited

U.S. PATENT DOCUMENTS

| | | | |
|---|---|---|---|
| 5,525,454 | A | 6/1996 | Fujikura et al. |
| 5,578,413 | A | 11/1996 | Fujikura et al. |
| 6,509,125 | B1 | 1/2003 | Ito et al. |
| 7,622,521 | B2 | 11/2009 | Seto |
| 7,901,851 | B2 | 3/2011 | Mizukawa et al. |
| 8,778,235 | B2 | 7/2014 | Ito et al. |
| 8,852,832 | B2 | 10/2014 | Arayama et al. |
| 2007/0112134 | A1 | 5/2007 | Seto |
| 2007/0117031 | A1 | 5/2007 | Mizukawa et al. |
| 2012/0176571 | A1 | 7/2012 | Makino |
| 2012/0187351 | A1 | 7/2012 | Ito et al. |
| 2012/0202145 | A1 | 8/2012 | Arayama et al. |

FOREIGN PATENT DOCUMENTS

| | | | |
|---|---|---|---|
| CN | 102483572 A | | 5/2012 |
| JP | 06-106048 | * | 4/1994 |
| JP | 07-28232 A | | 1/1995 |
| JP | 2000-162429 A | | 6/2000 |
| JP | 2000-275830 A | | 10/2000 |
| JP | 2005-274968 A | | 10/2005 |
| JP | 2006-106099 A | | 4/2006 |
| JP | 2007-138051 A | | 6/2007 |
| JP | 2007-139906 A | | 6/2007 |
| JP | 2011-095732 A | | 5/2011 |
| JP | 2012-093395 A | | 5/2012 |
| JP | 2013-029760 A | | 2/2013 |
| KR | 10-2012-0099347 A | | 9/2012 |
| WO | 2010/027061 A1 | | 3/2010 |

OTHER PUBLICATIONS

Computer-generated translation of JP 06-106048 (Apr. 1994).*

(Continued)

*Primary Examiner* — John A McPherson
(74) *Attorney, Agent, or Firm* — Sughrue Mion, PLLC

(57) ABSTRACT

Herein provided are radiation-sensitive colored compositions suppressing a phenomenon in which a radiation-sensitive colored composition of another color penetrates into previously formed pixels to result in a decrease in the color purity of the previously obtained pixels; cured colored films and color filters using them; processes for forming colored patterns; processes for preparing the color filters; solid-state image sensors; and image display devices.

The radiation-sensitive colored compositions comprise a dyestuff, a photopolymerizable compound, a photoinitiator, and a nonionic surfactant containing a partial structure represented by formula (1) or (2) below and having a weight average molecular weight of 2500 or less and an HLB value of 9.2 to 15.5 as determined by Griffin's method. In formula (1) and (2), $R^1$ and $R^2$ each independently represent a hydrocarbon group containing 8 or more carbon atoms, and n1 and n2 each independently represent 4 to 25.

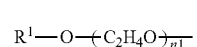

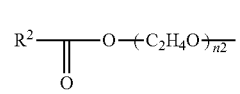

23 Claims, 1 Drawing Sheet

(56) References Cited

OTHER PUBLICATIONS

International Search Report for PCT/JP2014/056410 dated Apr. 15, 2014.
Written Opinion for PCT/JP2014/056410 dated Apr. 15, 2014.
International Preliminary Report on Patentability for PCT/JP2014/056410 dated Sep. 24, 2015.
Office Action dated Jan. 2, 2017, issued by the Korean Intellectual Property Office in corresponding Korean Application No. 10-2015-7024940.
Office Action dated Jan. 26, 2016, from the Japanese Patent Office in counterpart Japanese Application No. 2014-042375.
Office Action dated Jan. 2, 2019 in Chinese Patent Application No. 201480014595.4 Partial English Translation.

* cited by examiner

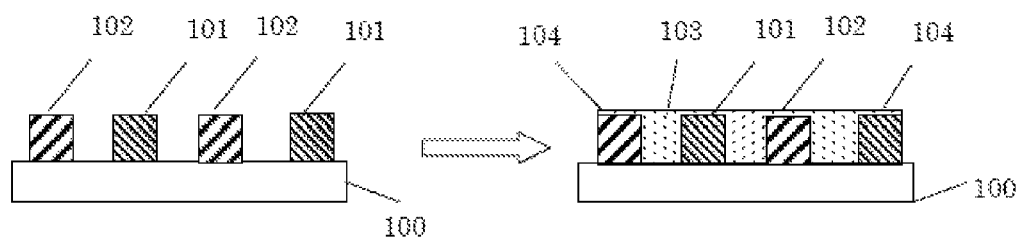

RADIATION-SENSITIVE COLORED COMPOSITIONS, CURED COLORED FILMS, COLOR FILTERS, PROCESSES FOR FORMING COLORED PATTERNS, PROCESSES FOR PREPARING COLOR FILTERS, SOLID-STATE IMAGE SENSORS AND LIQUID CRYSTAL DISPLAY DEVICES

CROSS-REFERENCE TO RELATED APPLICATIONS

This application is a Continuation of PCT International Application No. PCT/JP2014/056410 filed on Mar. 12, 2014, which claims priority under 35 U.S.C § 119(a) to Japanese Patent Application No. 2013-054234 filed on Mar. 15, 2013. Each of the above application(s) is hereby expressly incorporated by reference, in its entirety, into the present application.

TECHNICAL FIELD

The present invention relates to radiation-sensitive colored compositions suitable for preparing color filters used for forming colored pixels. It also relates to cured colored films and color filters using the radiation-sensitive colored compositions, processes for forming colored patterns, processes for preparing the color filters, solid-state image sensors and liquid crystal display devices.

BACKGROUND ART

Recently, there is a growing demand for solid-state image sensors such as CCD image sensors along with the widespread use of digital cameras, cell phones with cameras and the like. Color filters are used as key components of displays or optical elements of these devices, and increasingly required to be more sensitive and smaller. Such color filters typically have a colored pattern of three primary colors, i.e., red (R), green (G), and blue (B), and have the role of decomposing the light transmitted through it into the three primary colors.

One method for preparing the color filters is the pigment dispersion method. The pigment dispersion method for preparing the color filters by photolithography or inkjet printing is stable to light and heat because it uses pigments. However, it often encounters problems such as light scattering or color unevenness or roughness because pigments per se are microparticles. To overcome these problems, micronized pigments are used at the cost of dispersion stability.

An alternative to the pigment dispersion method for preparing the color filters is to use dyes as colorants. Dyes are dissolved in compositions so that they are less likely to induce light scattering or color unevenness or roughness as compared with pigments. Recently, highly robust dyes have been developed.

However, radiation-sensitive colored compositions containing dyestuffs have been reported to be likely to cause color migration between adjacent colored patterns of different hues or between laminated layers when they are heated after they have been formed into films, and solutions to these problems by polymerizing dyes have been disclosed (for example, see patent documents 1 to 5). Further, patent documents 6 and 7 describe curable negative compositions containing dyestuffs for use in color filters.

REFERENCES

Patent Documents

Patent document 1: JP-A2007-139906
Patent document 2: JP-A2007-138051
Patent document 3: JP-A2000-162429
Patent document 4: JP-A2011-95732
Patent document 5: JP-A2013-029760
Patent document 6: JP-A2006-106099
Patent document 7: JP-A2005-274968.

SUMMARY OF THE INVENTION

Problems to be Solved by the Invention

The method using dyes has been reported to encounter the problem that color purity decreases especially when the dyes are at high concentrations, as explained below.

To form colored pixels of cured colored films of multiple colors as in, for example, color filters that should have such pixels of multiple colors, it is necessary to form pixels representing one color and then form pixels representing another color. In this case, a radiation-sensitive colored composition of another color is applied on previously formed pixels 101, 102 to successively form pixels 103 by the radiation-sensitive colored composition of another color at locations other than those occupied by the previously obtained pixels, as shown in, for example, FIG. 1. In such cases where pixels are successively formed using multiple radiation-sensitive colored compositions, however, the radiation-sensitive colored composition of another color is left as a residue 104 on the previously formed pixels 101, 102 or the radiation-sensitive colored composition of another color penetrates into the previously formed pixels 101, 102, which causes a phenomenon in which the color purity of the previously obtained pixels 101, 102 decreases (such a phenomenon will be hereinafter also referred to as "color mixing with residue on another color"). Such color mixing with residue on another color resulted in a decrease in the color purity of the resulting color filter so that even colorants having high color purity and high coloring power were used in vain and color filters with high color resolution could not be obtained.

The present invention aims to provide radiation-sensitive colored compositions in which color mixing with residue on another color is suppressed. It also aims to provide cured colored films and color filter using the radiation-sensitive colored compositions, processes for forming colored patterns, processes for preparing the color filters, solid-state image sensors and image display devices.

Means for Solving the Problems

As a result of our careful studies under these circumstances, we found that color mixing with residue on another color can be reduced when radiation-sensitive colored compositions comprise a nonionic surfactant containing a specific structure and having a specific HLB value.

Without being bound to any theory, it is believed that color mixing with residue on another color can be effectively reduced when radiation-sensitive colored compositions comprise a nonionic surfactant containing a specific partial structure and having a specific HLB value, i.e., a nonionic surfactant containing a specific hydrophilic partial structure and a specific hydrophobic partial structure. Specifically, it is believed that the specific hydrophobic partial structure in the nonionic surfactant facilitates an interaction with hydrophobic moieties of dyes so that the nonionic surfactant is more likely to cover the dyes while the specific hydrophilic partial structure in the nonionic surfactant further improves the solubility of the dyes in developers, whereby color mixing with residue on another color can be effectively reduced.

[1] A radiation-sensitive colored composition comprising: a dye, a photopolymerizable compound, a photoinitiator, and a nonionic surfactant containing a partial structure represented by formula (1) or (2) and having a weight average molecular weight of 2500 or less and an HLB value of 9.2 to 15.5 as determined by Griffin's method;

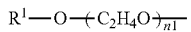  (1)

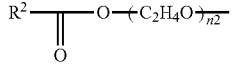  (2)

wherein $R^4$ and $R^2$ each independently represent a hydrocarbon group containing 8 or more carbon atoms, and n1 and n2 each independently represent 4 to 25.

[2] The radiation-sensitive colored composition according to [1], wherein the nonionic surfactant is a compound represented by formula (3) below:

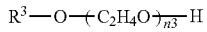  (3)

wherein $R^3$ represents an alkyl or alkenyl group containing 8 or more carbon atoms, and n3 represents 4 to 25.

[3] The radiation-sensitive colored composition according to [1] or [2], wherein the nonionic surfactant is a compound represented by formula (4) below:

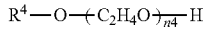  (4)

wherein $R^4$ represents an alkyl or alkenyl group containing 15 to 19 carbon atoms, and n4 represents 4 to 25.

[4] The radiation-sensitive colored composition according to any one of [1] to [3], wherein the dye has a weight average molecular weight of 5000 or more.

[5] The radiation-sensitive colored composition according to any one of [1] to [4], which comprises a colorant including the dye in a concentration of 50% by mass or more, relative to the total solids of the radiation-sensitive colored composition.

[6] The radiation-sensitive colored composition according to any one of [1] to [5], wherein the dye contains a partial structure derived from a dye selected from dipyrromethene dyes, azo dyes, anthraquinone dyes, triphenylmethane dyes, xanthene dyes, cyanine dyes, squarylium dyes, quinophthalone dyes, phthalocyanine dyes and subphthalocyanine dyes.

[7] The radiation-sensitive colored composition according to any one of [1] to [6], further comprising a pigment.

[8] The radiation-sensitive colored composition according to any one of [1] to [7], further comprising an alkali-soluble resin.

[9] The radiation-sensitive colored composition according to any one of [1] to [8] suitable for forming a colored layer of a color filter.

[10] A cured colored film obtainable by curing the radiation-sensitive colored composition according to any one of [1] to [9].

[11] A color filter comprising the cured colored film according to [10].

[12] The color filter according to [11], wherein the cured colored film has a thickness of 0.2 to 1.5 μm.

[13] A method for forming a colored pattern, comprising applying the radiation-sensitive colored composition according to any one of [1] to [9] on a support to form a radiation-sensitive colored composition layer; exposing the radiation-sensitive colored composition layer in a pattern; and developing unexposed regions to remove unexposed area, thereby forming a colored pattern.

[14] A method for manufacturing a color filter, comprising applying the radiation-sensitive colored composition according to any one of [1] to [9] on a support to form a radiation-sensitive colored composition layer; exposing the radiation-sensitive colored composition layer in a pattern; and developing unexposed regions to remove unexposed area, thereby forming a colored pattern.

[15] A solid-state image sensor comprising the color filter according to [11] or [12], or a color filter obtainable by the method for manufacturing a color filter according to [14].

[16] An image display device comprising the color filter according to [11] or [12], or a color filter obtainable by the method for manufacturing a color filter according to [14].

Effect of the Present Invention

The present invention makes possible to provide a radiation-sensitive colored composition in which color mixing with residue on another color is suppressed. The present invention also make possible to provide cured colored films and color filter using the radiation-sensitive colored compositions, processes for forming colored patterns, processes for preparing the color filters, solid-state image sensors and image display devices.

BRIEF EXPLANATION OF THE DRAWINGS

FIG. 1 is a schematic diagram showing an example of color mixing with residue on another color when multiple pixels are formed.

THE MOST PREFERRED EMBODIMENTS OF THE INVENTION

The present invention will be explained in detail below. As used herein, the numerical ranges expressed with "to" are used to mean the ranges including the values indicated before and after "to" as lower and upper limits.

In this specification, notation of group (atomic group) without being preceded by "substituted" or "unsubstituted", is used to encompass not only group having no substituent, but also group having substituent. For example, "alkyl group" encompass not only alkyl group having no substituent (unsubstituted alkyl group), but also alkyl group having substituent (substituted alkyl group). In this specification, "(meth)acrylate" means acrylate and methacrylate, "(meth)acryl" means acryl and methacryl, and "(meth)acryloyl" means acryloyl and methacryloyl. As used herein, the term "colored layer" refers to a pixel used in a color filter.

As used herein, the term "pigment" refers to an insoluble dye compound that does not dissolve in, for example, solvents. Typically, it refers to a dye compound that exists as dispersed particles in a composition. The solvents here include those specifically listed in the section of solvents herein later. Thus, dye compounds that are insoluble in these solvents fall within the pigments as used herein. The solubility of the pigments used in the present invention in, for example, both of propylene glycol monomethyl ether acetate and water is preferably 0.1 g or less per 100 g of the solvent at 25° C.

As used herein, the term "colored region" means to include regions of colored pixels (colored patterns) and regions forming light shield layers in color filters.

As used herein, HLB (Hydrophilic-Lipophilic Balance) refers to the ratio of the molecular mass of the hydrophilic group moiety to the total molecular mass of a nonionic surfactant, as determined by Griffin's formula shown below. The Griffin's formula is described in literatures (W. C. Griffin, J. Soc. Cosmetic Chemists, 1,311 (1949); T. Yoshida, S. Shindo, T. Ogaki and K. Yamanaka, eds., New Edition of the Handbook of Surfactants (1987) Kogakutosho, p. 234). Surfactants having higher HLB values are more hydrophilic, while those having lower values are more hydrophobic.

HLB value (as determined by Griffin's method)=20× (the total formula mass of the hydrophilic moiety/the molecular mass)

As used herein, the hydrophilic moiety of a nonionic surfactant means to include, for example, ethyleneoxy moieties, propyleneoxy moieties, and polyalcohol moieties (glycol, glycerin, glucoside, sorbitan, mannitol or sorbitol).

[Radiation-Sensitive Colored Compositions]

The radiation-sensitive colored compositions of the present invention comprise a dyestuff, a photopolymerizable compound, a photoinitiator, and a nonionic surfactant containing a partial structure represented by formula (1) or (2) below and having a weight average molecular weight of 2500 or less and an HLB value of 9.2 to 15.5.

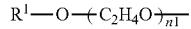  (1)

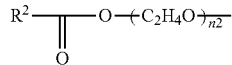  (2)

In formula (1) and (2), $R^1$ and $R^2$ each independently represent a hydrocarbon group containing 8 or more carbon atoms, and n1 and n2 each independently represent 4 to 25.

The radiation-sensitive colored compositions of the present invention comprise a nonionic surfactant containing a partial structure represented by formula (1) or (2) and having a weight average molecular weight of 2500 or less and an HLB value of 9.2 to 15.5, whereby color mixing with residue on another color can be reduced. Further, the radiation-sensitive colored compositions of the present invention also help to improve stability over time.

Without being bound to any theory, it is believed that the hydrophobic partial structure in the nonionic surfactant (($R^1$—O—) in formula (1) or ($R^2$C(=O)O—) in formula (2)) facilitates an interaction with hydrophobic moieties of dyes so that the nonionic surfactant is more likely to cover the dyes. On the other hand, it is believed that the hydrophilic partial structure in the nonionic surfactant ((—$C_2H_4$O-)n1 in formula (1) or (—$C_2H_4$O-)n2 in formula (2)) further improves the solubility of the dyes in developers, whereby color mixing with residue on another color can be effectively reduced.

Further, it is believed that the nonionic surfactant has an HLB value of 9.2 to 15.5 so that the proportion between the hydrophilic partial structure and the hydrophobic partial structure in the nonionic surfactant is controlled, whereby color mixing with residue on another color can be effectively reduced.

Various components of the radiation-sensitive colored compositions of the present invention are explained below.

[Nonionic Surfactant]

The nonionic surfactant used in the present invention contains a partial structure represented by formula (1) or (2) and also has a weight average molecular weight of 2500 or less and an HLB value of 9.2 to 15.5.

In formula (1) and (2), $R^1$ and $R^2$ each independently represent a hydrocarbon group containing 8 or more carbon atoms. Preferably, the hydrocarbon group is alkyl, alkenyl or aryl, more preferably alkyl or alkenyl.

The alkyl group may be straight-chain, branched or cyclic, but more preferably straight-chain. The alkyl group may be substituted or unsubstituted, but preferably unsubstituted. When the alkyl group is cyclic, it may be monocyclic or polycyclic. Preferably, the alkyl group contains 10 or more carbon atoms, more preferably 15 or more carbon atoms, even more preferably 18 or more carbon atoms. Preferably, the alkyl group contains at most 22 or less carbon atoms, more preferably 20 or less carbon atoms, even more preferably 19 or less carbon atoms. Especially, the alkyl group preferably contains 18 carbon atoms.

The alkenyl group may be straight-chain, branched or cyclic, but more preferably straight-chain. The alkenyl group may be substituted or unsubstituted, but preferably unsubstituted. When the alkenyl group is cyclic, it may be monocyclic or polycyclic. Preferably, the alkenyl group contains 10 or more carbon atoms, more preferably 15 or more carbon atoms, even more preferably 18 or more carbon atoms. Preferably, the alkyl group contains at most 22 or less carbon atoms, more preferably 20 or less carbon atoms, even more preferably 19 or less carbon atoms. Especially, the alkenyl group preferably contains 18 carbon atoms.

The aryl group is preferably a substituted or unsubstituted aryl group containing 8 to 20 carbon atoms, more preferably a substituted or unsubstituted aryl group containing 8 to 16 carbon atoms. Specifically, aryl groups include, for example, phenyl, naphthyl and the like.

The substituent by which the hydrocarbon group may be substituted is not specifically limited, but examples include, for example, polymerizable groups, halogen atoms, alkyl groups, carboxylate ester groups, alkyl halide groups, alkoxy groups, methacryloyloxy, acryloyloxy, ether, sulfonyl, sulfide, amide, acyl, hydroxyl, carboxyl and the like.

In formula (1) and (2), n1 and n2 each independently represent a number of 4 to 25, preferably 4 to 20, more preferably 6 to 20, even more preferably 7 to 20, especially preferably 8 to 20.

Preferably, the nonionic surfactant used in the present invention is a compound represented by formula (3) below:

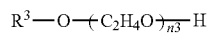  (3)

In formula (3), $R^3$ represents an alkyl or alkenyl group containing 8 or more carbon atoms, and n3 represents 4 to 25.

In formula (3), $R^3$ represents an alkyl or alkenyl group containing 8 or more carbon atoms. The alkyl or alkenyl group is as defined for $R^1$ and $R^2$ in formula (1) and (2), and also cover the same preferred ranges.

In formula (3) above, n3 represents a number of 4 to 25 as defined for n1 and n2 in formula (1) and (2) above, and also covers the same preferred ranges.

Especially, the nonionic surfactant used in the present invention is preferably a compound represented by formula (4) below:

$$R^4-O-(C_2H_4O)_{\overline{n4}}H \qquad (4)$$

In formula (4), $R^4$ represents an alkyl or alkenyl group containing 15 to 19 carbon atoms, and n4 represents 4 to 25.

In formula (4), $R^4$ represents an alkyl or alkenyl group containing 15 to 19 carbon atoms. The alkyl or alkenyl group is as defined for $R^3$ in formula (3).

When $R^4$ represents an alkyl group, the alkyl group preferably contains 15 or more carbon atoms, more preferably 18 or more carbon atoms. When $R^4$ represents an alkyl group, the alkyl group preferably contains at most 19 or less carbon atoms, and especially, the alkyl group preferably contains 18 carbon atoms.

When $R^4$ represents an alkenyl group, the alkenyl group preferably contains 15 or more carbon atoms, more preferably 18 or more carbon atoms. The alkyl group preferably contains at most 19 or less carbon atoms, and especially, the alkenyl group preferably contains 18 carbon atoms.

In formula (4), n4 represents a number of 4 to 25 as defined for n1 and 2 in the formulae (1) and (2), and also covers the same preferred ranges.

In the present invention, the weight average molecular weight of the nonionic surfactant is preferably 2500 or less to effectively prevent color mixing with residue on another color. More preferably, it is 350 to 2500, even more preferably 500 to 2000, especially preferably 500 to 1500.

In the present invention, the HLB value is in the range of 9.2 to 15.5, preferably 10.0 to 14.0, especially preferably 10.5 to 13.0. If the HLB value is 15.5 or less, the nonionic surfactant has good hydrophilicity so that an interaction is more likely to occur between hydrophobic moieties of dyes and the hydrophobic moiety of the nonionic surfactant, whereby color mixing with residue on another color can be reduced. If the HLB value is 15.5 or less, the surfactant is suitable for practical uses because it is well soluble in solvents and less likely to be separated in the radiation-sensitive colored compositions. If the HLB value is 9.2 or more, the nonionic surfactant is not excessively hydrophobic and dyes are well soluble in developers, whereby color mixing with residue on another color can be reduced.

Nonionic surfactants used in the present invention specifically include polyoxyethylene alkyl ethers (polyoxyethylene lauryl ether, polyoxyethylene stearyl ether, polyoxyethylene oleyl ether, polyoxyethylene 2-ethyl hexyl ether), polyoxyethylene aryl ethers (polyoxyethylene octylphenyl ether, polyoxyethylene nonylphenyl ether), polyethylene glycol dilaurate, polyethylene glycol distearate, polyethylene glycol monolaurate, polyoxyethylene glycol isostearate, polyoxyethylene glycol tristearate and the like. Among them, polyoxyethylene lauryl ether, polyoxyethylene oleyl ether or polyoxyethylene glycol isostearate is preferred. Specifically, they include EMULGEN series (EMULGEN 104P, EMULGEN 106, EMULGEN 108, EMULGEN 210P, EMULGEN 306P, EMULGEN 408, EMULGEN 409PV, EMULGEN 420, EMULGEN 707, EMULGEN LS-106), and EMANON series (EMANON 1112) from Kao Corporation; LEOX series (LEOX CL-30), and LEOCOL series (LEOCOL TD-50, SC-50) from Lion Corporation; Newcol series (Newcol NT-5, Newcol 2304YM, Newcol 1008, Newcol 707, Newcol 564) from NIPPON NYUKAZAI CO., LTD.; NONION series (NONION L-2, NONION DL-4HN), UNIOX series (UNIOX GM-SIS, UNIOX GT-20IS) and UNILUBE series from NOF CORPORATION; and the like.

Specific examples of the HLB values of exemplary compounds of nonionic surfactants that can be used in the present invention are shown below, but the present invention is not limited to these examples.

TABLE 1

| Nonionic surfactant | Product name | Distribution source | Structure | Structural formula | R Compositional formula |
|---|---|---|---|---|---|
| 1 | EMULGEN 104P | Kao | Polyoxy ethylene | $H_{25}C_{12}-O-(C_2H_4O)_{\overline{n}}H$ | $C_{12}H_{25}$ |
| 2 | EMULGEN 106 | Kao | lauryl ether | | $C_{12}H_{25}$ |
| 3 | EMULGEN 108 | Kao | | | $C_{12}H_{25}$ |
| 4 | EMULGEN 210P | Kao | Polyoxyethylene cetylether | $C_{16}H_{33}-O-(C_2H_4O)_{\overline{n}}H$ | $C_{16}H_{33}$ |
| 5 | EMULGEN 306P | Kao | Polyoxy ethylene stearylether | $C_{18}H_{37}-O-(C_2H_4O)_{\overline{n}}H$ | $C_{18}H_{37}$ |
| 6 | EMULGEN 408 | Kao | Polyoxyethylene | $H_{35}C_{18}-O-(C_2H_4O)_{\overline{n}}H$ | $C_{18}H_{35}$ |
| 7 | EMULGEN 409PV | Kao | oleyl ether | | $C_{18}H_{35}$ |
| 8 | EMULGEN 420 | Kao | | | $C_{18}H_{35}$ |
| 9 | Newcol 1008 | Nippon Nyukazai | Octaethyleneglycol octyl ether | $H_{17}C_8-O-(C_2H_4O)_{\overline{n}}H$ | $C_8H_{17}$ |
| 10 | Newcol 2304YM | Nippon Nyukazai | Polyoxy alkylene alkyl ether | $C_{12}H_{25}-O-[(C_2H_4O)_{\overline{n_1}}(C_2H_4O)_{\overline{n_2}}]H$ | $C_{12}H_{25}$ |

TABLE 1-continued

| # | Product | Maker | Chemical name | Structure | R |
|---|---|---|---|---|---|
| 11 | Newcol 564 | Nippon Nyukazai | Poly oxyethylenenonyl phenyl ether | 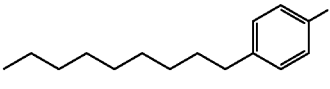 | $C_{15}H_{23}$ |
| 12 | Nonion L-2 | Nof | Polyethylene glycol monolaurate | 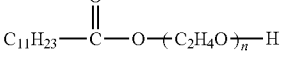 | $C_{11}H_{23}$ |
| 13 | Nonion DL-4HN | Nof | Polyethyleneglycol dilaurates | 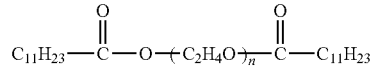 | $C_{11}H_{23}$ |
| 14 | Uniox GM5IS | Nof | Polyoxyethylene glyceryl isostearate | 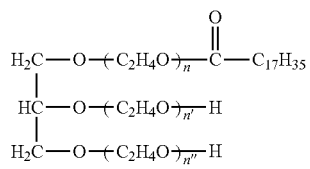 | $C_{17}H_{35}$ |
| 15 | Uniox GT20IS | Nof | Polyoxyethylene glyceryl triisostearate | 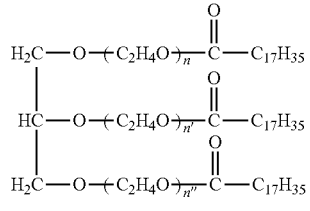 | $C_{17}H_{35}$ |

| | | | | For Nonionic surfactant | | | |
|---|---|---|---|---|---|---|---|
| | Hydrophilic group | | | | | HLB value | Average |
| Nonionic surfactant | Hydrophilic group | n | Molecular weight | Compositional formula | Molecular weight | (Griffin's method) | molecular weight |
| 1 | EO | 4 | 176 | $C_{20}H_{42}O_5$ | 362 | 9.7 | 600 |
| 2 | EO | 6 | 264 | $C_{24}H_{50}O_7$ | 450 | 11.7 | 900 |
| 3 | EO | 8 | 352 | $C_{28}H_{58}O_9$ | 531 | 13.3 | 1000 |
| 4 | EO | 10 | 441 | $C_{36}H_{74}O_{11}$ | 683 | 12.9 | 1200 |
| 5 | EO | 6 | 264 | $C_{30}H_{62}O_7$ | 535 | 9.9 | 1000 |
| 6 | EO | 8 | 352 | $C_{34}H_{68}O_9$ | 621 | 11.4 | 1200 |
| 7 | EO | 9 | 396 | $C_{36}H_{72}O_{10}$ | 665 | 11.9 | 1300 |
| 8 | EO | 20 | 881 | $C_{58}H_{116}O_{21}$ | 1150 | 15.3 | 2000 |
| 9 | EO | 8 | 352 | $C_{24}H_{50}O_9$ | 483 | 14.6 | 800 |
| 10 | EO + PO | 8 | 408 | $C_{32}H_{66}O_9$ | 595 | 13.7 | 1100 |
| 11 | EO | 8 | 352 | $C_{23}H_{40}O_9$ | 573 | 12.3 | 1000 |
| 12 | EO | 4.5 | 198 | $C_{21}H_{32}O_{6.5}$ | 399 | 9.9 | 700 |
| 13 | EO | 9 | 396 | $C_{42}H_{82}O_{12}$ | 779 | 10.2 | 1300 |
| 14 | EO + glycerine | 5 | 309 | $C_{31}H_{62}O_9$ | 579 | 10.7 | 800 |
| 15 | EO + glycerine | 20 | 970 | $C_{97}H_{190}O_{26}$ | 1773 | 10.9 | 2400 |

In the present invention, the nonionic surfactant is preferably added in an amount of 0.1 to 15% by mass, more preferably 0.5 to 10% by mass, especially preferably 2 to 6% by mass, relative to the total solids of the radiation-sensitive colored compositions of the present invention to effectively reduce color mixing with residue on another color.

In the radiation-sensitive colored compositions of the present invention, the nonionic surfactant may be used in combination with other surfactants. The other surfactants include various surfactants such as fluorosurfactants, cationic surfactants, anionic surfactants, nonionic surfactants other than the nonionic surfactant described above, silicone surfactants and the like. Especially, the nonionic surfactant is preferably used in combination with fluorosurfactants or silicone surfactants to further improve coatability.

The fluorosurfactants preferably have a fluorine content of 3 to 40% by mass, more preferably 5 to 30% by mass, especially preferably 7 to 25% by mass. Fluorosurfactants having a fluorine content in the ranges indicated above are effective for obtaining coated films having uniform thickness and for reducing coating consumption, and they are also well soluble in the compositions.

Fluorosurfactants include, for example, MEGAFACE F171, F172, F173, F176, F177, F141, F142, F143, F144, R30, F437, F479, F482, F780, F781 (all from DIC Corporation); Fluorad FC430, FC431, FC171 (all from Sumitomo 3M Limited); SURFLON S-382, SC-101, SC-103, SC-104, SC-105, SC1068, SC-381, SC-383, 5393, KH-40 (all from ASAHI GLASS CO., LTD.); and the like.

Cationic surfactants specifically include phthalocyanine derivatives (available from Morishita Sangyo K.K. under the brand name EFKA-745); the organosiloxane polymer KP341 (from Shin-Etsu Chemical Co., Ltd.); the (meth) acrylic (co)polymers POLYFLOW No. 75, No. 90, No. 95 (from Kyoeisha Chemical Co., Ltd.); W001(from Yusho Co., Ltd.); and the like.

Anionic surfactants specifically include W004, W005, W017 (from Yusho Co., Ltd.) and the like.

Silicone surfactants include, for example, "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400" from Toray Silicone Co., Ltd.; "TSF-4440", "TSF-4300", "TSF-4445", "TSF-444(4)(5)(6)(7)6", "TSF-4460", and "TSF-4452" from Toshiba Silicone Co., Ltd.; "KP341" from Shin-Etsu Silicone, Co., Ltd.; "BYK323" and "BYK330" from BYK Japan KK; and the like.

The other surfactants may be used alone or as a combination of two or more of them.

When the other surfactants are added to the radiation-sensitive colored compositions of the present invention, the other surfactants are preferably added in an amount of 0.005 to 2% by mass, more preferably 0.01 to 1% by mass, relative to the total solids of the radiation-sensitive colored compositions of the present invention.

[Dye]
[Dyestuff]

The radiation-sensitive colored compositions of the present invention comprise a dyestuff. The dyestuff is not specifically limited, and dyestuffs known for use in color filters can be used. For example, dyestuff monomers and dyestuff multimers can be used. Specifically, the following dyestuffs can be used: pyrazole azo dyestuffs, anilinoazo dyestuffs, triphenylmethane dyestuffs, anthraquinone dyestuffs, anthrapyridone dyestuffs, benzylidene dyestuffs, oxonol dyestuffs, pyrazolotriazole azo dyestuffs, pyridone azo dyestuffs, cyanine dyestuffs, phenothiazine dyestuffs, pyrrolopyrazole azomethine dyestuffs, xanthene dyestuffs, phthalocyanine dyestuffs, benzopyran dyestuffs, indigo dyestuffs, pyrromethene dyestuffs, methine dyestuffs and the like. Further, multimers of these dyestuffs may be used.

When water or an alkaline solution is used as a developer, acidic dyestuffs and/or derivatives thereof may be suitably used to completely remove binders and/or dyestuffs in unirradiated regions by development.

Preferably, the dyestuff used in the present invention contains a partial structure derived from a dye selected from dipyrromethene dyes, azo dyes, anthraquinone dyes, triphenylmethane dyes, xanthene dyes, cyanine dyes, squarylium dyes, quinophthalone dyes, phthalocyanine dyes and subphthalocyanine dyes.

Further, the dyestuff used in the present invention is preferably a multimer containing a partial structure and a polymerizable group, preferably including structures of dimers, trimers and polymers and the like.

In the dyestuff used in the present invention, each dye from which the partial structure is derived as described above preferably has a dye skeleton having a maximum absorption at a wavelength in the range of 400 to 780 nm. This dyestuff functions as, for example, a colorant in the radiation-sensitive colored compositions of the present invention.

As used herein, the "partial structure derived from a dye" refers to a structure obtained by removing a hydrogen atom from a particular dye (hereinafter also referred to as "dye compound") capable of forming the dye structure described below and that can be attached to an attachment moiety of a dye multimer (a polymer chain or the core of a dendrimer or the like).

(Partial Structure Derived from a Dye)

The partial structure derived from a dye (hereinafter also referred to as "dye structure") in the dyestuff used in the radiation-sensitive colored compositions of the present invention may be, for example, a dye structure selected from quinone dyes (benzoquinone dyes, naphthoquinone dyes, anthraquinone dyes, anthrapyridone dyes and the like), carbonium dyes (diphenylmethane dyes, triphenylmethane dyes, xanthene dyes, acridine dyes and the like), quinoneimine dyes (oxazine dyes, thiazine dyes and the like), azine dyes, polymethine dyes (oxonol dyes, merocyanine dyes, arylidene dyes, styryl dyes, cyanine dyes, squarylium dyes, croconium dyes and the like), quinophthalone dyes, phthalocyanine dyes, subphthalocyanine dyes, perinone dyes, indigo dyes, thioindigo dyes, quinoline dyes, nitro dyes, nitroso dyes, dipyrromethene dyes, azo dyes and metal complex dyes thereof or the like.

Among these dye structures, especially preferred are dye structures selected from dipyrromethene dyes, azo dyes, anthraquinone dyes, triphenylmethane dyes, xanthene dyes, cyanine dyes, squarylium dyes, quinophthalone dyes, phthalocyanine dyes, and subphthalocyanine dyes because of color separation, adhesion to substrates and surface roughness.

In the dyestuff used in the present invention, a hydrogen atom in the dye structure may be substituted by a substituent selected from the substituent group A shown below.

(Substituent Group A)

Substituents by which the dye multimer may be substituted include halogen atoms, alkyl, cycloalkyl, alkenyl, cycloalkenyl, alkynyl, aryl, heterocyclyl, cyano, hydroxyl, nitro, carboxyl, alkoxy, aryloxy, silyloxy, heterocyclyloxy, acyloxy, carbamoyloxy, amino (including alkylamino and anilino), acylamino, aminocarbonylamino, alkoxycarbonylamino, aryloxycarbonylamino, sulfamoylamino, alkyl- or aryl-sulfonylamino, mercapto, alkylthio, arylthio, heterocyclylthio, sulfamoyl, sulfo, alkyl- or aryl-sulfinyl, alkyl- or aryl-sulfonyl, acyl, aryloxycarbonyl, alkoxycarbonyl, carbamoyl, aryl- or heterocyclyl-azo, imide, phosphino, phosphinyl, phosphinyloxy, phosphinylamino, silyl and the like.

Details can be found in, for example, paragraphs 0027 to 0038 of JP-A2013-29760, the disclosure of which is incorporated herein by reference.

Especially preferred dye skeletons are explained below.

(Anthraquinone Dyes)

Preferred partial structures derived from anthraquinone dyes (anthraquinone compounds) are those derived from compounds represented by formulae (AQ-1) to (AQ-3) below (anthraquinone compounds). As used herein, anthraquinone compounds collectively refer to compounds comprising a dye moiety containing an anthraquinane skeleton in the molecule.

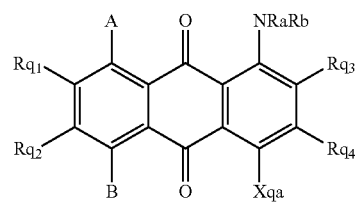

Formula (AQ-1)

-continued

Formula (AQ-2)

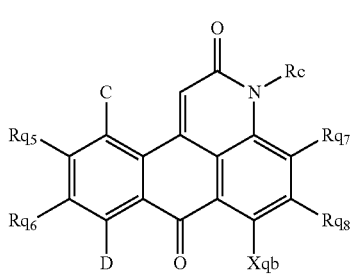

Formula (AQ-3)

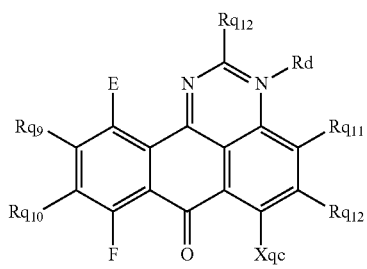

In formula (AQ-1), A and B each independently represent amino, hydroxyl, alkoxy or a hydrogen atom. Xqa represents $ORqa_1$ or $NRqa_2Rqa_3$. $Rqa_1$ to $Rqa_3$ each independently represent a hydrogen atom, alkyl or aryl. $Rq_1$ to $Rq_4$ represent a substituent. Substituents that can be represented by $Rq_1$ to $Rq_4$ are the same as those mentioned in the section of substituent group A. Ra and Rb each independently represent a hydrogen atom, alkyl or aryl.

In formula (AQ-2), C and D have the same meanings as defined for A and B in formula (AQ-1). Xqb represents $ORqb_1$ or $NRqb_2Rqb_3$. $Rqb_1$ to $Rqb_3$ each independently represent a hydrogen atom, alkyl or aryl. $Rq_5$ to $Rq_8$ represent a substituent. $Rq_5$ to $Rq_8$ have the same meanings as defined for $Rq_1$ to $Rq_4$ in formula (AQ-1). Rc has the same meaning as defined for Ra or Rb in formula (AQ-1).

In formula (AQ-3), E and F have the same meanings as defined for A and B in formula (AQ-1). Xqc represents $ORqc_1$ or $NRqc_2Rqc_3$. $Rqc_1$ to $Rqc_3$ each independently represent a hydrogen atom, alkyl or aryl. $Rq_9$ to $Rq_{12}$ have the same meanings as defined for $Rq_1$ to $Rq_4$ in formula (AQ-1). Rd has the same meaning as defined for Ra or Rb in formula (AQ-1).

Preferred ranges of formulae (AQ-1), (AQ-2) and (AQ-3) can be found in, for example, paragraphs 0045 to 0047 of JP-A2013-29760, the disclosure of which is incorporated herein by reference.

Specific examples of anthraquinone dyes can be found in, for example, paragraphs 0049 and 0050 of JP-A2013-29760, the disclosure of which is incorporated herein by reference.

(Triphenylmethane Dyes)

Preferred partial structures derived from triphenylmethane dyes (triphenylmethane compounds) are those derived from compounds represented by formula (TP) below (triphenylmethane compounds). As used herein, triphenylmethane compounds collectively refer to compounds comprising a dye moiety containing a triphenylmethane skeleton in the molecule.

Formula (TP)

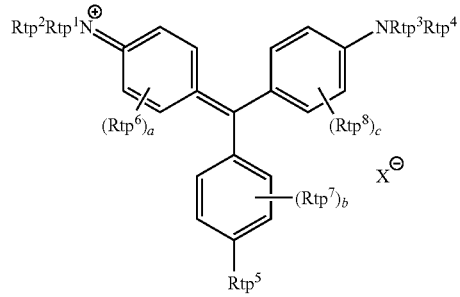

In formula (TP), $Rtp^1$ to $Rtp^4$ each independently represent a hydrogen atom, alkyl or aryl. $Rtp^5$ represents a hydrogen atom, alkyl, aryl or $NRtp^9Rtp^{10}$ (wherein $Rtp^9$ and $Rtp^{10}$ represent a hydrogen atom, alkyl or aryl.). $Rtp^6$, $Rtp^7$ and $Rtp^8$ represent a substituent. a, b and c represent 0 to 4. When a, b and c represent 2 or more, each set of $Rtp^6$, $Rtp^7$ and $Rtp^8$ groups may be joined together to form a ring. $X^-$ represents an anion structure. When $X^-$ is absent, at least one of $Rtp^1$ to $Rtp^7$ contains an anion.

Preferred ranges of formula (TP) can be found in, for example, paragraphs 0055 to 0062 of JP-A2013-29760, the disclosure of which is incorporated herein by reference.

(Xanthene Dyes)

Preferred partial structures derived from xanthene dyes (xanthene compounds) are those derived from xanthene compounds represented by formula (J) below.

Formula (J)

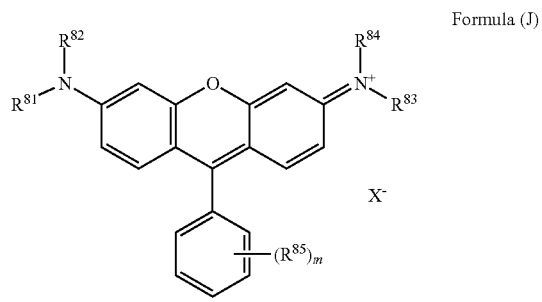

In formula (J), $R^{81}$, $R^{82}$, $R^{83}$ and $R^{84}$ each independently represent a hydrogen atom or a monovalent substituent, $R^{85}$ each independently represents a monovalent substituent, and m represents 0 to 5. $X^-$ represents an anion. When $X^-$ is absent, at least one of $R^{81}$ to $R^{85}$ contains an anion.

Preferred ranges of formula (J) can be found in, for example, paragraphs 0066 to 0073 of JP-A2013-29760, the disclosure of which is incorporated herein by reference.

(Cyanine Dyes)

Preferred partial structures derived from cyanine dyes (cyanine compounds) are those derived from compounds represented by formula (PM) below (cyanine compounds). As used herein, cyanine compounds collectively refer to compounds comprising a dye moiety containing a cyanine skeleton in the molecule.

Formula (PM)

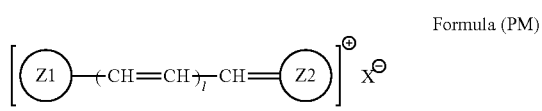

In formula (PM), Z1 ring and Z2 ring each independently represent an optionally substituted heterocycle. l represents 0 or more and 3 or less. $X^-$ represents an anion. Preferred ranges of formula (PM) can be found in, for example, paragraphs 0077 to 0084 of JP-A2013-29760, the disclosure of which is incorporated herein by reference.

(Squarylium Dyes)

Preferred partial structures derived from squarylium dyes (squarylium compounds) are those derived from compounds represented by formula (K) below (squarylium compounds). As used herein, squarylium compounds collectively refer to compounds comprising a dye moiety containing a squarylium skeleton in the molecule.

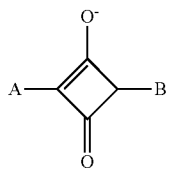

Formula (K)

In formula (K), A and B each independently represent an aryl or heterocyclic group. The aryl is preferably an aryl group containing 6 to 48 carbon atoms, more preferably 6 to 24 carbon atoms, such as phenyl, naphthyl or the like. The heterocyclic group is preferably a 5- or 6-membered heterocyclic group such as pyrroyl, imidazoyl, pyrazoyl, thienyl, pyridyl, pyrimidyl, pyridazyl, triazol-1-yl, thienyl, furyl, thiadiazoyl or the like.

Preferred ranges of formula (K) can be found in, for example, paragraphs 0088 to 0106 of JP-A2013-29760, the disclosure of which is incorporated herein by reference.

(Quinophthalone Dyes)

Preferred partial structures derived from quinophthalone dyes (quinophthalone compounds) are those derived from compounds represented by formula (QP) below (quinophthalone compounds). As used herein, quinophthalone compounds collectively refer to compounds comprising a dye moiety containing a quinophthalone skeleton in the molecule.

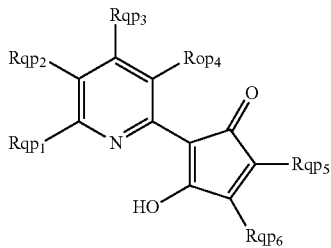

In formula (QP), $Rqp^1$ to $Rqp^6$ each independently represent a hydrogen atom or a substituent. When at least two of $Rqp^1$ to $Rqp^6$ are adjacent to each other, they may be joined together to form a ring, and such a ring may be further substituted.

Preferred ranges of formula (QP) can be found in, for example, paragraphs 0110 to 0114 of JP-A2013-29760, the disclosure of which is incorporated herein by reference.

(Phthalocyanine Dyes)

Preferred partial structures derived from phthalocyanine dyes (phthalocyanine compounds) are those derived from compounds represented by formula (F) below (phthalocyanine compounds). As used herein, phthalocyanine compounds collectively refer to compounds comprising a dye moiety containing a phthalocyanine skeleton in the molecule.

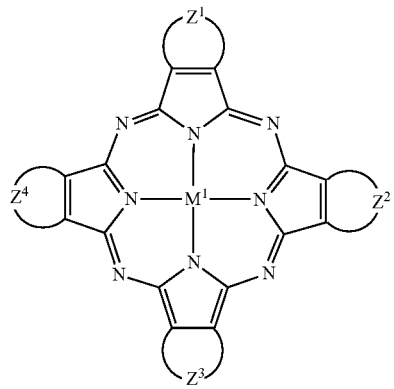

Formula (F)

In formula (F), $M^1$ represents a metal, $Z^1$, $Z^2$, $Z^3$, and $Z^4$ each independently represent a group of atoms required to form a 6-membered ring containing atoms selected from hydrogen, carbon and nitrogen atoms.

Preferred ranges of formula (F) can be found in, for example, paragraphs 0118 to 0124 of JP-A2013-29760, the disclosure of which is incorporated herein by reference.

(Subphthalocyanine Compounds)

Preferred partial structures derived from subphthalocyanine dyes (phthalocyanine compounds) are those derived from compounds represented by formula (SP) below (subphthalocyanine compounds). As used herein, subphthalocyanine compounds collectively refer to compounds comprising a dye moiety containing a subphthalocyanine skeleton in the molecule.

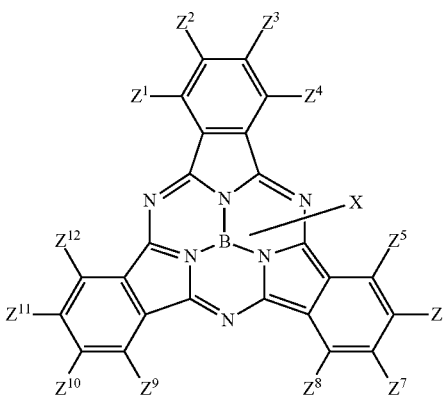

Formula (SP)

In formula (SP), $Z^1$ to $Z^{12}$ each independently represent a hydrogen atom, alkyl, aryl, hydroxyl, mercapto, amino, alkoxy, aryloxy, or thioether. X represents an anion. Preferred ranges of formula (SP) can be found in, for example, paragraphs 0128 to 0133 of JP-A2013-29760, the disclosure of which is incorporated herein by reference.

Further, dipyrromethene dyes and azo dyes can be found in, for example, paragraphs 0033 to 0135 of JP-A2011-95732, the disclosure of which is incorporated herein by reference.

(The Structure of the Dyestuff Used in the Radiation-Sensitive Colored Compositions of the Present Invention)

The dyestuff used in the radiation-sensitive colored compositions of the present invention may be a dye monomer containing one partial structure derived from a dye as described above in the molecule or a dye oligomer or dye multimer containing two or more partial structures derived from a dye as described above in the molecule.

<Dye Monomer>

Preferably, the dye monomer contains a polymerizable group. In such embodiments, heat resistance tends to improve. Only one or more than polymerizable group may be contained. Polymerizable groups that can be used include known polymerizable groups that can be crosslinked by free radical mechanism or exposure to acids or heat, e.g., ethylenically unsaturated bond-containing groups, cyclic ethers (epoxy, oxetane), methylol and the like, especially preferably ethylenically unsaturated bond-containing groups, more preferably (meth)acryloyl, most preferably (meth) acryloyl derived from glycidyl (meth)acrylate and 3,4-epoxy-cyclohexylmethyl (meth)acrylate.

Methods for introducing a polymerizable group include copolymerizing a dye monomer with a compound containing the polymerizable group to introduce it, or the like. These methods can be found in, for example, paragraphs 0181 to 0188 of JP-A2013-29760, the disclosure of which is incorporated herein by reference.

Preferably, the dye monomer contains 1 to 4, more preferably 1 to 2 polymerizable groups in one molecule.

The dye monomer may contain an alkali-soluble group. Examples of alkali-soluble groups include carboxylic acid, sulfonic acid, and phosphoric acid groups.

Methods for introducing an alkali-soluble group into a dye monomer include introducing the alkali-soluble group into the dye monomer in advance.

Preferably, the dye monomer contains 1 to 4, more preferably 1 to 2 alkali-soluble groups in one molecule.

Other functional groups that may be contained in the dye monomer include development-promoting groups such as lactone, acid anhydrides, amides, —COCH$_2$CO—, cyano and the like; hydrophilic/hydrophobic balance-controlling groups such as long-chain and cyclic alkyl, aralkyl, aryl, polyalkylene oxide, hydroxyl, maleimide, amino and the like; and they can be introduced as appropriate.

Preferably, the dye monomer has an acid number of 5 to 200 mg KOH/g, more preferably 10 to 180 mg KOH/g.

<Dye Oligomer>

The dye oligomer is an oligomer containing two or more partial structures derived from a dye as described above in the molecule and includes any structures ranging from dimers to octamers. Preferably, the dye oligomer is an oligomer represented by formula (I) below:

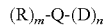  Formula (I)

In formula (I), Q represents a (m+n)-valent linking group, R represents a substituent, and D represents the dye structure described above. m represents an integer of 0 to 6, n represents an integer of 2 to 8, and (m+n) represents an integer of 2 to 8. When m is 2 or more, multiple R groups may be different from each other, and when n is 2 or more, multiple D groups may be different from each other.

In formula (I), Q represents a (m+n)-valent linking group, preferably a trivalent to hexavalent linking group.

Preferably, the (m+n)-valent linking group represented by Q is a linking group represented by formula (Q-1) or (Q-2) below.

In formula (Q-1), $R^1$ to $R^4$ each independently represent a linking group or a substituent provided that at least two of $R^1$ to $R^4$ represent a linking group.

Preferably, the substituent represented by $R^1$ to $R^4$ is an alkyl group containing 1 to 10 carbon atoms (preferably an alkyl group containing 1 to 6 carbon atoms, more preferably an alkyl group containing 1 to 3 carbon atoms), an aryl group containing 6 to 20 carbon atoms (preferably an aryl group containing 6 to 14 carbon atoms, more preferably an aryl group containing 6 to 10 carbon atoms), more preferably an alkyl group containing 1 to 10 carbon atoms, even more preferably methyl, ethyl or propyl.

More preferably, the linking group represented by $R^1$ to $R^4$ is alkylene (preferably a straight-chain or branched alkylene, more preferably —(CH$_2$)$_{n1}$— (wherein n1 preferably represents an integer of 1 to 3)), —O—, —CO—, —SO$_2$— or —NRa- (wherein Ra represents an alkyl group containing 1 to 5 carbon atoms or a hydrogen atom), and a combination of two or more of these groups, even more preferably a combination of two or more of alkylene, —O—, —CO— and —NRa-.

In the linking group represented by $R^1$ to $R^4$, the number of atoms linking R or D to C at the center is preferably 1 to 15 atoms, more preferably 1 to 10 atoms. For example, the number of atoms linking R or D to C at the center is 5 atoms when the linking group is —CH$_2$—CH$_2$—C(=O)—O—CH$_2$—.

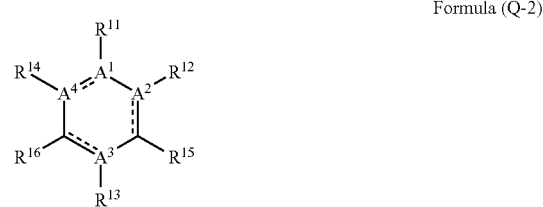

In formula (Q-2), $A^1$ to $A^4$ each independently represent a carbon atom or a nitrogen atom. $R^{11}$ to $R^{16}$ each independently represent a hydrogen atom, =O or a linking group. The dashed line indicates a single bond or a double bond.

In formula (Q-2), the 6-membered ring containing $A^1$ to $A^4$ may be an aliphatic ring, heterocycle, or benzene ring, preferably a heterocycle or benzene ring.

The linking group represented by $R^{11}$ to $R^{16}$ is as defined for the linking group represented by $R^1$ to $R^4$ in formula (Q-1), and also covers the same preferred ranges.

Specific examples of (m+n)-valent linking groups represented by Q are shown below. However, the present invention is not limited to these examples.

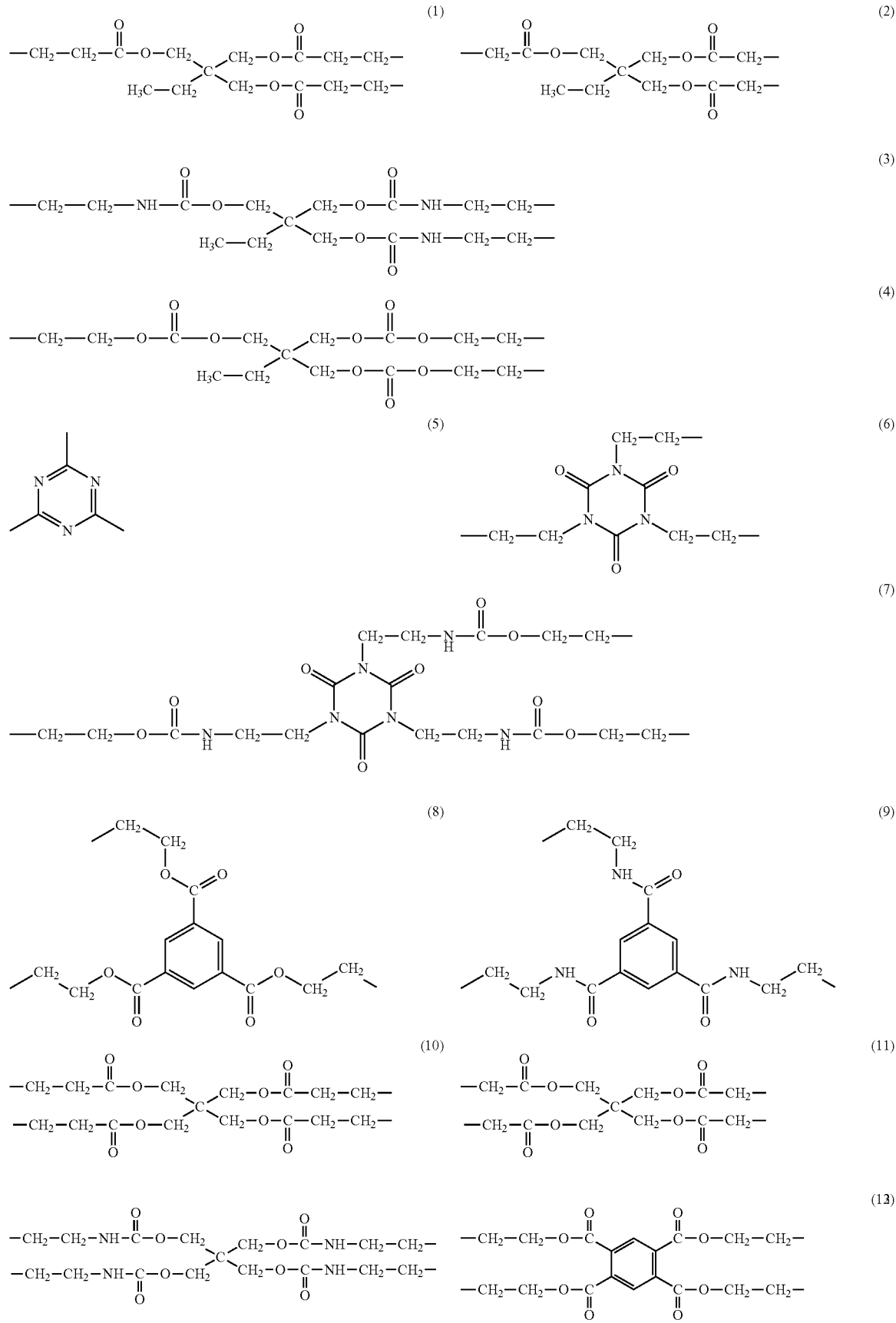

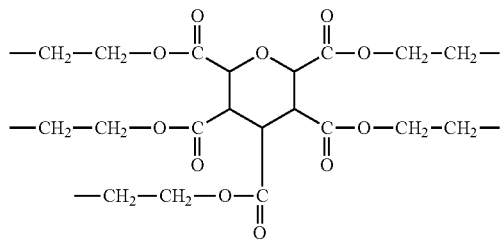

(14)

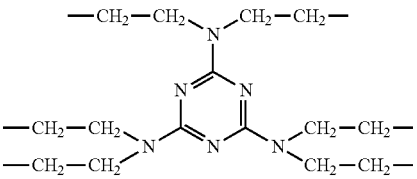

(15)

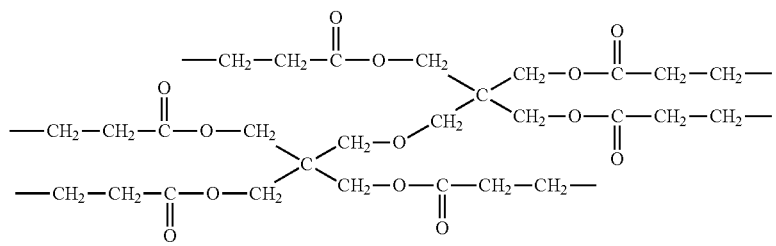

(16)

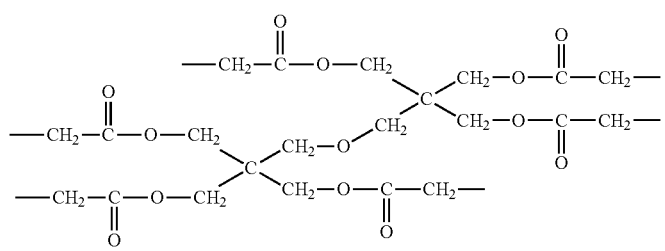

(17)

In formula (I), R each independently represents a substituent, and when m is 2 or more, multiple R groups may be different from each other.

The substituent represented by R may be, for example, a halogen atom, alkyl, cycloalkyl, alkenyl, cycloalkenyl, alkynyl, aryl, heterocyclyl, cyano, hydroxyl, nitro, carboxyl, alkoxy, aryloxy, silyloxy, heterocyclyloxy, acyloxy, carbamoyloxy, amino (including alkylamino and anilino), acylamino, aminocarbonylamino, alkoxycarbonylamino, aryloxycarbonylamino, sulfamoylamino, alkyl- or arylsulfonylamino, mercapto, alkylthio, arylthio, heterocyclylthio, sulfamoyl, sulfo, alkyl- or aryl-sulfinyl, alkyl- or aryl-sulfonyl, acyl, aryloxycarbonyl, alkoxycarbonyl, carbamoyl, aryl- or heterocyclyl-azo, imide, phosphino, phosphinyl, phosphinyloxy, phosphinylamino, phosphono, silyl or the like.

Further, R may represent a polymerizable group or an alkali-soluble group.

Polymerizable groups include known polymerizable groups that can be crosslinked by free radical mechanism or exposure to acids or heat, e.g., ethylenically unsaturated bond-containing groups, cyclic ethers (epoxy, oxetane), methylol and the like, preferably ethylenically unsaturated bond-containing groups, more preferably (meth)acryloyl, especially preferably (meth)acryloyl derived from glycidyl (meth)acrylate and 3,4-epoxy-cyclohexylmethyl (meth) acrylate.

Alkali-soluble group include acid groups such as carboxyl, sulfo, and phosphoric acid groups and the like, preferably carboxyl.

m represents an integer of 0 to 6, preferably an integer of 1 to 4, more preferably an integer of 1 to 3.

n represents an integer of 2 to 8, preferably an integer of 2 to 6, more preferably an integer of 2 to 5.

m+n represents an integer of 2 to 8, preferably an integer of 2 to 7, more preferably an integer of 3 to 6.

<Dye Multimer>

The dye multimer contains two or more partial structures derived from a dye as described above in the molecule. Preferably, the dye multimer is a dye multimer comprising at least one of the structural units represented by formula (A), formula (B) and formula (C) below, or a dye multimer represented by formula (D) below.

Structural Unit Represented by Formula (A)

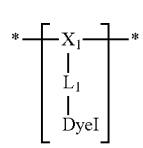

Formula (A)

In formula (A), $X_1$ represents a linking group formed by polymerization, and $L^1$ represents a single bond or a divalent linking group. DyeI represents the dye structure described above.

Formula (A) is explained in detail below.

In formula (A), $X_1$ represents a linking group formed by polymerization, namely a moiety forming a structural unit corresponding to a main chain formed by a polymerization reaction. The moiety defined by two asterisks (*) forms the structural unit. $X_1$ is not specifically limited so far as it is a linking group formed from a known polymerizable monomer, but especially preferably a linking groups represented by any one of (XX-1) to (X-24) below, more preferably a linking group selected from the (meth)acrylic linking chains represented by (XX-1) and (XX-2), the styrene linking chains represented by (XX-10) to (XX-17), (XX-18) and (XX-19), and the vinyl linking chain represented by (XX-24), even more preferably a linking group selected from the (meth)acrylic linking chains represented by (XX-1) and (XX-2), the styrene linking chains represented by (XX-10) to (XX-17), and the vinyl linking chain represented by (XX-24), still more preferably the (meth)acrylic linking chains represented by (XX-1) and (XX-2), and the styrene linking chain represented by (XX-11).

In (XX-1) to (X-24), the asterisk (*) represents the point of attachment to $L_1$. Me represents methyl. In (XX-18) and (XX-19), R represents a hydrogen atom, an alkyl group containing 1 to 5 carbon atoms or phenyl.

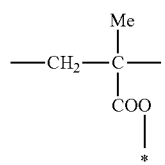 (XX-1)

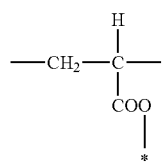 (XX-2)

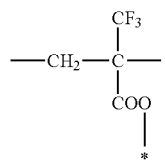 (XX-3)

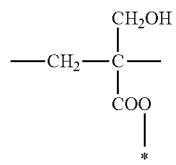 (XX-4)

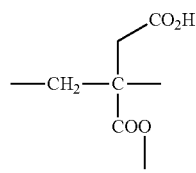 (XX-5)

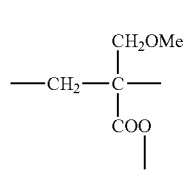 (XX-6)

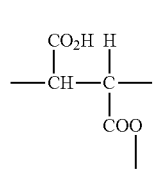 (XX-7)

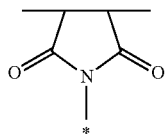 (XX-8)

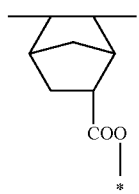 (XX-9)

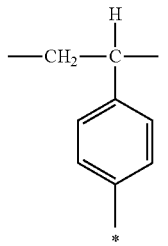 (XX-10)

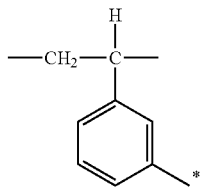 (XX-11)

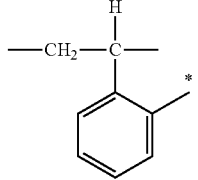 (XX-12)

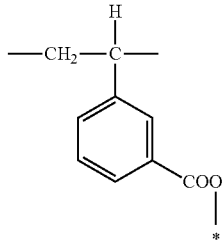 (XX-13)

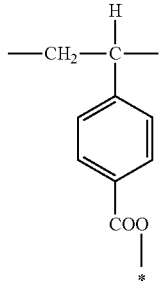 (XX-14)

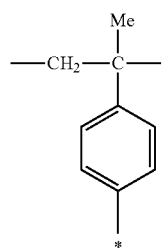 (XX-15)
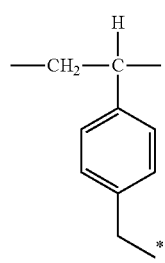 (XX-16)
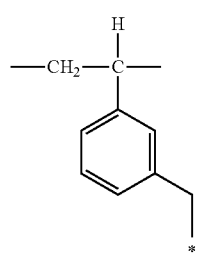 (XX-17)
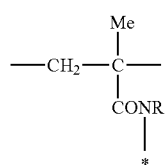 (XX-18)
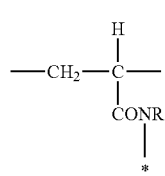 (XX-19)
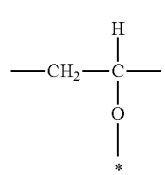 (XX-20)
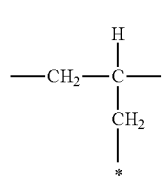 (XX-21)
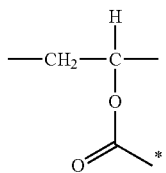 (XX-22)
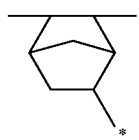 (XX-23)
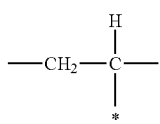 (XX-24)
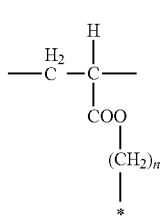 (XX-25)
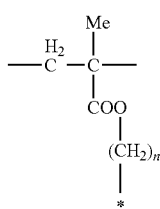 (XX-26)
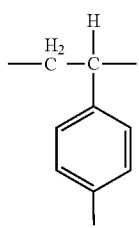 (XX-27)
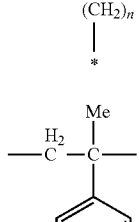 (XX-28)

-continued

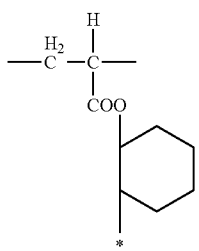
(XX-29)

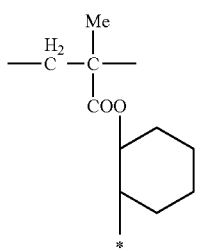
(XX-30)

In formula (A), $L_1$ represents a single bond or a divalent linking group. When $L^1$ represents a divalent linking group, the divalent linking group is a substituted or unsubstituted alkylene group containing 1 to 30 carbon atoms (e.g., methylene, ethylene, trimethylene, propylene, butylene or the like), a substituted or unsubstituted arylene group containing 6 to 30 carbon atoms (e.g., phenylene, naphthalene or the like), a substituted or unsubstituted heterocyclic linking group, —CH=CH—, —O—, —S—, —C(=O)—, —CO$_2$—, —NR—, —CONR—, —O$_2$C—, —SO—, —SO$_2$— or a linking group formed by combining two or more of them. Alternatively, $L_1$ also preferably contains an anion. More preferably, $L_1$ represents a single bond or an alkylene group, even more preferably a single bond or —(CH$_2$)n- (wherein n represents an integer of 1 to 5.). In the groups shown above, R each independently represents a hydrogen atom, alkyl, aryl, or heterocyclyl. Examples of $L_1$ groups containing an anion are described later.

In formula (A), DyeI represents the dye structure described above.

The dye multimer comprising a structural unit represented by formula (A) can be synthesized by (1) addition polymerization using a monomer containing a dye residue, or (2) reacting a polymer containing a highly reactive functional group such as isocyanate, acid anhydride or epoxy with a dye containing a functional group capable of reacting with the highly reactive group (hydroxyl, primary or secondary amino, carboxyl or the like).

The addition polymerization can be performed by applying known addition polymerization techniques (radical polymerization, anionic polymerization, cationic polymerization), among which radical polymerization is especially preferred because of milder reaction conditions enough to protect the dye structure against degradation. For radical polymerization, known reaction conditions can be applied. Thus, the dye multimer used in the present invention is preferably an addition polymer.

Especially, the dye multimer comprising a structural unit represented by formula (A) is preferably a radical polymer obtained by radically polymerizing a dye monomer containing an ethylenically unsaturated bond to improve heat resistance.

Details of formula (A) can be found in paragraphs 0138 to 0152 of JP-A2013-29760, the disclosure of which is incorporated herein by reference.

Structural Unit Represented by Formula (B)

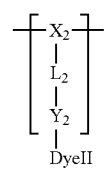

Formula (B)

In formula (B), $X_2$ has the same meaning as defined for $X_1$ in formula (A). $L_2$ has the same meaning as defined for $L^1$ in formula (A). $Y_2$ represents a group capable of forming an ionic bond or a coordinate bond with DyeII. DyeII represents a dye structure. Details of formula (B) can be found in paragraphs 0156 to 0161 of JP-A2013-29760, the disclosure of which is incorporated herein by reference.

Structural Unit Represented by Formula (C)

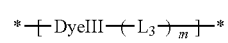

Formula (C)

In formula (C) above, $L_3$ represents a single bond or a divalent linking group. DyeIII represents a dye structure. m represents 0 or 1. Details of formula (C) can be found in paragraphs 0165 to 0167 of JP-A2013-29760, the disclosure of which is incorporated herein by reference.

Dye Multimer Represented by Formula (D)

Formula (D)

In formula (D), $L_4$ represents an n-valent linking group. n represents an integer of 2 to 20. When n is 2 or more, the structures of DyeIV may be identical or different. DyeIV represents a dye structure. Details of formula (D) can be found in paragraphs 0173 to 0178 of JP-A2013-29760, the disclosure of which is incorporated herein by reference.

Among dye multimers comprising a structural unit represented by formula (A), formula (B) and/or formula (C) and dye multimers represented by formula (D), preferred ones are dye multimers comprising structural units represented by formula (A) and formula (C) and dye multimers represented by formula (D) because they are linked via a covalent bond so that radiation-sensitive colored compositions containing such dye multimers are excellent in heat resistance and they are effective for preventing color migration to adjacent other colored patterns when the radiation-sensitive colored compositions are applied to multicolor patterning. Especially, compounds represented by formula (A) are preferred because the molecular weight of the resulting dye multimers can be readily controlled.

Preferably, the dye multimer comprises a structural unit containing a dye structure in an amount of 15 to 60 mol %, more preferably 20 to 50 mol %, especially preferably 20 to 45 mol % when all structural units in the dye multimer represent 100 mol %.

<<Other Functional Groups or Other Structural Units>>

The dye multimer may contain a functional group or a structural unit other than the structural unit containing a dye structure.

The functional group may be contained in the structural unit containing a dye structure, or may be contained as another structural unit containing the functional group in addition to the structural unit containing a dye structure.

Examples of functional groups include polymerizable groups, alkali-soluble group and the like.

These groups are explained in detail below.

<<<Polymerizable Group>>>

Only one or more than one polymerizable group may be contained.

Polymerizable groups that can be used include known polymerizable groups that can be crosslinked by free radical mechanism or exposure to acids or heat, e.g., ethylenically unsaturated bond-containing groups, cyclic ethers (epoxy, oxetane), methylol and the like, especially preferably ethylenically unsaturated bond-containing groups, more preferably (meth)acryloyl, even more preferably (meth)acryloyl derived from glycidyl (meth)acrylate and 3,4-epoxy-cyclohexylmethyl (meth)acrylate.

Preferably, the structural unit containing a polymerizable group is represented by formula (P) below.

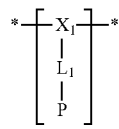

Formula (P)

In formula (P), $X^1$ represents a linking group formed by polymerization, and $L^1$ represents a single bond or a divalent linking group. P represents a polymerizable group.

In formula (P), $X^1$ and $L^1$ each have the same meanings as defined for $X^1$ and $L_1$ in formula (A), and also cover the same preferred ranges.

Methods for introducing a polymerizable group include (1) (a) modifying a structural unit into which the polymerizable group is to be introduced with a compound containing the polymerizable group to introduce it, or (2) copolymerizing a compound containing the polymerizable group to introduce it, or the like.

When a polymerizable group is contained in a dye monomer, the amount of the polymerizable group contained in the dye monomer is preferably 0.1 to 2.0 mmol, more preferably 0.2 to 1.5 mmol, especially preferably 0.3 to 1.0 mmol per gram of the dye structure.

When other structural units contain a polymerizable group, the amount contained is preferably, for example, 10 to 40% by mass, more preferably 15 to 35% by mass based on 100% by mass of all structural units.

Specific examples of structural units containing a polymerizable group are shown below. However, the present invention is not limited to these examples.

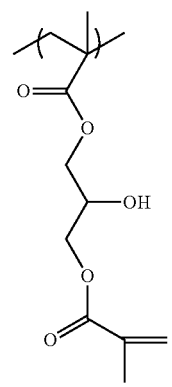

(G-1)

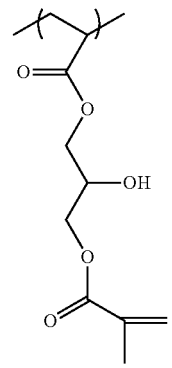

(G-2)

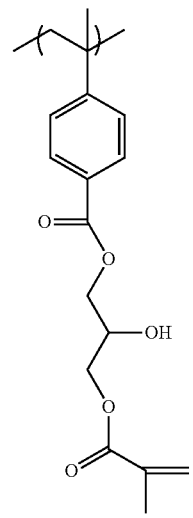

(G-3)

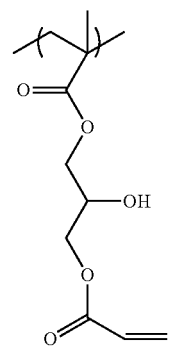

(G-4)

(G-5)
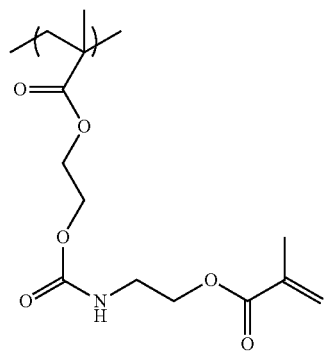
(G-6)
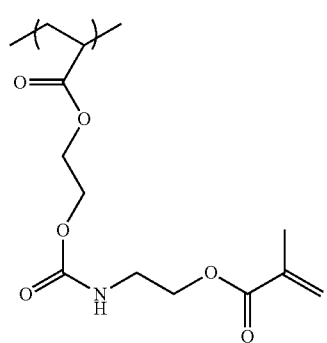
(G-7)
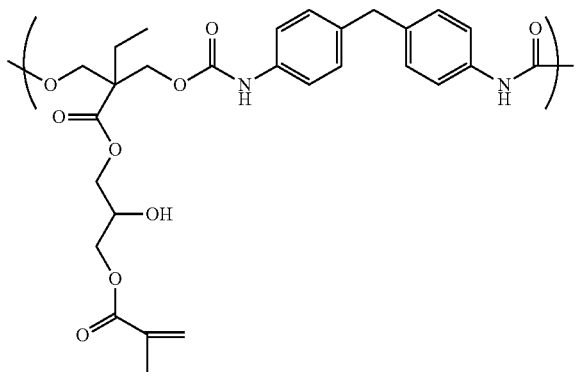
(G-8)
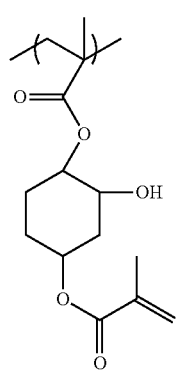
(G-9)
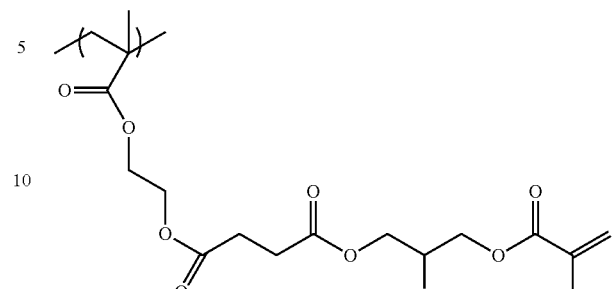
(G-10)
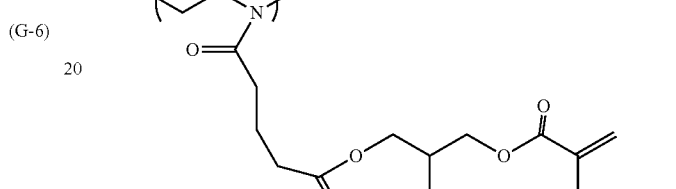
(G-11)
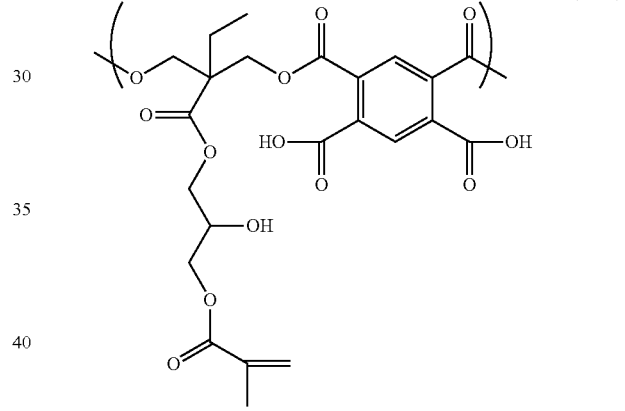
(G-12)
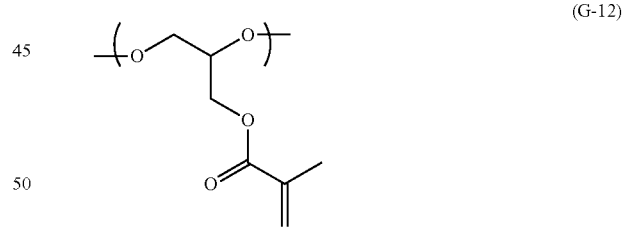
(G-13)
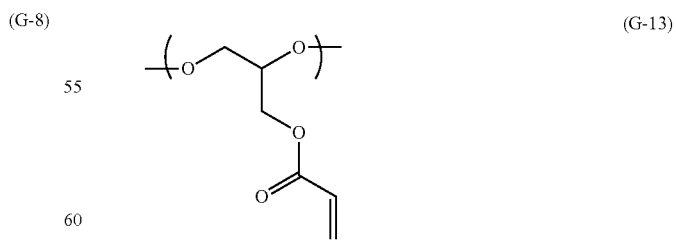
(G-14)
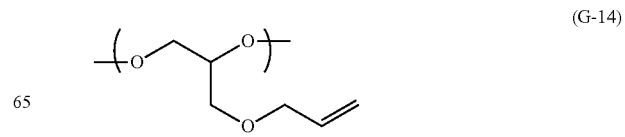

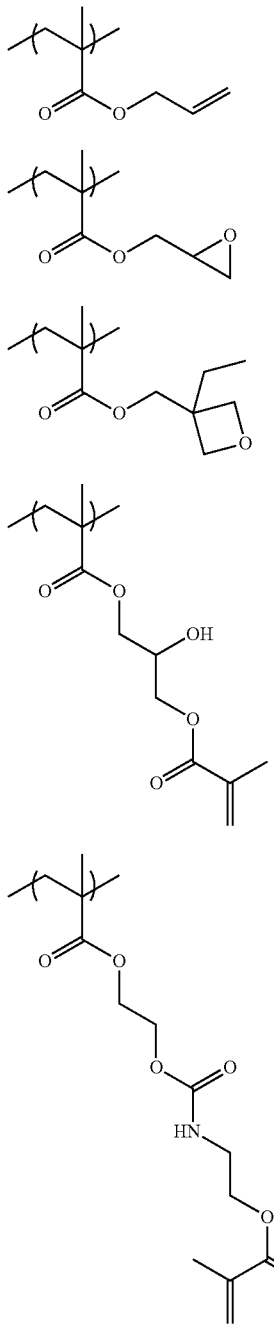

(G-15)

(G-16)

(G-17)

(B-18)

(B-19)

<<<Alkali-Soluble Group>>>

An example of alkali-soluble groups that may be contained in the dye multimer is an acid group. Examples of acid groups include carboxylic acid, sulfonic acid, and phosphoric acid groups.

In the present invention, an alkali-soluble group is preferably contained in the dye multimer as a structural unit containing the alkali-soluble group. More specifically, it is preferably contained as a repeat unit of formula (P) above wherein P is an alkali-soluble group.

Methods for introducing an alkali-soluble group into a dye multimer include introducing the alkali-soluble group into a dye monomer in advance, or copolymerizing a monomer other than a dye monomer containing the alkali-soluble group ((meth)acrylic acid, caprolactone-modified acrylic acid, succinic anhydride-modified 2-hydroxyethyl (meth)acrylate, phthalic anhydride-modified 2-hydroxyethyl (meth)acrylate, 1,2-cyclohexane dicarboxylic anhydride-modified 2-hydroxyethyl (meth)acrylate; a carboxylic acid-containing monomer such as styrenecarboxylic acid, itaconic acid, maleic acid, or norbornenecarboxylic acid; a phosphoric acid-containing monomer such as acid phosphooxyethyl methacrylate, or vinylphosphonic acid; a sulfonic acid-containing monomer such as vinylsulfonic acid, or 2-acrylamide-2-methylsulfonic acid), even more preferably a combination of both methods.

The amount of the alkali-soluble group (acid number) contained per gram of the dye multimer is preferably 15 mg KOH/g to 130 mg KOH/g, more preferably 25 mg KOH/g to 100 mg KOH/g, even more preferably 25 mg KOH/g to 80 mg KOH/g. The amount of the alkali-soluble group (acid number) can be determined by titration with 0.1N aqueous sodium hydroxide solution.

When the dye multimer comprises a structural unit containing a dye monomer and a structural unit containing an acid group, the proportion of the structural unit containing an acid group is preferably, for example, 5 to 70 mol, more preferably 10 to 50 mol per 100 mol of the structural unit containing a dye monomer.

Functional groups contained in the dye multimer include development-promoting groups such as lactone, acid anhydrides, amides, —COCH$_2$CO—, cyano and the like; hydrophilic/hydrophobic balance-controlling groups such as long-chain and cyclic alkyl, aralkyl, aryl, polyalkylene oxide, hydroxyl, maleimide, amino and the like; and they can be introduced as appropriate.

Methods for introducing a functional group include introducing the functional group into a dye monomer in advance, or copolymerizing a monomer containing the functional group.

<<<Structures Represented by Formulae (1) to (5)>>>

In the dye multimer, the structural unit containing a dye structure may contain a structure represented by any one of formulae (1) to (5).

The structure represented by formula (1) is a structure collectively referred to as hindered amine. The structure represented by formula (2) is a structure collectively referred to as hindered phenol. The structure represented by formula (3) is a structure collectively referred to as benzotriazole. The structure represented by formula (4) is a structure collectively referred to as hydroxybenzophenone. The structure represented by formula (5) is a structure collectively referred to as triazine.

Among the structures represented by formulae (1) to (5), preferred are the structure represented by formula (1) and the structure represented by formula (2), especially preferably the structure represented by formula (1). The dye multimer used in the present invention comprises a dye structure and a structure represented by formula (1) in the same molecule so that the amine group in the structure represented by formula (1) interacts with substrates, whereby adhesion can be more improved.

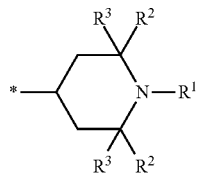

(1)

In formula (1), $R^1$ represents a hydrogen atom, an alkyl group containing 1 to 18 carbon atoms, an aryl group, or an oxyradical. $R^2$ and $R^3$ each independently represent an alkyl group containing 1 to 18 carbon atoms. $R^2$ and $R^3$ may be joined together to represent an aliphatic ring containing 4 to 12 carbon atoms. The asterisk (*) represents the point of attachment of the structure represented by formula (1) to a polymer skeleton.

In formula (1), $R^1$ represents a hydrogen atom, an alkyl group containing 1 to 18 carbon atoms, an aryl group, or an oxyradical, preferably an alkyl group containing 1 to 18 carbon atoms.

The alkyl group containing 1 to 18 carbon atoms may be straight-chain, branched or cyclic, but preferably straight-chain. The alkyl group containing 1 to 18 carbon atoms preferably contains 1 to 12 carbon atoms, more preferably 1 to 8 carbon atoms, even more preferably 1 to 3 carbon atoms, especially preferably 1 or 2 carbon atoms. Especially, the alkyl group containing 1 to 18 carbon atoms is preferably methyl or ethyl, more preferably methyl. The aryl group may contain 6 to 18 carbon atoms, or 6 to 12 carbon atoms, or 6 carbon atoms. Specifically, it is phenyl.

When $R^1$ in formula (1) represents an alkyl group containing 1 to 18 carbon atoms or an aryl group, the alkyl group containing 1 to 18 carbon atoms and the aryl group may be substituted or unsubstituted. Substituents by which they may be substituted include substituents selected from the substituent group A described above.

In formula (1), $R^2$ and $R^3$ each independently represent an alkyl group containing 1 to 18 carbon atoms, preferably an alkyl group containing 1 to 3 carbon atoms, more preferably methyl. $R^2$ and $R^3$ may be joined together to represent an aliphatic ring containing 4 to 12 carbon atoms.

In formula (1), the asterisk (*) represents the point of attachment of the structure represented by formula (1) to a polymer skeleton. The point of attachment may be linked to a polymer skeleton directly or via a linking group or may be linked to the dye structure described above directly or via a linking group. Especially, the asterisk (*) in formula (1) is preferably linked to a polymer skeleton directly or via a linking group.

Specific examples of structure represented by formula (1) are shown below, but the present invention is not limited to these examples. In the structures shown below, the asterisk (*) represents the point of attachment of the structure represented by formula (2) to a polymer skeleton.

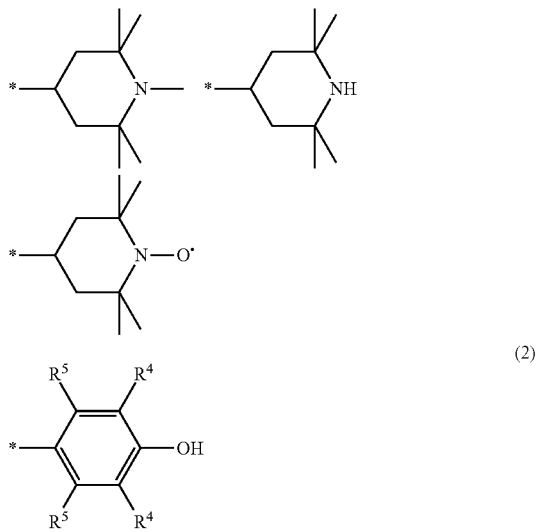

(2)

In formula (2), $R^4$ represents formula (2A) below, an alkyl group containing 1 to 18 carbon atoms or an aryl group. $R^5$ each independently represents a hydrogen atom or an alkyl group containing 1 to 18 carbon atoms. The asterisk (*) represents the point of attachment of the structure represented by formula (2) to a polymer skeleton.

In formula (2), $R^4$ represents formula (2A) above, an alkyl group containing 1 to 18 carbon atoms or an aryl group, preferably formula (2A). The alkyl group containing 1 to 18 carbon atoms and the aryl group are as defined for the alkyl group containing 1 to 18 carbon atoms and the aryl group for $R^1$ in formula (1). Further, the asterisk (*) has the same meaning as defined for the point of attachment in formula (1).

(2A)

In formula (2A), $R^6$ each independently represents an alkyl group containing 1 to 18 carbon atoms. The asterisk (*) represents the point of attachment of the structure represented by formula (2A) to the structure represented by formula (2).

In formula (2A), $R^6$ has the same meaning as defined for the alkyl group containing 1 to 18 carbon atoms for $R^1$ in formula (1). Further, the asterisk (*) has the same meaning as defined for the point of attachment in formula (1).

Specific examples of structures represented by formula (2) are shown below, but the present invention is not limited to these examples. In the structures shown below, the asterisk (*) represents the point of attachment of the structure represented by formula (2) to a polymer skeleton.

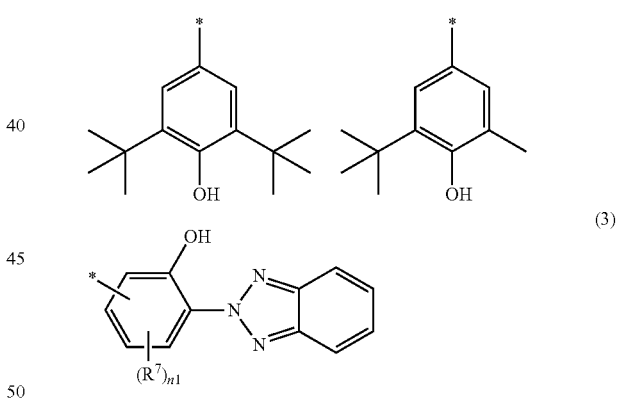

(3)

In formula (3), $R^7$ represents an alkyl group containing 1 to 18 carbon atoms; and n1 represents an integer of 0 to 3. When n1 is 2 or 3, multiple $R^7$ groups may be identical or different. The asterisk (*) represents the point of attachment of the structure represented by formula (3) to a polymer skeleton.

In formula (3), $R^7$ has the same meaning as defined for the alkyl group containing 1 to 18 carbon atoms for $R^1$ in formula (1).

In formula (3), n1 represents an integer of 0 to 3, preferably an integer of 0 to 2, preferably 0 or 1.

In formula (3), the asterisk (*) has the same meaning as defined for the point of attachment in formula (1).

Specific examples of structures represented by formula (3) are shown below, but the present invention is not limited to these examples. In the structures shown below, the asterisk (*) represents the point of attachment of the structure represented by formula (3) to a polymer skeleton.

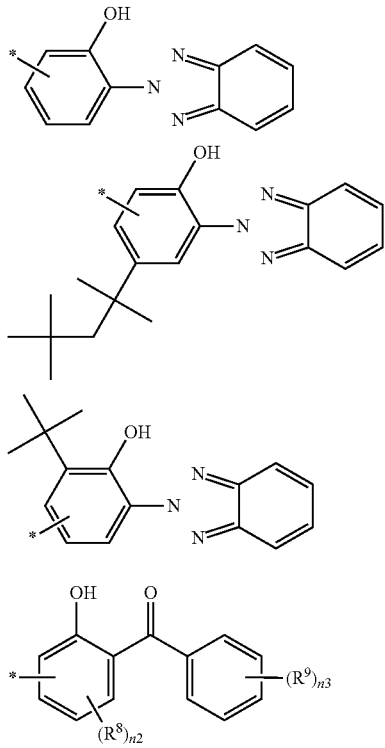

(4)

In formula (4), $R^8$ and $R^9$ each independently represent an alkyl group containing 1 to 18 carbon atoms. n2 represents an integer of 0 to 3. n3 represents an integer of 0 to 4. When n2 is 2 or 3, multiple $R^8$ groups may be identical or different. When n3 represents an integer of 2 to 4, multiple $R^9$ groups may be identical or different. The asterisk (*) represents the point of attachment of the structure represented by formula (4) to a polymer skeleton.

In formula (4), $R^8$ and $R^9$ have the same meaning as defined for the alkyl group containing 1 to 18 carbon atoms for $R^1$ in formula (1).

In formula (4), n2 represents an integer of 0 to 3, preferably an integer of 0 to 2, preferably 0 or 1.

In formula (4), n3 represents an integer of 0 to 4, preferably an integer of 0 to 2, preferably 0 or 1.

In formula (4), the asterisk (*) has the same meaning as defined for the point of attachment in formula (1).

Specific examples of structures represented by formula (4) are shown below, but the present invention is not limited to these examples. In the structures shown below, the asterisk (*) represents the point of attachment of the structure represented by formula (4) to a polymer skeleton.

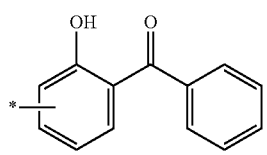

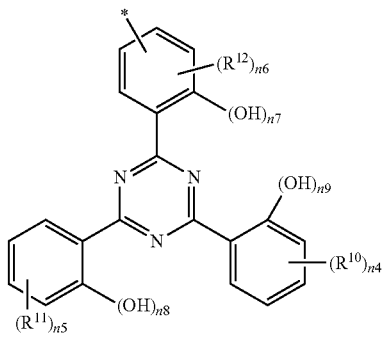

(5)

In formula (5), $R^{10}$ to $R^{12}$ each independently represent an alkyl group containing 1 to 18 carbon atoms or an alkoxy group containing 1 to 8 carbon atoms. n4 to n6 each independently represent an integer of 0 to 5. n7 to n9 each independently represent 0 or 1, and at least one of n7 to n9 represents 1. The asterisk (*) represents the point of attachment of the structure represented by formula (5) to a polymer skeleton.

When $R^{10}$ in formula (5) represents an alkyl group containing 1 to 18 carbon atoms, it is as defined for the alkyl group containing 1 to 18 carbon atoms for $R^1$ in formula (1), preferably an alkyl group containing 1 to 3 carbon atoms, more preferably methyl. When $R^{10}$ represents an alkoxy group containing 1 to 8 carbon atoms, the alkoxy group preferably contains 1 to 6 carbon atoms, more preferably 1 to 5 carbon atoms, even more preferably 1 to 4 carbon atoms.

In formula (5), n4 represents an integer of 0 to 5, preferably an integer of 1 to 4, preferably 2 or 3. When n4 represents an integer of 2 to 5, multiple $R^{10}$ groups may be identical or different.

In formula (5), $R^{11}$ has the same meaning as defined for $R^{10}$ in formula (5), and also covers the same preferred ranges.

In formula (5), n5 represents an integer of 0 to 5, preferably an integer of 1 to 3, preferably 1 or 2. When n5 represents an integer of 2 to 5, multiple $R^{11}$ groups may be identical or different.

In formula (5), $R^{12}$ has the same meaning as defined for $R^{10}$ in formula (5), and also covers the same preferred ranges.

In formula (5), n6 represents an integer of 0 to 5, preferably an integer of 0 to 3, preferably 0 or 1. When n6 represents an integer of 2 to 5, multiple $R^{12}$ groups may be identical or different.

In formula (5), n7 to n9 each independently represent 0 or 1, provided that at least one of n7 to n9 represents 1. Especially preferably, only n7 represents 1, or only n8 and n9 represent 1, or only n7 and either n8 or n9 represents 1.

In formula (5), $R^{10}$ to $R^{12}$ may be each independently substituted or unsubstituted. Substituents by which they may be substituted include substituents selected from the substituent group A described above.

In formula (5), the asterisk (*) has the same meaning as defined for the point of attachment in formula (1). Specific examples of structures represented by formula (5) are shown below, but the present invention is not limited to these examples. In the structures shown below, the asterisk (*) represents the point of attachment of the structure represented by formula (5) to a polymer skeleton.

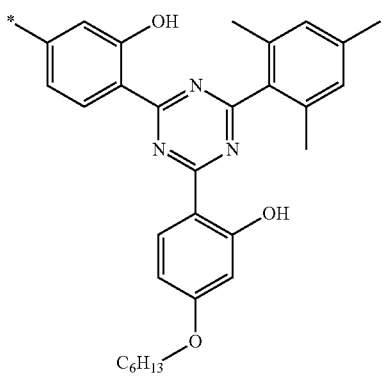
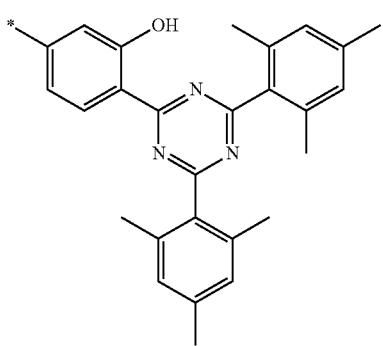
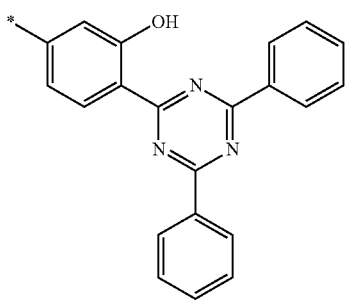
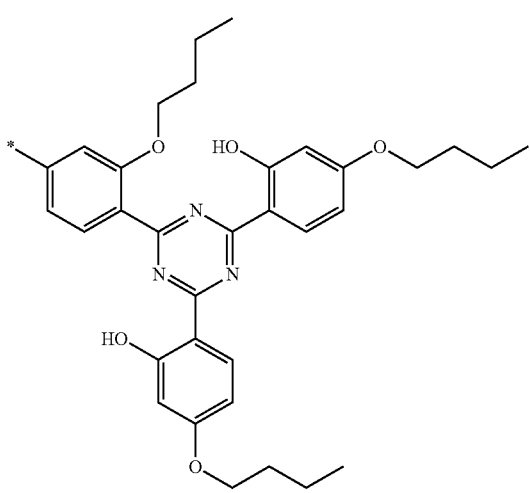

<<<<Structural Unit Containing at Least One of Structures Represented by Formulae (1) to (5)>>>>

Preferably, the structural unit containing at least one of structures represented by formulae (1) to (5) is represented by formula (E) below:

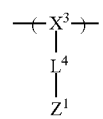

Formula (E)

In formula (e), $X^3$ has the same meaning as defined for $X^1$ in formula (A). $L^4$ has the same meaning as defined for $L^1$ in formula (A). $Z^1$ represents a structure represented by any one of formulae (1) to (5) described above.

Specific examples of structural units containing at least one of structures represented by formulae (1) to (5) are shown below, but the present invention is not limited to these examples.

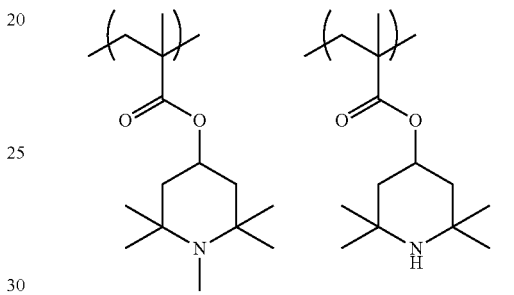
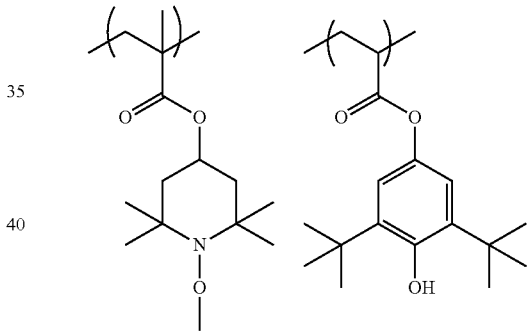
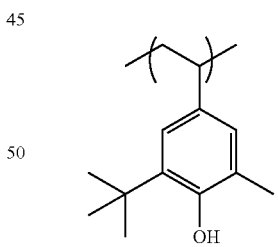
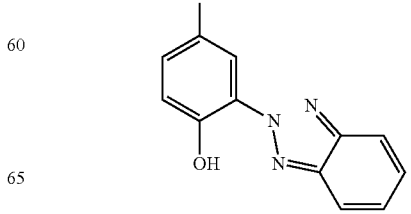

41
-continued
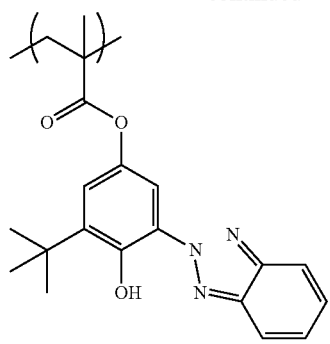
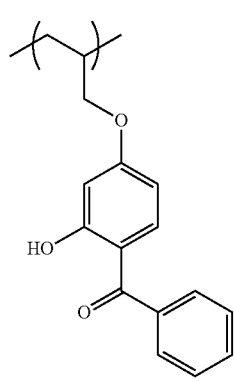 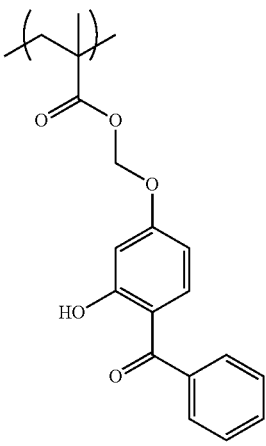
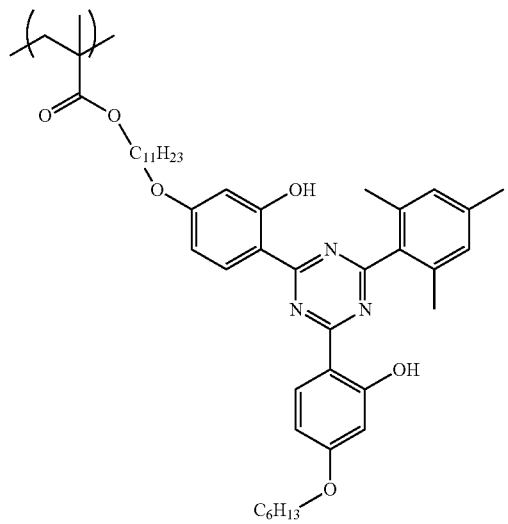
42
-continued
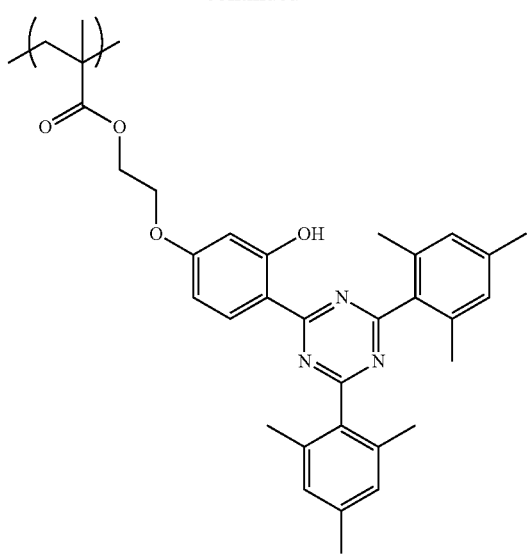
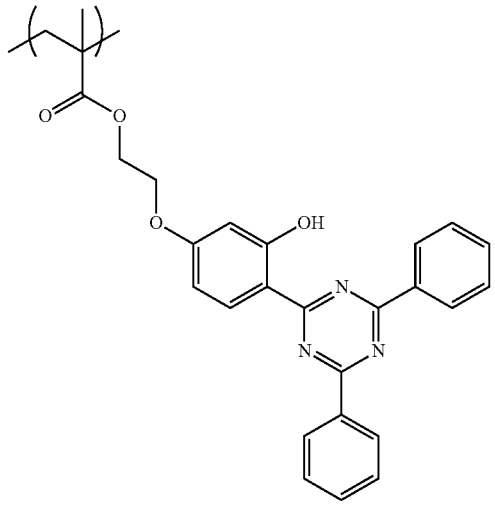
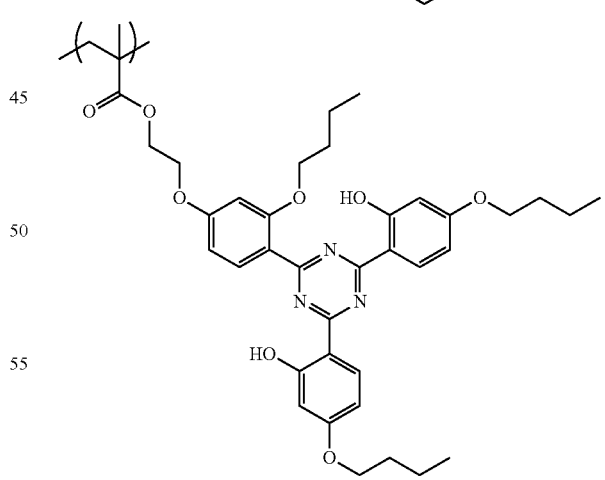
Preferably, the dye multimer comprises a structural unit containing at least one of structures represented by formulae (1) to (5) in an amount of 0.5 to 20% by mass, more preferably 1 to 10% by mass, especially preferably 1 to 5% by mass when all structural units in the dye multimer represent 100% by mass.

Further, the amount of the structural unit containing at least one of structures represented by formulae (1) to (5) is preferably 0.5 to 25 mol %, more preferably 1 to 10 mol %, even more preferably 1 to 5 mol % per mole of the structural unit containing a dye structure.

<<Counteranion>>

When the dye structure used in the present invention contains a cation structure, the counteranion for it may be present in the same structural unit of the dye multimer or outside the same structural unit. The expression "the counteranion is present in the same structural unit" means that the cation and the anion are linked together via a covalent bond in a structural unit containing a dye structure. On the other hand, the expression "outside the same structural unit" means to include the other cases. For example, this means that the cation and the anion are not linked together via a covalent bond but present as separate compounds, or the cation and the anion are contained as independent structural units of a dye multimer.

The anion in the present invention is preferably a non-nucleophilic anion. The non-nucleophilic anion may be an organic anion or an inorganic anion, preferably an organic anion. Examples of counteranions used in the present invention include known non-nucleophilic anions described in paragraph number 0075 of JP-A2007-310315, the disclosure of which is incorporated herein by reference. The term "non-nucleophilic" here means the inability of an anion to nucleophilically attack dyes upon heating.

Cases in which the counteranion is present in the same structural unit.

In a first embodiment of the anion according to the present invention, the counteranion is present in the same structural unit, specifically the cation and the anion are linked together via a covalent bond in a structural unit containing a dye structure.

In this embodiment, the anion moiety is preferably at least one member selected from $-SO_3^-$, $-COO^-$, $-PO_4$, a structure represented by formula (A1) below and a structure represented by formula (A2) below, more preferably at least one member selected from a structure represented by formula (A1) below and a structure represented by formula (A2) below. Further, the anion moiety may comprise a carboxylate anion, a sulfonate anion, an anion represented by formula (A1-1-2) or an anion represented by formula (A1-1-3).

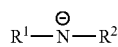

Formula (A1)

In formula (A1), $R^1$ and $R^2$ each independently represent $-SO_2-$ or $-CO-$.

Preferably, at least one of $R^1$ and $R^2$ in formula (A1) represents $-SO_2-$, more preferably both of $R^1$ and $R^2$ represent $-SO_2-$.

More preferably, formula (A1) above is represented by formula (A1-1)

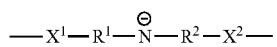

Formula (A1-1)

In formula (A1-1), $R^1$ and $R^2$ each independently represent $-SO_2-$ or $-CO-$. $X^1$ and $X^2$ each independently represent an alkylene or arylene group.

In formula (A1-1), $R^1$ and $R^2$ have the same meanings as defined for $R^1$ and $R^2$ in formula (A1), and also cover the same preferred ranges.

When $X^1$ represents an alkylene group, the alkylene group preferably contains 1 to 8 carbon atoms, more preferably 1 to 6 carbon atoms. When $X^1$ represents an arylene group, the arylene group preferably contains 6 to 18 carbon atoms, more preferably 6 to 12 carbon atoms, even more preferably 6 carbon atoms. When $X^1$ is substituted, it is preferably substituted by a fluorine atom.

$X^2$ represents an alkyl or aryl group, preferably an alkyl group. The alkyl group preferably contains 1 to 8 carbon atoms, more preferably 1 to 6 carbon atoms, even more preferably 1 to 3 carbon atoms, especially preferably one carbon atom. When $X^2$ is substituted, it is preferably substituted by a fluorine atom.

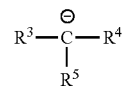

Formula (A2)

In formula (A2), $R^3$ represents $-SO_2-$ or $-CO-$. $R^4$ and $R^5$ each independently represent $-SO_2-$, $-CO-$ or $-CN$.

Preferably, at least one of $R^3$ to $R^5$ in formula (A2) represents $-SO_2-$, more preferably at least two of $R^3$ to $R^5$ represent $-SO_2-$.

An especially preferred example of the present embodiment is a case in which the skeleton of the dye multimer is represented by a structural unit represented by formula (A) above, wherein $L_1$ partially contains a moiety represented by formula (A1). Specific examples of such cases include (a-xt-1), (a-xt-5), and (a-xt-6) among the examples of structural units containing a dye structure shown later. Another example of the present embodiment is a case in which the skeleton of the dye multimer comprises a structural unit represented by formula (B). Specific examples of such cases include (B-dp-1), (B-mp-1), (B-xt-1), and (B-xt-2) among the examples of structural units containing a dye structure shown later.

Cases in which the counteranion is present as a separate molecule.

In a second embodiment of the anion according to the present invention, the counteranion is present outside the same structural unit and the cation and the anion are not linked together via a covalent bond but present as separate molecules.

Examples of anions in this embodiment include fluorine anion, chlorine anion, bromine anion, iodine anion, cyanide ion, perchlorate anion and the like as well as non-nucleophilic anions, preferably non-nucleophilic anions.

The non-nucleophilic counteranion may be an organic anion or an inorganic anion, but preferably an organic anion. Examples of counteranions used in the present invention include known non-nucleophilic anions described in paragraph number 0075 of JP-A2007-310315, the disclosure of which is incorporated herein by reference.

Preferably, such anions include bis(sulfonyl)imide anion, tris(sulfonyl)methyl anion, tetraaryl borate anion, $B^-(CN)_{n1}(OR^a)_{4-n1}$ (wherein $R^a$ represents an alkyl group containing 1 to 10 carbon atoms or an aryl group containing 6 to 10 carbon atoms, and n1 represents 1 to 4.) and $PF_{n2}R^F_{(6-n2)}^-$ (wherein $R^F$ represents a fluoroalkyl group containing 1 to 10 carbon atoms, and n2 represents an integer of 1 to 6), more preferably a member selected from bis(sulfonyl)imide anion, tris(sulfonyl)methyl anion and tetraaryl borate anion, even more preferably bis(sulfonyl)imide anion. When such non-nucleophilic counteranions are used, the advantages of the present invention tend to be achieved more effectively.

The bis(sulfonyl)imide anion as a non-nucleophilic counteranion is preferably a structure represented by formula (AN-1) below.

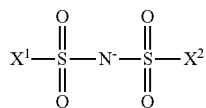

(AN-1)

In formula (AN-1), $X^1$ and $X^2$ each independently represent a fluorine atom or a fluoroalkyl group containing 1 to 10 carbon atoms. $X^2$ and $X^2$ may be joined together to form a ring.

$X^4$ and $X^2$ each independently represent a fluorine atom or a fluoroalkyl group containing 1 to 10 carbon atoms, preferably a fluorine atom or a fluoroalkyl group containing 1 to 10 carbon atoms, more preferably a perfluoroalkyl group containing 1 to 10 carbon atoms, even more preferably a perfluoroalkyl group containing 1 to 4 carbon atoms, especially preferably trifluoromethyl.

The tris(sulfonyl)methyl anion as a non-nucleophilic counteranion is preferably a structure represented by formula (AN-2) below.

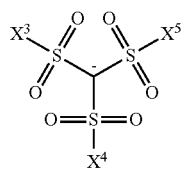

(AN-2)

In formula (AN-2), $X^3$, $X^4$ and $X^5$ each independently represent a fluorine atom or a fluoroalkyl group containing 1 to 10 carbon atoms.

$X^3$, $X^4$ and $X^5$ each independently have the same meanings as defined for $X^4$ and $X^2$, and also cover the same preferred ranges.

The tetraaryl borate anion as a non-nucleophilic counteranion is preferably a compound represented by formula (AN-5) below.

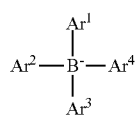

(AN-5)

In formula (AN-5), $Ar^1$, $Ar^e$, $Ar^a$ and $Ar^4$ each independently represent an aryl group.

Preferably, $Ar^1$, $Ar^2$, $Ar^3$ and $Ar^4$ each independently represent an aryl group containing 6 to 20 carbon atoms, more preferably an aryl group containing 6 to 14 carbon atoms, even more preferably an aryl group containing 6 to 10 carbon atoms.

The aryl group represented by $Ar^1$, $Ar^2$, $Ar^3$ and $Ar^4$ may be substituted. When it is substituted, the substituent may be a halogen atom, alkyl, aryl, alkoxy, carbonyl, carbonyloxy, carbamoyl, sulfo, sulfonamide, nitro or the like, preferably a halogen atom or an alkyl group, more preferably a fluorine atom or an alkyl group, even more preferably a fluorine atom or a perfluoroalkyl group containing 1 to 4 carbon atoms.

More preferably, $Ar^1$, $Ar^2$, $Ar^3$ and $Ar^4$ each independently represent a phenyl group containing a halogen atom and/or a halo alkyl group, more preferably a phenyl group containing a fluorine atom and/or a fluoroalkyl group.

Preferably, the non-nucleophilic counteranion is —B(CN)$_{n1}$(OR$^a$)$_{4-n1}$ (wherein R$^a$ represents an alkyl group containing 1 to 10 carbon atoms or an aryl group containing 6 to 10 carbon atoms, and n1 represents an integer of 1 to 4.). The alkyl group containing 1 to 10 carbon atoms represented by R$^a$ is preferably an alkyl group containing 1 to 6 carbon atoms, more preferably an alkyl group containing 1 to 4 carbon atoms. The aryl group containing 6 to 10 carbon atoms represented by R$^a$ is preferably phenyl naphthyl.

Preferably, n1 represents 1 to 3, more preferably 1 to 2.

Further, the non-nucleophilic counteranion is preferably —PF$_6$R$^P$$_{(6-n2)}$$^-$ wherein R$^P$ represents a fluoroalkyl group containing 1 to 10 carbon atoms, and n2 represents an integer of 1 to 6. Preferably, R$^P$ represents a fluoroalkyl group containing 1 to 6 carbon atoms, more preferably a fluoroalkyl group containing 1 to 4 carbon atoms, even more preferably a perfluoroalkyl group containing 1 to 3 carbon atoms. Preferably, n2 represents an integer of 1 to 4, more preferably 1 or 2.

The non-nucleophilic counteranion used in the present invention preferably has a mass of 100 to 1,000, more preferably 200 to 500 per molecule.

The dye multimer of the present invention may contain only one or more than one type of non-nucleophilic counteranion.

Specific examples of non-nucleophilic counteranions used in the present invention are shown below, but the present invention is not limited to these examples.

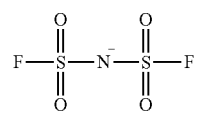

(IM-1)

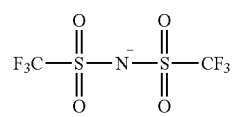

(IM-2)

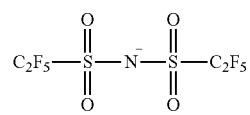

(IM-3)

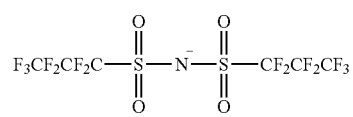

(IM-4)

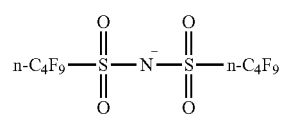

(IM-5)

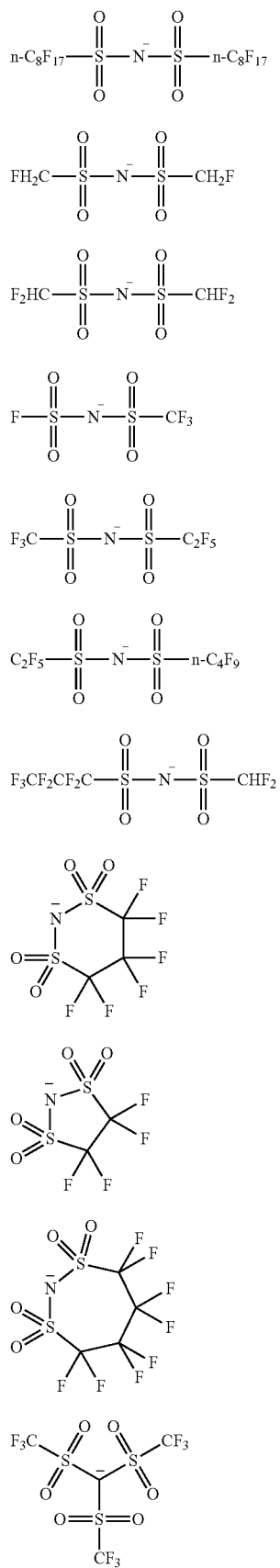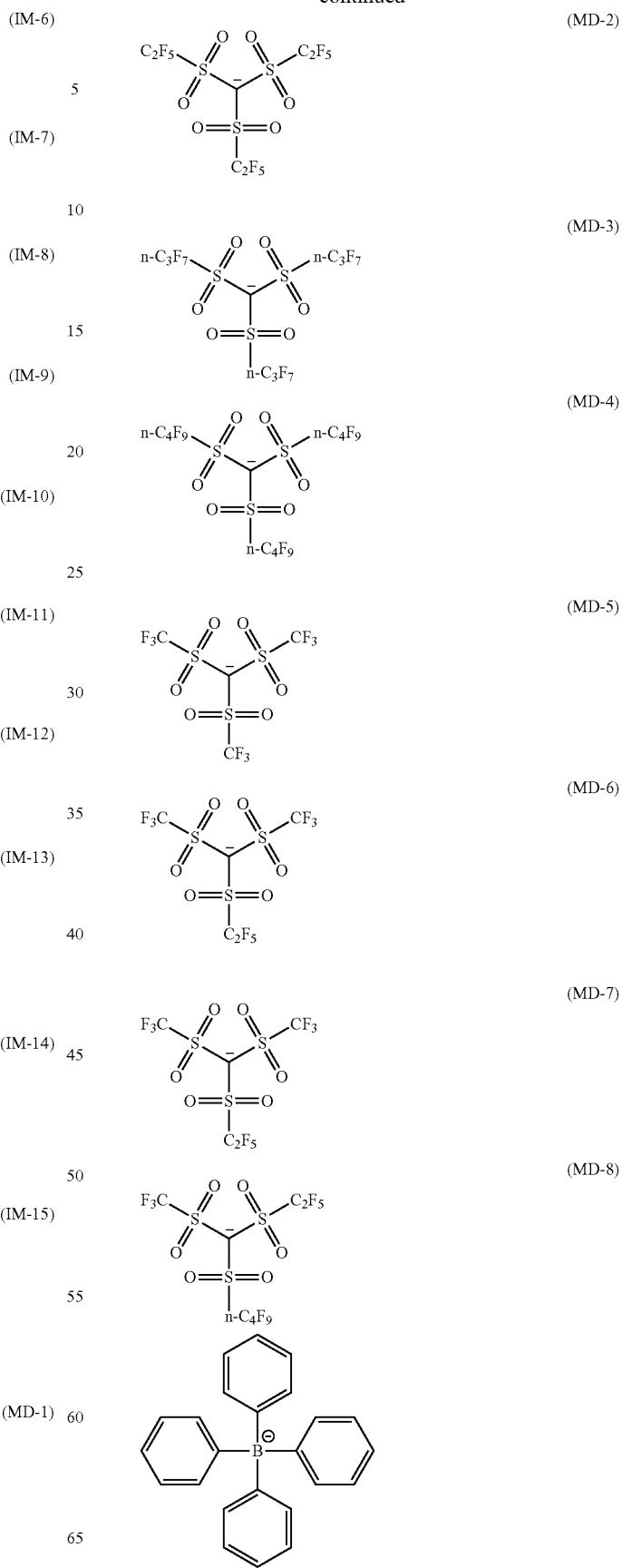

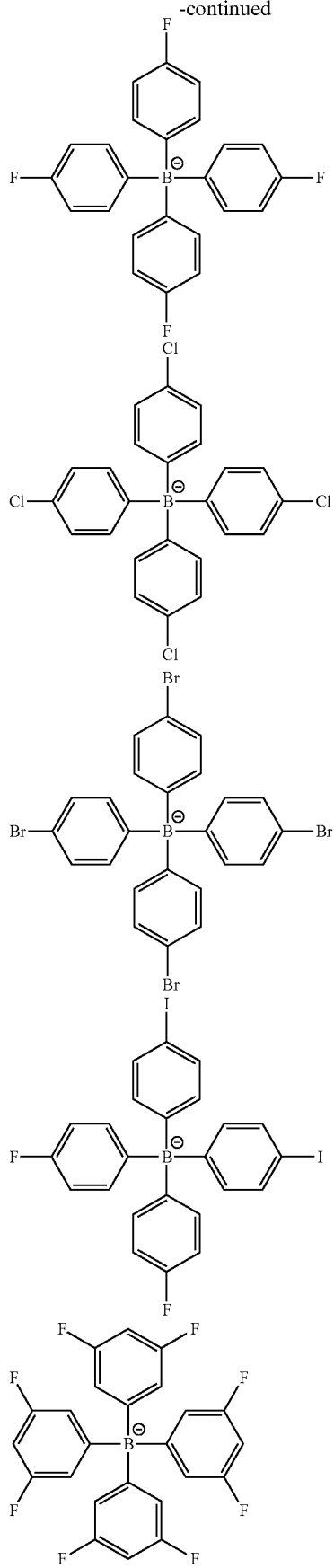
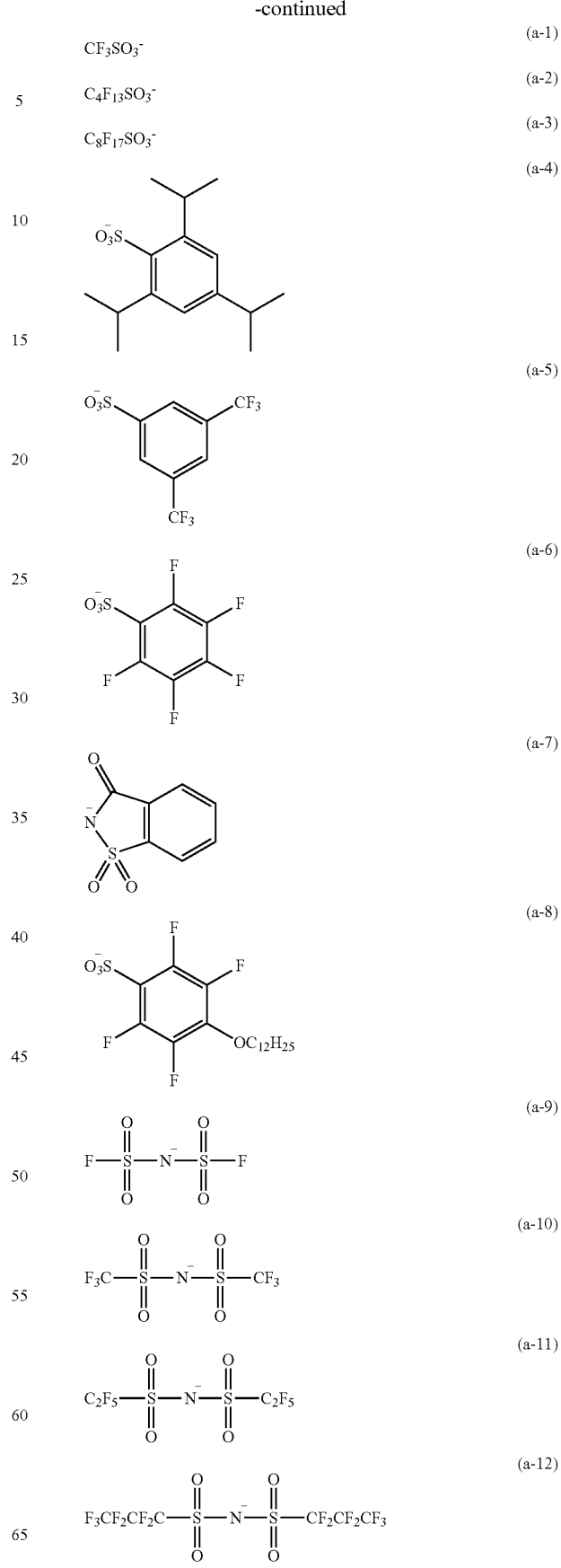

-continued (a-13) 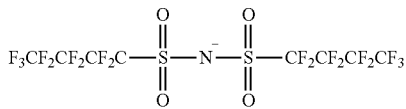

(a-14) 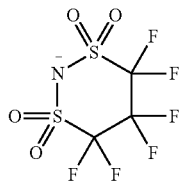

(a-15) 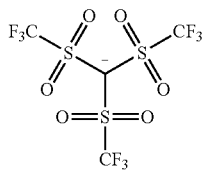

(a-16) 
O₃S—CF₂—SO₃⁻

(a-17) 
O₃S—CF₂CF₂—SO₃⁻

(a-18) 
O₃S—CF₂CF₂CF₂—SO₃⁻

(a-19) 
O₃S—CF₂CF₂CF₂CF₂—SO₃⁻

(a-20) 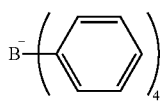

(a-21) 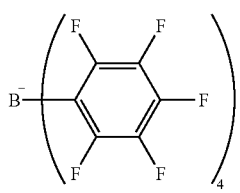

(a-22) 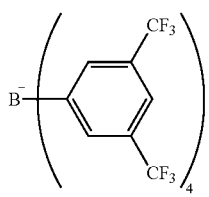

(a-23) 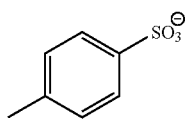

(a-24) 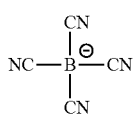

(a-25) 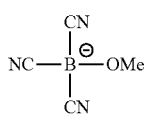

(a-27) 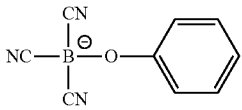

(a-28) 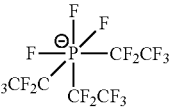

In the second embodiment, the anion may be a multimer. Examples of multimers here include multimers comprising a structural unit containing an anion but not comprising a structural unit derived from a dye structure containing a cation. Preferred examples of structural units containing an anion here include those mentioned later for a third embodiment. Further, the multimer containing an anion may comprise a structural unit other than the structural unit containing an anion. Preferred examples of such structural units include those mentioned later as other repeat units that may be contained in the dye multimer used in the present invention.

Cases in which the cation and the anion are contained in separate structural units of a dye multimer.

In a third embodiment of the present invention, the cation and the anion are contained in independent structural units of a dye multimer.

In the present embodiment, the anion may be present in the side chain or main chain of the dye multimer, or the counteranion may be present in both of the main chain and side chain. Preferably, it is present in the side chain. Preferred examples of structural units containing an anion include a structural unit represented by formula (C1) and a structural unit represented by formula (D1).

Formula (C1)

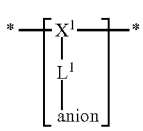

In formula (C1), X¹ represents the main chain of the structural unit. L¹ represents a single bond or a divalent linking group. anion represents a counteranion.

In formula (C1), X¹ represents the main chain of the structural unit, typically a linking group formed by a polymerization reaction, preferably e.g., a (meth)acrylic group, a styrene group, a vinyl group or the like, more preferably a (meth)acrylic group or a styrene group, even more preferably a (meth)acrylic group. It should be noted that the moiety defined by two asterisks (*) forms the structural unit.

When L¹ represents a divalent linking group, it is preferably an alkylene group containing 1 to 30 carbon atoms (methylene, ethylene, trimethylene, propylene, butylene or the like), an arylene group containing 6 to 30 carbon atoms (phenylene, naphthalene or the like), a heterocyclic linking group, —CH=CH—, —O—, —S—, —C(=O)—, —CO—, —NR—, —CONR—, —OC—, —SO—, —SO₂— and a linking group formed by combining two or more of them. In the groups shown above, R each independently represents a hydrogen atom, alkyl, aryl, or heterocyclyl. Especially, L² preferably represents a single bond or a divalent linking group formed by combining two or more of an alkylene group containing 1 to 10 carbon atoms (preferably —(CH$_2$)n- wherein n represents an integer of 5 to 10), an arylene group containing 6 to 12 carbon atoms (preferably phenylene, naphthalene), —NH⁻, —CO$_2$—, —O— and —SO$_2$—.

Specific preferred examples of X$^1$ include the examples of X$^1$ in formula (A) shown above.

*─[─L$^2$-anion-L$^3$─]─*  Formula (D1)

In formula (D1), L$^2$ and L$^3$ each independently represent a single bond or a divalent linking group. anion represents the counteranion described above.

When L$^2$ and L$^3$ represent a divalent linking group in formula (D1), they preferably represent an alkylene group containing 1 to 30 carbon atoms, an arylene group containing 6 to 30 carbon atoms, a heterocyclic linking group, —CH═CH—, —O—, —S—, —C(═O)—, —CO$_2$—, —NR—, —CONR—, —O$_2$C—, —SO—, —SO$_2$— and a linking group formed by combining two or more of them. In the groups shown above, R each independently represents a hydrogen atom, alkyl, aryl, or heterocyclyl.

Preferably, L$^2$ represents an arylene group containing 6 to 12 carbon atoms (especially phenylene). The arylene group containing 6 to 30 carbon atoms is preferably substituted by a fluorine atom.

Preferably, L$^3$ represents a group consisting of a combination of an arylene group containing 6 to 12 carbon atoms (especially phenylene) and —O—, wherein at least one arylene group containing 6 to 12 carbon atoms is preferably substituted by a fluorine atom.

Preferred examples of counteranions include the anion moieties mentioned in the explanation of cases in which the counteranion is present in the same structural unit.

Specific examples of structural units containing an anion in the present embodiment are shown below, but the present invention is not limited to these examples.

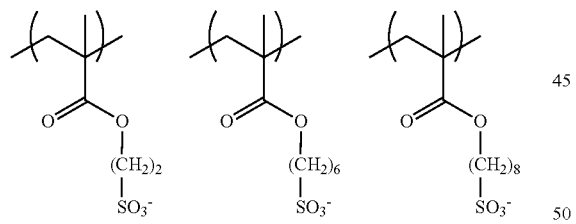

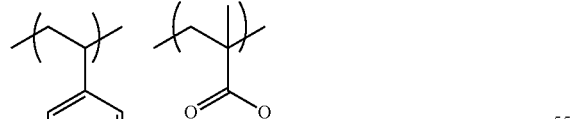

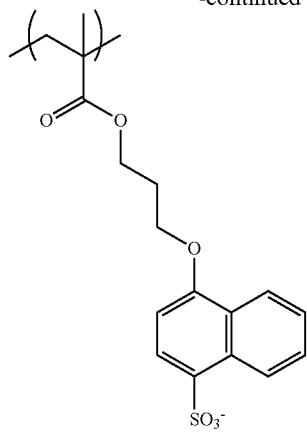

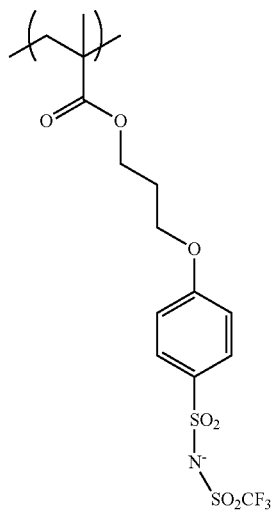

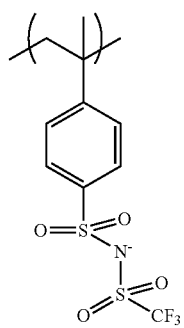

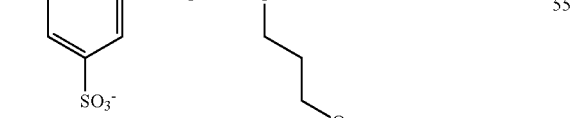

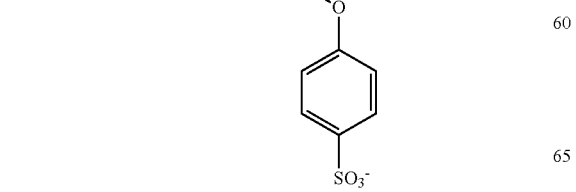

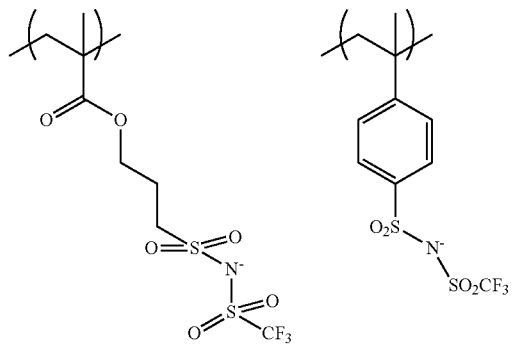

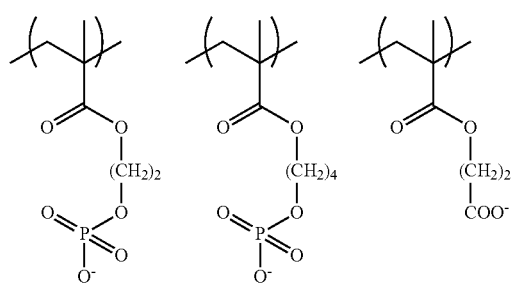
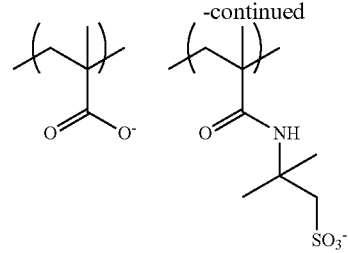
It should be understood that although the following specific examples are shown to be undissociated into anion structures, those dissociated into anion structures are also within the scope of the present invention.
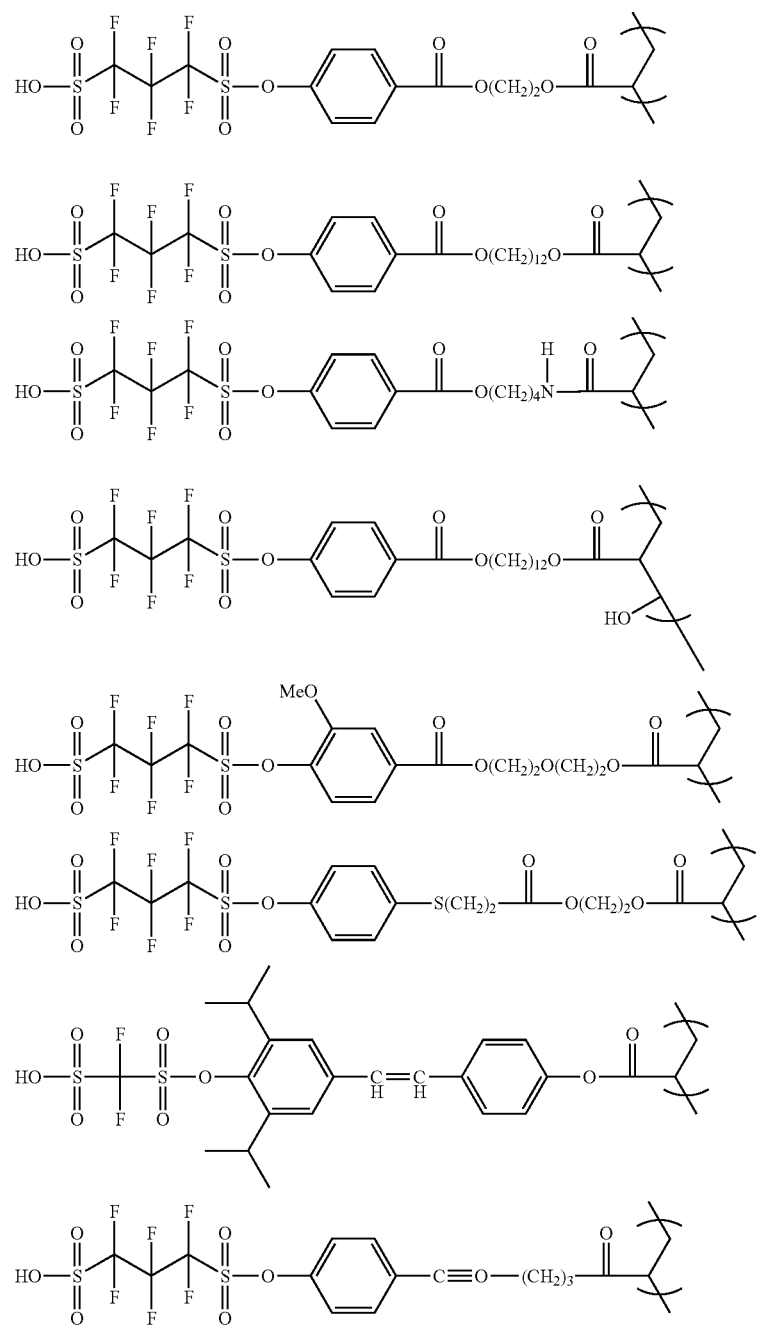

-continued
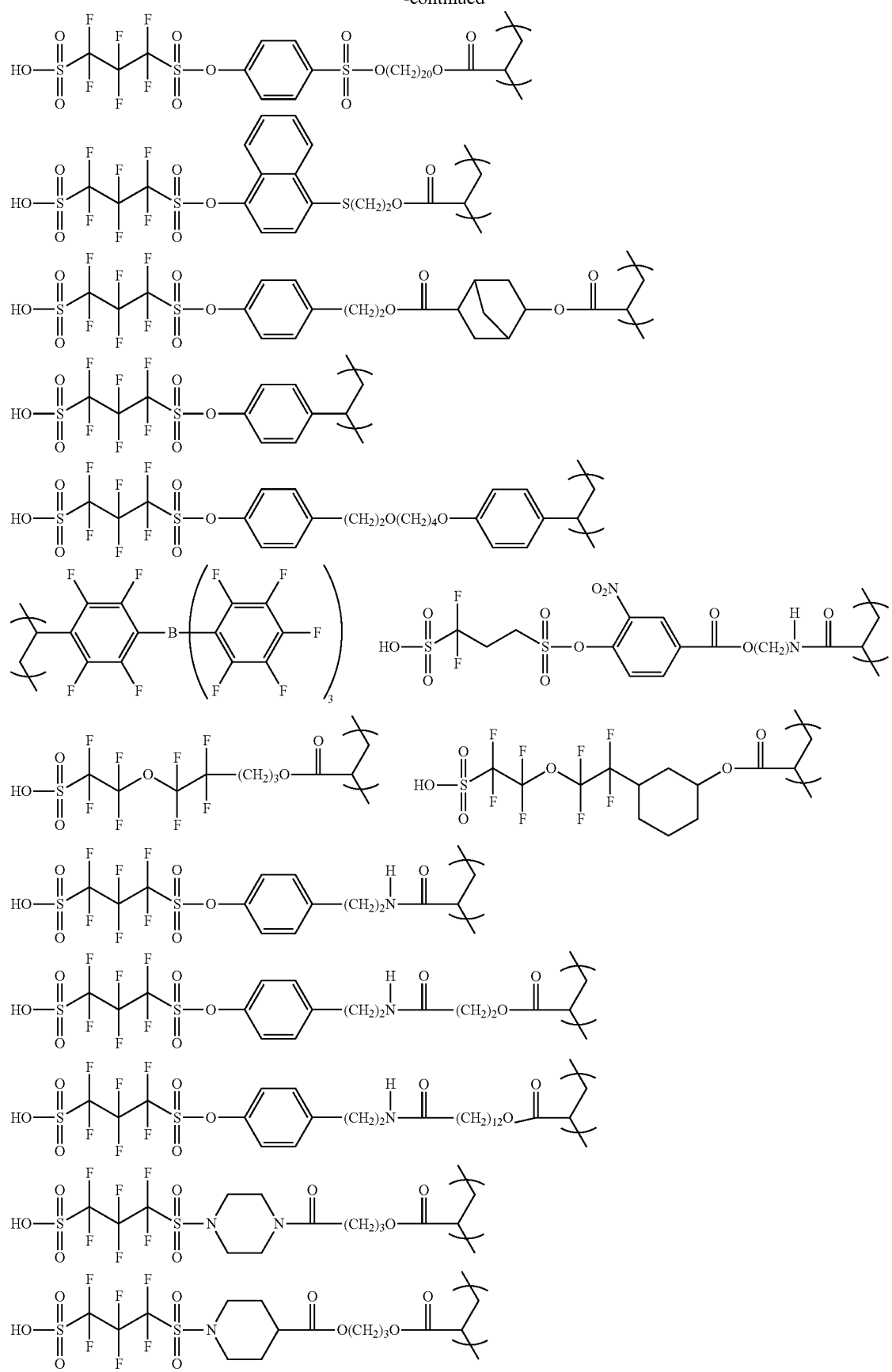

-continued
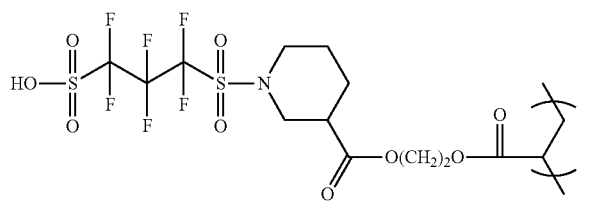
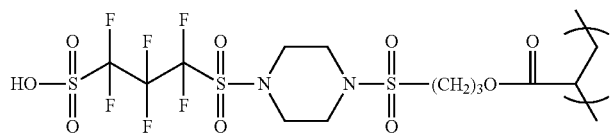
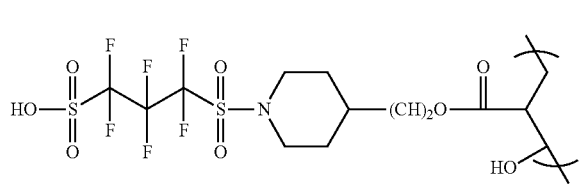
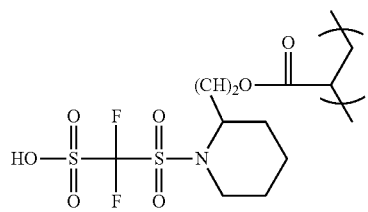
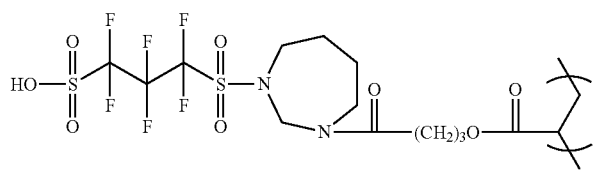
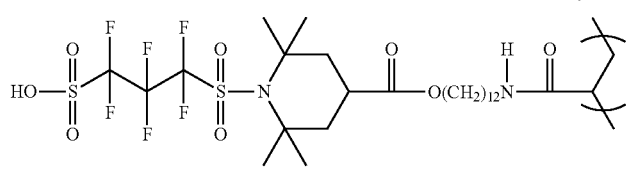
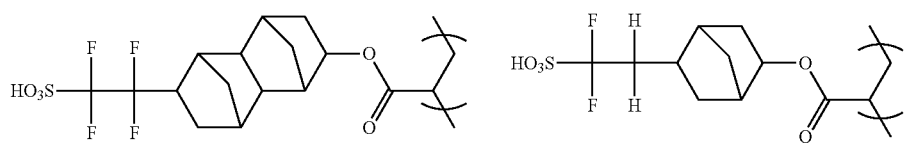
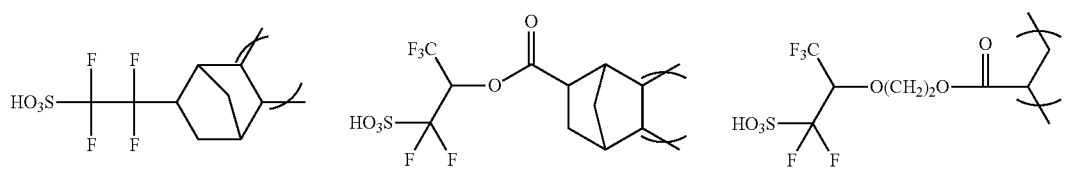
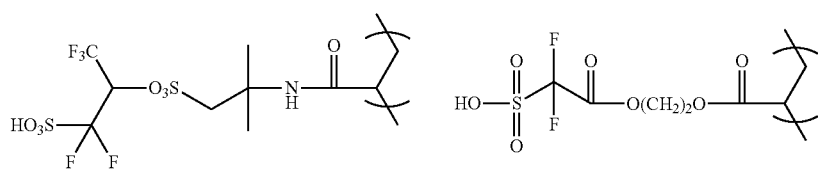
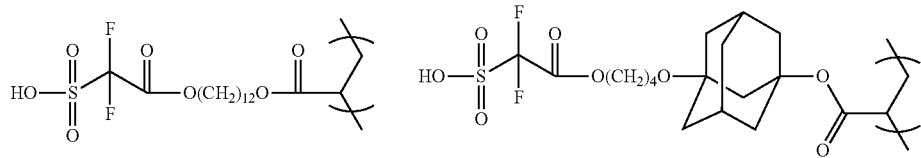
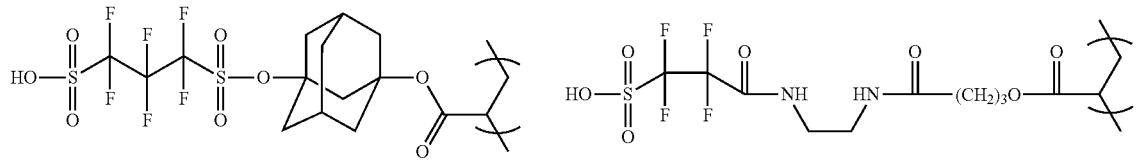

-continued
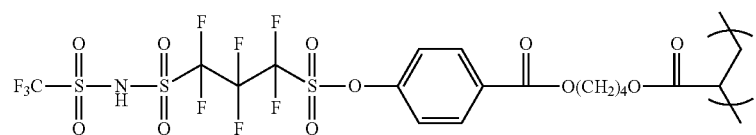
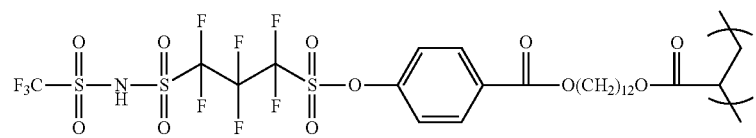
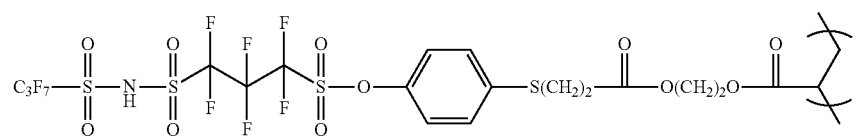
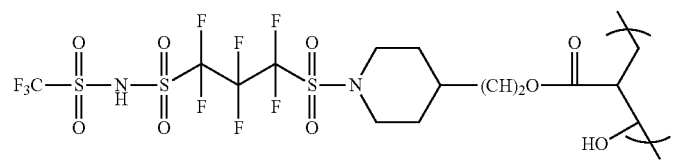
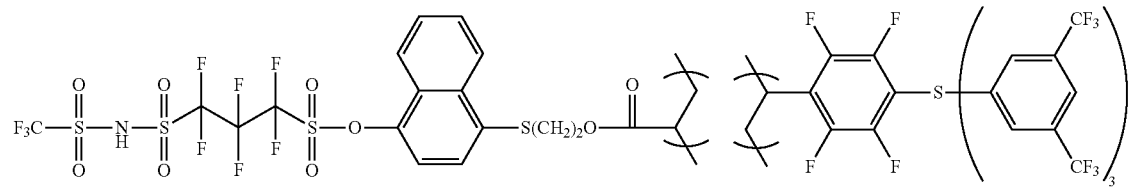
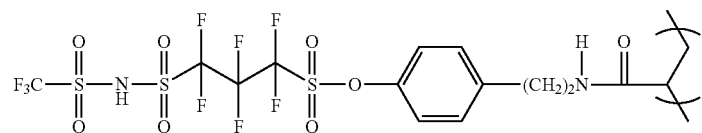
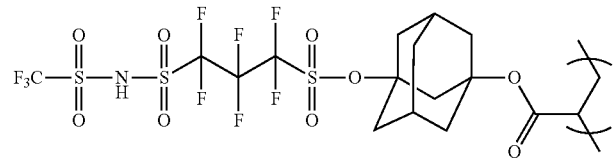
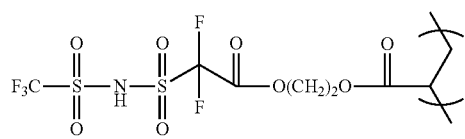
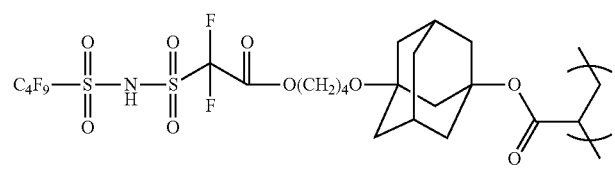
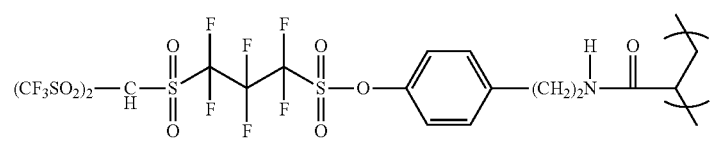
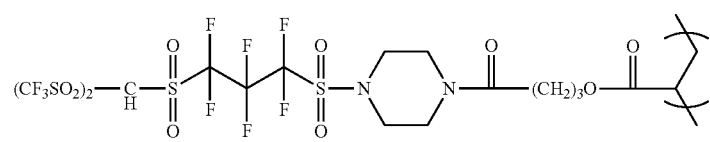

-continued
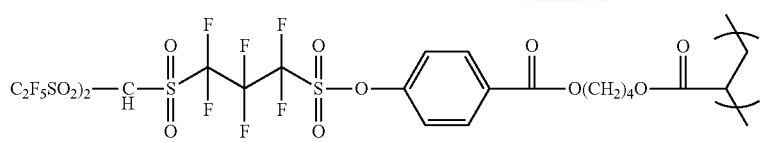
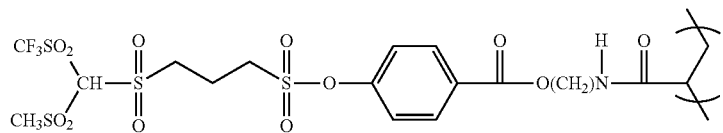
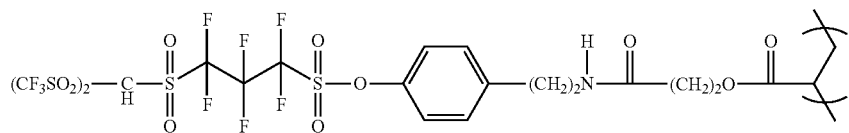
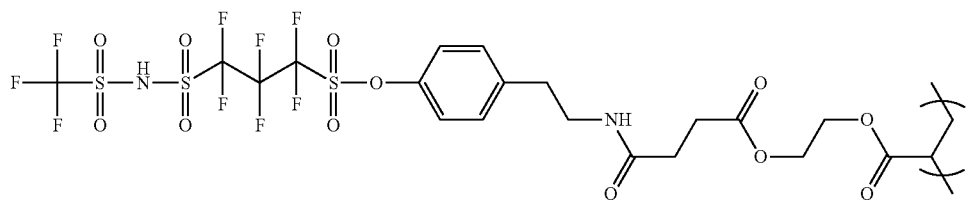
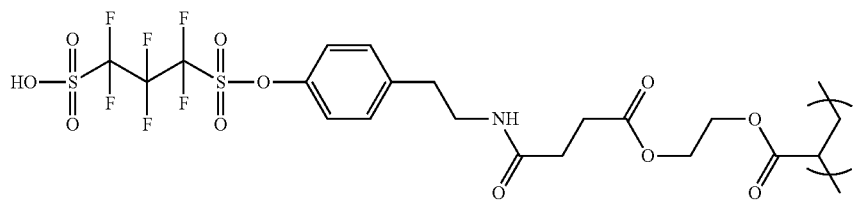
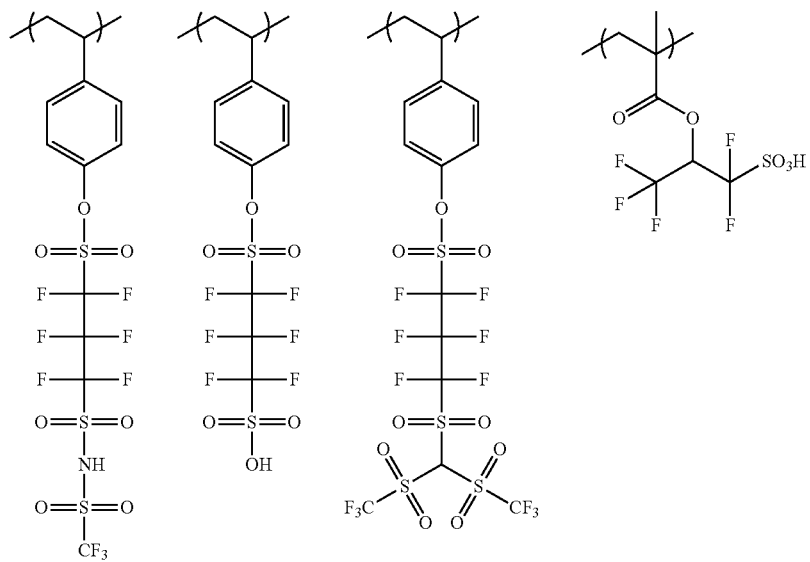

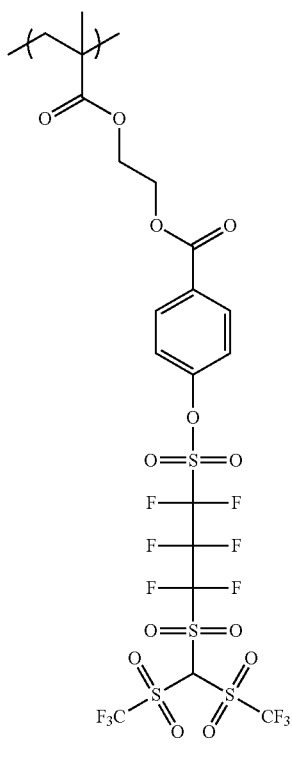
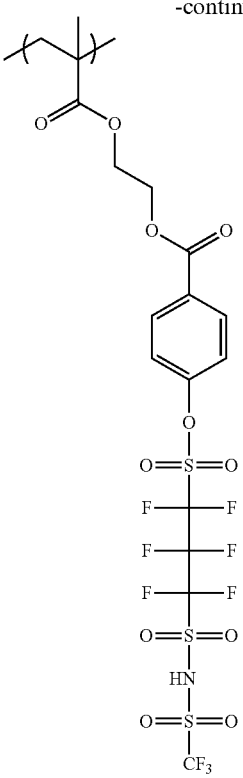
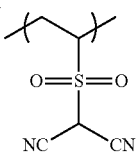
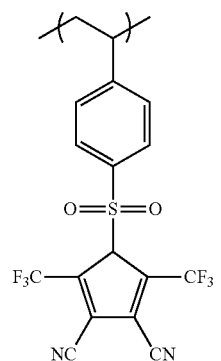

<Specific Examples of Dyes>

Specific examples of dyes are shown below, but the present invention is not limited to these examples. In the following specific examples, X⁻ represents an anion. Further, any one of hydrogen atoms in the dye structures shown below is attached to a polymer skeleton.

Specific examples of triphenylmethane compounds are shown below.

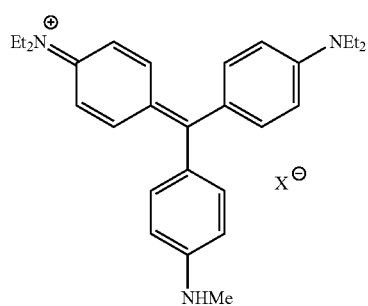

(tp-1)

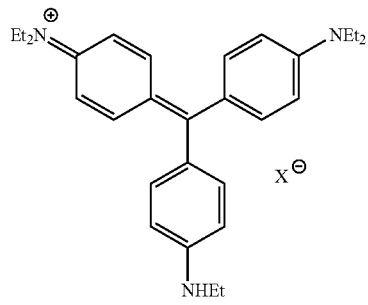

(tp-2)

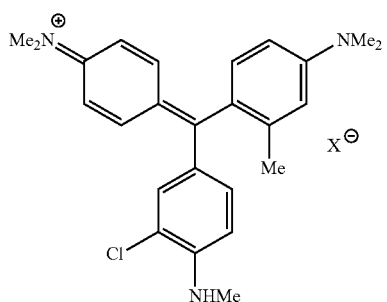

(tp-3)

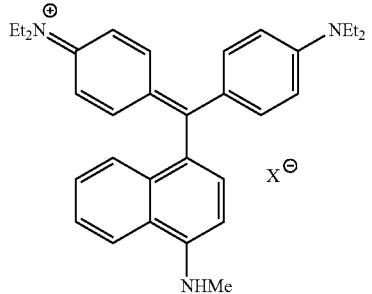

(tp-4)

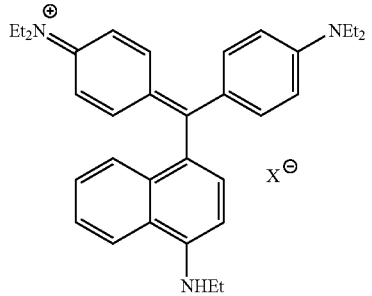

(tp-5)

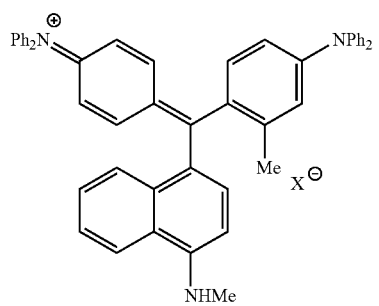
(tp-6)
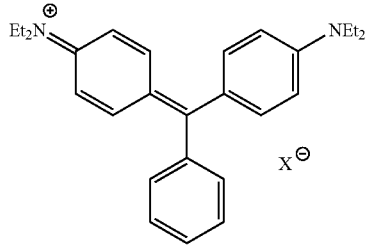
(tp-11)
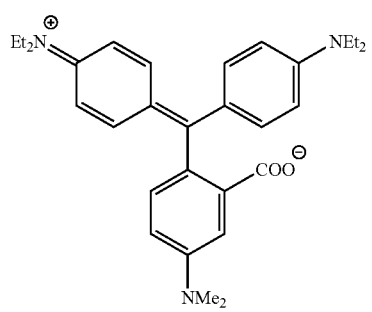
(tp-7)
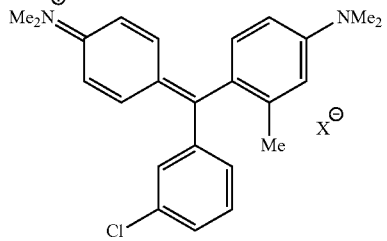
(tp-12)
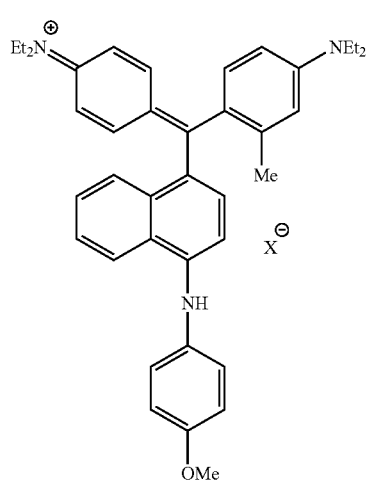
(tp-8)
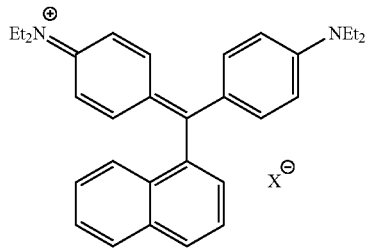
(tp-13)
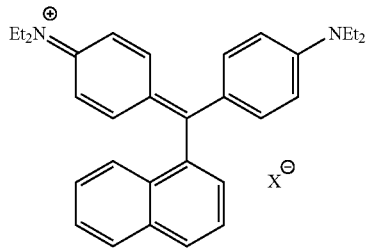
(tp-14)
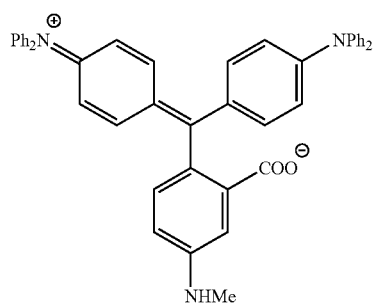
(tp-9)
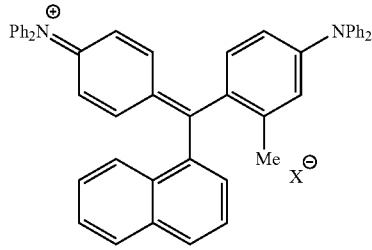
(tp-15)
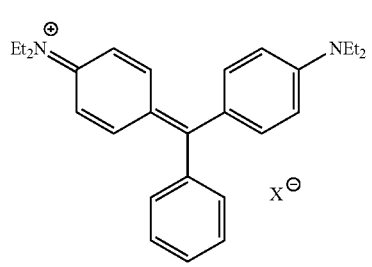
(tp-10)
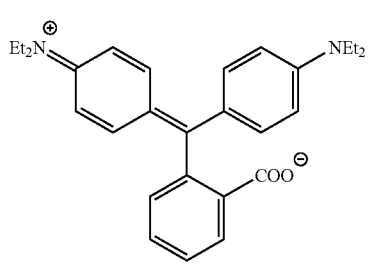
(tp-16)

(tp-17)
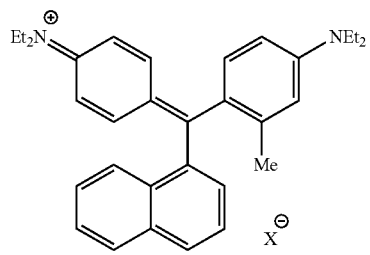
(tp-18)
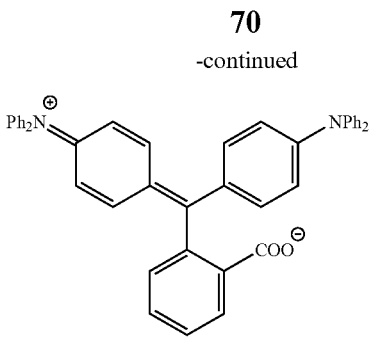
Specific examples of xanthene compounds are shown below.
(A-xt-1)
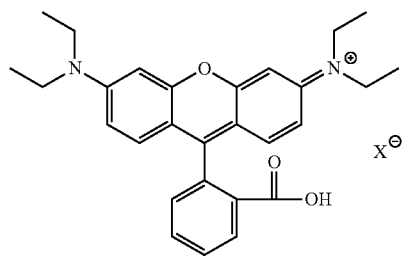
(A-xt-2)
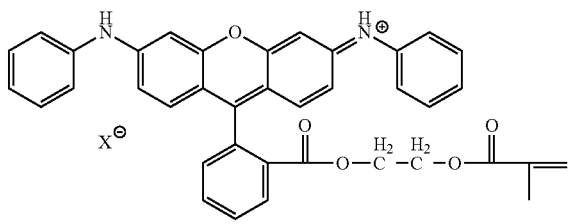
(A-xt-3)
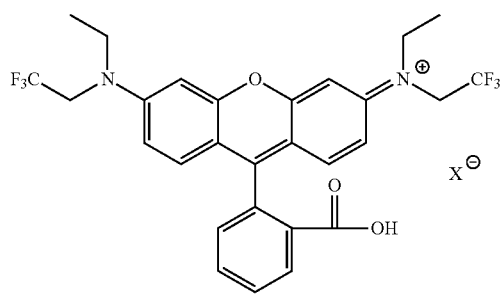
(A-xt-4)
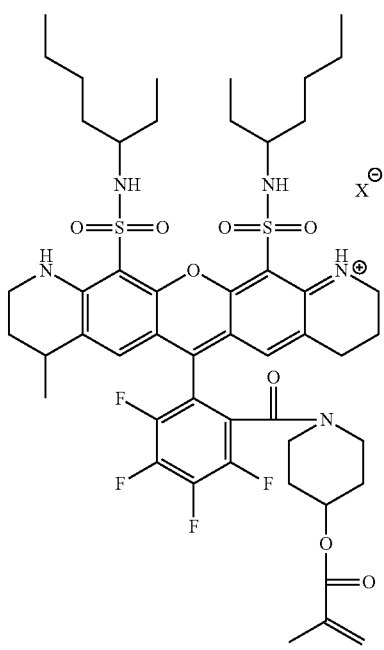
(A-xt-5)
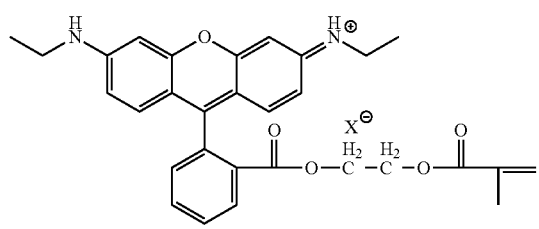
(A-xt-6)
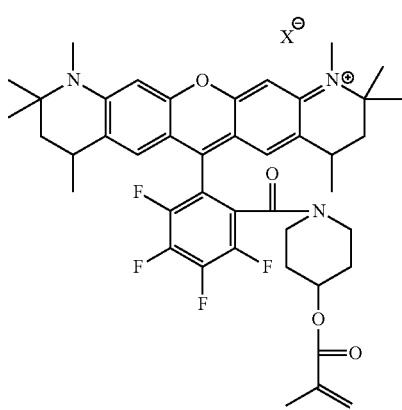

-continued
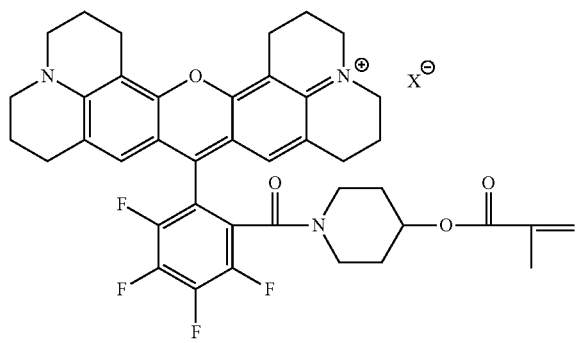
(A-xt-7)
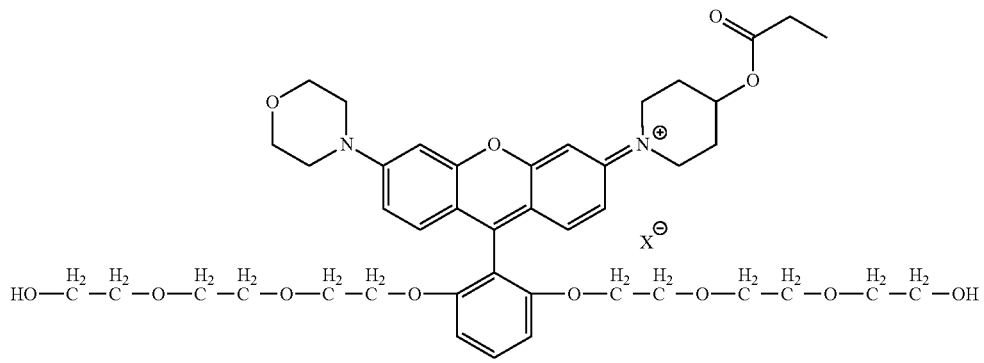
(A-xt-8)
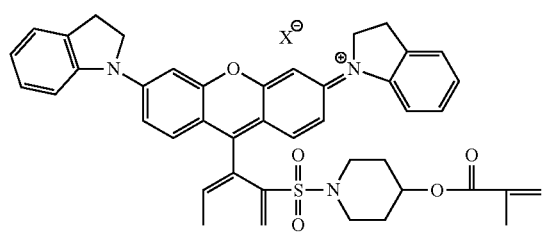
(A-xt-9)
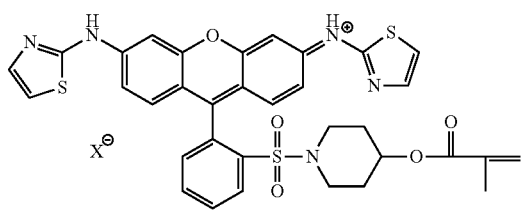
(A-xt-10)
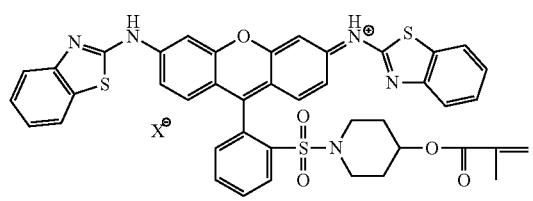
(A-xt-11)
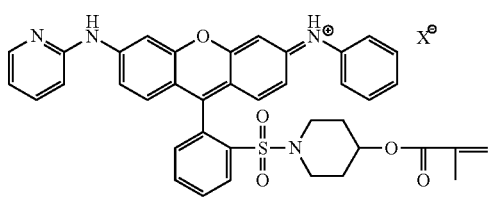
(A-xt-12)
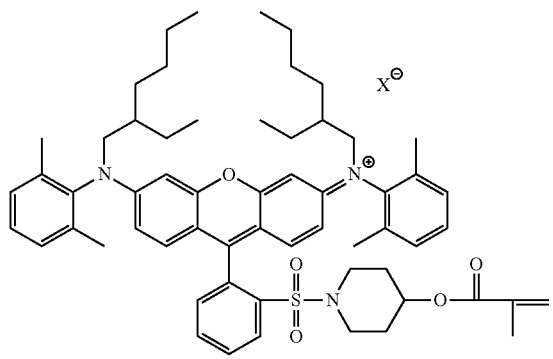
(A-xt-13)
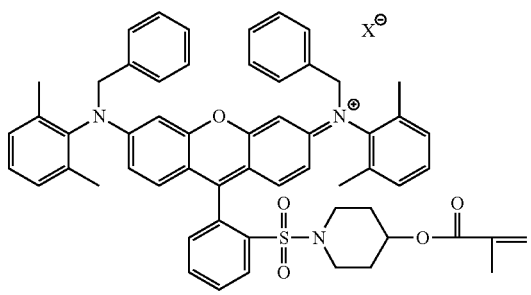
(A-xt-14)

-continued
(A-xt-15)
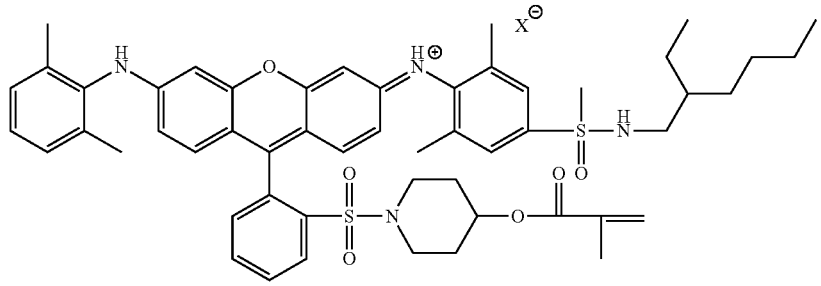
(A-xt-16)
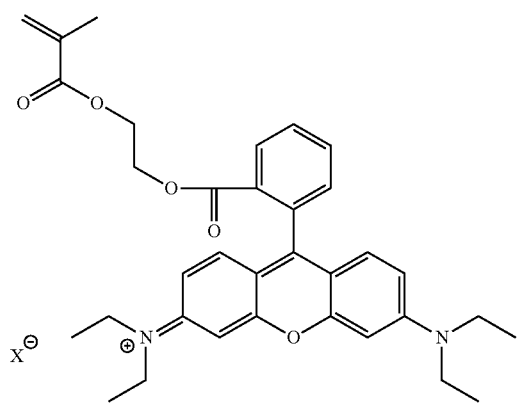
(A-1)
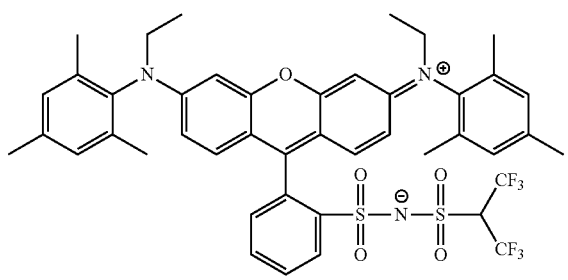
(A-2)
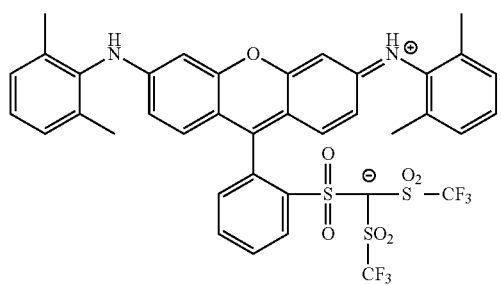
(A-3)
(A-4)
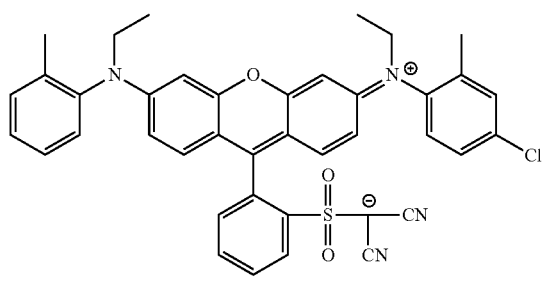
(A-5)
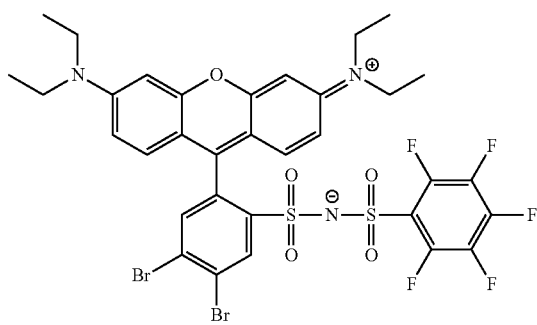

-continued
(A-6)
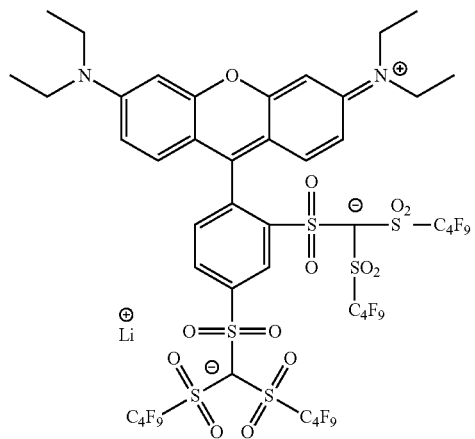
(A-7)
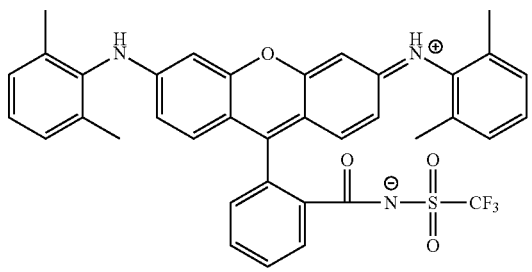
(A-8)
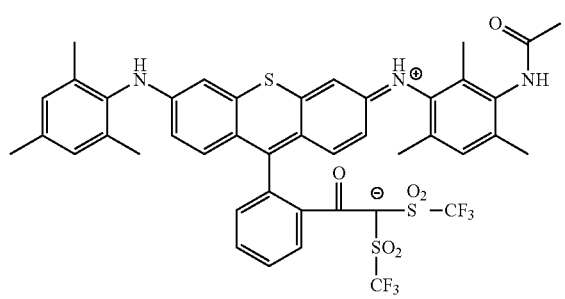
(A-9)
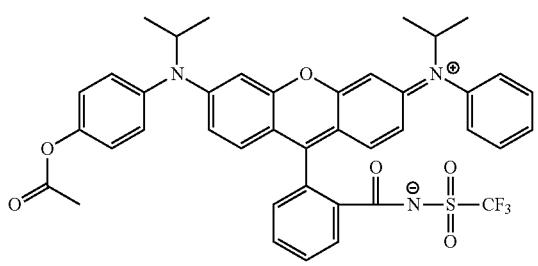
(A-10)
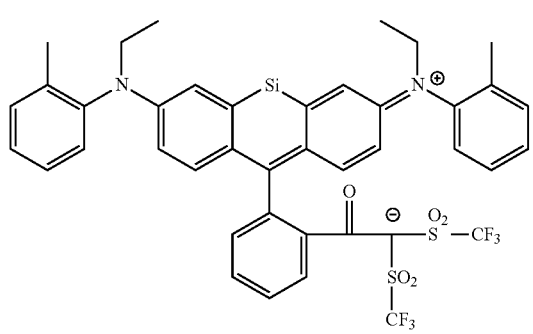
(A-11)
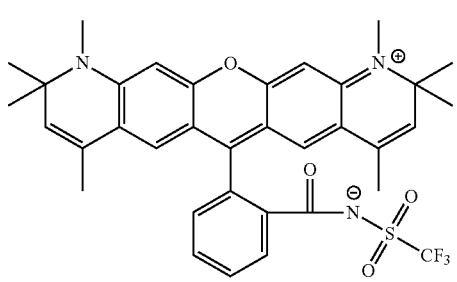
(A-12)
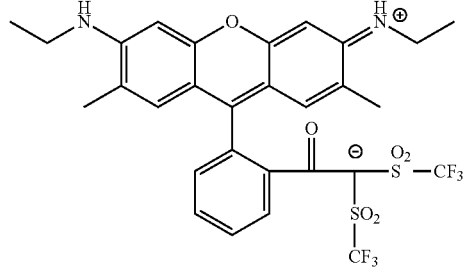

-continued
(A-13)
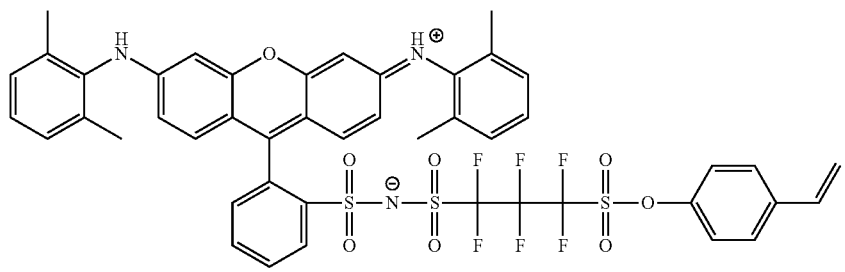
(A-14)
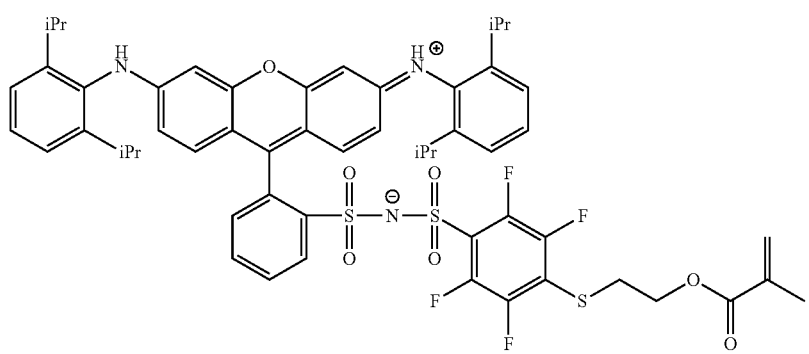
(A-15)
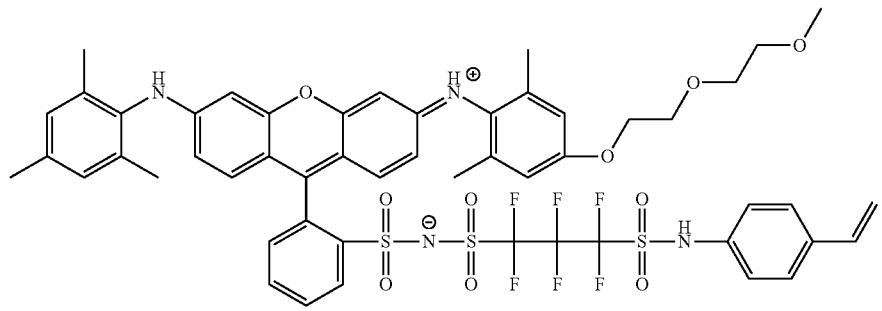
(A-16)
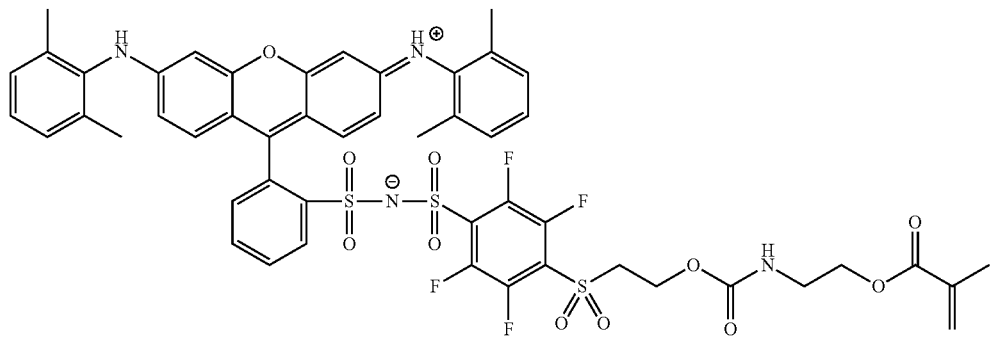
(A-17)
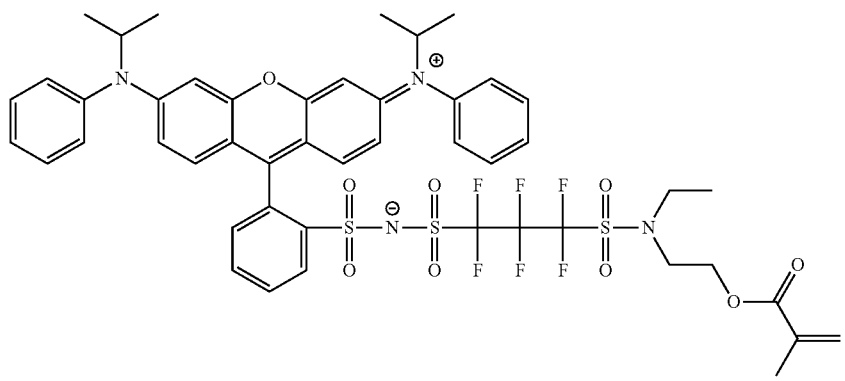

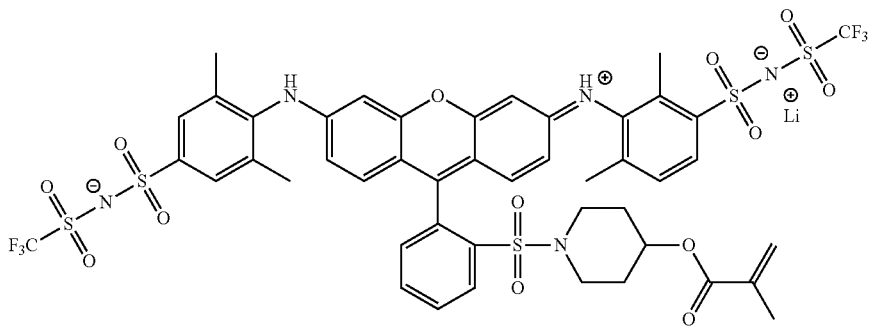
(A-18)
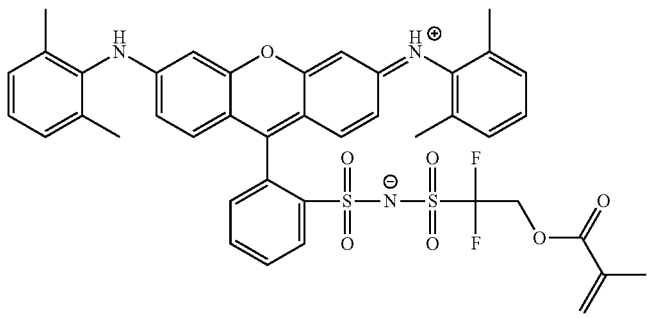
(A-19)
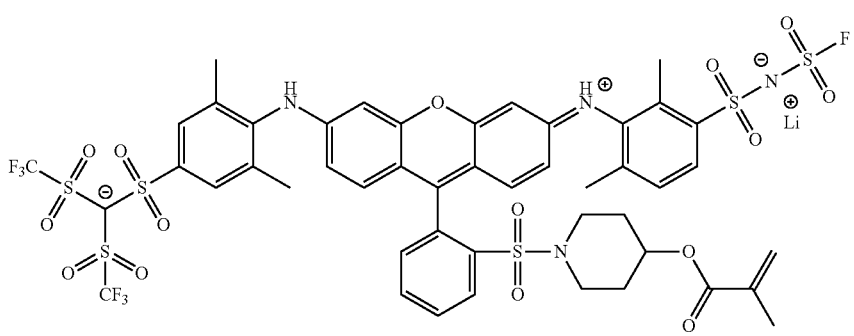
(A-20)
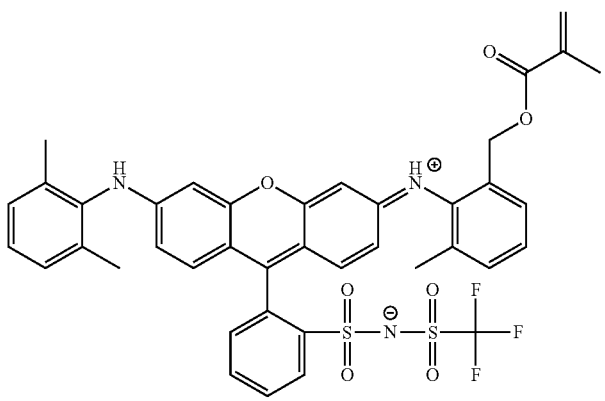
(A-21)
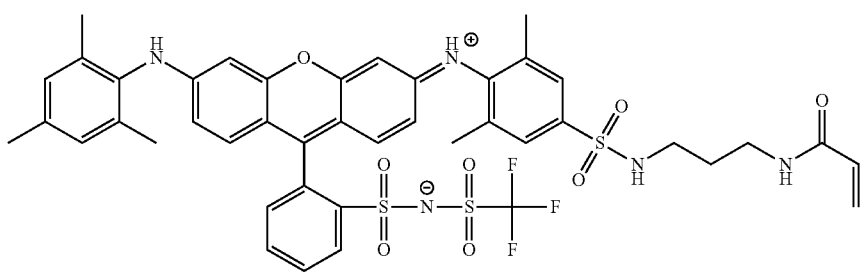
(A-22)

-continued
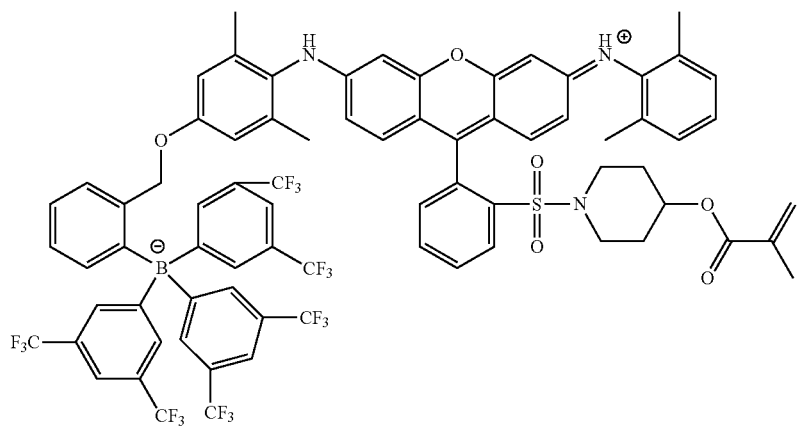
(A-23)
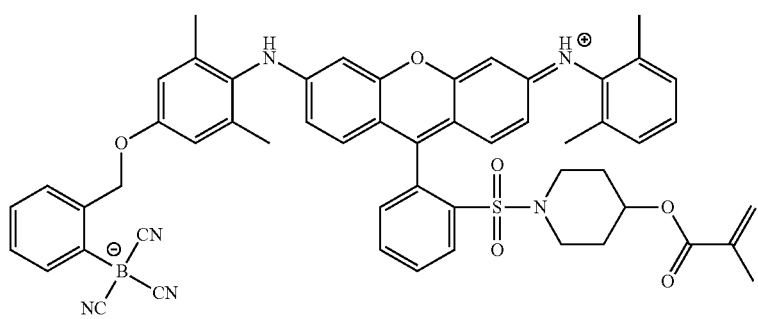
(A-24)
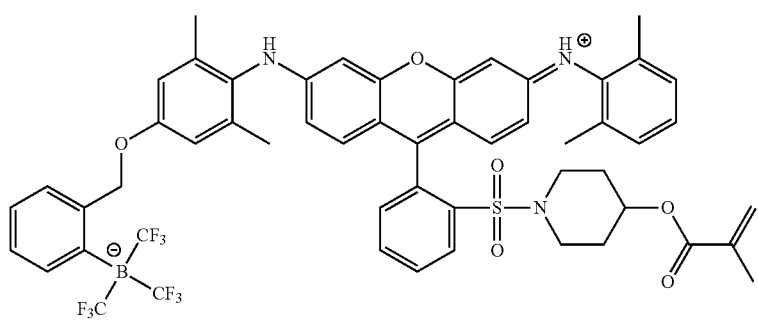
(A-25)
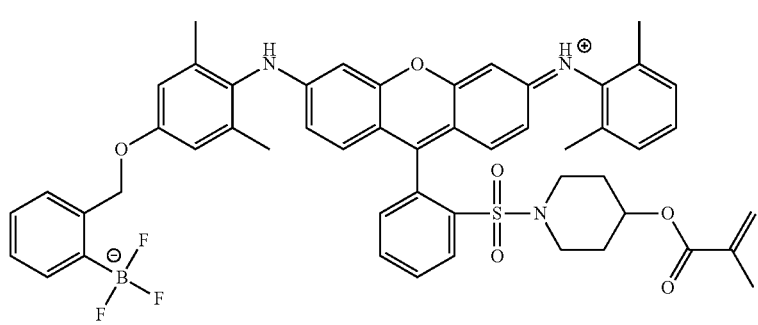
(A-26)
Examples of structural units containing a dye structure used in the present invention are shown below. X⁻ represents a counteranion. It should be understood that although some X groups are shown to be undissociated into anion structures, but those dissociated are also included in the present invention.

83
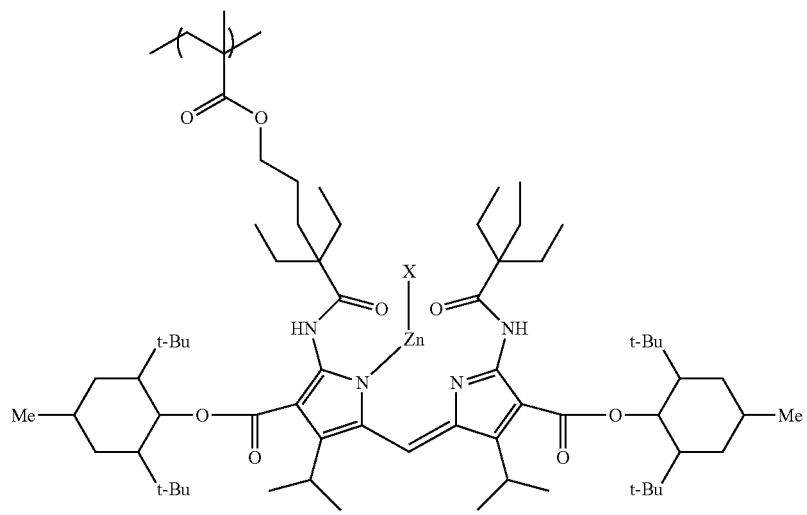
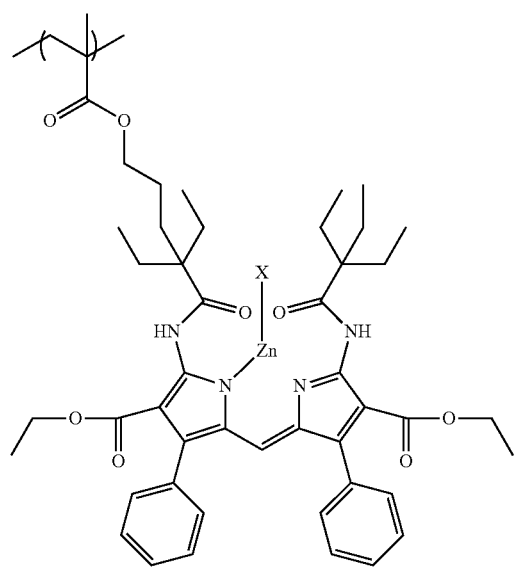
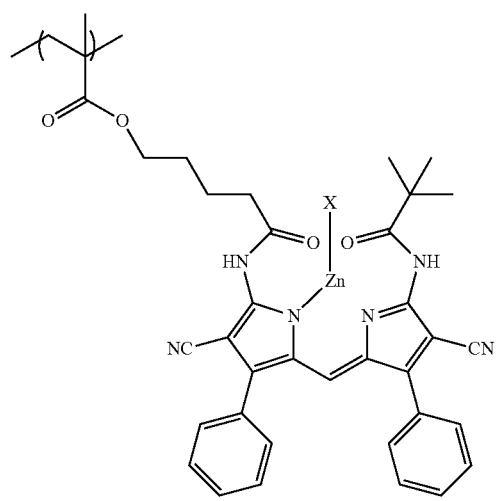
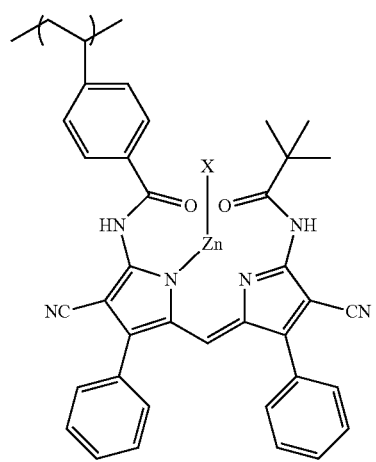
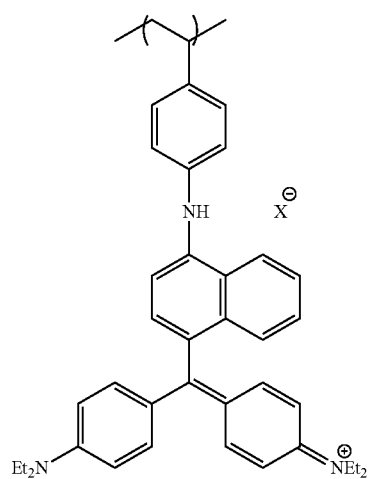
(A-tp-1)

(A-tp-2)
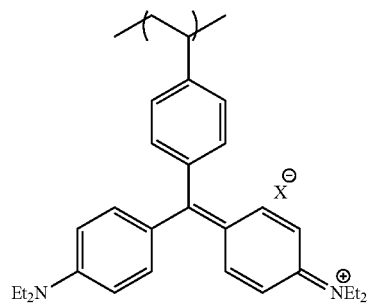
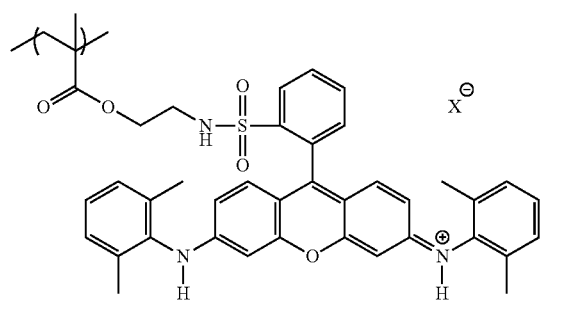
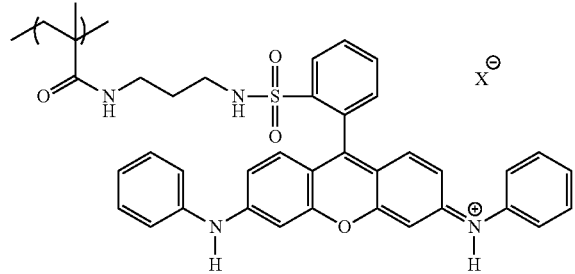
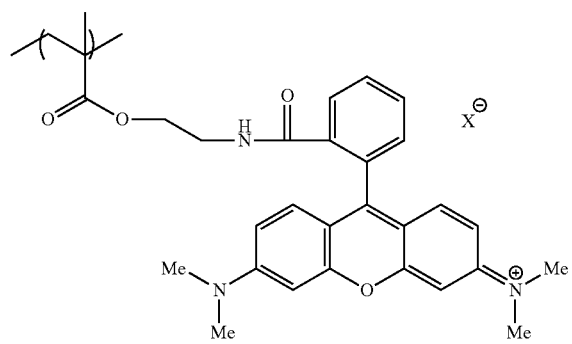
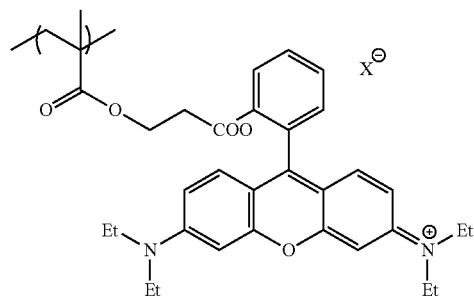
(A-tp-3)
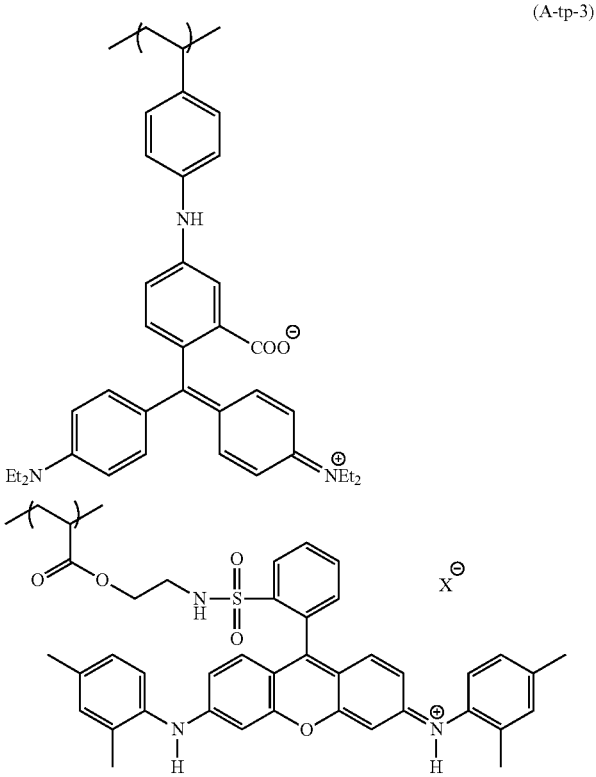
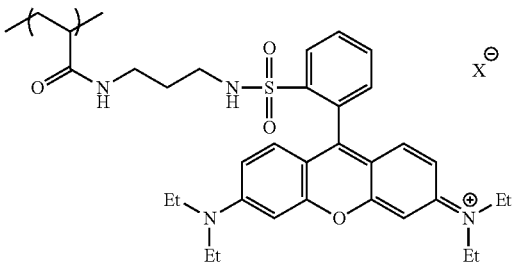
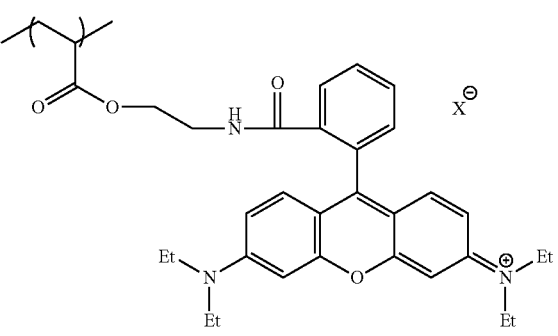
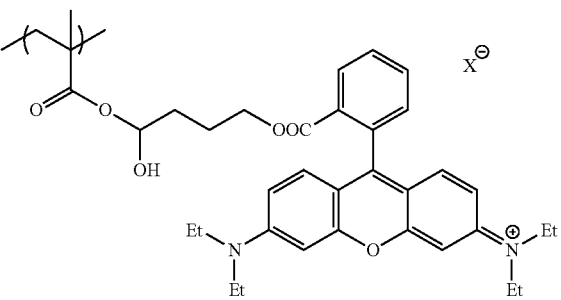

-continued
(a-xt-1)
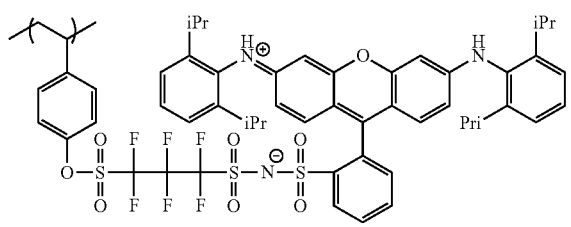
(a-xt-2)
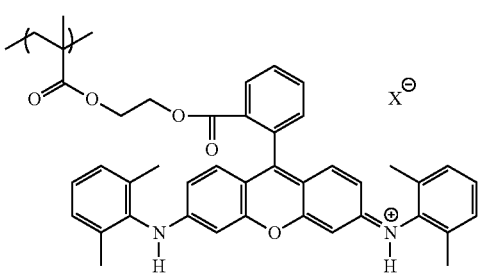
(a-xt-3)
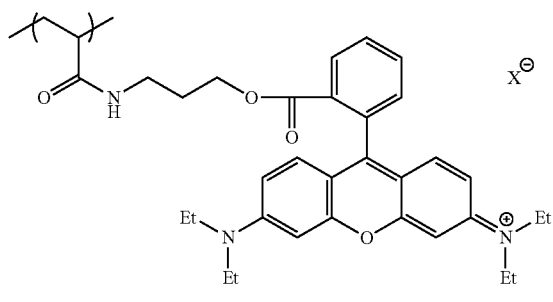
(a-xt-4)
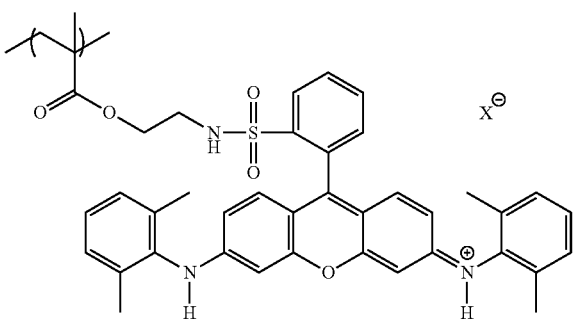
(a-xt-5)
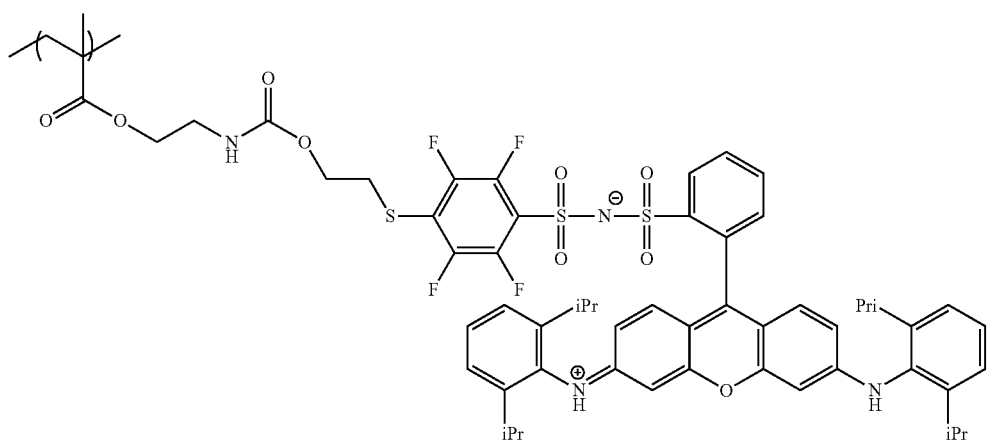
(a-xt-6)
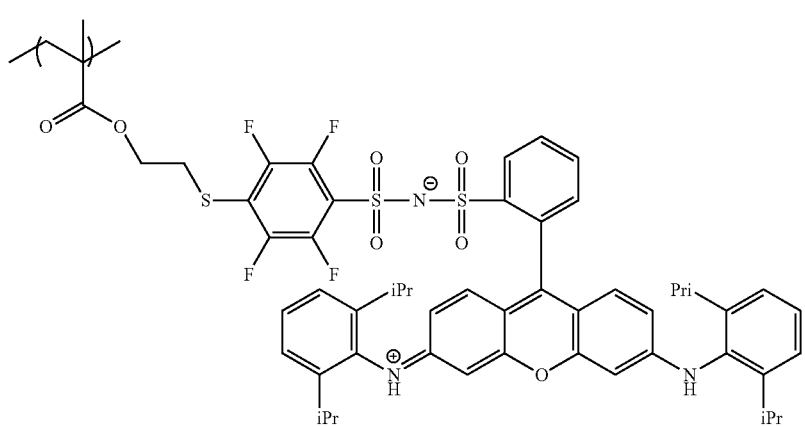

-continued
(a-xt-9)
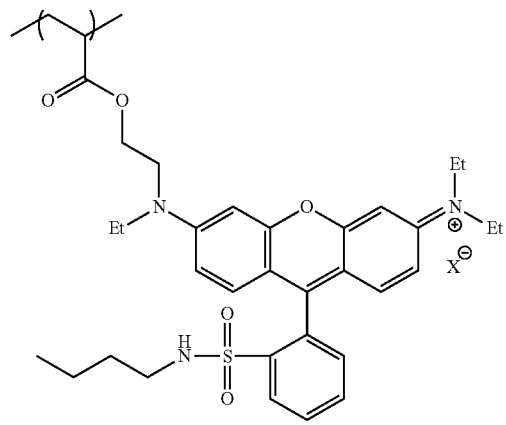
(a-xt-10)
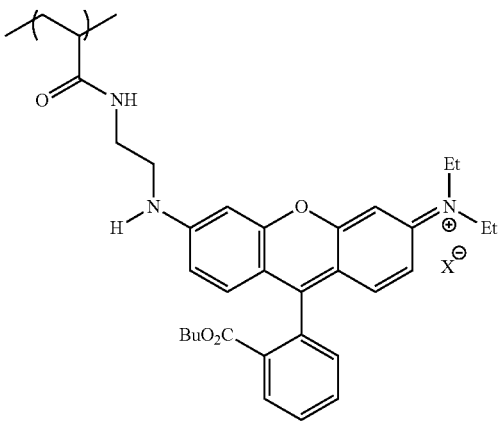
(a-xt-11)
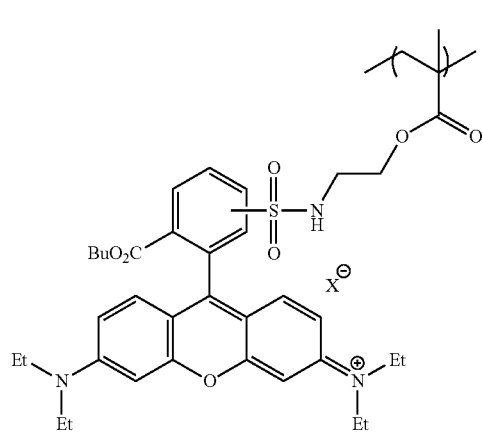
(a-xt-12)
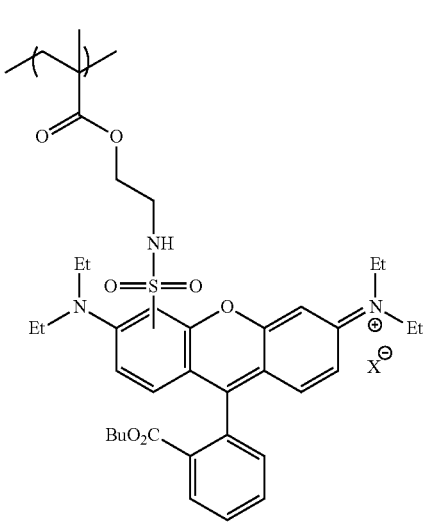
(A-1)
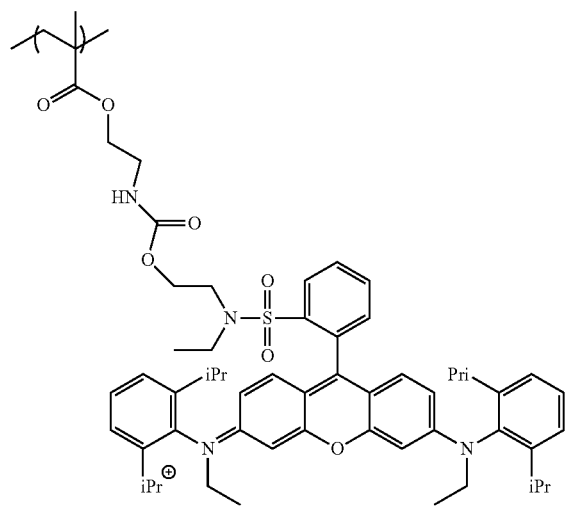
(A-2)
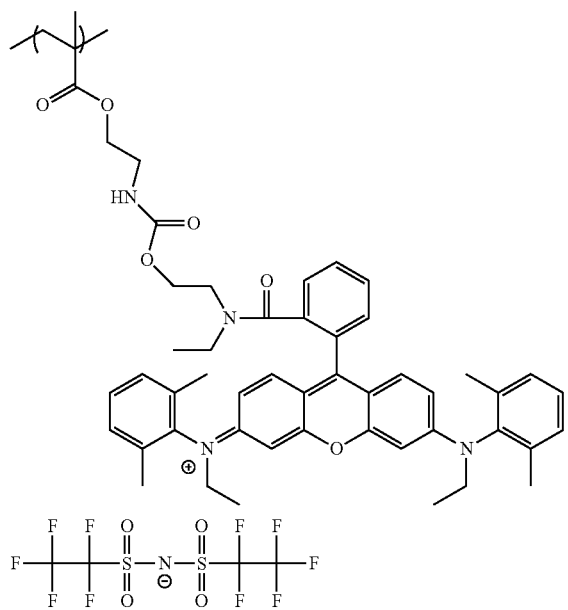

(A-3)
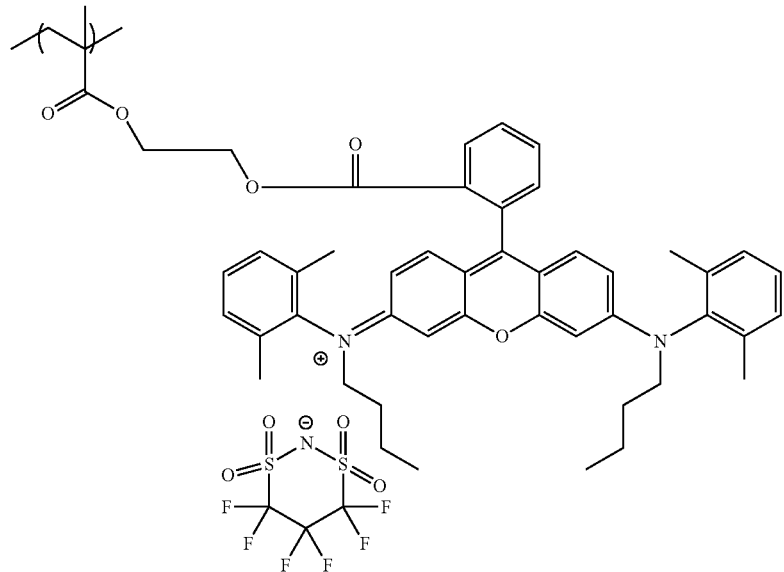
(A-4)
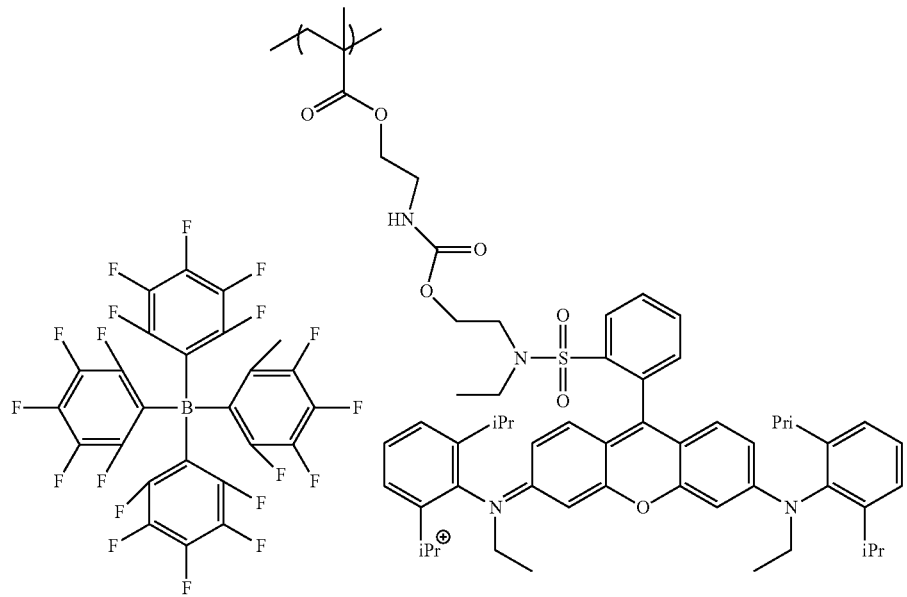

(A-5)
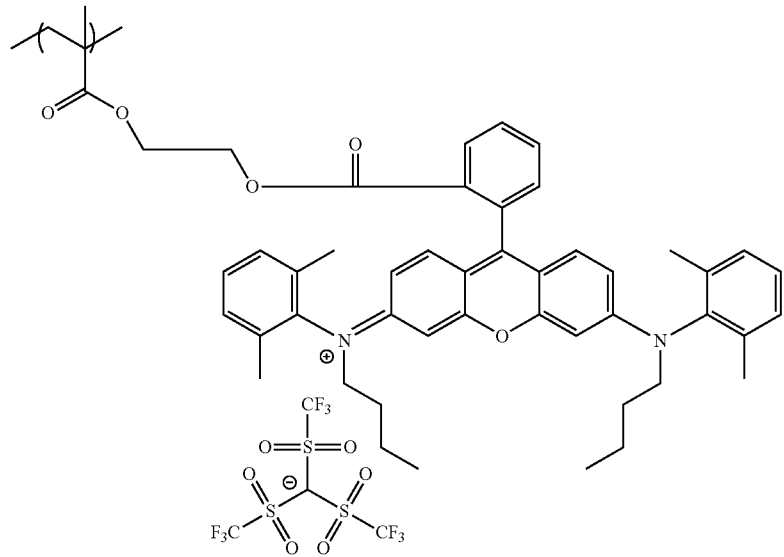
(A-6)
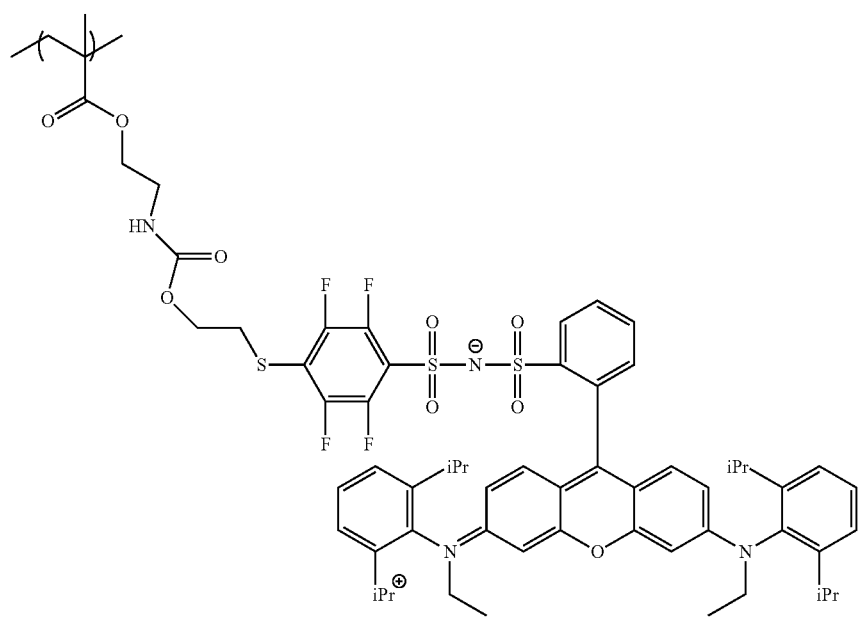

(A-7)
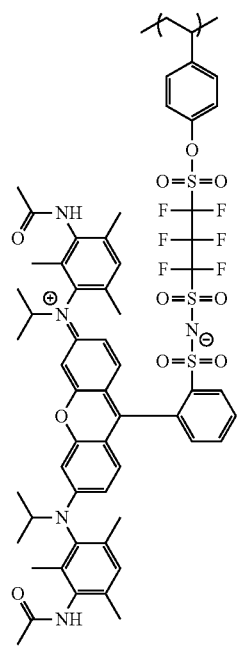
(A-8)
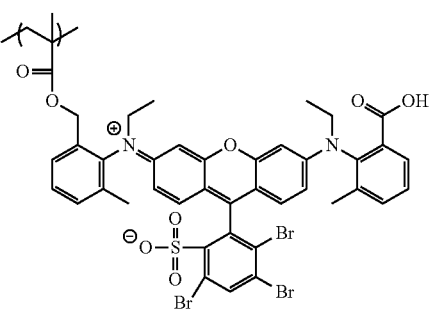
(A-9)
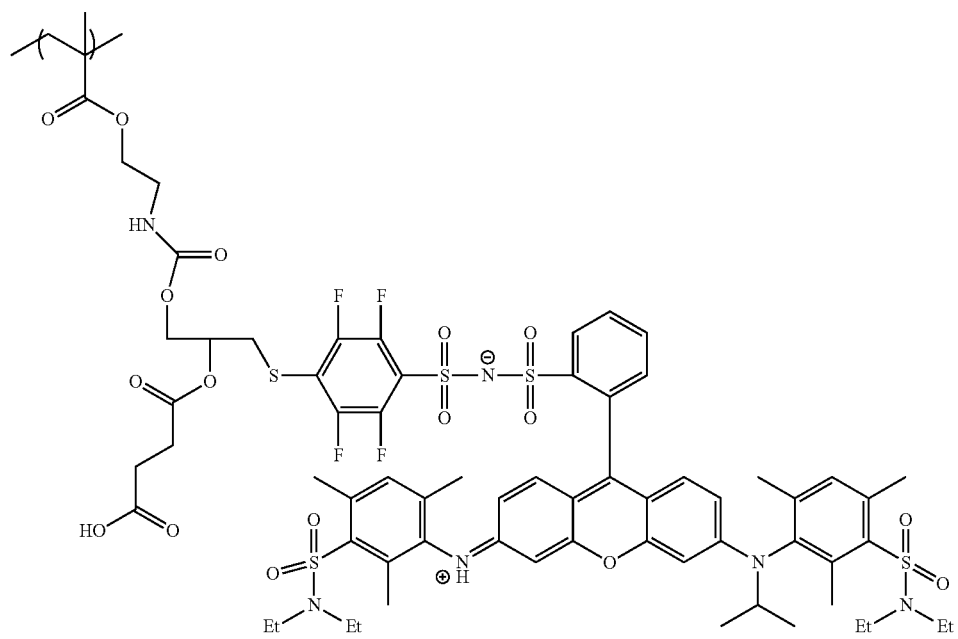

-continued
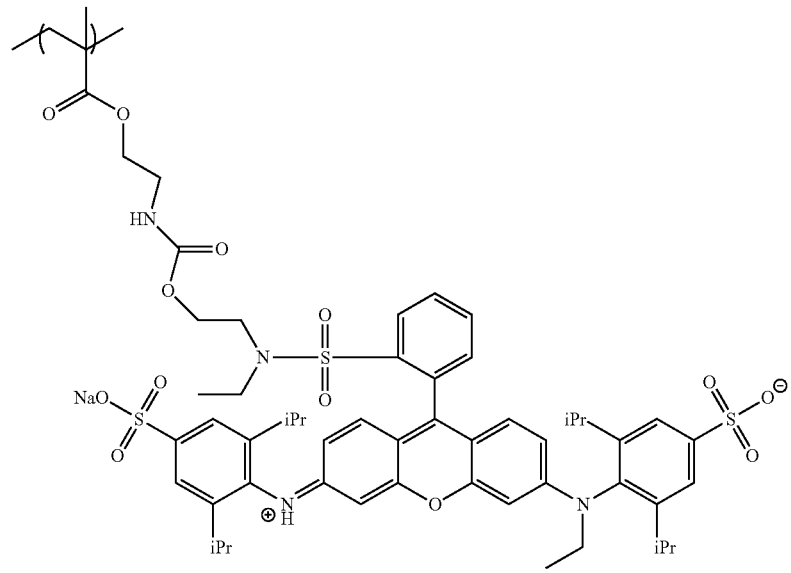
(A-10)
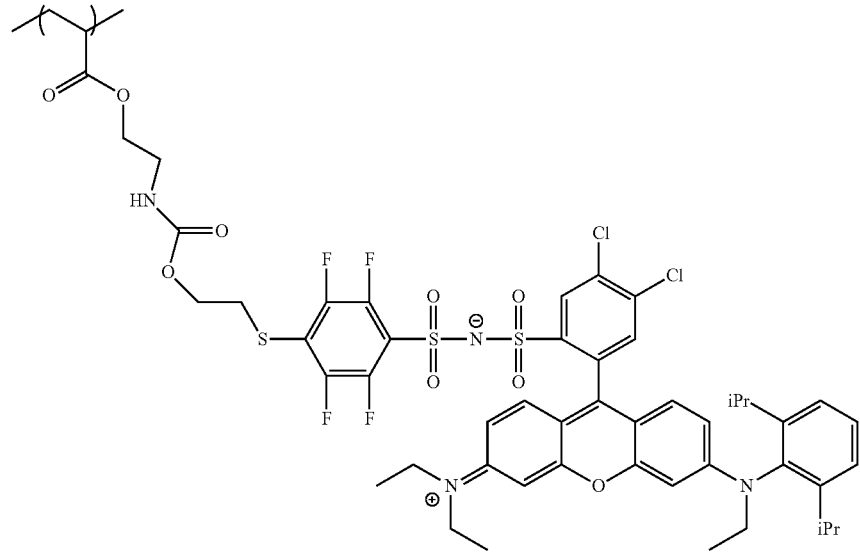
(A-11)

-continued
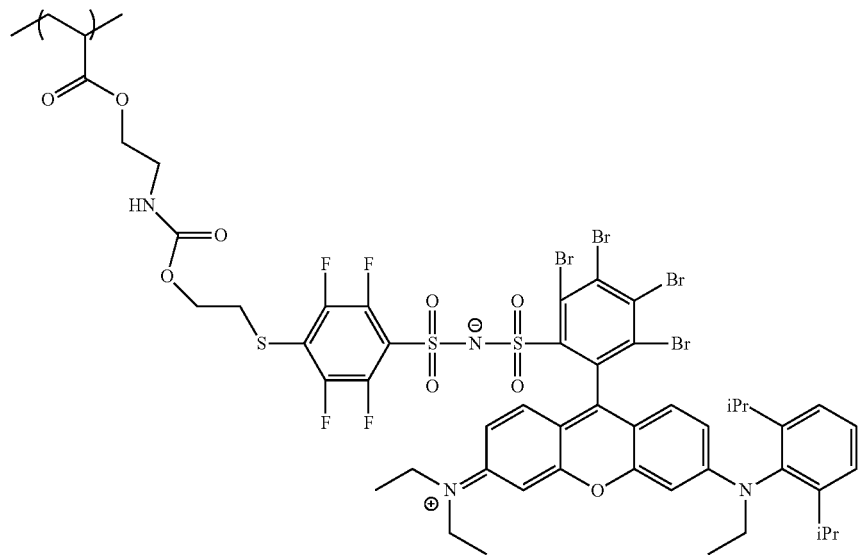
(A-12)
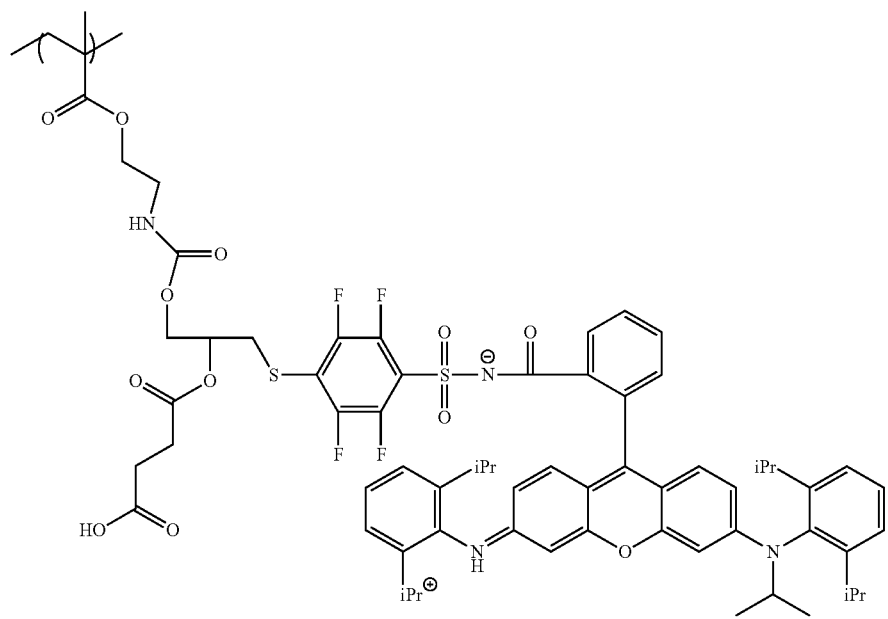
(A-13)

-continued
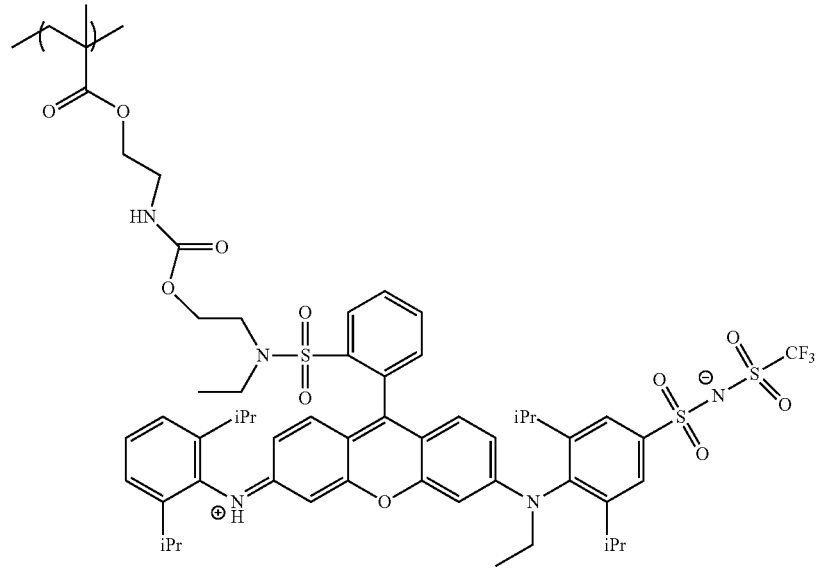
(A-14)
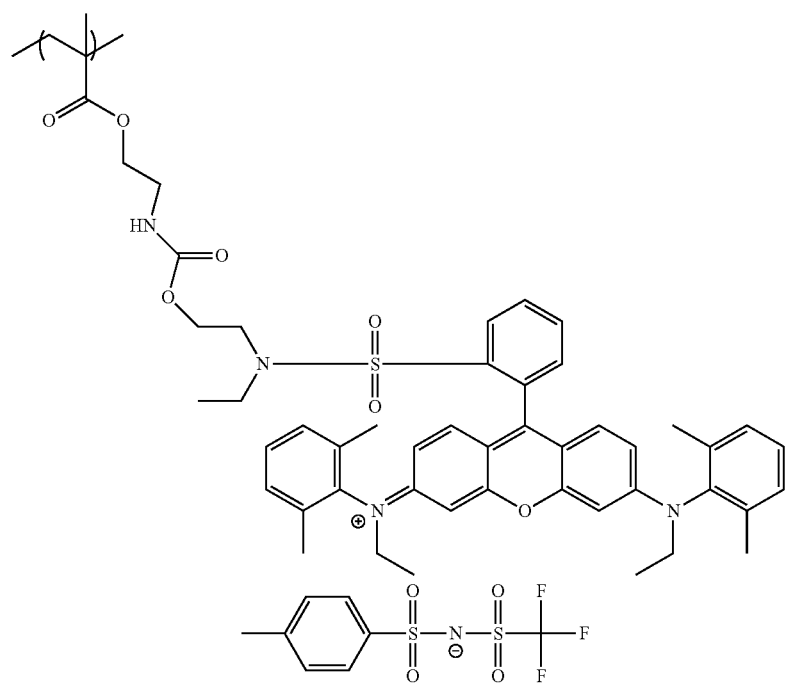
(A-15)
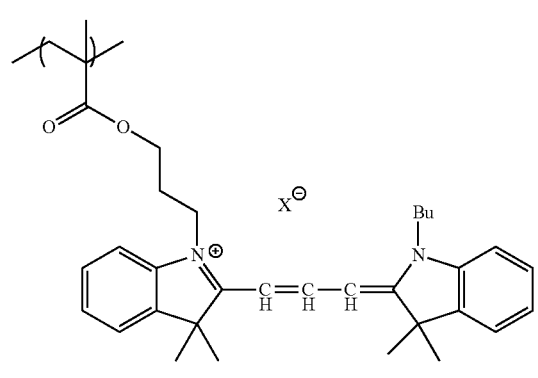
(A-pm-1)
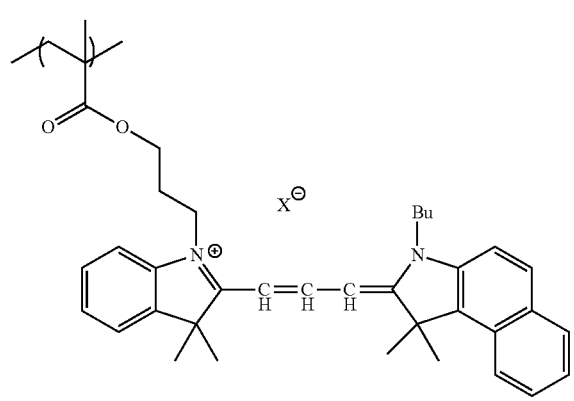
(A-pm-2)

-continued
(A-pm-3)
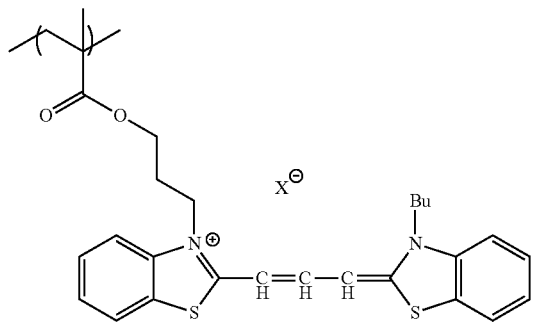
(A-pm-4)
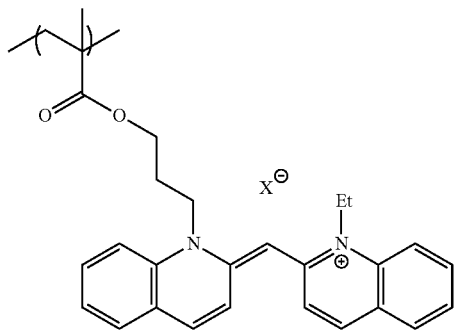
(A-SP-1)
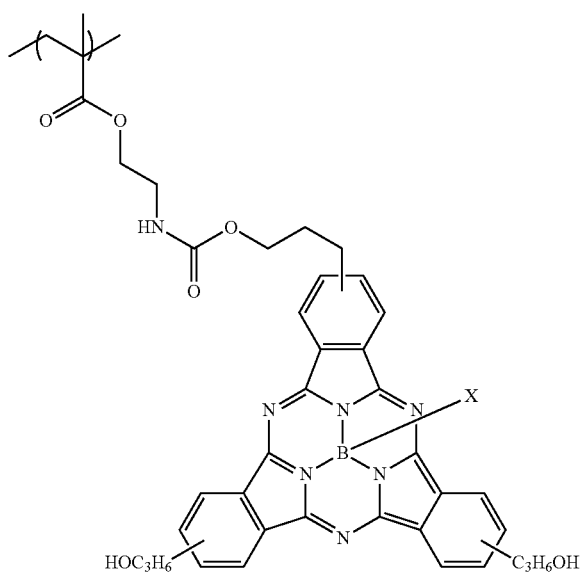
(A-SP-2)
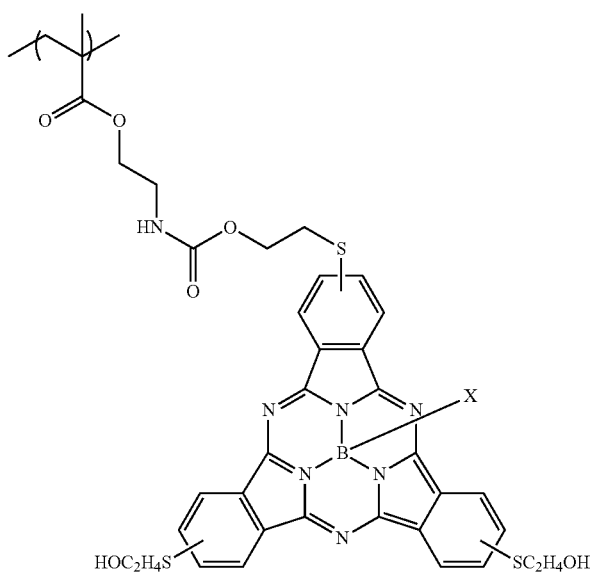
(A-SP-3)
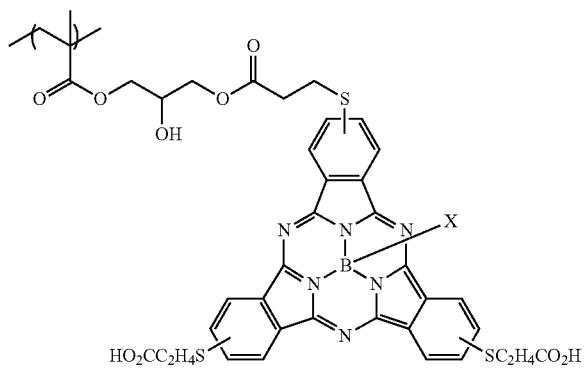
(A-SP-4)
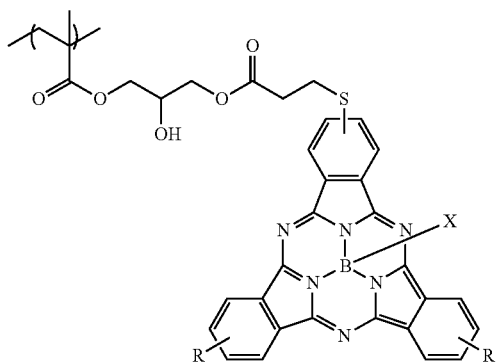
R =
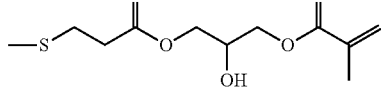

-continued
(B-dp-1)
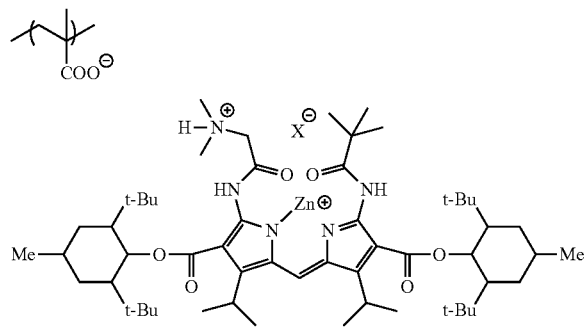
(B-pm-1)
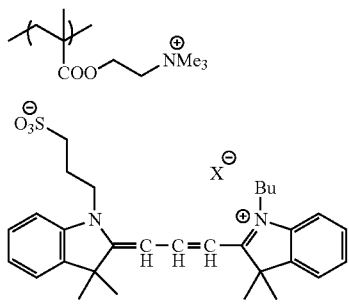
(B-xt-1)
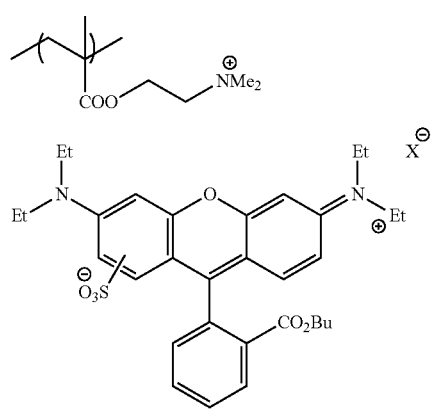
(B-xt-2)
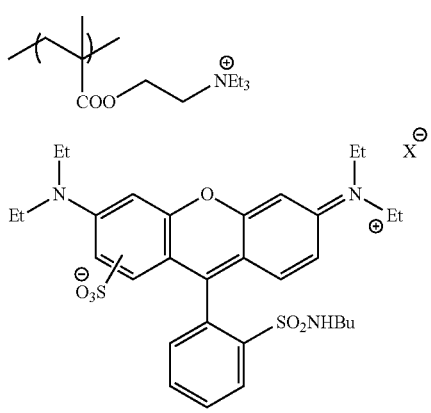
(C-dp-1)
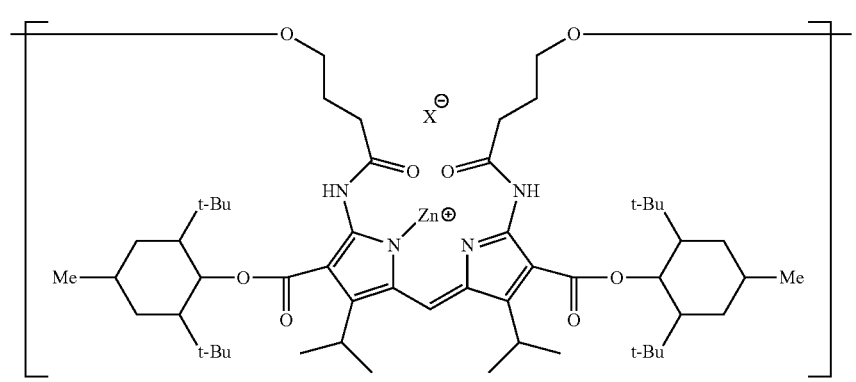
(C-xt-1)
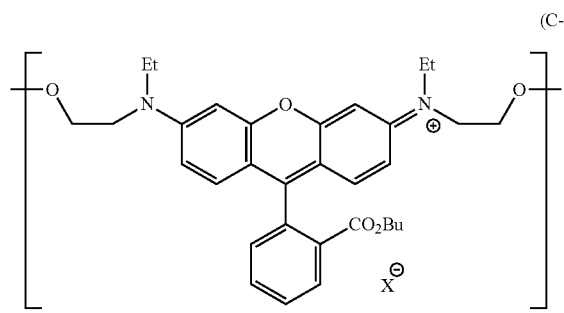
(C-xt-2)
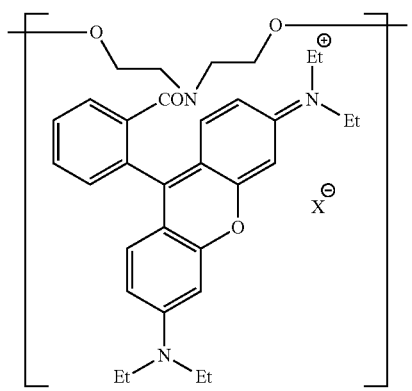

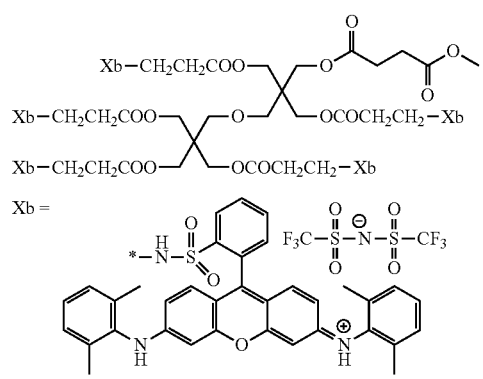
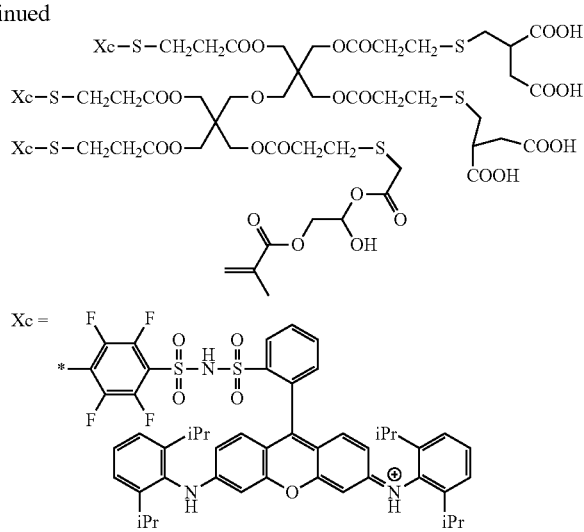
Structural units containing a dye structure also include structural units derived from any one of the exemplary compounds M-17 to M-37, M-39, M-40, and M-43 shown below.
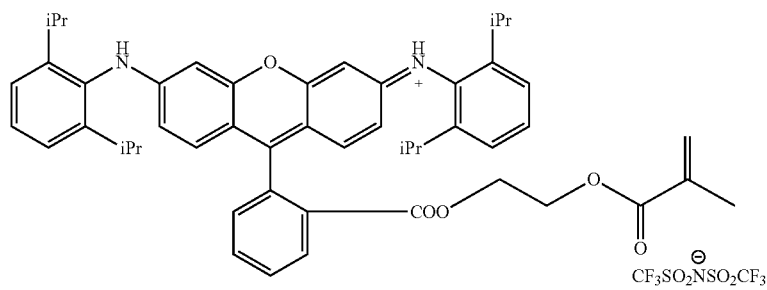
M-17
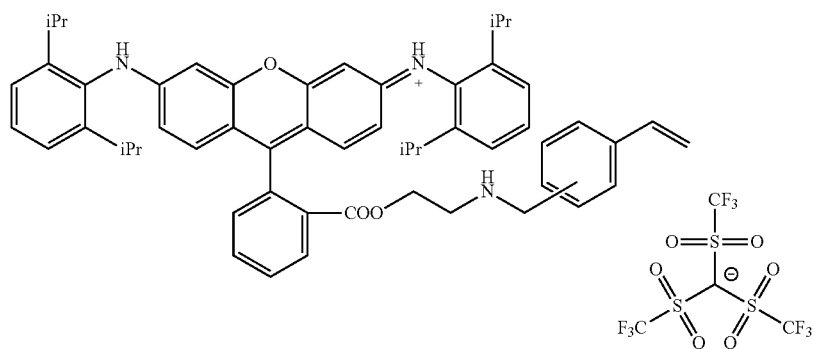
M-18

-continued
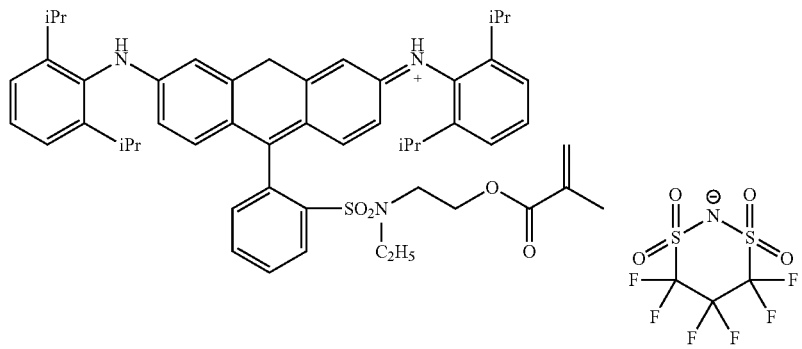
M-19
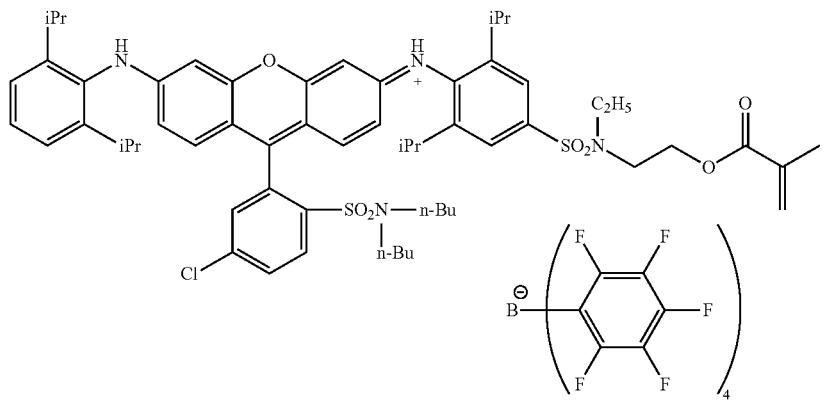
M-20
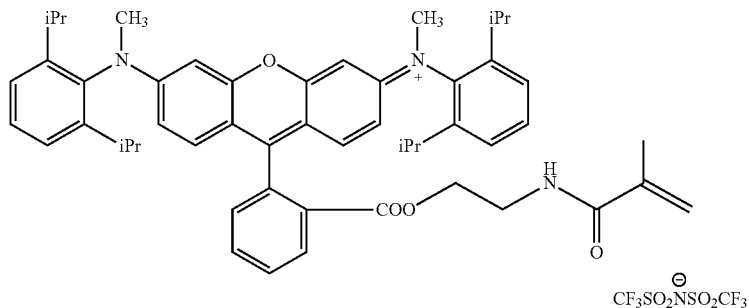
M-21
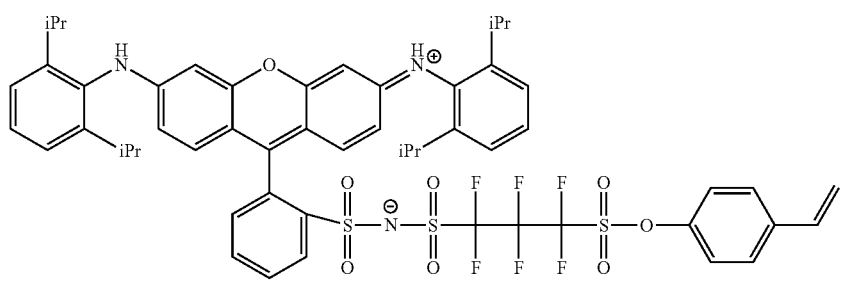
M-22

-continued
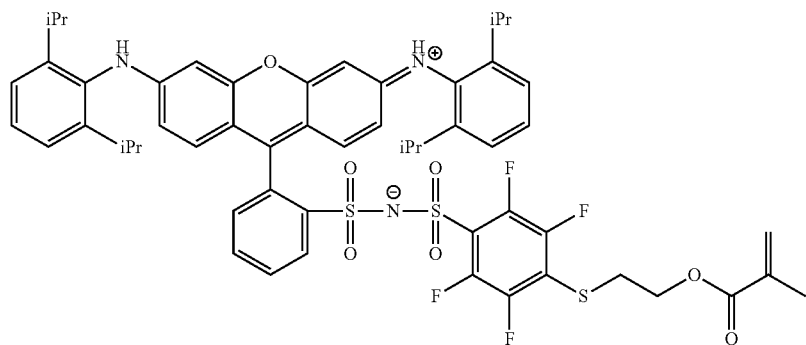
M-23
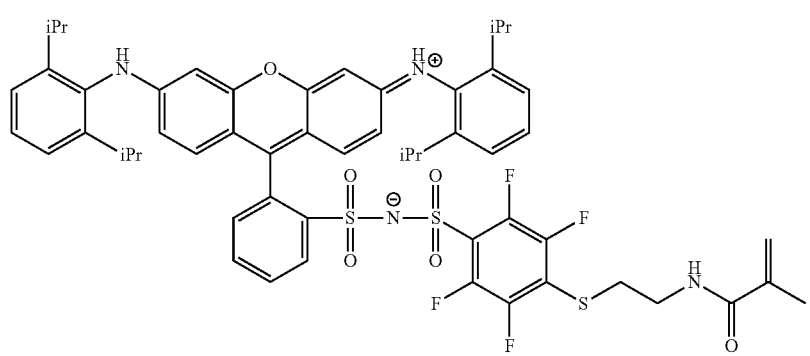
M-24
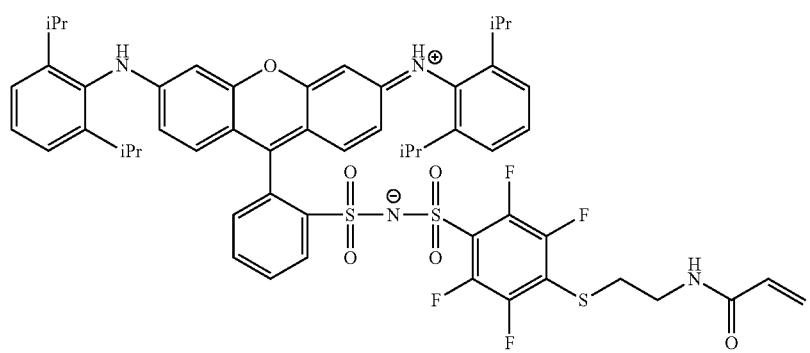
M-25
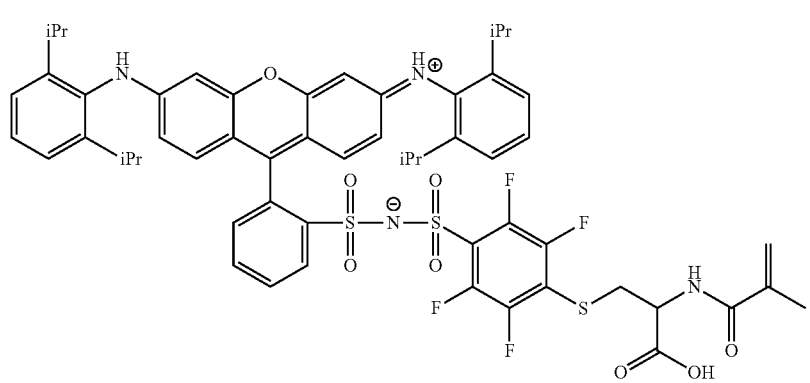
M-26

-continued
M-27
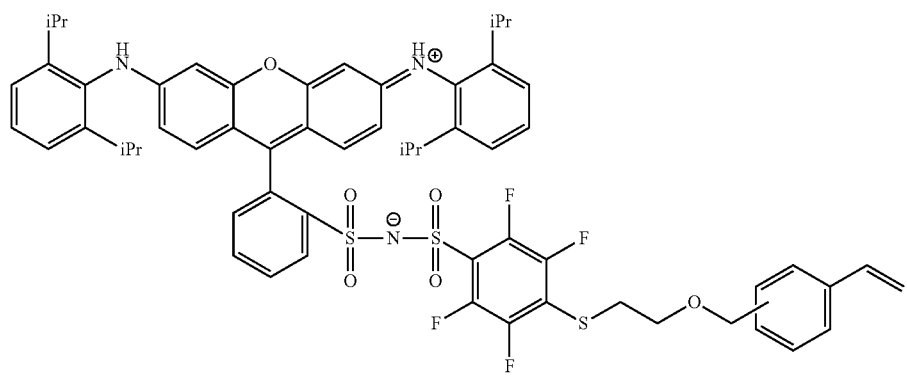
M-28
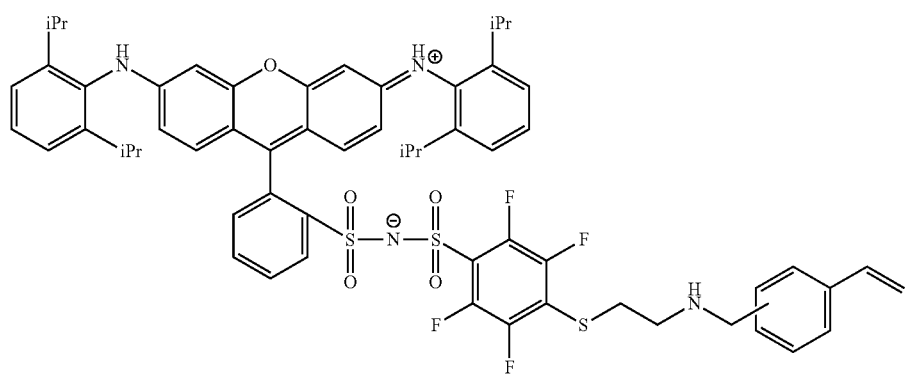
M-29
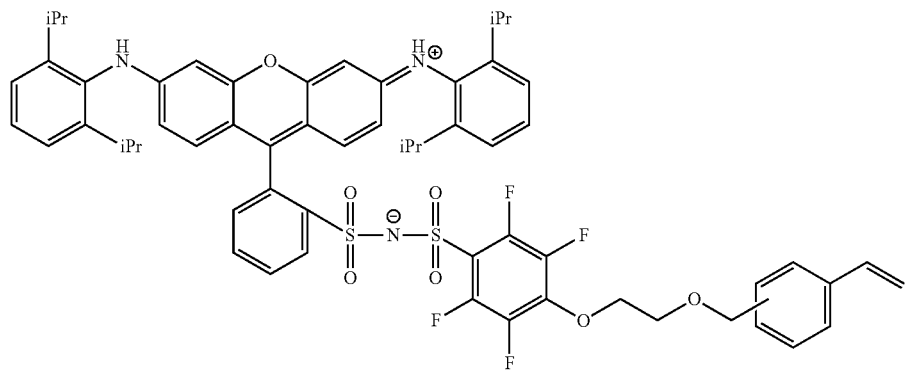
M-30
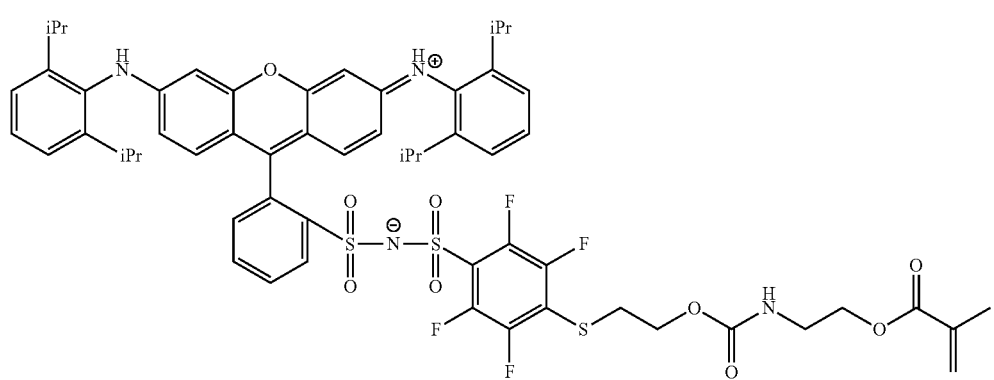

M-31
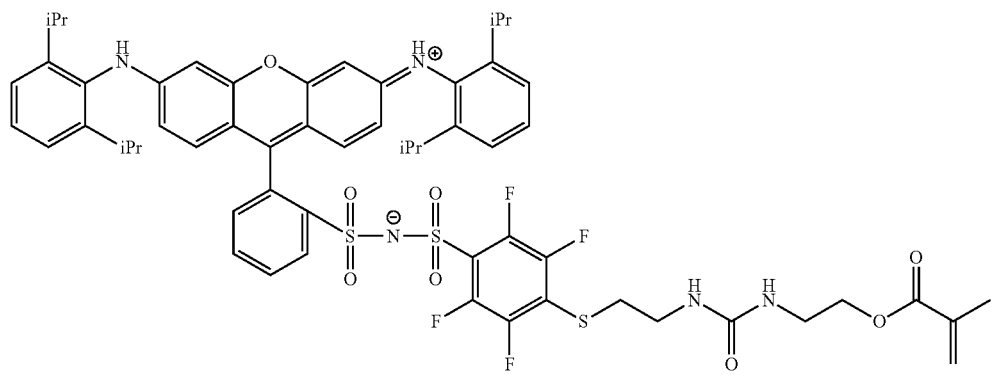
M-32
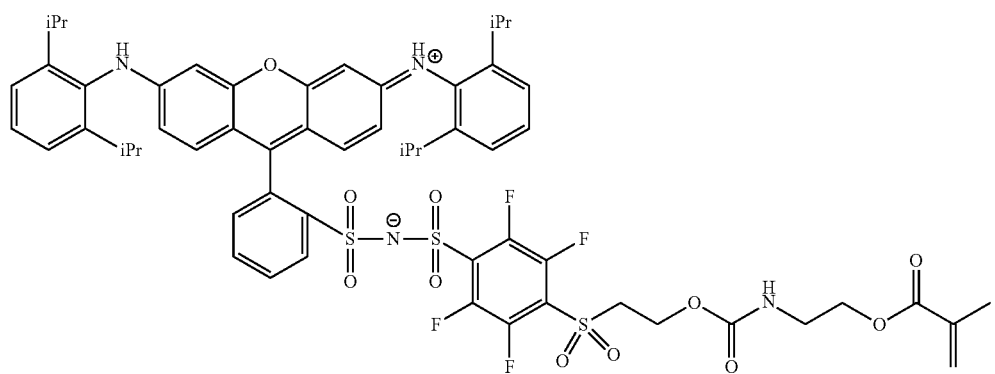
M-33
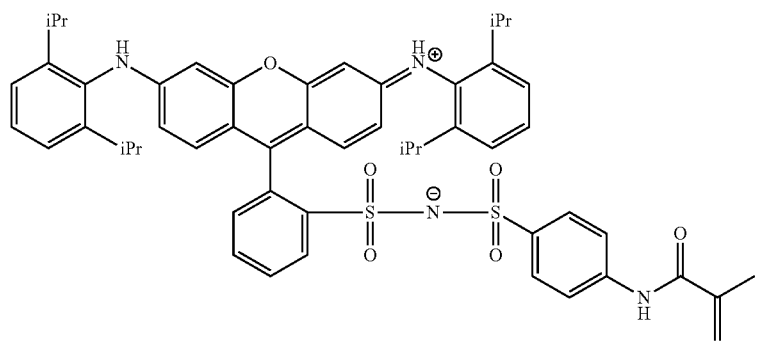
M-34
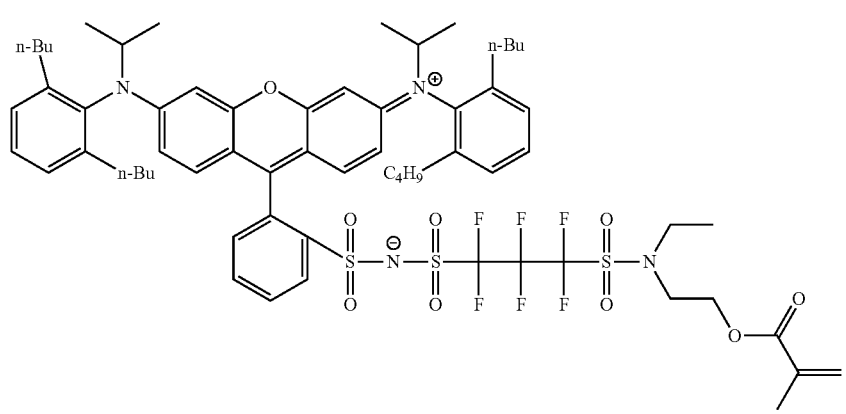

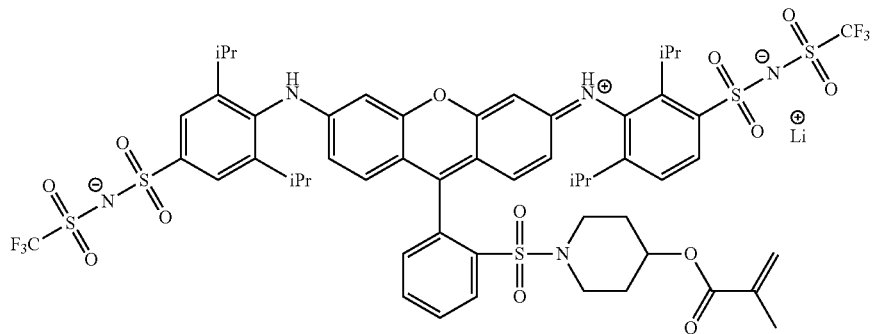
M-35
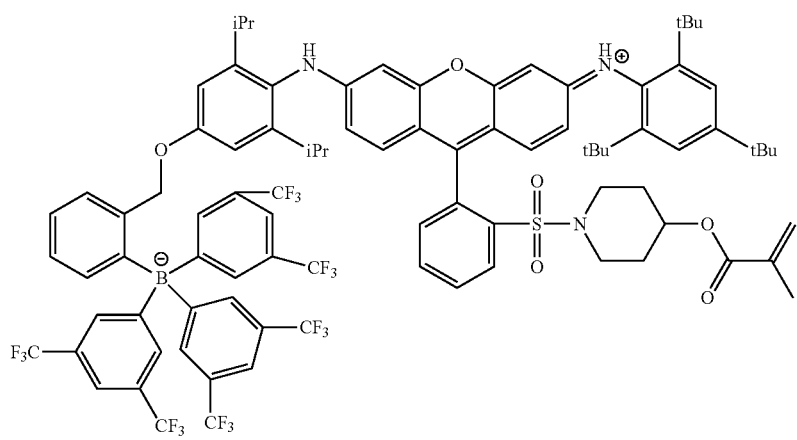
M-36
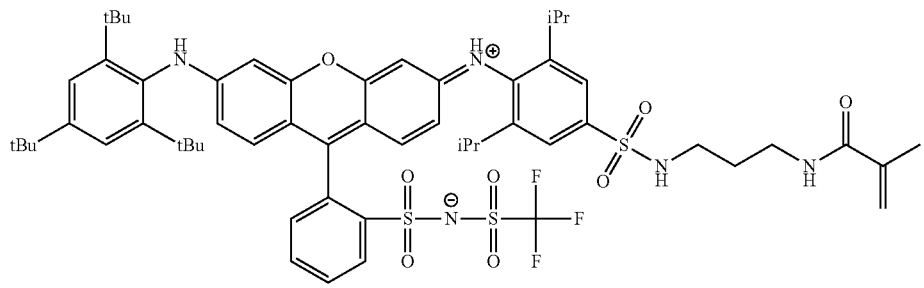
M-37
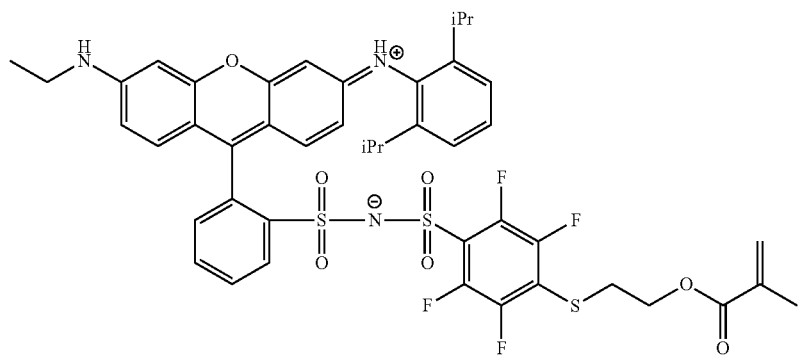
M-39

M-40
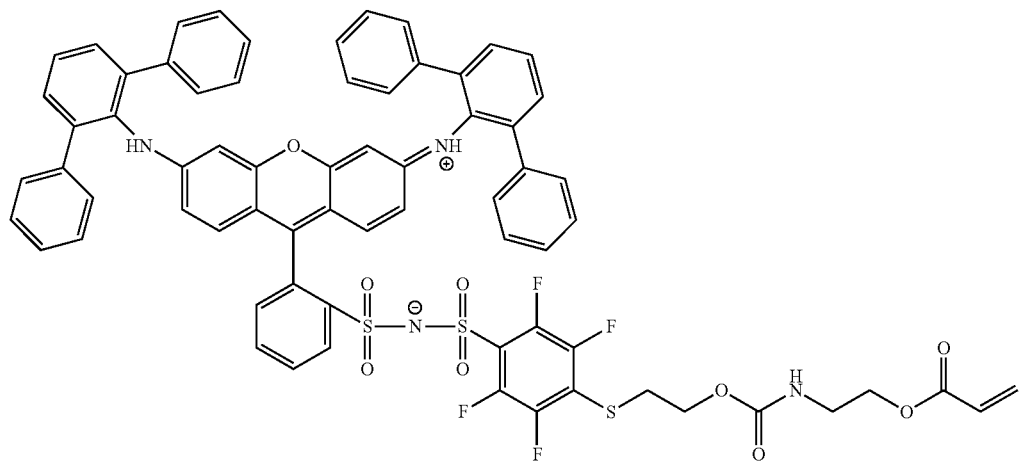
M-43
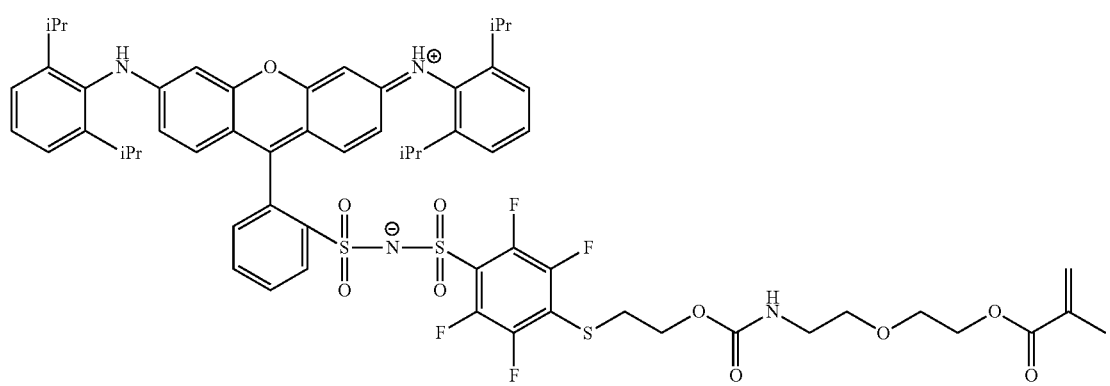
M-44
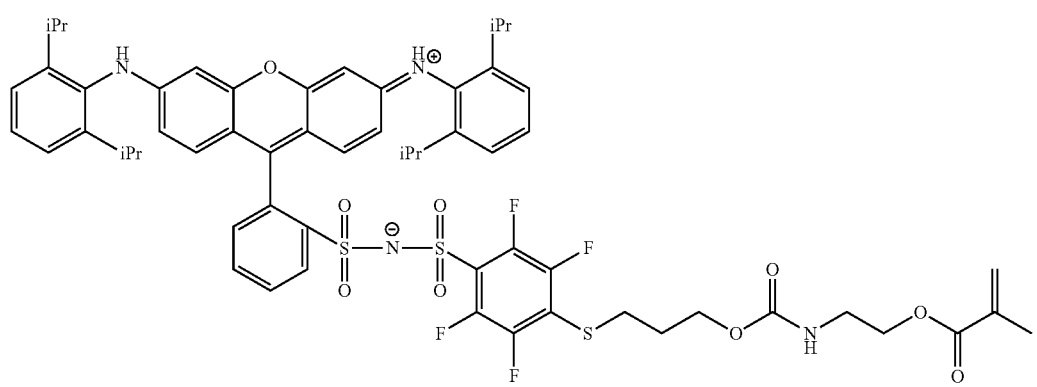
M-45
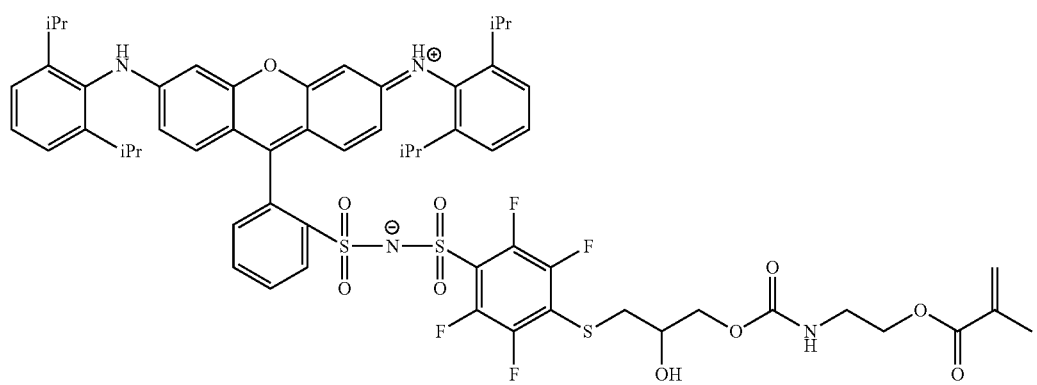

-continued
M-46
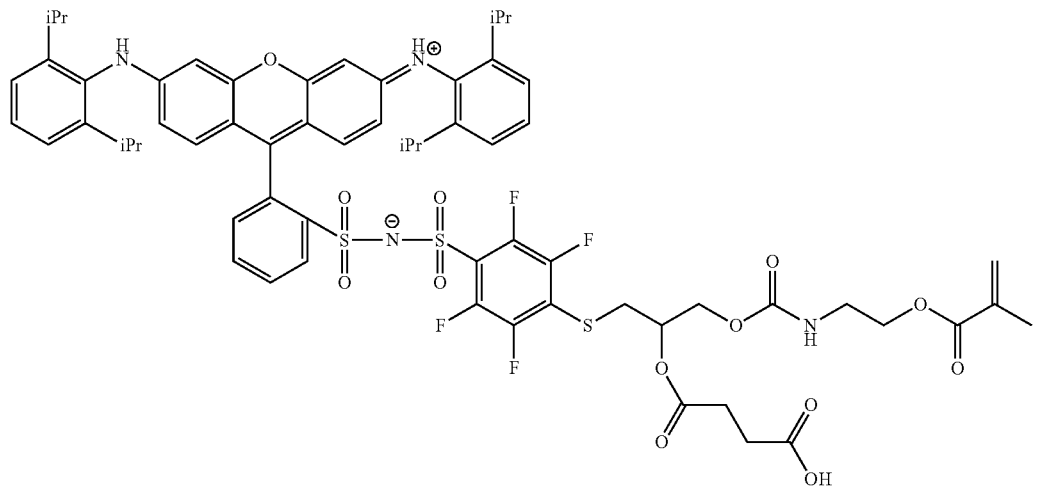
M-47
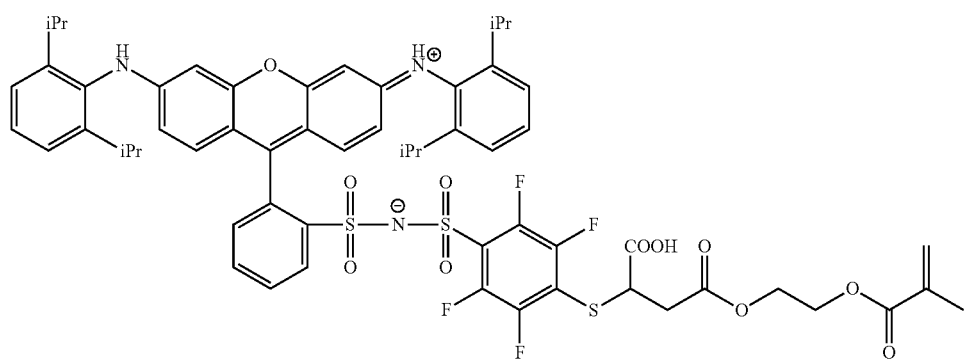
M-48
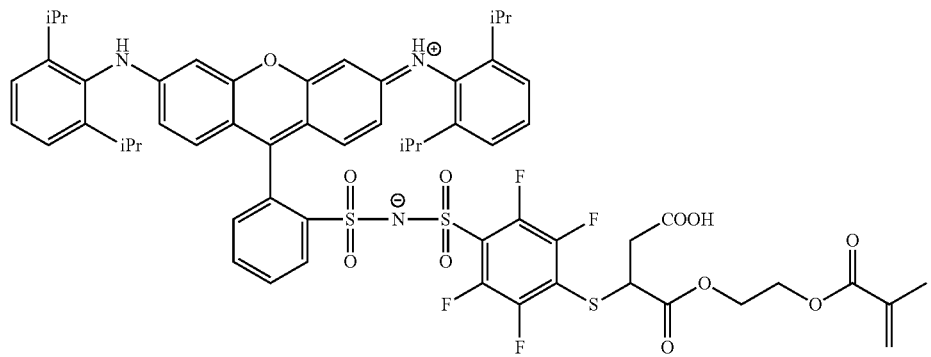
M-49
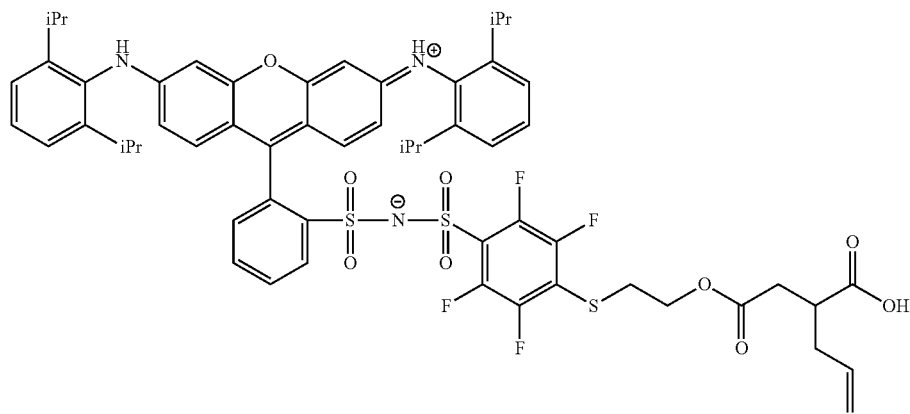

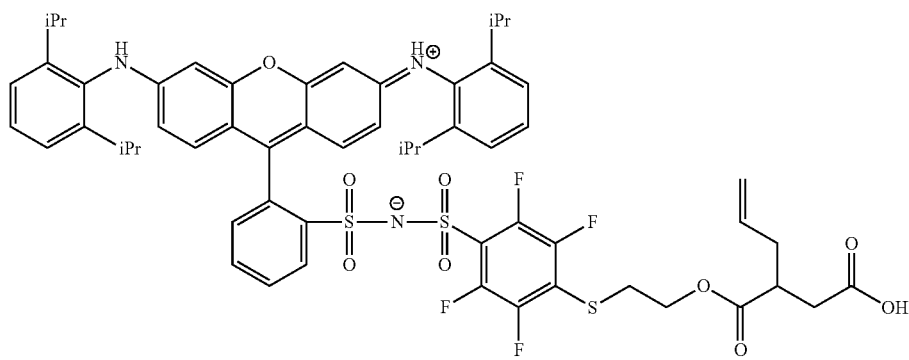

M-50

<Characteristics of the Dyestuff>

The dyestuff used in the present invention preferably has a maximum absorption at a wavelength of 400 to 650 nm, more preferably 450 to 600 nm.

The dyestuff used in the present invention preferably has a weight average molecular weight of 2000 or more, more preferably 3000 or more, even more preferably 4000 or more, especially preferably 5000 or more. Especially when the dyestuff has a weight average molecular weight of 5000 or more, the solubility of the radiation-sensitive colored compositions of the present invention in developers improves so that color mixing with residue on another color can be reduced more effectively. The upper limit of the weight average molecular weight of the dyestuff is not specifically limited, but preferably 30000 or less, more preferably 20000 or less, even more preferably 15000 or less, especially preferably 10000 or less.

As used herein, the weight average molecular weight and the number average molecular weight are values determined as styrene equivalent molecular weights by GPC.

When the dyestuff is a dye multimer, the ratio between the weight average molecular weight (Mw) and the number average molecular weight (Mn) [(Mw)/(Mn)] is preferably 1.0 to 3.0, more preferably 1.6 to 2.5, especially preferably 1.6 to 2.0.

Preferably, the dyestuff used in the present invention has a glass transition temperature (Tg) of 50° C. or more, more preferably 100° C. or more. Further, it preferably has a 5% weight loss temperature of 120° C. or more, more preferably 150° C. or more, even more preferably 200° C. or more as measured by thermogravimetric analysis (TGA). If these temperatures are in such ranges, the variation in concentration caused by heat processes can be reduced when the radiation-sensitive colored compositions of the present invention are applied for preparing color filters and the like.

Further, the dyestuff used in the present invention preferably has an absorption coefficient per unit weight (hereinafter abbreviated as ε' expressed in L/g*cm, where ε'=ε/ average molecular weight) of 30 or more, more preferably 60 or more, even more preferably 100 or more. If it is in the ranges indicated above, color filters with good color reproducibility can be prepared by using the radiation-sensitive colored compositions of the present invention.

Preferably, the dyestuff has a molar absorption coefficient as high as possible to improve coloring power. The maximum absorption wavelength and the molar absorption coefficient herein are measured with the spectrophotometer cary 5 (from Varian).

Preferably, the dyestuff used in the present invention is a compound soluble in the following organic solvents. That is, it is preferably soluble in organic solvents including esters (e.g., methyl 3-ethoxypropionate, ethyl 3-ethoxypropionate, ethyl lactate, butyl acetate, methyl 3-methoxypropionate and the like), ethers (e.g. methyl cellosolve acetate, ethyl cellosolve acetate, propylene glycol monomethyl ether, propylene glycol monomethyl ether acetate and the like), ketones (e.g., methyl ethyl ketone, cyclohexanone, 2-heptanone, 3-heptanone and the like), and aromatic hydrocarbons (e.g., toluene, xylene and the like) at 1% by mass or more and 50% by mass or less, more preferably 5 to 40% by mass, even more preferably 10 to 30% by mass. If the solubility is in the ranges indicated above, a favorable profile of coated surfaces can be provided or the decrease in concentration due to dissolution after coating of another color can be reduced when the radiation-sensitive colored compositions of the present invention are applied for preparing color filters and the like.

In the radiation-sensitive colored compositions of the present invention, only one or more than one dyestuff may be used.

The amount of the dyestuff contained in the radiation-sensitive colored compositions of the present invention is preferably 10 to 70% by mass, more preferably 10 to 50% by mass, especially preferably 15 to 30% by mass based on the total solids of the radiation-sensitive colored compositions.

Further, the concentration of colorants including the dyestuff is preferably 50% by mass or more, more preferably 60% by mass or more based on the total solids of the radiation-sensitive colored compositions.

The radiation-sensitive colored compositions of the present invention can be used in color filters, ink materials (especially UV ink materials), dye-sublimation heat transfer printing materials and the like.

Thanks to the characteristics of the dye structure having a specific structure contained in the structure of the dyestuff used in the present invention, the radiation-sensitive colored compositions of the present invention can be formed into thin films (for example, having a thickness of 1 μm or less) of colored patterns. Thus, the radiation-sensitive colored compositions of the present invention are especially suitable for preparing color filters for solid-state image sensors required to have a very small size of 2 μm or less (a pixel pattern having a side length of e.g. 0.5 to 2.0 μm as viewed from a direction perpendicular to the substrate) with high precision and to have a good rectangular sectional profile.

In the radiation-sensitive colored compositions of the present invention, various known pigments (e.g., inorganic pigments and organic pigments) other than dyes can be used so far as the advantages of the present invention are not adversely affected.

When a pigment is used, the type, particle size, and the amount of the pigment to be added should also be controlled in order that the resulting colored layer can preferably maintain a high transmittance.

Inorganic pigments include metal compounds represented by metal oxides, metal complexes and the like or carbon black (C.I. Pigment Black 7). Metal compounds specifically include oxides of metals such as iron, cobalt, aluminum, cadmium, lead, copper, titanium, magnesium, chromium, zinc, antimony and the like, and composite metal oxides.

Organic pigments include, for example,
C.I. Pigments Yellow 11, 24, 31, 53, 83, 93, 99, 108, 109, 110, 138, 139, 147, 150, 151, 154, 155, 167, 180, 185, 199;
C.I. Pigments Orange 36, 38, 43, 71;
C.I. Pigments Red 81, 105, 122, 149, 150, 155, 171, 175, 176, 177, 209, 220, 224, 242, 254, 255, 264, 270;
C.I. Pigments Violet 19, 23, 32, 39;
C.I. Pigments Blue 1, 2, 15, 15:1, 15:3, 15:6, 16, 22, 60, 66;
C.I. Pigments Green 7, 36, 37, 58;
C.I. Pigments Brown 25, 28;
C.I. Pigment Black 1; and the like.

Pigments that can be preferably used in the present invention are shown below. However, the present invention is not limited to these examples.
C.I. Pigments Yellow 11, 24, 108, 109, 110, 138, 139, 150, 151, 154, 167, 180, 185;
C.I. Pigments Orange 36, 71;
C.I. Pigments Red 122, 150, 171, 175, 177, 209, 224, 242, 254, 255, 264;
C.I. Pigments Violet 19, 23, 32;
C.I. Pigments Blue 15:1, 15:3, 15:6, 16, 22, 60, 66;
C.I. Pigments Green 7, 36, 37, 58; and
C.I. Pigments Black 1, 7.

—Dispersants—

When the radiation-sensitive colored compositions of the present invention comprise a pigment, they can contain a dispersant. Dispersants include polymeric dispersants [for example, polyamidoamines and their salts, polycarboxylic acids and their salts, high-molecular weight unsaturated acid esters, modified polyurethanes, modified polyesters, modified poly(meth)acrylates, (meth)acrylic copolymers, and naphthalenesulfonic acid/formaldehyde condensates]; surfactants such as polyoxyethylene alkyl phosphate esters, polyoxyethylene alkyl amines, and alkanolamines; and pigment derivatives, etc.

Polymeric dispersants can be further classified by their structure into straight-chain polymers, terminally modified polymers, graft polymers, and block polymers.

Terminally modified polymers having an anchoring moiety for pigment surfaces include, for example, the polymers having a terminal phosphate group described in JP-A-H3-112992, JP-A2003-533455 and the like; the polymers having a terminal sulfonate group described in JP-A2002-273191 and the like; and the polymers having a partial skeleton or heterocycle of an organic dye described in JP-A-H9-77994 and the like; etc. Further, the polymers containing two or more terminal anchoring moieties for pigment surfaces (acid groups, basic groups, partial skeletons or heterocycles of organic dyes and the like) described in JP-A2007-277514 are also preferred because of excellent dispersion stability.

Graft polymers having an anchoring moiety for pigment surfaces include, for example, polyester dispersants such as the reaction products of a poly (lower alkylene imine) and a polyester described in JP-A-S54-37082, JP-A-H8-507960, JP-A2009-258668 and the like; the reaction products of a polyallylamine and a polyester described in JP-A-H9-169821 and the like; the copolymers of a macromonomer and a nitrogen-containing monomer described in JP-A-H10-339949, JP-A2004-37986 and the like; the graft polymers having a partial skeleton or heterocycle of an organic dye described in JP-A2003-238837, JP-A2008-9426, JP-A2008-81732 and the like; the copolymers of a macromonomer and an acid group-containing monomer described in JP-A2010-106268 and the like; etc. Among others, the amphoteric dispersant resins having a basic group and an acidic group described in JP-A2009-203462 are especially preferred because of the dispersibility and dispersion stability of the resulting pigment dispersions and the developability exhibited by radiation-sensitive colored compositions using such pigment dispersions.

Macromonomers that can be used for preparing graft polymers having an anchoring moiety for pigment surfaces by radical polymerization include known macromonomers such as macromonomers AA-6 (methyl polymethacrylate having a terminal methacryloyl group), AS-6 (polystyrene having a terminal methacryloyl group), AN-6S (a styrene-acrylonitrile copolymer having a terminal methacryloyl group), and AB-6 (butyl polyacrylate having a terminal methacryloyl group) available from Toagosei Co., Ltd.; PLACCELs FM5 (an adduct of 2-hydroxyethyl methacrylate with 5 molar equivalents of ε-caprolactone), and FA10L (an adduct of 2-hydroxyethyl acrylate with 10 molar equivalents of ε-caprolactone) available from Daicel Chemical Industries, Ltd.; and the polyester macromonomers described in JP-A-H2-272009 and the like. Among them, polyester macromonomers having high flexibility and affinity for solvents are especially preferred because of the dispersibility and dispersion stability of the resulting pigment dispersions and the developability exhibited by radiation-sensitive colored compositions using such pigment dispersions, among which those represented by the polyester macromonomers described in JP-A-H2-272009 are especially preferred.

Preferred block polymers having an anchoring moiety for pigment surfaces include the block polymers described in JP-A2003-49110, JP-A2009-52010 and the like.

Dispersants are also commercially available, specific examples of which include "DA-7301" available from Kusumoto Chemicals, Ltd.; "Disperbyk-101 (polyamidoamine phosphate), 107 (carboxylic acid ester), 110 (an acid group-containing copolymer), 130 (polyamide), 161, 162, 163, 164, 165, 166, 170 (high molecular weight copolymers)", and "BYK-P104, P105 (high-molecular weight unsaturated polycarboxylic acids)" available from BYK Chemie; "EFKA 4047, 4050 to 4010 to 4165 (polyurethanes), EFKA 4330 to 4340 (block copolymers), 4400 to 4402 (modified polyacrylates), 5010 (polyester amide), 5765 (high-molecular weight polycarboxylic acid salt), 6220 (fatty acid polyester), 6745 (phthalocyanine derivative), 6750 (azo pigment derivative)" available from EFKA; "AJISPER PB821, PB822, PB880, PB881" available from Ajinomoto Fine-Techno Co., Inc.; "FLOWLEN TG-710 (urethane oligomer)", and "POLYFLOW No. 50E, No. 300 (acrylic copolymers)" available from Kyoeisha Chemical Co., Ltd.; "DISPARLON KS-860, 873SN, 874, #2150 (aliphatic polycarboxylic acids), #7004 (polyether ester), DA-703-50, DA-705, DA-725" available from Kusumoto Chemicals, Ltd.; "DEMOL RN, N (naphthalenesulfonic acid/formaldehyde polycondensates), MS, C, SN-B (aromatic sulfonic acid/formaldehyde polycondensates)", "HOMOGENOL L-18 (polycarboxylate polymer)", "EMULGEN 920, 930, 935, 985 (polyoxyethylene nonylphenyl ethers)", and "ACETAMIN 86 (stearylamine acetate)" available from Kao Corporation; "Solsperse 5000 (phthalocyanine derivative), 22000 (azo pigment derivative), 13240 (polyester amine), 3000, 17000, 27000 (terminally functionalized polymers), 24000, 28000, 32000, 38500 (graft polymers)" available from Lubrizol Japan Limited; "Nikkol T106 (polyoxyethylene sorbitan monooleate), and MYS-IEX (polyoxyethylene monostearate)" available from Nikko Chemicals Co., Ltd.; Hinoact T-8000E and the like available from Kawaken Fine Chemicals, Co., Ltd.; the organosiloxane polymer KP341 available from Shin-Etsu Chemical Co., Ltd.; cationic surfactants such as "W001", nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate and sorbitan fatty acid ester, and anionic surfactants such as "W004, W005, W017" available from Yusho Co., Ltd.; "EFKA-46, EFKA-47, EFKA-47EA, EFKAPolymer 100, EFKAPolymer 400, EFKA Polymer 401, EFKA Polymer 450" available from Morishita Sangyo K.K.; polymeric dispersants such as "Disperse Aid 6, Disperse Aid 8, Disperse Aid 15, Disperse Aid 9100" available from San Nopco Limited; "Adeka Pluronics L31, F38, L42, L44, L61, L64, F68, L72, P95, F77, P84, F87, P94, L101, P103, F108, L121, P-123" available from ADEKA; and "IONET (brand name)S-20" available from Sanyokasei Co., Ltd.; and the like.

The dispersants may be used alone or as a combination of two or more of them. Especially, a combination of a pigment derivative and a polymeric dispersant is preferably used in the present invention. Further, a combination of a terminally modified polymer, graft polymer or block polymer having an anchoring moiety for pigment surfaces with an alkali-soluble resin may be used as a dispersant of the present invention. Such alkali-soluble resins include (meth)acrylic acid copolymers, itaconic acid copolymers, crotonic acid copolymers, maleic acid copolymers, partially esterified maleic acid copolymers and the like, as well as acidic cellulose derivatives containing a carboxylic acid in the side chain and resins obtained by modifying a hydroxyl-containing polymer with an acid anhydride, among which (meth)acrylic acid copolymers are especially preferred. Also preferred are the copolymers of an N-substituted maleimide monomer described in JP-A-H10-300922; the copolymers of an ether dimer described in JP-A2004-300204; and the alkali-soluble resins containing a polymerizable group described in JP-A-H7-319161.

The amount of the dispersants contained in the radiation-sensitive colored compositions is preferably 1 to 80 parts by mass, more preferably 5 to 70 parts by mass, even more preferably 10 to 60 parts by mass per 100 parts by mass of the pigment.

Specifically when a polymeric dispersant is used, it is preferably used in an amount in the range of 5 to 100 parts by mass, more preferably in the range of 10 to 80 parts by mass per 100 parts by mass of the pigment.

When a combination of a pigment derivative and a polymeric dispersant is used, the pigment derivative is preferably used in an amount in the range of 1 to 30 parts by mass, more preferably in the range of 3 to 20 parts by mass, especially preferably in the range of 5 to 15 parts by mass per 100 parts by mass of the pigment.

When a dyestuff and a pigment are used in the radiation-sensitive colored compositions of the present invention, the concentration of colorants including the dyestuff and the pigment is preferably 50% by mass or more, more preferably 60% by mass or more, even more preferably 70% by mass or more based on the total solids of the radiation-sensitive colored compositions to improve curing sensitivity and color density. Further, the concentration of the colorants is preferably 90% by mass or less, more preferably 85% by mass or less based on the total solids of the radiation-sensitive colored compositions.

When a pigment is used in the radiation-sensitive colored compositions of the present invention, the concentration of the pigment is preferably 25% by mass or more, more preferably 35% by mass or more, even more preferably 45% by mass or more based on the total solids of the radiation-sensitive colored compositions. Further, the concentration of the pigment is preferably 65% by mass or less, more preferably 55% by mass or less based on the total solids of the radiation-sensitive colored compositions.

Color mixing with residue on another color can be reduced even if the radiation-sensitive colored compositions of the present invention contain colorants at such a high concentration.

[Photopolymerizable Compound]

The radiation-sensitive colored compositions of the present invention comprise a photopolymerizable compound.

Photopolymerizable compounds that can be used include known photopolymerizable compounds that can be crosslinked by free radical mechanism or exposure to acids or heat, e.g., photopolymerizable compounds containing an ethylenically unsaturated bond, a cyclic ether (epoxy, oxetane), a methylol group or the like. The photopolymerizable compound is preferably selected from photopolymerizable compounds containing at least one, preferably more than one terminal ethylenically unsaturated bond to improve sensitivity. Among others, polyfunctional photopolymerizable compounds having a functionality of four or more are preferred, and polyfunctional photopolymerizable compounds having a functionality of five or more are more preferred.

Such compounds are widely known in the field of industry, and can be used in the present invention without any specific limitation. These may be in any chemical forms such as monomers, prepolymers, i.e., dimers, trimers and oligomers, or mixtures thereof and multimers thereof. The photopolymerizable compounds in the present invention may be used alone or as a combination of two or more of them.

More specifically, examples of monomers and prepolymers thereof include unsaturated carboxylic acids (e.g., acrylic acid, methacrylic acid, itaconic acid, crotonic acid, isocrotonic acid, maleic acid and the like) and their esters, amides, and multimers thereof, preferably esters of unsaturated carboxylic acids and aliphatic polyalcohol compounds; amides of unsaturated carboxylic acids and aliphatic polyamine compounds; and multimers thereof. Other examples that can be preferably used include the reaction products of unsaturated carboxylic acid esters or amides having a nucleophilic substituent such as hydroxyl, amino or mercapto obtained by addition reaction with monofunctional or polyfunctional isocyanates or epoxies or by dehydration condensation reaction with monofunctional or polyfunctional carboxylic acids and the like. Other preferred examples include the addition reaction products of unsaturated carboxylic acid esters or amides having an electrophilic substituent such as isocyanate or epoxy with monofunctional or polyfunctional alcohols, amines or thiols, as well as the substitution reaction products of unsaturated carboxylic acid esters or amides having an eliminatable substituent such as halogen or tosyloxy with monofunctional or polyfunctional alcohols, amines or thiols. Alternative examples that can be used include compounds obtained by replacing the unsaturated carboxylic acids by unsaturated phosphonic acids, vinyl benzene derivatives such as styrene, vinyl ethers, allyl ethers or the like.

Specific examples of these compounds can be found in paragraphs 0095 to 0108 of JP-A2009-288705, the disclosure of which is incorporated herein by reference.

Other preferred photopolymerizable compounds are compounds containing at least one addition polymerizable ethylenically unsaturated group and having a boiling point of 100° C. or more under atmospheric pressure. Examples of such compounds can be found in, for example, paragraph 0227 of JP-A2013-29760, the disclosure of which is incorporated herein by reference.

Compounds containing at least one addition polymerizable ethylenically unsaturated group and having a boiling point of 100° C. or more under atmospheric pressure can be found in paragraphs 0254 to 0257 of JP-A2008-292970, the disclosure of which is incorporated herein by reference.

Among others, preferred photopolymerizable compounds include dipentaerythritol triacrylate (commercially available under the brand name KAYARAD D-330 from Nippon Kayaku Co., Ltd.), dipentaerythritol tetraacrylate (commercially available under the brand name KAYARAD D-320 from Nippon Kayaku Co., Ltd.), dipentaerythritol penta(meth)acrylate (commercially available under the brand name KAYARAD D-310 from Nippon Kayaku Co., Ltd.), dipentaerythritol hexa(meth)acrylate (commercially available under the brand name KAYARAD DPHA from Nippon Kayaku Co., Ltd.), and those structures in which the (meth)acryloyl has been introduced via an ethylene glycol or propylene glycol residue. Oligomers of these compounds can also be used. Preferred embodiments of polymerizable compounds are shown below.

The photopolymerizable compound may be a polyfunctional monomer containing an acid group such as a carboxyl group, sulfonic acid group, or phosphoric acid group. If the ethylenic compounds contain an unreacted carboxyl group as in the case of mixtures as described above, they can be used as they are, or if desired, a non-aromatic carboxylic anhydride may be reacted with a hydroxyl group of the ethylenic compounds to introduce an acid group. Specific examples of non-aromatic carboxylic anhydrides used in the latter case include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, the monomer containing an acid group is preferably a polyfunctional monomer consisting of an ester of an aliphatic polyhydroxy compound and an unsaturated carboxylic acid in which an acid group has been introduced by reacting a non-aromatic carboxylic anhydride with an unreacted hydroxyl group of the aliphatic polyhydroxy compound, and especially preferably the aliphatic polyhydroxy compound in the ester is pentaerythritol and/or dipentaerythritol. For example, polybasic acid-modified acrylic oligomers are commercially available from Toagosei Co., Ltd. under the brand names M-510, M-520, ARONIX 102349 and the like.

These monomers may be used alone or as a mixture of two or more of them because it is technically difficult to use a single compound. Further, a polyfunctional monomer not containing an acid group and a polyfunctional monomer containing an acid group may be used in combination as appropriate.

The polyfunctional monomer containing an acid group preferably has an acid number of 0.1 mg KOH/g to 40 mg KOH/g, especially preferably 5 mg KOH/g to 30 mg KOH/g. If the acid number of the polyfunctional monomer is too low, the solubility in developers decreases, but if it is too high, the monomer is difficult to prepare or handle and poor in photopolymerization performance, which results in low curability such as surface smoothness of pixels. Thus, when two or more polyfunctional monomers containing different acid groups are used in combination or when a polyfunctional monomer not containing an acid group is also used, it is preferable to control the total acid number of the all polyfunctional monomers within the ranges indicated above.

Another preferred embodiment comprises a polyfunctional monomer containing a caprolactone structure as a polymerizable monomer.

The polyfunctional monomer containing a caprolactone structure is not specifically limited so far as it contains a caprolactone structure in the molecule, but examples include ε-caprolactone-modified polyfunctional (meth)acrylates obtained by esterifying a polyhydric alcohol such as trimethylolethane, ditrimethylolethane, trimethylolpropane, ditrimethylolpropane, pentaerythritol, dipentaerythritol, tripentaerythritol, glycerin, diglycerol or trimethylol melamine with (meth)acrylic acid and ε-caprolactone. Among others, polyfunctional monomers containing a caprolactone structure represented by formula (Z-1) below are preferred.

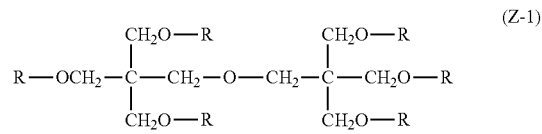

In formula (Z-1), all of the six R groups are a group represented by formula (Z-2) below, or one to five of the six R groups are a group represented by formula (Z-2) below, while the remainder are a group represented by formula (Z-3) below.

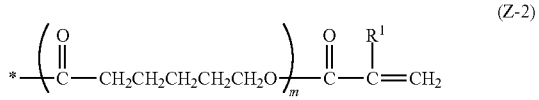
(Z-2)

In formula (Z-2), $R^1$ represents a hydrogen atom or methyl, m represents an integer of 1 or 2, and the asterisk "*" represents the point of attachment.

(Z-3)

In formula (Z-3), $R^1$ represents a hydrogen atom or methyl, and the asterisk "*" represents the point of attachment.

Such polyfunctional monomers containing a caprolactone structure are commercially available from, for example, Nippon Kayaku Co., Ltd. as KAYARAD DPCA series including DPCA-20 (a compound of formulae (1) to (3) above wherein m=1, the number of groups represented by formula (2) equals 2, and all of $R^1$ groups are a hydrogen atom), DPCA-30 (a compound of the same formulae wherein m=1, the number of groups represented by formula (2) equals 3, and all of $R^1$ groups are a hydrogen atom), DPCA-60 (a compound of the same formulae wherein m=1, the number of groups represented by formula (2) equals 6, and all of $R^1$ groups are a hydrogen atom), DPCA-120 (a compound of the same formulae wherein m=2, the number of groups represented by formula (2) equals 6, and all of $R^1$ groups are a hydrogen atom) and the like.

In the present invention, the polyfunctional monomers containing a caprolactone structure can be used alone or as a mixture of two or more of them.

Further, the specific monomer in the present invention is also preferably at least one member selected from compounds represented by formula (Z-4) or (Z-5) below.

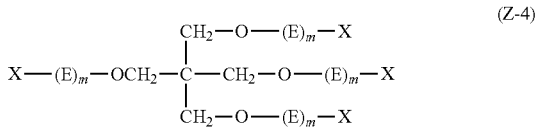
(Z-4)

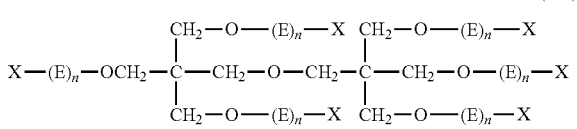
(Z-5)

In formulae (Z-4) and (Z-5), E each independently represents $-((CH_2)yCH_2O)-$ or $-((CH_2)yCH(CH_3)O)-$ wherein y each independently represents an integer of 0 to 10, X each independently represents an acryloyl group, a methacryloyl group, a hydrogen atom, or a carboxyl group.

In formula (Z-4), the total number of acryloyl and methacryloyl groups is three or four, m each independently represents an integer of 0 to 10, and the sum of m is an integer of 0 to 40 provided that when the sum of m is zero, any one of X is a carboxyl group. In formula (ii), the total number of acryloyl and methacryloyl groups is five or six, n each independently represents an integer of 0 to 10, and the sum of n is an integer of 0 to 60 provided that when the sum of n is zero, any one of X is a carboxyl group.

In formula (Z-4), m is preferably an integer of 0 to 6, more preferably an integer of 0 to 4.

Further, the sum of m is preferably an integer of 2 to 40, more preferably an integer of 2 to 16, especially preferably an integer of 4 to 8.

In formula (Z-5), n is preferably an integer of 0 to 6, more preferably an integer of 0 to 4.

Further, the sum of n is preferably an integer of 3 to 60, more preferably an integer of 3 to 24, especially preferably an integer of 6 to 12.

In preferred embodiments, $-((CH_2)yCH_2O)-$ or $-((CH_2)yCH(CH_3)O)-$ in formula (Z-4) or formula (Z-5) is attached to X at the oxygen end.

The compounds represented by formula (Z-4) or formula (Z-5) may be used alone or as a combination of two or more of them. Especially, preferred embodiments are compounds of formula (ii) wherein all of the six X groups are an acryloyl group.

Further, the total amount of the compounds represented by formula (Z-4) or formula (Z-5) contained in a photopolymerizable compound is preferably 20% by mass or more, more preferably 50% by mass or more.

The compounds represented by formula (Z-4) or formula (Z-5) can be synthesized by a previously known process comprising the steps of attaching a ring-opened skeleton to pentaerythritol or dipentaerythritol by a ring-opening addition reaction of ethylene oxide or propylene oxide; and reacting e.g., (meth)acryloyl chloride with the terminal hydroxyl group of the ring-opened skeleton to introduce a (meth)acryloyl group. Each step is well known, and the compounds represented by formula (i) or (ii) can readily be synthesized by those skilled in the art.

Among the compounds represented by formula (Z-4) or formula (Z-5), pentaerythritol derivatives and/or dipentaerythritol derivatives are more preferred.

Specifically, examples include the compounds represented by formulae (a) to (f) below (hereinafter also referred to as "exemplary compounds (a) to (f)"), among which exemplary compounds (a), (b), (e) and (f) are preferred.

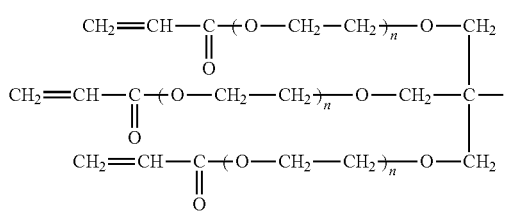
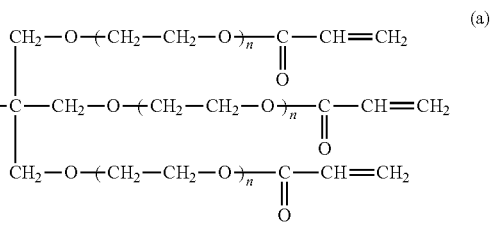
(a)

The total of each n is 6.

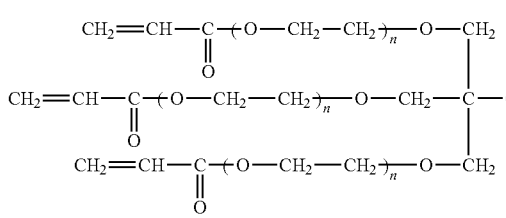 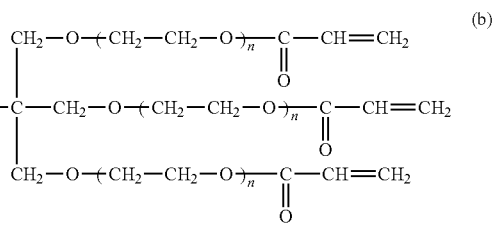
(b)
The total of each n is 12.
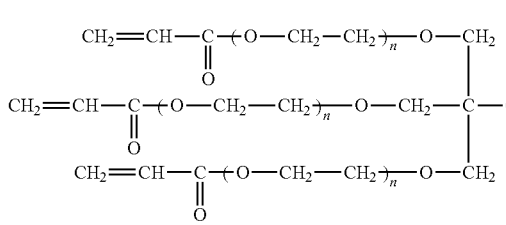 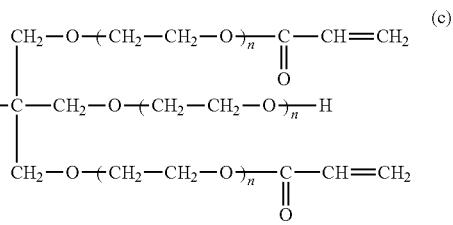
(c)
The total of each n is 12.
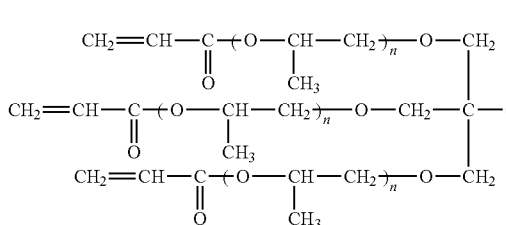 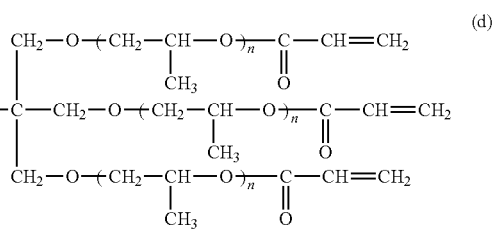
(d)
The total of each m is 6.
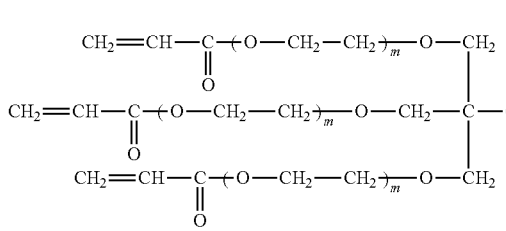 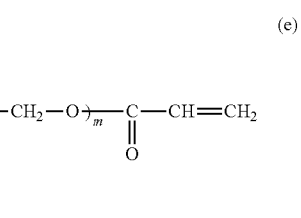
(e)
The total of each m is 4.
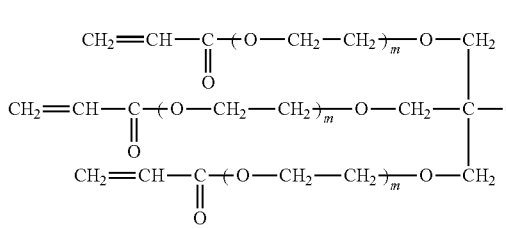
(f)
The total of each m is 12.

Commercially available photopolymerizable compounds represented by formulae (Z-4) and (Z-5) include, for example, a tetrafunctional acrylate containing four ethyleneoxy chains available from Sartomer as SR-494; a hexafunctional acrylate containing six pentyleneoxy chains and a trifunctional acrylate containing three isobutyleneoxy chains available from Nippon Kayaku Co., Ltd. as DPCA-60 and TPA-330, respectively; and the like.

Other preferred photopolymerizable compounds include urethane acrylates as described in JP-B-S48-41708, JP-A-S51-37193, JP-B-H2-32293 and JP-B-H2-16765; and the urethane compounds containing an ethylene oxide skeleton described in JP-B-S58-49860, JP-B-S56-17654, JP-B-S62-39417 and JP-B-S62-39418. Further, curable compositions having a very high exposure speed can be obtained by using the addition polymerizable compounds containing an amino structure or a sulfide structure in the molecule described in JP-A-S63-277653, JP-A-S63-260909 and JP-A-H1-105238 as photopolymerizable compounds.

Commercially available photopolymerizable compounds include the urethane oligomers UAS-10 and UAB-140 (from Sanyo Kokusaku Pulp Co., Ltd.), UA-7200 (from Shin-Nakamura Chemical Co., Ltd.), DPHA-40H (from Nippon Kayaku Co., Ltd.), UA-306H, UA-306T, UA-3061, AH-600, T-600, and AI-600 (from Kyoeisha Chemical Co., Ltd.) and the like.

Details of how to use these photopolymerizable compounds including their structure, whether they are to be used alone or in combination, the amount to be added and the like can be selected at will to suit the final performance design of the radiation-sensitive colored compositions. For example, preferred structures contain much unsaturated groups per molecule and often preferably have a functionality of two or more to improve sensitivity. To increase the strength of films of the radiation-sensitive colored compositions, compounds having a functionality of three or more are preferred, and both sensitivity and strength can be optimized by using compounds having different functionalities/different polymerizable groups (e.g., acrylic acid esters, methacrylic acid esters, styrene compounds, vinyl ether compounds) in combination. Further, photopolymerizable compounds having a functionality of three or more and different ethylene oxide chain lengths are preferably used in combination because the developability of the radiation-sensitive colored compositions can be optimized and excellent patternability can be achieved.

How to select/use a photopolymerizable compound is also an important factor for compatibility with other components contained in the radiation-sensitive colored compositions (e.g., photoinitiators, dispersed substances, alkali-soluble resins and the like) and dispersibility, and compatibility can be sometimes improved by using a low-purity compound or a combination of two or more compounds, for example. Further, a specific structure may be selected to improve adhesion to hard surfaces such as supports.

Preferably, the amount of the photopolymerizable compound contained in the radiation-sensitive colored compositions of the present invention is 0.1% by mass to 90% by mass, more preferably 1.0% by mass to 50% by mass, especially preferably 2.0% by mass to 30% by mass, relative to the total solids of the radiation-sensitive colored compositions.

[Photoinitiator]

The radiation-sensitive colored compositions of the present invention should also necessarily comprise a photoinitiator to further improve sensitivity.

The photoinitiator is not specifically limited so far as it has the ability to initiate the polymerization of photopolymerizable compounds, and it can be appropriately selected from known photoinitiators. For example, it is preferably sensitive to radiations from UV to visible regions. Further, it may be an activator producing some reaction with a photoexcited sensitizer to generate active radicals or an initiator functioning to initiate cationic polymerization depending on the type of monomer.

The photoinitiator preferably contains at least one compound having a molecular absorption coefficient of at least about 50 in the range of about 300 nm to 800 nm (more preferably 330 nm to 500 nm).

Photoinitiators include, for example, halogenated hydrocarbon derivatives (e.g., those having a triazine skeleton, those having an oxadiazole skeleton, and the like), acyl phosphine compounds such as acyl phosphine oxide, hexaaryl biimidazole, oxime compounds such as oxime derivatives, organic peroxides, thio compounds, ketone compounds, aromatic onium salts, ketoxime ethers, aminoacetophenone compounds, hydroxyacetophenone and the like.

To improve sensitivity to exposure, preferred compounds are selected from the group consisting of trihalomethyl triazine compounds, benzyl dimethyl ketal compounds, α-hydroxyketone compounds, α-aminoketone compounds, acyl phosphine compounds, phosphine oxide compounds, metallocene compounds, oxime compounds, triaryl imidazole dimers, onium compounds, benzothiazole compounds, benzophenone compounds, acetophenone compounds and derivatives thereof, cyclopentadiene-benzene-iron complexes and salts thereof, halomethyl oxadiazole compounds, and 3-aryl-substituted coumarin compounds Especially when the radiation-sensitive colored compositions of the present invention are used to prepare color filters for solid-state image sensors, it is important that they should be not only readily curable but also developable without leaving residues in unexposed regions because well-defined micropatterns must be formed. In this respect, oxime compounds are especially preferred for use as polymerization initiators. Especially when micropatterns are to be formed in solid-state image sensors, stepper exposure systems are used for curing but such exposure systems may be damaged by halogens and the amount of polymerization initiators added must be reduced, which leads to the conclusion that oxime compounds are especially preferred for use as photoinitiators (C) to form micropatterns as in solid-state image sensors.

Specific examples of photoinitiators used in the present invention can be found in, for example, paragraphs 0265 to 0268 of JP-A2013-29760, the disclosure of which is incorporated herein by reference.

Hydroxyacetophenone compounds, aminoacetophenone compounds, and acyl phosphine compounds can also be suitably used as photoinitiators. More specifically, for example, the aminoacetophenone initiators described in JP-A-H10-291969 and the acyl phosphine oxide initiators described in Japanese Patent No. 4225898 can also be used.

Hydroxyacetophenone initiators that can be used include IRGACURE-184, DAROCUR-1173, IRGACURE-500, IRGACURE-2959 and IRGACURE-127 (all brand names from BASF). Aminoacetophenone initiators that can be used include commercially available products IRGACURE-907, IRGACURE-369, and IRGACURE-379 (all brand names from BASF). Other aminoacetophenone initiators that can be used include the compounds having an absorption wavelength matched to a source of long wave radiation such as 365 nm or 405 nm described in JP-A2009-191179.

Acyl phosphine initiators that can be used include commercially available products IRGACURE-819 and DAROCUR-TPO (both brand names from BASF).

More preferred photoinitiators are oxime compounds. Specific examples of oxime initiators that can be used include the compounds described in JP-A2001-233842, the compounds described in JP-A2000-80068, and the compounds described in JP-A2006-342166.

Oxime compounds such as oxime derivatives suitably used as photoinitiators in the present invention include, for example, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one and the like.

Oxime ester compounds include the compounds described in J.C.S. Perkin II (1979) pp. 1653-1660, J.C.S. Perkin II (1979) pp. 156-162, Journal of Photopolymer Science and Technology (1995) pp. 202-232 and JP-A2000-66385; the compounds described in JP-A2000-80068, JP-A2004-534797, and JP-A2006-342166 and the like.

Commercially available products such as IRGACURE-OXE01 (from BASF) and IRGACURE-OXE02 (from BASF) can also be suitably used.

Oxime ester compounds other than those described above that may be used include the compounds having an oxime attached to the nitrogen atom of a carbazole described in JP-A2009-519904; the compounds containing a hetero substituent in a benzophenone moiety described in U.S. Pat. No. 7,626,957; the compounds containing a nitro group in a dye moiety described in JP-A2010-15025 and US Patent Application Publication No. 2009/292039; the ketoxime compounds described in WO2009/131189; the compounds containing a triazine skeleton and an oxime skeleton in the same molecule described in U.S. Pat. No. 7,556,910; the compounds having a maximum absorption at 405 nm and also having good sensitivity to g-line sources described in JP-A2009-221114, and the like.

Preferably, suitable compounds can be found in paragraphs 0274 to 0275 of JP-A2013-29760, the disclosure of which is incorporated herein by reference.

Specifically, a preferred oxime polymerization initiator is a compound represented by formula (OX-1) below. It should be noted that the oxime compound may exist as an (E)-isomer or a (Z)-isomer or a mixture of (E)- and (Z)-isomers depending on the geometry of the nitrogen-oxygen bond of the oxime.

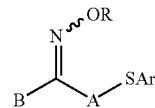

(OX-1)

In formula (OX-1), R and B each independently represent a monovalent substituent, A represents a divalent organic group, and Ar represents an aryl group.

Such oxime initiators can be found in the explanation of the compound represented by formula (OX-1), (OX-2) or (OX-3) in paragraph 0513 of JP-A2012-208494 (or [0632] of the corresponding US Patent Application Publication No. 2012/235099) et seq., the disclosure of which is incorporated herein by reference.

Specific examples (C-4) to (C-13) of oxime compounds that are suitably used are shown below, but the present invention is not limited to these examples.

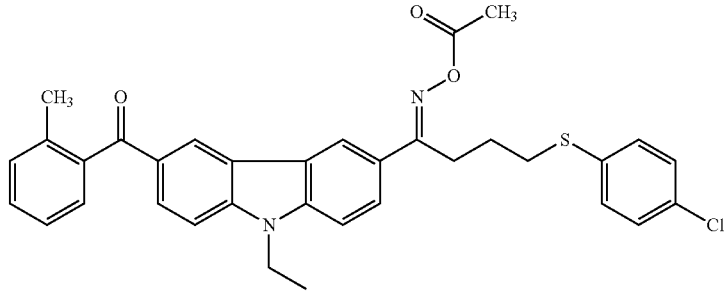

(C-4)

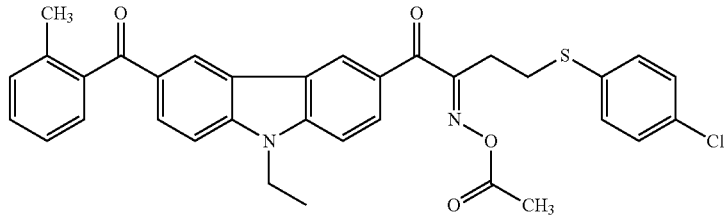

(C-5)

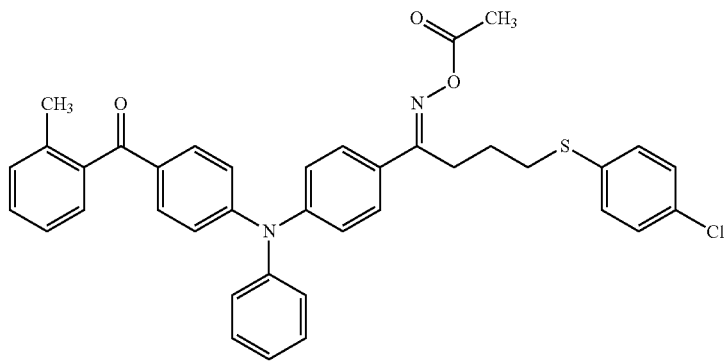

(C-6)

-continued
(C-7)
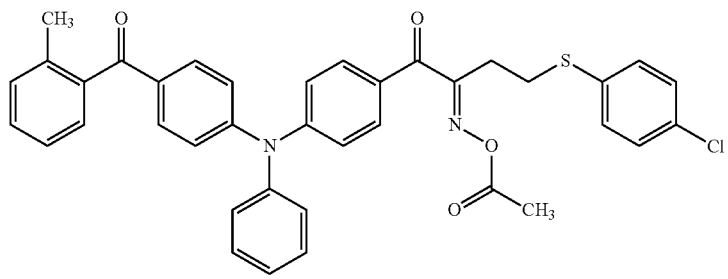
(C-8)
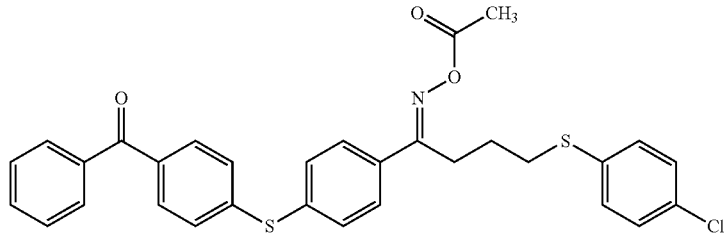
(C-9)
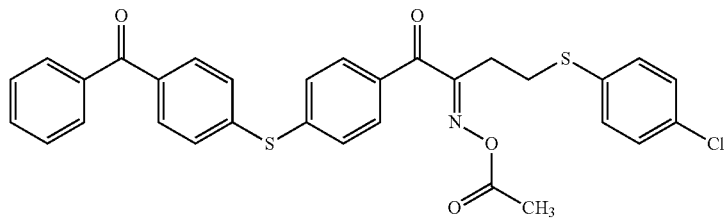
(C-10)
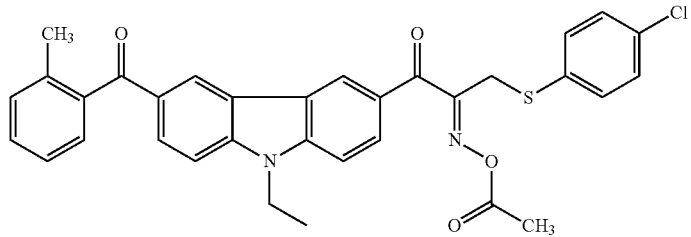
(C-11)
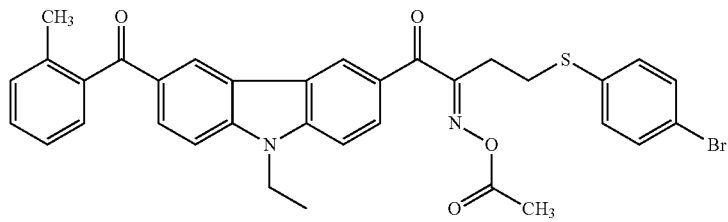
(C-12)
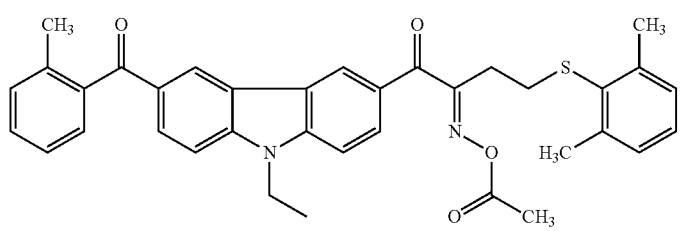

-continued

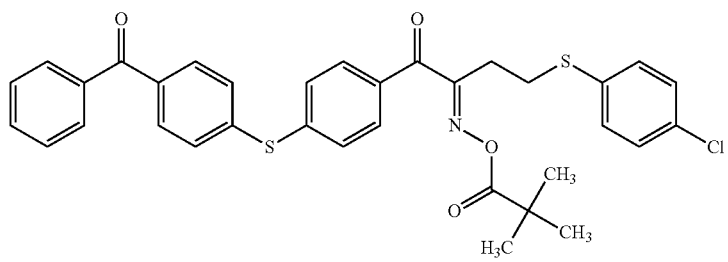

(C-13)

The oxime compound has a maximum absorption in a wavelength region of 350 nm to 500 nm, preferably has an absorption in a wavelength region of 360 nm to 480 nm, especially preferably has a high absorbance at 365 nm and 455 nm.

The oxime compound preferably has a molar absorption coefficient of 1,000 to 300,000, more preferably 2,000 to 300,000, especially preferably 5,000 to 200,000 at 365 nm or 405 nm to improve sensitivity.

The molar absorption coefficient of a compound can be determined by known methods, and specifically, it is preferably determined at a concentration of 0.01 g/L in ethyl acetate as a solvent by using an ultraviolet-visible spectrophotometer (Carry-5 spectrophotometer from Varian), for example.

The photoinitiators used in the present invention may be used as a combination of two or more of them, if desired.

The amount of the photoinitiators (C) contained in the radiation-sensitive colored compositions of the present invention is preferably 0.1% by mass or more and 50% by mass or less, more preferably 0.5% by mass or more and 30% by mass or less, even more preferably 1% by mass or more and 20% by mass or less, relative to the total solids of the radiation-sensitive colored compositions. When it is in the ranges indicated above, good sensitivity and patternability can be achieved.

[Alkali-Soluble Resin]

The radiation-sensitive colored compositions of the present invention may comprise an alkali-soluble resin.

The alkali-soluble resin can be appropriately selected from alkali-soluble resins consisting of a high-molecular weight organic linear polymer containing at least one alkali solubility-promoting group in the molecule (preferably, a molecule comprising an acrylic copolymer or a styrene copolymer as the main chain). Preferred examples are polyhydroxystyrene resins, polysiloxane resins, acrylic resins, acrylamide resins, and acrylic/acrylamide copolymer resins to improve heat resistance, while acrylic resins, acrylamide resins, and acrylic/acrylamide copolymer resins are preferred for optimizing developability.

Alkali solubility-promoting groups (hereinafter also referred to as "acid groups") include, for example, carboxyl, phosphoric acid, sulfonic acid, phenolic hydroxyl and the like, preferably those soluble in solvents and developable with aqueous weakly alkaline solutions, especially preferably (meth)acrylic acid. Only one or more than one of these acid groups may be contained.

Monomers capable of providing an acid group after polymerization include, for example, hydroxyl-containing monomers such as 2-hydroxyethyl (meth)acrylate; epoxy-containing monomers such as glycidyl (meth)acrylate; isocyanate-containing monomers such as 2-isocyanatoethyl (meth)acrylate; and the like. These monomers for introducing an acid group may be used alone or as a combination of two or more of them. To introduce an acid group into an alkali-soluble resin, a monomer containing the acid group and/or a monomer capable of providing the acid group after polymerization (hereinafter sometimes referred to as a "monomer for introducing an acid group") may be used as a monomer component and polymerized, for example.

It should be noted that when a monomer capable of providing an acid group after polymerization is used as a monomer component to introduce the acid group, a treatment for providing the acid group as described herein later, for example, is needed after polymerization.

For preparing the alkali-soluble resin, known processes based on radical polymerization can be applied, for example. Various polymerization conditions for preparing the alkali-soluble resin by radical polymerization such as temperature, pressure, the type and the amount of the radical initiator, the type of the solvent and the like can be readily determined by those skilled in the art or can be experimentally determined.

High-molecular weight organic linear polymers used as alkali-soluble resins are preferably polymers containing a carboxylic acid in the side chain, e.g., methacrylic acid copolymers, acrylic acid copolymers, itaconic acid copolymers, crotonic acid copolymers, maleic acid copolymers, partially esterified maleic acid copolymers, alkali-soluble phenol resins such as Novolac resins and the like; as well as acidic cellulose derivatives containing a carboxylic acid in the side chain, and acid anhydride adducts of hydroxyl-containing polymers.

Especially, preferred alkali-soluble resins are copolymers of (meth)acrylic acid and other monomers polymerizable therewith. The other monomers polymerizable with (meth)acrylic acid include alkyl (meth)acrylates, aryl (meth)acrylates, vinyl compounds and the like. Alkyl (meth)acrylates and aryl (meth)acrylates include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate and the like; vinyl compounds include styrene, α-methylstyrene, vinyl toluene, glycidyl methacrylate, acrylonitrile, vinyl acetate, N-vinylpyrrolidone, tetrahydrofurfuryl methacrylate, polystyrene macromonomers, polymethyl methacrylate macromonomers and the like; and N-substituted maleimide monomers described in JP-A-H10-300922 include N-phenylmaleimide, N-cyclohexylmaleimide and the like. It should be noted that these other monomers polymerizable with (meth)acrylic acid may be used alone or as a combination of two or more of them.

The alkali-soluble resin also preferably comprises (a) a polymer obtained by polymerizing a monomer component essentially based on a compound represented by formula (ED) below (hereinafter sometimes referred to as "ether dimer").

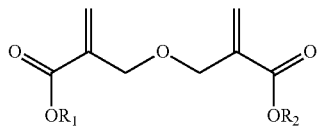

Formula (ED)

In formula (ED), $R^1$ and $R^2$ each independently represent a hydrogen atom or an optionally substituted C1-25 hydrocarbon group.

This allows the radiation-sensitive colored compositions of the present invention to form a cured coating film having very excellent heat resistance and transparency. In formula (1) representing an ether dimer, the optionally substituted C1-25 hydrocarbon group represented by $R^1$ and $R^2$ is not specifically limited, but includes, for example, a straight-chain or branched alkyl group such as methyl, ethyl, n-propyl, isopropyl, n-butyl, isobutyl, t-butyl, t-amyl, stearyl, lauryl, or 2-ethylhexyl; an aryl group such as phenyl; an alicyclic group such as cyclohexyl, t-butylcyclohexyl, dicyclopentadienyl, tricyclodecanyl, isobornyl, adamantyl, or 2-methyl-2-adamantyl; an alkoxy-substituted alkyl group such as 1-methoxyethyl, or 1-ethoxyethyl; an aryl-substituted-alkyl group such as benzyl; or the like. Among them, especially preferred are substituents on the primary or secondary carbon such as methyl, ethyl, cyclohexyl and benzyl to improve heat resistance because they are hard to eliminate by acids or heating.

Specific examples of ether dimers can be found in, for example, paragraph 0317 of JP-A2013-29760, the disclosure of which is incorporated herein by reference. Only one or more than one ether dimer may be used. Structures derived from the compound represented by formula (ED) may be copolymerized with other monomers.

To improve the crosslinking efficiency of the radiation-sensitive colored compositions according to the present invention, an alkali-soluble resin containing a polymerizable group may be used. Useful alkali-soluble resins containing a polymerizable group are alkali-soluble resins containing an allyl, (meth)acryl or allyloxyalkyl group or the like in the side chain and the like. Examples of polymers containing a polymerizable group as described above can be found in, for example, paragraph 0318 of JP-A2013-29760, the disclosure of which is incorporated herein by reference.

Especially preferred alkali-soluble resins are benzyl (meth)acrylate/(meth)acrylic acid copolymers and multi-component copolymers composed of benzyl (meth)acrylate/(meth)acrylic acid/other monomers. Other examples include 2-hydroxyethyl methacrylate copolymers; the 2-hydroxypropyl (meth)acrylate/polystyrene macromonomer/benzyl methacrylate/methacrylic acid copolymers, 2-hydroxy-3-phenoxypropyl acrylate/polymethyl methacrylate macromonomer/benzyl methacrylate/methacrylic acid copolymers, 2-hydroxyethyl methacrylate/polystyrene macromonomer/methyl methacrylate/methacrylic acid copolymers, and 2-hydroxyethyl methacrylate/polystyrene macromonomer/benzyl methacrylate/methacrylic acid copolymers described in JP-A-H7-140654; and the like, especially preferably benzyl methacrylate/methacrylic acid copolymers and the like.

Preferably, the alkali-soluble resin has an acid number of 30 mg KOH/g to 200 mg KOH/g, more preferably 50 mg KOH/g to 150 mg KOH/g, especially preferably 70 mg KOH/g to 120 mg KOH/g.

Further, the alkali-soluble resin preferably has a weight average molecular weight (Mw) of 2,000 to 50,000, more preferably 5,000 to 30,000, especially preferably 7,000 to 20,000.

Preferably, the amount of the alkali-soluble resin contained in the radiation-sensitive colored compositions is 1% by mass to 15% by mass, more preferably 2% by mass to 12% by mass, especially preferably 3% by mass to 10% by mass, relative to the total solids of the radiation-sensitive colored compositions.

It should be noted that the mass ratio of the photopolymerizable compound (B) to the alkali-soluble resin is preferably 0.8 to 4.0, more preferably 1.0 to 3.0. When it is in the ranges indicated above, adhesion to substrates at their periphery and the surface roughness of the resulting color filter improve.

[Other Components]

In addition to the components described above, the radiation-sensitive colored compositions of the present invention may further comprise other components such as organic solvents, crosslinking agents and the like so far as the advantages of the present invention are not adversely affected.

(Organic Solvent)

The radiation-sensitive colored compositions of the present invention may comprise an organic solvent.

Basically, the organic solvent is not specifically limited so far as it can satisfy the solubility of various components in it and the coatability of the radiation-sensitive colored compositions, but it is preferably selected taking into consideration especially the solubility of UV absorbers, alkali-soluble resins, dispersants and the like, coatability and safety. Further, at least two organic solvents are preferably contained for preparing the radiation-sensitive colored compositions according to the present invention.

Organic solvents include esters such as 3-oxypropionic acid alkyl esters and 2-oxypropionic acid alkyl esters; ethers; ketones; aromatic hydrocarbons; and the like.

Specific examples of organic solvents can be found in, for example, paragraph 0324 of JP-A2013-29760, the disclosure of which is incorporated herein by reference.

Two or more of these organic solvent are also preferably mixed to improve the solubility of UV absorbers and alkali-soluble resins, the profile of coated surfaces or the like. In this case, especially preferred are mixed solutions composed of two or more members selected from the solvents mentioned above, i.e., methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

The amount of the organic solvents contained in the radiation-sensitive colored compositions is preferably such that the total solids content of the compositions may be 5% by mass to 80% by mass, more preferably 5% by mass to 60% by mass, especially preferably 10% by mass to 50% by mass to improve coatability.

(Crosslinking Agent)

Further, a crosslinking agent can supplementarily be used in the radiation-sensitive colored compositions of the present invention to further increase the hardness of cured colored films obtained by curing the radiation-sensitive colored compositions. The crosslinking agent is not specifically limited so far as it allows films to be cured by a crosslinking reaction, and examples include (a) epoxy resins, (b) melamine compounds, guanamine compounds, glycoluril compounds or urea compounds substituted by at least one substituent selected from methylol, alkoxymethyl and acyloxymethyl, (c) phenol compounds, naphthol compounds or hydroxyanthracene compounds substituted by at least one substituent selected from methylol, alkoxymethyl and acyloxymethyl. Among others, preferred are polyfunctional epoxy resins.

Details of crosslinking agents including specific examples and the like can be found in paragraphs 0134 to 0147 of JP-A2004-295116, the disclosure of which is incorporated herein by reference.

(Polymerization Inhibitor)

The radiation-sensitive colored compositions of the present invention should desirably contain a small amount of a polymerization inhibitor to prevent undesired thermal polymerization of photopolymerizable compounds during the preparation or storage of the radiation-sensitive colored compositions.

Polymerization inhibitors that can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerous salt and the like. The amount of the polymerization inhibitors contained is preferably about 0.01% by mass to about 5% by mass based on the total mass of the compositions.

(Other Additives)

The radiation-sensitive colored compositions may optionally contain various additives such as fillers, adhesion promoters, antioxidants, UV absorbers, deflocculating agents and the like. These additives include those described in paragraphs 0155 to 0156 of JP-A2004-295116.

The radiation-sensitive colored compositions of the present invention can contain the sensitizers and photostabilizers described in paragraph 0078 of JP-A2004-295116 and the thermal polymerization inhibitors described in ibid., paragraph 0081.

(Organic Carboxylic Acids and Organic Carboxylic Anhydrides)

The radiation-sensitive colored compositions of the present invention may contain an organic carboxylic acid and/or an organic carboxylic anhydride having a molecular weight of 1000 or less. Specific examples of organic carboxylic acids and organic carboxylic anhydrides can be found in, for example, paragraphs 0338 to 0340 of JP-A2013-29760, the disclosure of which is incorporated herein by reference.

[Processes for Preparing the Radiation-Sensitive Colored Compositions]

The radiation-sensitive colored compositions of the present invention are prepared by mixing the components described above. For preparing the radiation-sensitive colored compositions, various components constituting the radiation-sensitive colored compositions may be added at once, or various components may be each dissolved/dispersed in a solvent and then sequentially added. The order of addition and operating conditions are not specifically limited. For example, all components may be dissolved/dispersed in a solvent at once to prepare a composition, or if desired, two or more solutions/dispersions may be appropriately prepared from various components and mixed immediately before use (before coating) to prepare a composition. The radiation-sensitive colored compositions of the present invention are preferably filtered through a filter for the purpose of removing impurities or reducing defects or for other purposes. Any conventional filters used for filtration purposes and the like can be used without any specific limitation. For example, they include filters made of fluororesins such as PTFE (polytetrafluoroethylene); polyamide resins such as nylon-6, and nylon-6,6; polyolefin resins (including high density and ultrahigh molecular weight polyolefins) such as polyethylene, and polypropylene (PP); etc. Among these materials, polypropylene (including high density polypropylene) is preferred.

The pore size of the filter is suitably about 0.01 to 7.0 μm, preferably about 0.01 to 3.0 μm, more preferably about 0.05 to 0.5 μm. When it is in the ranges indicated above, small impurities that would interfere with the preparation of a homogeneous and smooth radiation-sensitive colored composition in subsequent steps can be removed more surely.

Different filters may be used in combination. In this case, the filtration through a first filter may take place once or twice or more.

Further, first filters having different pore sizes in the ranges indicated above may be combined. The pore size herein can be selected by referring to nominal values specified by filter manufacturers. Commercially available filters can be selected from various filters supplied by, for example, Nihon Pall Ltd., Advantec Toyo Kaisha, Ltd., Entegris Japan Co., Ltd. (former Nihon Mykrolis K.K.), KITZ MICRO FILTER CORPORATION and the like. A second filter formed from a material similar to those described for the first filter above or the like can be used.

For example, a dispersion alone may be filtered through a first filter, followed by a second filtration after the other components have been mixed.

The radiation-sensitive colored compositions of the present invention can form cured colored films having improved adhesion to substrates and good surface roughness so that they can be conveniently used for forming colored layers in color filters. The radiation-sensitive colored compositions of the present invention can also be conveniently used for forming colored patterns in color filters and the like used for image display devices such as solid-state image sensors (e.g., CCD, CMOS and the like) or liquid crystal display devices (LCDs). Further, they can also be conveniently used for preparing inks for printing, inks for inkjet printing and paints and the like. Especially, they can be conveniently used for preparing color filters for solid-state image sensors such as CCD and CMOS.

<Cured Colored Films, Patterning Processes, Color Filters and Processes for Preparing the Color Filters>

Next, the cured colored films, patterning processes and color filters according to the present invention are explained in detail below with reference to processes for preparing them.

Processes for preparing the color filters of the present invention involve applying a patterning process of the present invention and are characterized by comprising the steps of applying a curable colored composition of the present invention on a substrate to form a colored layer; exposing the colored layer in a pattern to cure the exposed regions; and developing uncured regions in the exposed colored layer to remove them, thereby forming a colored pattern.

The patterning processes of the present invention can be suitably applied to form colored layers (pixels) of color filters.

The support on which a pattern is formed by the patterning processes of the present invention is not specifically limited to a plate such as a substrate so far as it can be applied for patterning. Various steps of the patterning processes of the present invention are explained in detail below with reference to a method for manufacturing a color filter for solid-state image sensors, but the present invention is not limited to this process.

A method for manufacturing a color filter according to the present invention involves applying a patterning process of the present invention and comprises the step of forming a colored pattern on a support using the patterning process of the present invention.

Thus, the method for manufacturing a color filter according to the present invention comprises the steps of applying a photosensitive colored composition of the present invention on a support to form a colored layer; exposing the colored layer in a pattern to cure the exposed regions; and developing uncured regions in the exposed colored layer to remove them, thereby forming a colored pattern. Further, it may optionally comprise the step of baking the colored layer (prebaking step) and the step of baking the developed colored layer (postbaking step). These steps are hereinafter sometimes collectively referred to as "patterning step".

The color filters of the present invention can be suitably obtained by the preparation process described above.

The color filter for solid-state image sensors is hereinafter sometimes simply referred to as "color filter".

[The Step of Forming a Colored Layer]

In the step of forming a colored layer, a radiation-sensitive colored composition of the present invention is applied on a support to form a colored layer.

The support that can be used in this step is, for example, a substrate (e.g., silicon substrate) for solid-state image sensors on which image sensors (photodetectors) such as CCDs (Charge Coupled Devices) or CMOSs (Complementary Metal-Oxide Semiconductors) are mounted.

The colored pattern in the present invention may be formed on the side of the substrate for solid-state image sensors bearing the image sensors (front side) or the side not bearing the image sensors (backside).

A light-shielding film may be provided between colored patterns in the image sensors or on the backside of the substrate for solid-state image sensors.

Further, a primer layer may be provided on the support to improve adhesion to the overlying layers or to prevent diffusion of substances or to flatten the surface of the substrate, if desired.

The radiation-sensitive colored composition of the present invention can be applied on the support by various coating techniques such as slot-die coating, inkjet coating, spin coating, flow coating, roll coating, and screen printing, more preferably slot-die coating and spin coating.

The radiation-sensitive colored composition layer applied on the support can be dried (prebaked) by using a hot plate, oven or the like at a temperature of 50° C. to 140° C. for 10 seconds to 300 seconds.

[Exposure Step]

In the exposure step, the colored layer formed during the step of forming a colored layer is exposed in a pattern through a mask having a predetermined mask pattern using an exposure system such as a stepper, for example. Thus, a cured colored film consisting of a cured radiation-sensitive colored composition of the present invention can be obtained.

Radiations (light) that can be used for exposure especially preferably include ultraviolet rays such as g-line and i-line (especially preferably i-line). The radiation dose (exposure does) is preferably 30 mJ/cm$^2$ to 1500 mJ/cm$^2$, more preferably 50 mJ/cm$^2$ to 1000 mJ/cm$^2$, especially preferably 80 mJ/cm$^2$ to 500 mJ/cm$^2$.

The cured colored film preferably has a thickness of 1.5 μm or less, more preferably 0.2 to 1.5 μm, even more preferably 0.35 to 1.10 μm, especially preferably 0.50 to 0.90 μm.

The thickness is preferably 1.5 μm or less because high resolution and high adhesion can be achieved.

[Patterning Step]

Then, a treatment with an alkaline developer takes place, whereby the regions of the colored layer unirradiated during the exposure step dissolve in the aqueous alkaline solution while only photocured regions remain.

The developer is desirably an organic alkaline developer that is harmless to the underlying image sensors or circuits or the like. The developing temperature is typically 20° C. to 30° C., and the developing period was conventionally 20 seconds to 90 seconds.

To further remove residues, the developing period may recently last for 120 seconds to 180 seconds. Alternatively, the step of removing the developer by spinning every 60 seconds and freshly supplying the developer may be repeated several times to further improve removal of residues.

Alkaline agents used in the developer include, for example, organic alkaline compounds such as aqueous ammonia, ethylamine, diethylamine, dimethylethanolamine, tetramethylammonium hydroxide, tetraethylammonium hydroxide, corrin, pyrrole, piperidine, and 1,8-diazabicyclo-[5,4,0]-7-undecene, and an aqueous alkaline solution of these alkaline agents diluted with pure water to a concentration of 0.001% by mass to 10% by mass, preferably 0.01% by mass to 1% by mass is preferably used as the developer.

Inorganic alkaline agents may also be used in the developer, and they preferably include, for example, sodium hydroxide, potassium hydroxide, sodium carbonate, sodium hydrogen carbonate, sodium silicate, sodium metasilicate and the like.

When such an aqueous alkaline solution is used as a developer, development is typically followed by rinsing with pure water.

This is preferably followed by drying and then a heat treatment (postbaking). If a multicolored pattern is to be formed, a cured film can be prepared by sequentially repeating the steps described above for each color. This gives a color filter.

Postbaking is a post-development heat treatment to complete curing, and involves a thermal curing treatment typically at 100° C. to 240° C., preferably 200° C. to 240° C.

This postbaking treatment can be performed on the developed coated layer by a continuous or batch process using a heating means such as a hot plate, a convection oven (hot air circulation dryer) or a high-frequency heater under the conditions described above.

In addition to the steps described above, the preparation process of the present invention may optionally comprise other steps known for preparation processes of color filters for solid-state image sensors. For example, the process may optionally comprise the step of curing the formed colored pattern by heating and/or exposure after the step of forming a colored layer, exposure step, and patterning step.

When the radiation-sensitive colored compositions of the present invention are used, ejector nozzles of coaters or pipes may be clogged or the radiation-sensitive colored compositions or pigments may be deposited/precipitated/ dried in coaters to cause contamination or the like, for example. To efficiently wash out contaminants caused by the radiation-sensitive colored compositions of the present invention, the solvents mentioned above for the compositions are preferably used as cleaning solutions. Further information can be found in, for example, paragraph 0358 of JP-A2013-29760, the disclosure of which is incorporated herein by reference.

Among them, alkylene glycol monoalkyl ether carboxylate and alkylene glycol monoalkyl ether are preferred.

These solvents may be used alone or as a mixture of two or more of them. When two or more solvents are mixed, a solvent containing a hydroxyl group and a solvent not containing a hydroxyl group are preferably mixed. The mass ratio of the solvent containing a hydroxyl group and the solvent not containing a hydroxyl group is 1/99 to 99/1, preferably 10/90 to 90/10, more preferably 20/80 to 80/20. A mixed solvent of propylene glycol monomethyl ether acetate (PGMEA) and propylene glycol monomethyl ether (PGME) at a ratio of 60/40 is especially preferred. To improve the penetration of the cleaning solution into contaminants, the cleaning solution may contain the surfactants mentioned above for the compositions.

The color filters for solid-state image sensors of the present invention employ the radiation-sensitive colored compositions of the present invention so that they exhibit less peel-off defects and less residue defects and high linearity of colored patterns. The color filters for solid-state image sensors of the present invention can be conveniently used in solid-state image sensors such as CCDs and CMOSs, especially suitably for high resolution CCDs and CMOSs containing more than a million pixels and the like. The color filters for solid-state image sensors of the present invention can be used as, for example, color filters placed between the light-capturing part of each pixel constituting a CCD or CMOS and a microlens for focusing light.

The film thickness of a colored pattern (colored pixel) in the color filters for solid-state image sensors is preferably 1.5 μm or less, more preferably 0.2 to 1.5 μm, even more preferably 0.2 to 1.2 μm.

Further, the size (pattern width) of a colored pattern (colored pixel) is preferably 2.5 μm or less, more preferably 2.0 μm or less, especially preferably 1.7 μm or less.

<Solid-State Image Sensors>

The solid-state image sensors according to the present invention comprise a color filter for solid-state image sensors of the present invention as described above. The architecture of the solid-state image sensors according to the present invention is not specifically limited so far as it comprises a color filter for solid-state image sensors of the present invention and functions as a solid-state image sensor, but specifically designed as follows, for example.

An architecture is designed to comprise a plurality of photodiodes each constituting a light-capturing area of a solid-state image sensor (CCD image sensor, CMOS image sensor or the like) and transfer electrodes made of polysilicon or the like on a support; a light-shielding film made of tungsten or the like provided on the photodiodes and the transfer electrodes and having an aperture only at the light-capturing part of each photodiode; a device-protecting film made of silicon nitride or the like formed on the light-shielding film to cover the entire surface of the light-shielding film and the light-capturing part of each photodiode; and a color filter for solid-state image sensors of the present invention on the device-protecting film.

Further, the architecture may be designed to comprise a light-focusing means (e.g., a microlens or the like; same as below) on the device-protecting layer and under the color filter (on the side near the support) or a light-focusing means on the color filter or the like.

<Image Display Devices>

The color filters of the present invention can be used in not only solid-state image sensors but also image display devices such as liquid crystal display devices and organic EL devices, and they are especially suitable for applications to liquid crystal display devices.

When they are used in liquid crystal display devices, the orientation of liquid crystal molecules is less affected by resistivity loss and high-quality images with good hue can be displayed while metal complex dyes having excellent spectroscopic properties and heat resistance are contained as colorants. Thus, liquid crystal display devices incorporating the color filters of the present invention allow high-quality images to be displayed with good hue.

The definition of display devices and details of each type of display device can be found in, for example, paragraph 0364 of JP-A2013-29760, the disclosure of which is incorporated herein by reference.

The color filters of the present invention may also be used in color TFT liquid crystal display devices. Color TFT liquid crystal display devices are described in, for example, "Color TFT Liquid Crystal Displays (KYORITSU SHUPPAN CO., LTD., 1996)". The present invention can also be applied to wide viewing angle liquid crystal display devices such as In-Plane Switching (IPS) or Halftone-Grayscale Method including MVA as well as STN, TN, VA, OCS, FFS, and R-OCB and the like.

Further, the color filters of the present invention can also be applied to high-brightness and high-definition displays based on the COA (Color-filter On Array) technology. For example, relevant information can be found in paragraph 0365 of JP-A2013-29760, the disclosure of which is incorporated herein by reference.

In addition to the color filters of the present invention, the liquid crystal display devices incorporating the color filters of the present invention further comprise various components such as an electrode substrate, polarizing films, retardation films, a backlight, spacers, and viewing angle compensation films. The color filters of the present invention can be applied to liquid crystal display devices composed of these known components. Information about these components can be found in, for example, paragraph 0366 of JP-A2013-29760, the disclosure of which is incorporated herein by reference.

Liquid crystal display devices using the color filters of the present invention can achieve high contrast when they are combined with a conventionally known three-wavelength cold cathode tube, and they can further provide liquid crystal display devices with high luminance, high color purity and good color reproducibility when red, green and blue LED light sources (RGB-LEDs) are used as a backlight.

EXAMPLES

The following examples further illustrate the present invention, but the present invention is not limited to these examples and changes may be made without departing from the spirit of the invention. Unless otherwise specified, "parts" and "%" are based on mass.

Synthesis of Dyestuffs a, b and c

Synthesis Example 1

Dyestuff a (dye monomer M1) was obtained according to the method described in paragraphs 0413 to 0423 of JP-A2012-158739.

Synthesis Example 2

A mixed solution of 50 g of dyestuff a, 3.67 g of methacrylic acid, 1.05 g of dodecanethiol, 4.78 g of a polymerization initiator (V-601 from Wako Pure Chemical Industries, Ltd.), and 50 g of cyclohexanone was prepared. Separately, a reaction vessel was charged with 50 g of dyestuff a, 3.67 g of methacrylic acid, 1.05 g of dodecanethiol, and 50 g of cyclohexanone and stirred at 80° C. under nitrogen flow. To this was added the prepared mixed solution dropwise over 1 hour, and the mixture was stirred for 3 hours, and then the reaction was stopped. After cooling to room temperature, a mixed solution of the resulting reaction solution and 1038 mL of methanol was added dropwise to 6200 mL of acetonitrile over 20 minutes, and the mixture was stirred for 10 minutes. The resulting precipitate was filtered, and then dried to give 70 g of a dye multimer designated as dyestuff b. Dyestuff b had a weight average molecular weight (Mw) of 6,000 as determined by GPC and the ratio between the weight average molecular weight and the number average molecular weight (Mw/Mn) was 2.0. It also had an acid number of 82 mg KOH/g as determined by titration with 0.1N aqueous sodium hydroxide solution.

Synthesis Example 3

A mixture of 15 g of dyestuff b, 2.08 g of glycidyl methacrylate, 0.38 g of tetrabutylammonium bromide, 0.017 g of p-methoxyphenol and 96.8 g of propylene glycol methyl ether acetate was heated at 100° C. with stirring for 8 hours. The resulting dyestuff solution was added dropwise to a mixed solution of 180 g of acetonitrile and 900 g of ion exchange water, and the mixture was filtered and dried to give 15 g a dye multimer designated as dyestuff c. Dyestuff b had a weight average molecular weight (Mw) of 9,000 as determined by GPC and the ratio between the weight average molecular weight and the number average molecular weight (Mw/Mn) was 2.2. It also had an acid number of 28 mg KOH/g as determined by titration with 0.1N aqueous sodium hydroxide solution.

The structure of dyestuff a (dye monomer M1), the structure of dyestuff b (formula (101)), and the structure of dyestuff c (formula (102)) are shown below.

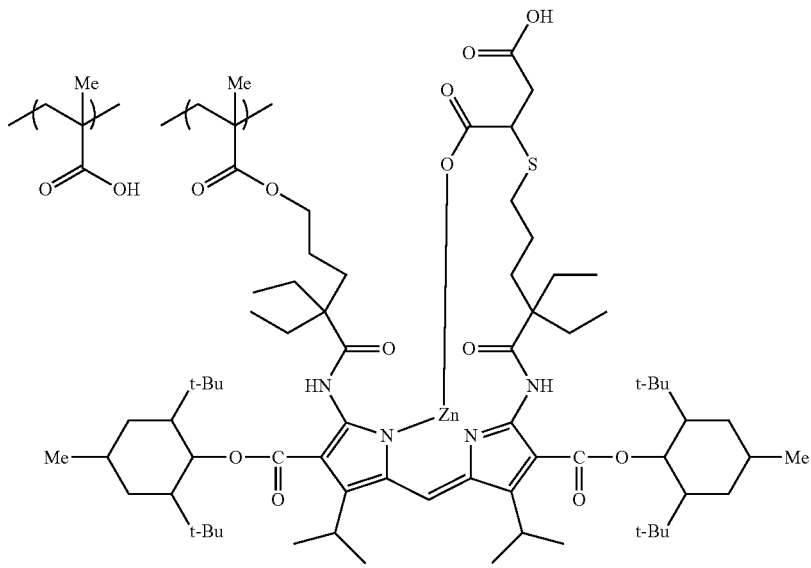

(101)

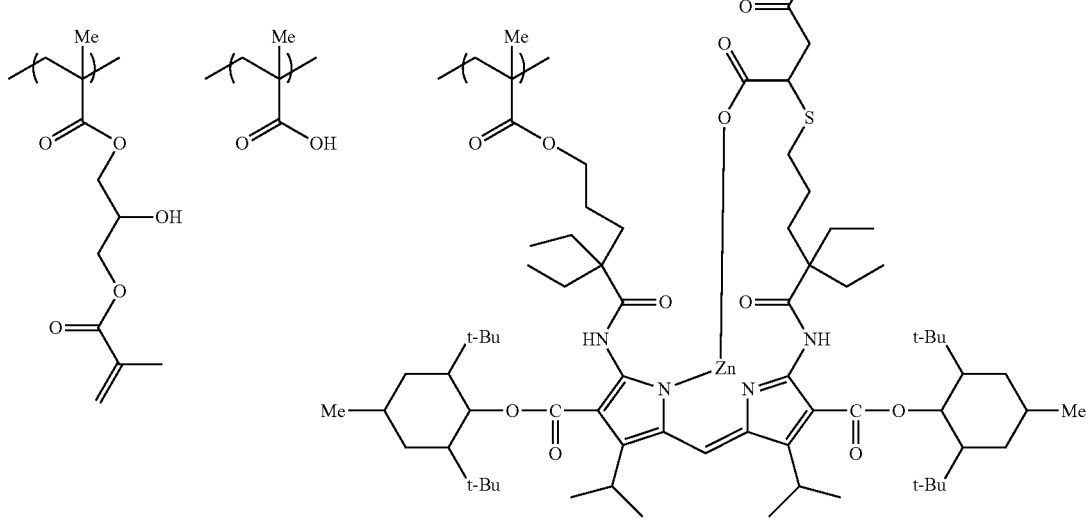

(102)

-continued
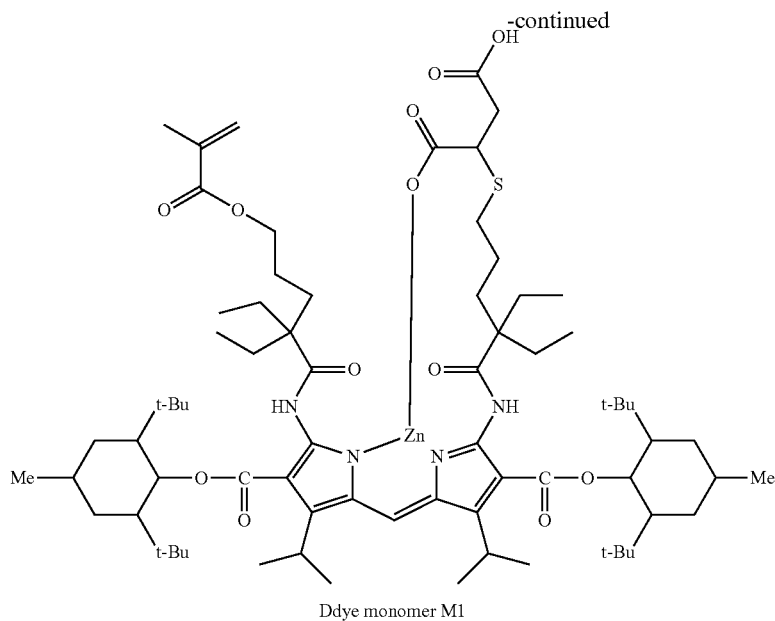
Dye monomer M1
Synthesis of Dyestuffs d and e
A triphenylmethane dye designated as dye monomer M2 was used as a dye to synthesize a dye multimer designated as dyestuff e having a structure represented by formula (103) below. Detailed procedures are explained below.
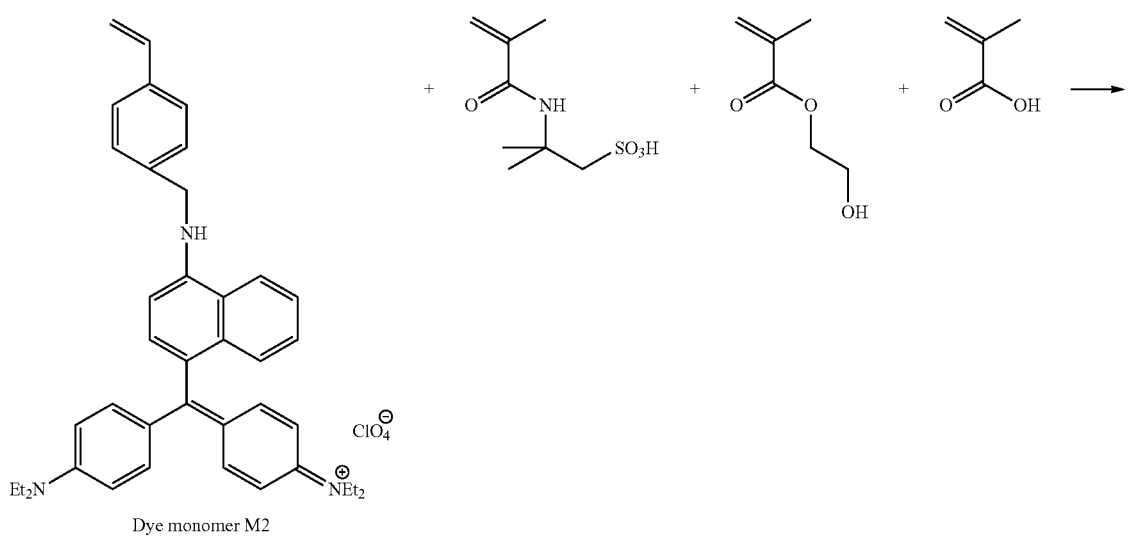
Dye monomer M2

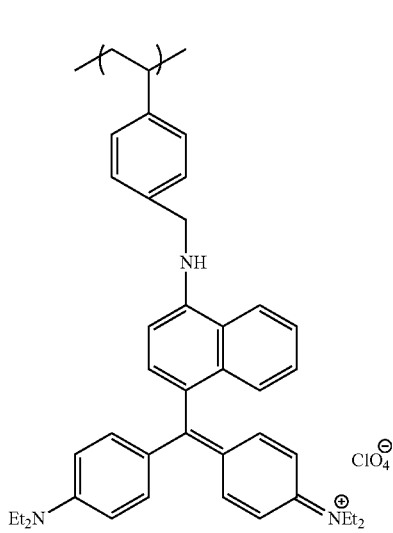

Formula (103)

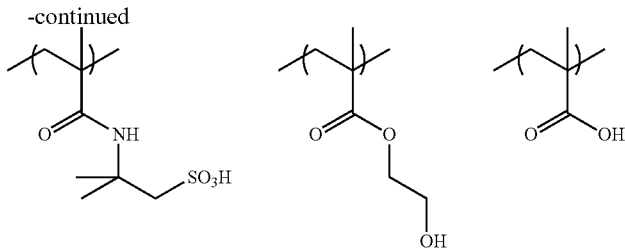

Synthesis Example 4

Dyestuff d (dye monomer M2) was synthesized according to the method described in JP-A2000-162429.

Dye monomer M2 (15 g), 2-acrylamide-2-methylpropanesulfonic acid (6.5 g), hydroxyethyl methacrylate (23 g), methacrylic acid (5.5 g), 28% by mass aqueous ammonia (2 g), and azobisisobutyronitrile (5 g) were added to N-ethylpyrrolidone (70 g), and the mixture was stirred at room temperature for 30 minutes to dissolve (a polymerization solution for dropwise addition).

Separately, a solution of dye monomer M2 (15 g), 2-acrylamide-2-methylpropanesulfonic acid (6.5 g), hydroxyethyl methacrylate (23 g), methacrylic acid (5.5 g), and 28% by mass aqueous ammonia (2 g) dissolved in N-ethylpyrrolidone (70 g) was stirred at 95° C. To this was added dropwise the prepared polymerization solution for dropwise addition over 3 hours and the mixture was stirred for 1 hour, and then azoisobutyronitrile (2.5 g) was added, and the mixture was further reacted for 2 hours and then the reaction was stopped. After cooling to room temperature, the solvent was distilled off to give a copolymer (dyestuff e) having a weight average molecular weight (Mw) of 28000 and an acid number of 190 mg KOH/g as determined by titration with 0.1N aqueous sodium hydroxide solution.

Synthesis of Dyestuff i

An anthraquinone dye designated as dye monomer M3 was used as a dye to synthesize a dye multimer designated as dyestuff i having a structure represented by formula (104) as explained below.

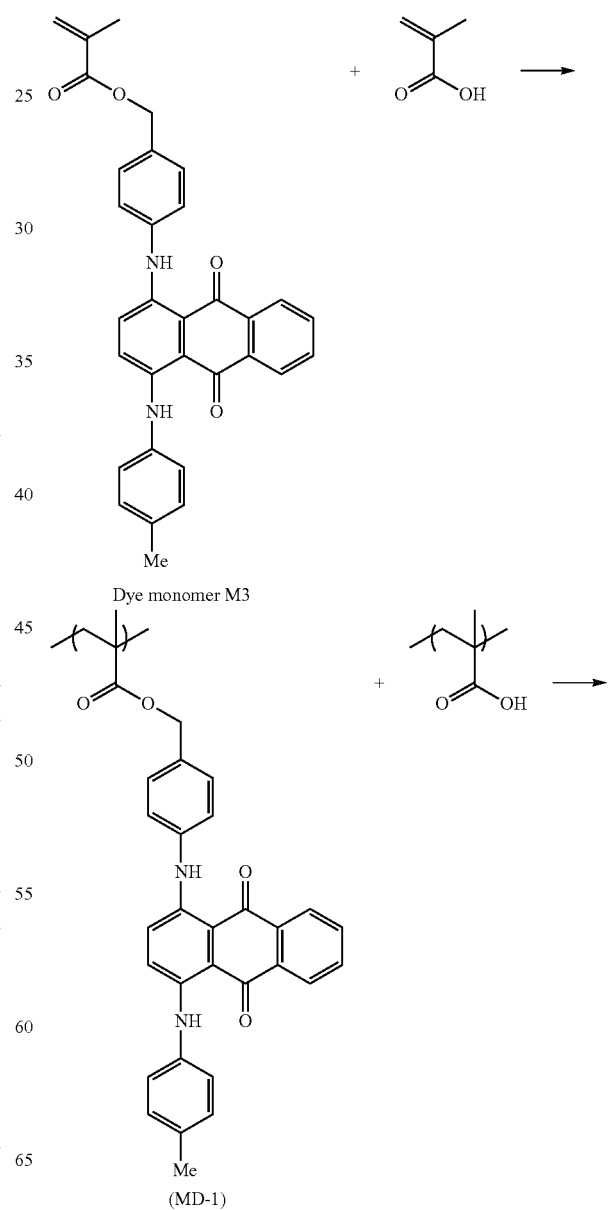

(MD-1)

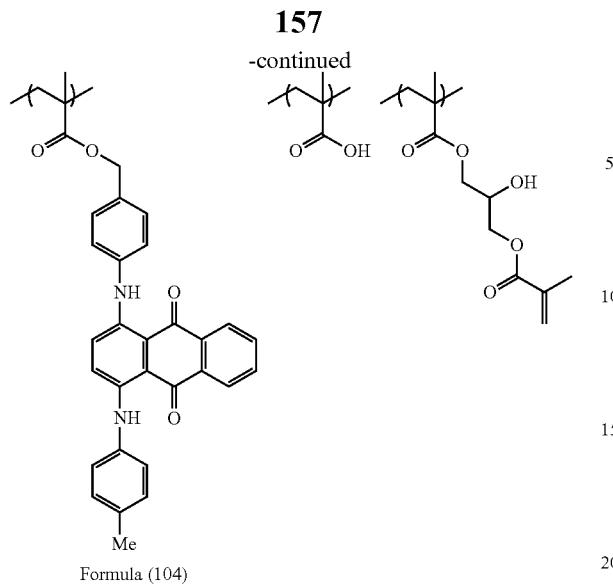

Formula (104)

A reaction vessel was charged with dye monomer M3 (8.21 g), methacrylic acid (1.08 g), dodecyl mercaptan (0.20 g), and propylene glycol 1-monomethyl ether 2-acetate (PGMEA) (23.3 g), and heated to 80° C. in a nitrogen atmosphere. To this solution was added dropwise a mixed solution of dye monomer M3 (8.21 g), methacrylic acid (1.08 g), dodecyl mercaptan (0.25 g), dimethyl 2,2'-azobis (isobutyrate) (0.46 g), and PGMEA (23.3 g) (this mixed solution had a turbidity of 8 ppm at room temperature) over 2 hours. Then, the mixture was stirred for 3 hours and then heated to 90° C., stirred with heating for 2 hours, and then allowed to cool to give a solution of (MD-1) in PGMEA. Then, glycidyl methacrylate (1.42 g), tetrabutylammonium bromide (80 mg), and p-methoxyphenol (20 mg) were added, and the mixture was heated at 100° C. for 15 hours in an air atmosphere until the disappearance of glycidyl methacrylate was observed. After cooling, the reaction mixture was reprecipitated by dropwise addition to a mixed solvent of methanol/ion exchange water=100 mL/10 mL to give 17.6 g of dye multimer 13. GPC analysis showed that it had a weight average molecular weight (Mw) of 9,000, and the weight average molecular weight/number average molecular weight (Mw/Mn) ratio was 1.9. The dye multimer also had an acid number of 42 mg KOH/g as determined by titration with 0.1N aqueous sodium hydroxide solution, and contained 22 mg of polymerizable groups per gram of dye multimer 13 as determined by NMR.

Synthesis of Dyestuffs j to u

Dyestuff j to dyestuff u were synthesized in the same manner as described in Synthesis of dyestuff i except that the type of dye monomer was as shown in Table 1 below.

In Table 1 below, dye monomers M4 to M15, and formula (105) to formula (116) are as follows.

Dye monomer M4 and dye monomer M5 are anthraquinone dyes, dye monomer M6 is a squarylium dye, dye monomer M7 is a cyanine dye, dye monomer M8 is a phthalocyanine dye, dye monomer M9 is a subphthalocyanine dye, dye monomer M10 is a quinophthalone dye, dye monomer M11 is a xanthene dye, and dye monomer M12 to dye monomer M15 are azo dyes.

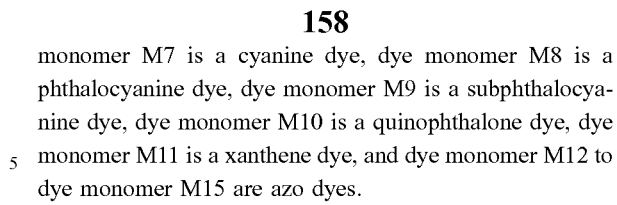

M4

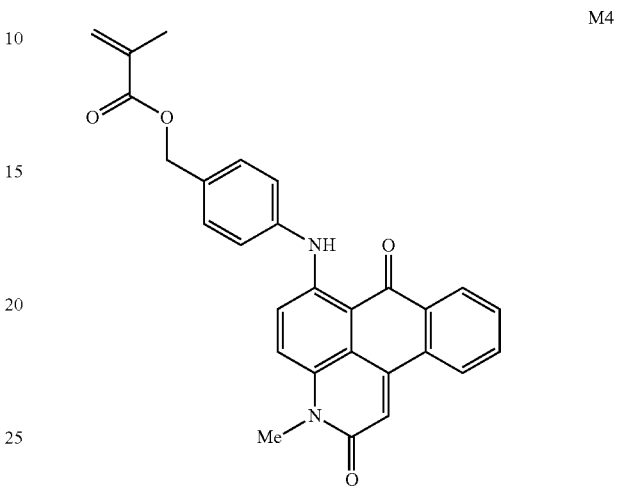

M5

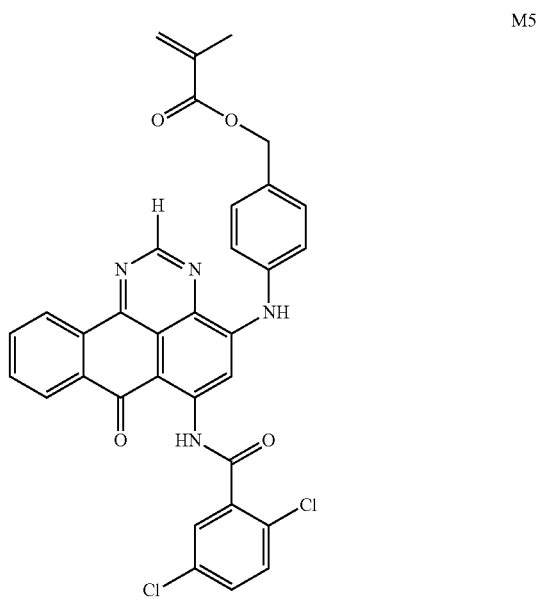

M6

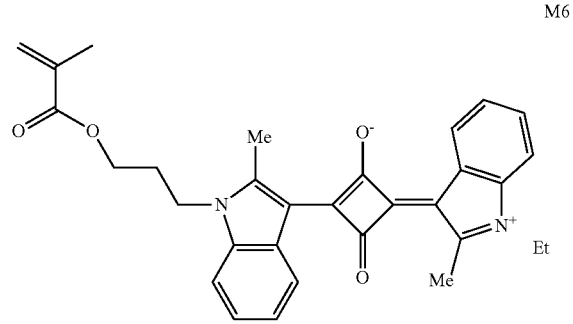

-continued
M7
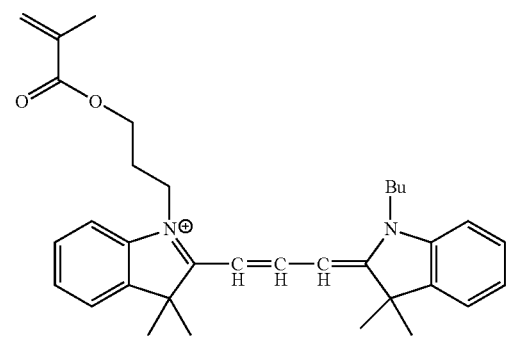
M8
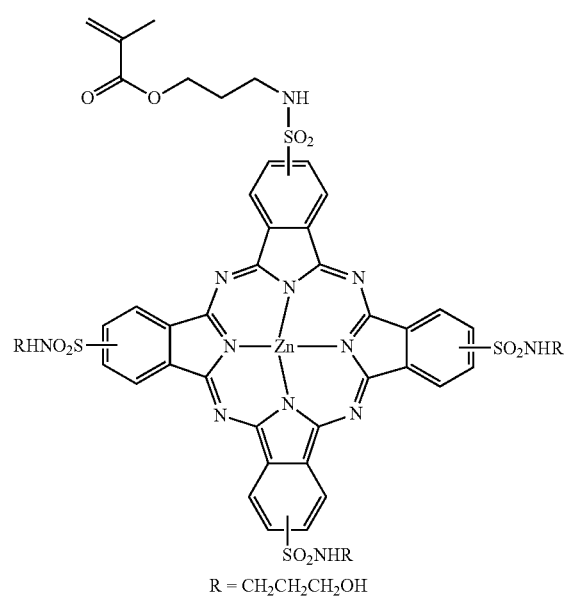
R = CH₂CH₂CH₂OH
M9
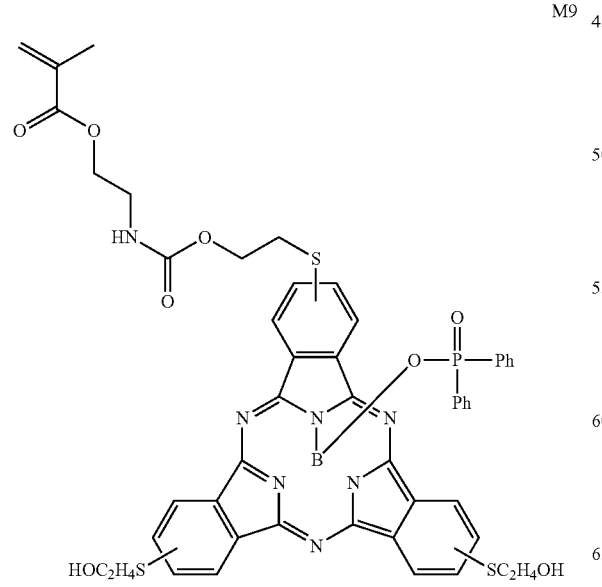
-continued
M10
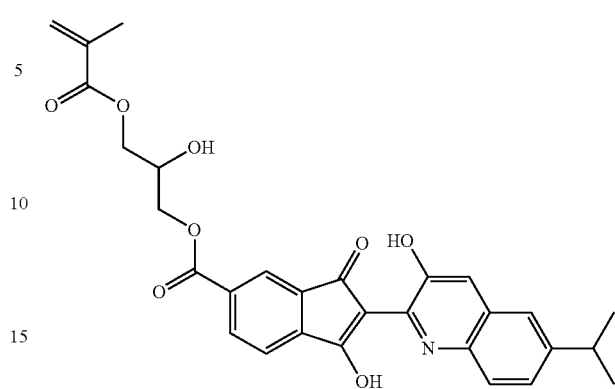
M11
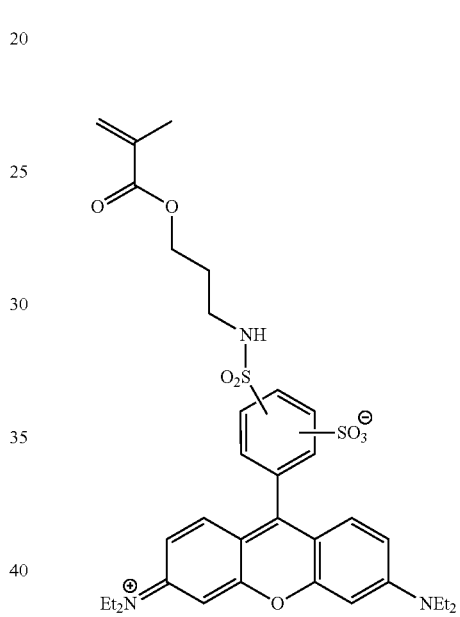
M12
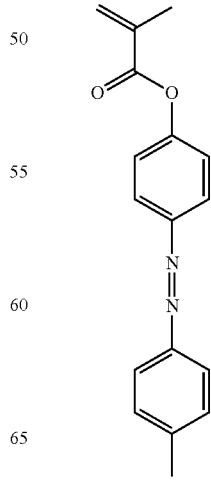

M13
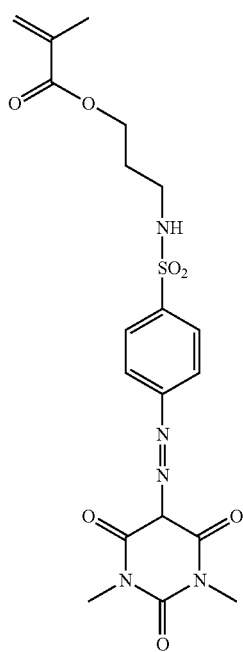
M14
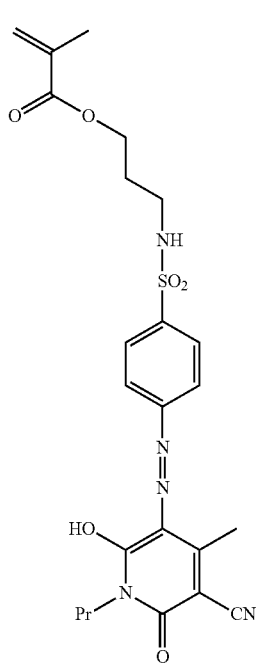
M15
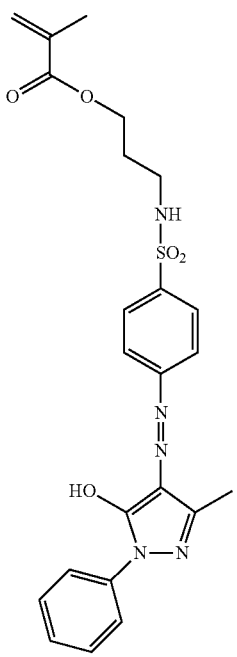
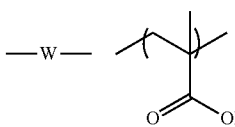
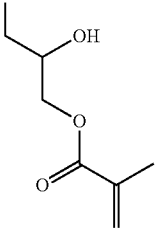
Formula (105)
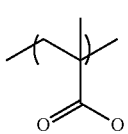

Formula (106)
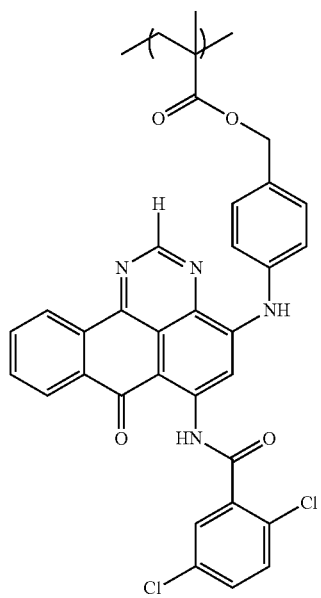
Formula (107)
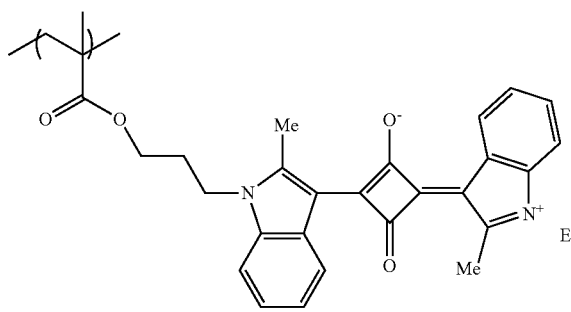
Formula (108)
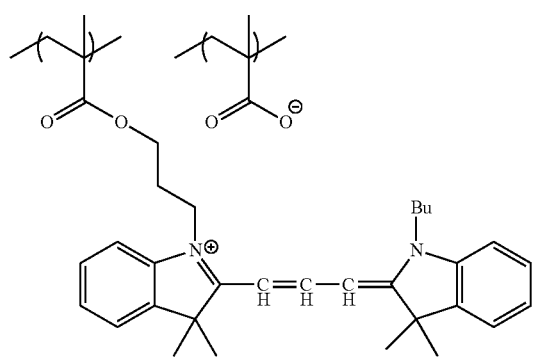
Formula (109)
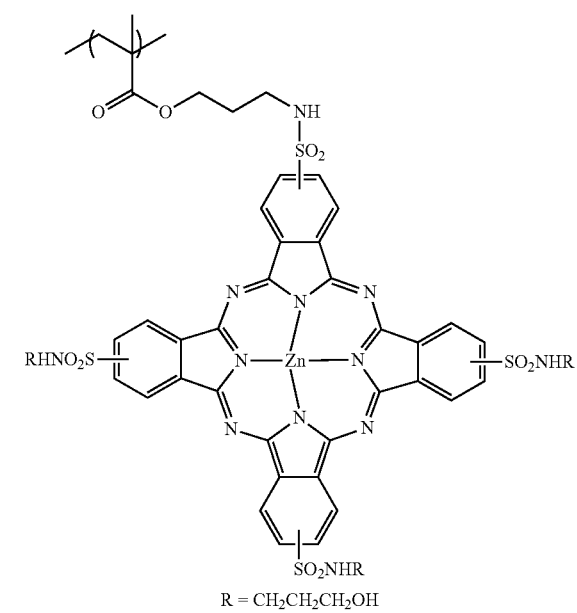
R = CH₂CH₂CH₂OH
Formula (110)
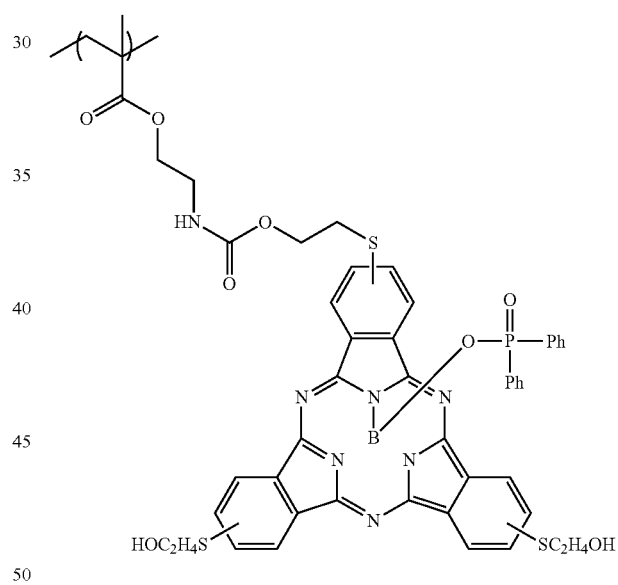
Formula (111)
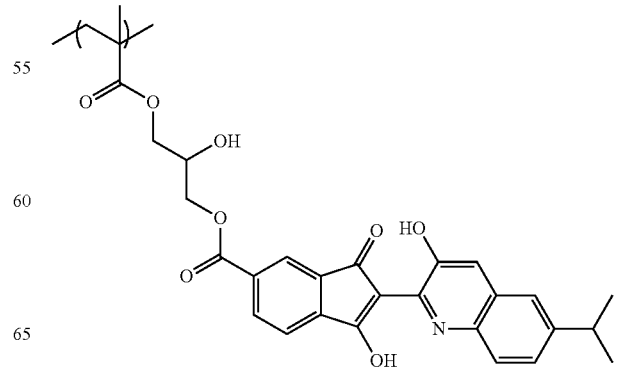

Formula (112)
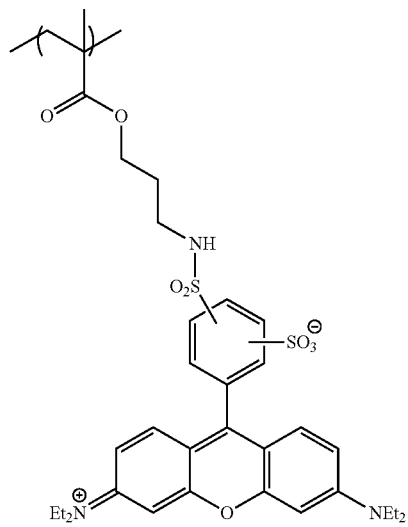
—W— =
Formula (113)
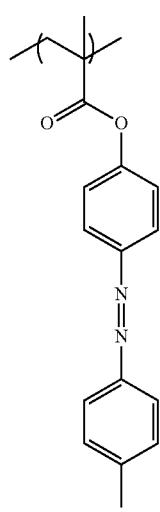
Formula (114)
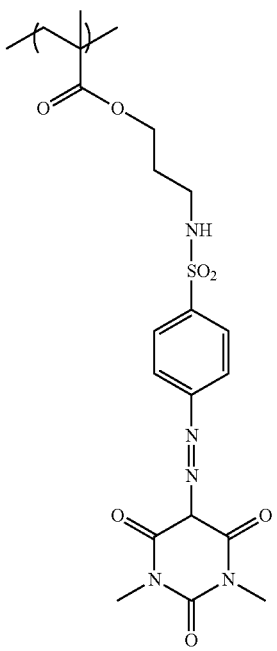
Formula (115)
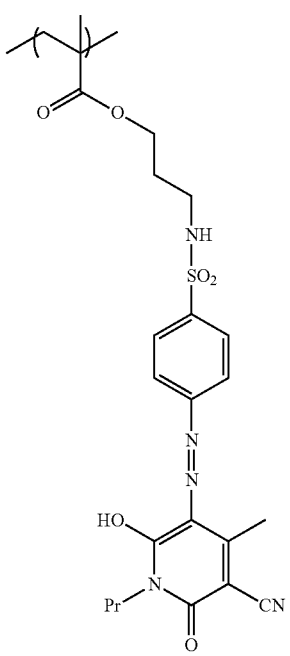

-continued

Formula (116)

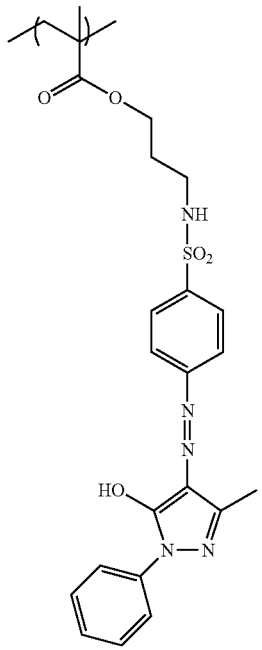

Table 1 below describes the types of dye monomers (M1 to M15) capable of forming a dye structure contained in the dye multimers designated as dyestuff c to dyestuff u, the structures of the dye multimers (formula (101) to formula (116)) and the acid numbers and weight average molecular weights (Mw) of the dye multimers obtained.

TABLE 2

| Dyestuff | Structure | Dye monomer | Acid Value (mgKOH/g)] | Mw |
|---|---|---|---|---|
| Dyestuff b | Formula(101) | M1 | 82 | 6000 |
| Dyestuff c | Formula(102) | M1 | 28 | 9000 |
| Dyestuff e | Formula(103) | M2 | 190 | 28000 |
| Dyestuff i | Formula(104) | M3 | 42 | 9000 |
| Dyestuff j | Formula(105) | M4 | 35 | 7500 |
| Dyestuff k | Formula(106) | M5 | 48 | 7200 |
| Dyestuff l | Formula(107) | M6 | 32 | 8500 |
| Dyestuff m | Formula(108) | M7 | 38 | 8200 |
| Dyestuff n | Formula(109) | M8 | 41 | 10000 |
| Dyestuff o | Formula(110) | M9 | 53 | 5300 |
| Dyestuff p | Formula(111) | M10 | 51 | 6800 |
| Dyestuff q | Formula(112) | M11 | 35 | 7200 |
| Dyestuff r | Formula(113) | M12 | 41 | 8900 |
| Dyestuff s | Formula(114) | M13 | 36 | 7700 |
| Dyestuff t | Formula(115) | M14 | 45 | 7500 |
| Dyestuff u | Formula(116) | M15 | 50 | 5500 |

Synthesis Example 5

Synthesis Example of Dyestuff aa (Dye Monomer M-21)

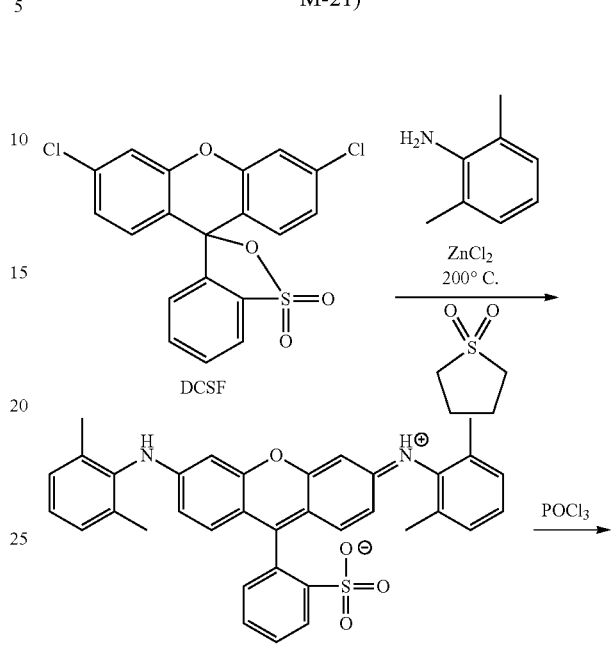

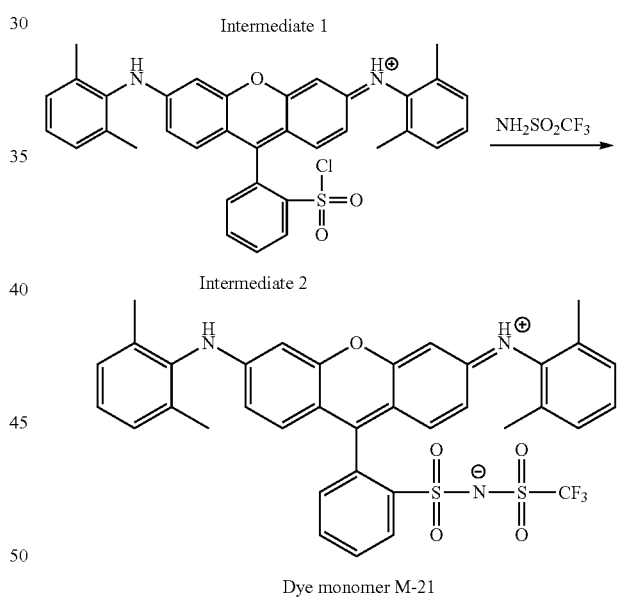

Dye monomer M-21

Synthesis of Intermediate 1

In a flask, 50 parts of DCSF (from Chugai kasei Company, Limited), 74.76 parts of 2,6-dimethylaniline, 27.58 parts of zinc chloride, and 200 parts of sulfolane were stirred at an external temperature of 200° C. for 4 hours. Then, the reaction mixture was allowed to cool to room temperature and added dropwise to 500 parts of 2N hydrochloric acid, and precipitated crystals were filtered off. The crystals were washed by dispersion into 300 parts of acetonitrile at 40° C., filtered and dried by air blowing for 10 hours to give 46.5 parts of Intermediate 1 (yield: 65.6%).

Synthesis of Intermediate 2

In a flask, 20 parts of Intermediate 1 and 106 parts of phosphorus oxychloride were stirred at 60° C. for 2 hours. The reaction solution was allowed to cool to room temperature, and added dropwise to 1500 parts of iced water, and the mixture was stirred for 30 minutes. The resulting crystals were filtered off, washed with 200 parts of water, and dried by air blowing for 10 hours to give 18.5 parts of Intermediate 2 (yield: 89.4%).

Synthesis of Dyestuff aa (Dye Monomer M-21)

To a solution of 7 parts of Intermediate 2 and 1.94 parts of trifluoromethyl sulfonamide dissolved in 40 parts of chloroform was added dropwise 1.55 parts of triethylamine, and the mixture was stirred at room temperature for 1 hour. Then, the mixture was washed with 100 parts of water, and the organic layer was dried over sodium sulfate, purified by column chromatography, and concentrated under reduced pressure to give dyestuff aa (3 parts (yield: 36%)).

Synthesis Example 6

Synthesis Example of Dyestuff ab (Dye Monomer M-22)

Synthesis of Intermediate 3

In a flask, 50 parts of p-acetoxystyrene, 150 parts of ethyl acetate, and 89.2 parts of a 28% solution of sodium methoxide in methanol were stirred at room temperature for 1 hour. To the reaction solution was added 500 parts of 1N aqueous hydrochloric acid to wash the ethyl acetate layer, and then the ethyl acetate layer was dried over magnesium sulfate. To the solution was added 4.63 parts of triethylamine, and the mixture was cooled to 0° C., and 13.8 parts of EF-3000 from Mitsuibishi Materials Corporation was added dropwise with cooling, and the mixture was stirred for 30 minutes. Then, the mixture was stirred with 500 parts of aqueous ammonia for 30 minutes. The reaction solution was neutralized with 1N aqueous hydrochloric acid, and then washed with 500 parts of saturated saline solution, dried over magnesium sulfate, and concentrated under reduced pressure. The residue was purified by column chromatography on silica gel (eluent: chloroform/methanol=8/2) to give 3 parts of Intermediate 3.

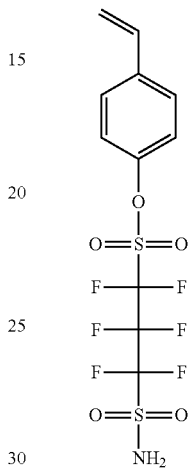

Dyestuff ab (Dye Monomer M-22)

To a solution of 3 parts of Intermediate 3 and 0.7 parts of triethylamine dissolved in 12 parts of methylene chloride was added 4.6 parts of Intermediate 2, and the mixture was stirred at room temperature for 1 hour. The reaction solution was washed with 50 parts of water, dried over magnesium sulfate, and then purified by column chromatography on silica gel (eluent: chloroform/methanol=8/2) to give 0.8 parts of dyestuff ab (dye monomer M-22).

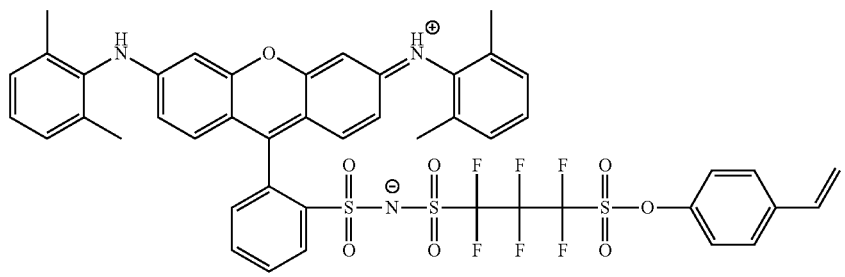

Dye monomer M-22

Synthesis Example 7

Synthesis Example of Dyestuff ac (Dye Monomer M-23)

Dyestuff ac (dye monomer M-23) was synthesized in the same manner as described in <Dyestuff ab (dye monomer M-22)> except that 2,6-dimethylaniline was replaced by 2,6-diisoproylaniline in the synthesis of Intermediate 1.

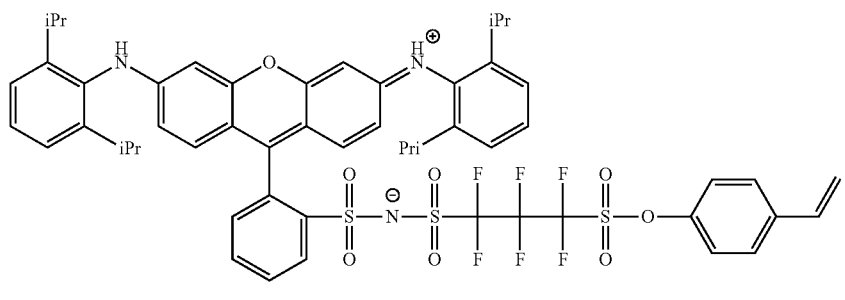

Dye monomer M-23

Synthesis Example 8

Synthesis of Dyestuff ad and ae

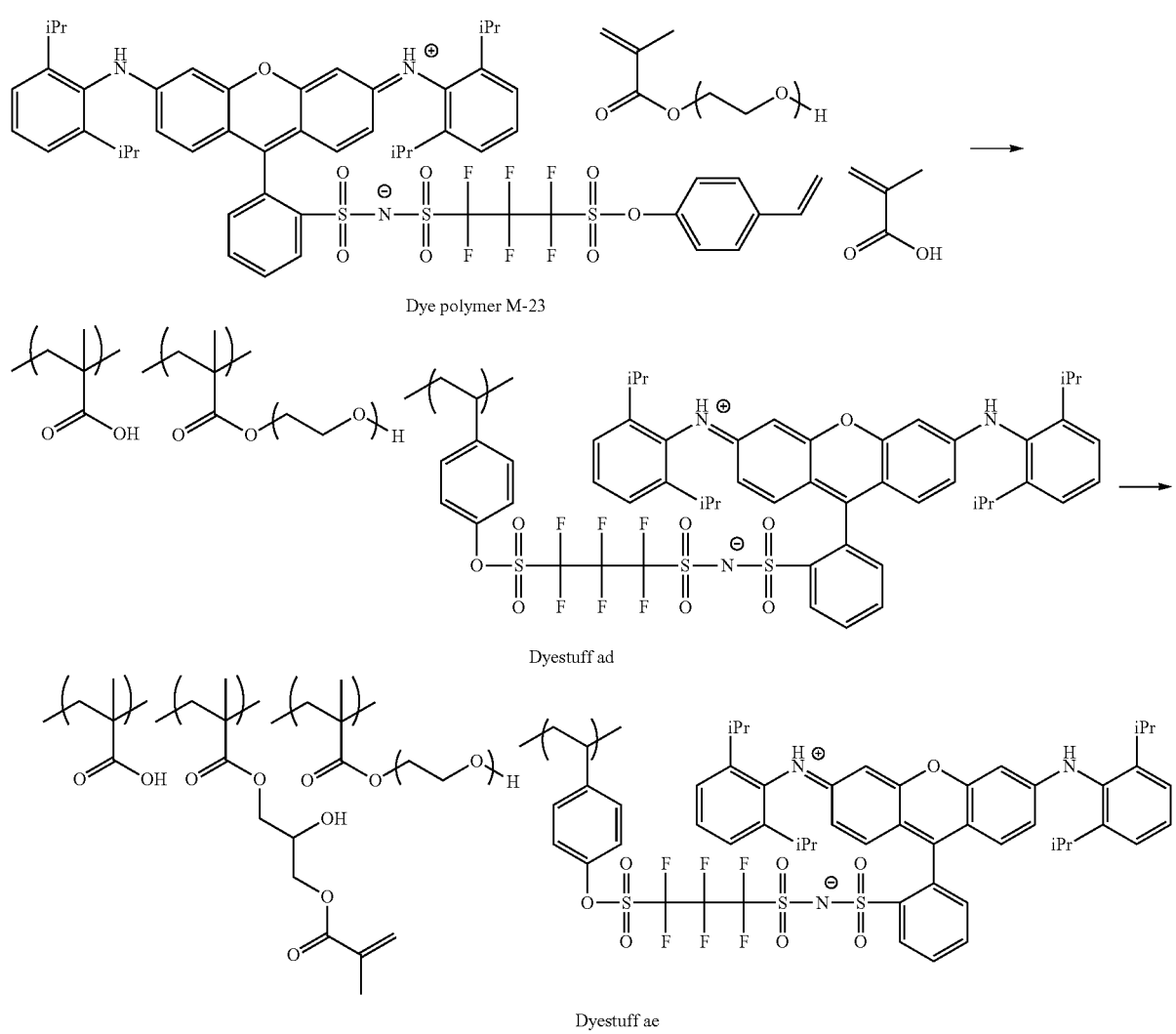

A three-neck flask was charged with 31.2 g of cyclohexanone, and heated to 90° C. in a nitrogen atmosphere. To this solution was added dropwise a mixed solution of dye monomer M-23 (35.0 g, 32.3 mmol), methacrylic acid (9.64 g, 112 mmol), dodecyl mercaptan (2.75 g, 13.6 mmol), polyethylene glycol monomethacrylate (commercially available under the brand name BLEMMER PE-90 from NOF CORPORATION) (3.52 g), dimethyl 2,2'-azobis (isobutyrate) (commercially available under the brand name V601 from Wako Pure Chemical Industries, Ltd.) (6.25 g, 27.1 mmol), and cyclohexanone (81.2 g) over 1 hour. Then, the mixture was stirred at 90° C. for 3 hours, and then cooled to room temperature, and reprecipitated by dropwise addition to a mixed solvent of ethyl acetate/acetonitrile=1530 mL/170 mL. After drying by air blowing at 40° C. for one day, 25.3 g of a dye multimer designated as dyestuff ad was obtained. Dyestuff ad had an acid number of 2.23 mmol/g, and $^1$H-NMR confirmed that the composition ratio (molar ratio) was dye portion:methacrylic acid portion:PE-90 portion=20:68:12. A three-neck flask was charged with dyestuff ad obtained as described above (12.5 g), glycidyl methacrylate (2.19 g), tetraethylammonium bromide (0.40 g), p-methoxyphenol (0.015 g), and cyclohexanone (83.3 g), and stirred at 105° C. in air for 4 hours. Then, the mixture was allowed to cool to room temperature, and reprecipitated by dropwise addition to a mixed solvent of ethyl acetate/acetonitrile=748 mL/39 mL. After drying by air blowing at 40° C. for one day, 6.52 g of a dye multimer designated as dyestuff ae was obtained. Dyestuff ae had an acid number of 1.01 mmol/g, and $^1$H-NMR confirmed that the composition ratio (molar ratio) was dye portion:methacrylic acid portion: polymerizable group-containing portion:PE-90 portion=20:36:32:12.

Synthesis of Dye Multimers Used in Other Examples and Comparative Examples

Synthesis of Dyestuff al to ar

These were synthesized in the same manner as described in Synthesis example 8 except that dye monomer M-23 and polyethylene glycol monomethacrylate were changed to contain repeat units as described in Table 3 below.

TABLE 3

| | | Dyestuff monomer | | | | | | | | | |
|---|---|---|---|---|---|---|---|---|---|---|---|
| | Dyestuff | Dyestuff monomer | Kind of repeat unit 1 | Molar ratio of repeat unit 1 | Kind of repeat unit 2 | Molar ratio of repeat unit 2 | Kind of repeat unit 3 | Molar ratio of repeat unit 3 | Kind of repeat unit 4 | Molar ratio of repeat unit 4 | Mw | Acid Value [mmol/g] |
| Synthesis Example9 | Dyestuff ae | M-23 | a-xt-2 | 0.2 | M-101 | 0.36 | M-102 | 0.32 | M-105 | 0.12 | 13000 | 1.01 |
| Synthesis Example10 | Dyestuff al | M-24 | a-xt-3 | 0.22 | M-101 | 0.34 | M-102 | 0.31 | M-106 | 0.13 | 13000 | 1.02 |
| Synthesis Example11 | Dyestuff am | M-25 | a-xt-4 | 0.23 | M-101 | 0.39 | M-102 | 0.26 | M-107 | 0.12 | 13500 | 1.04 |
| Synthesis Example12 | Dyestuff an | M-26 | a-xt-5 | 0.21 | M-101 | 0.39 | M-102 | 0.27 | M-108 | 0.13 | 14000 | 1.06 |
| Synthesis Example13 | Dyestuff ao | M-27 | a-xt-6 | 0.23 | M-101 | 0.39 | M-102 | 0.27 | M-106 | 0.11 | 12500 | 0.94 |
| Synthesis Example14 | Dyestuff ap | M-28 | a-xt-7 | 0.24 | M-103 | 0.36 | M-104 | 0.26 | M-108 | 0.14 | 12000 | 0.90 |
| Synthesis Example15 | Dyestuff aq | M-29 | a-xt-8 | 0.19 | M-103 | 0.34 | M-104 | 0.34 | M-109 | 0.13 | 14000 | 1.02 |
| Synthesis Example16 | Dyestuff ar | M-22 | a-xt-1 | 0.2 | M-101 | 0.36 | M-102 | 0.32 | M-110 | 0.12 | 8000 | 1.01 |

Dye monomers M-24 to M29 (dyestuff of to ak) used in Synthesis examples 9 to 16 are shown below.

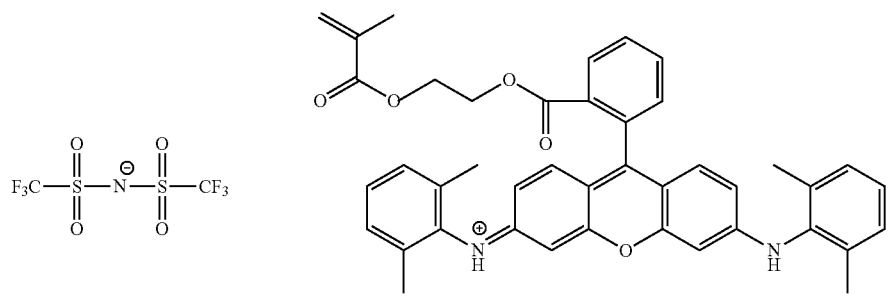

Dye monomer M-24 (dyestuff af)

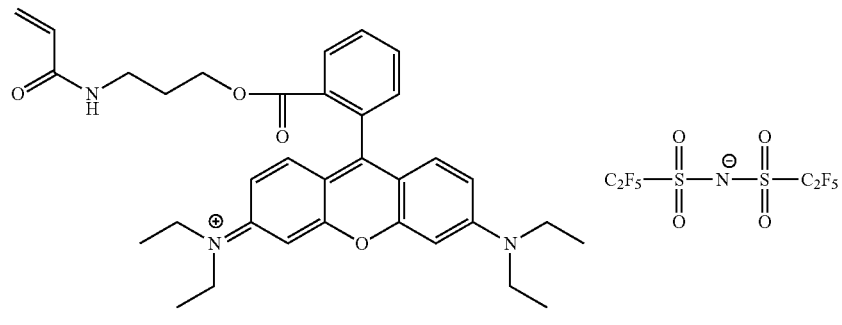

Dye monomer M-25 (dyestuff ag)

-continued
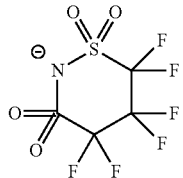
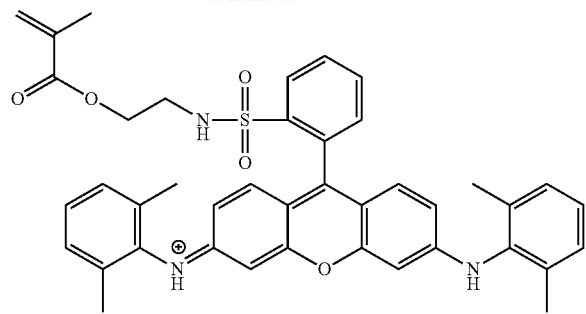
Dye monomer M-26 (dyestuff ah)
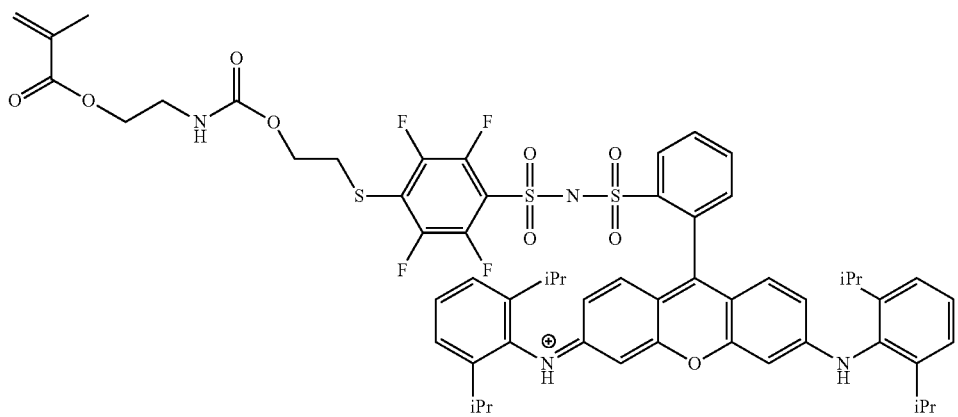
Dye monomer M-27 (dyestuff ai)
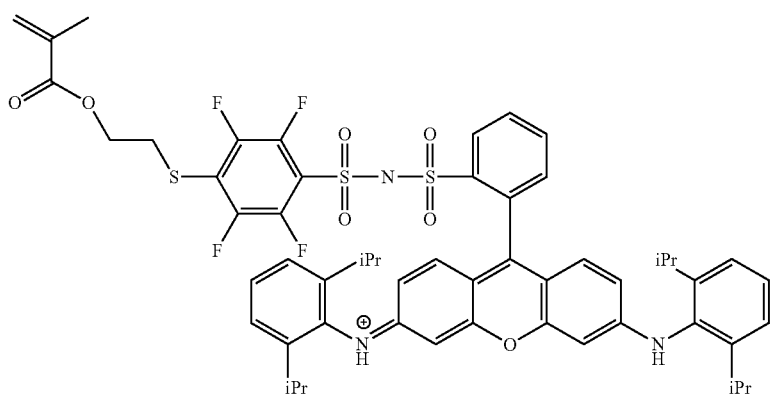
Dye monomer M-28 (dyestuff aj)

-continued
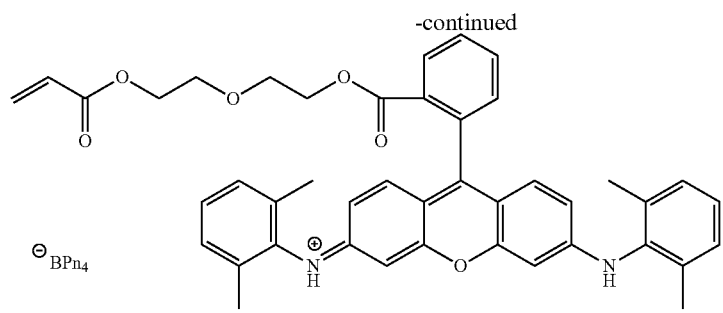
Dye monomer M-29 (dyestuff ak)
The repeat units of the dye multimers obtained in Synthesis examples 9 to 16 are shown below.
<Repeat Unit 1>
(a-xt-1)
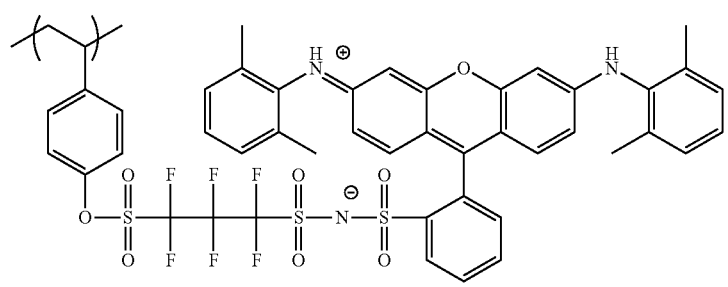
(a-xt-2)
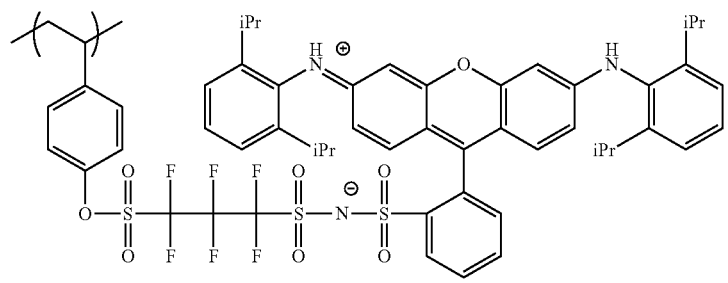
(a-xt-3)
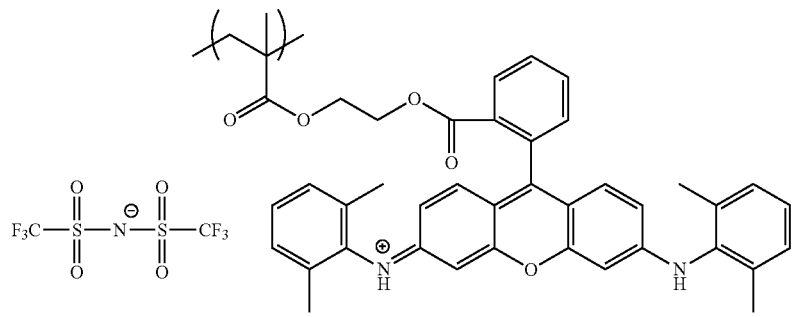

(a-xt-4)
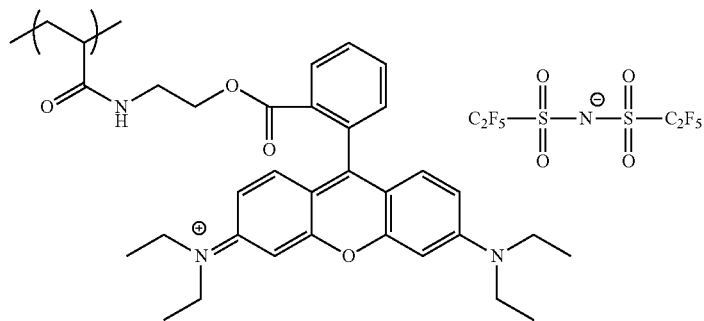
(a-xt-5)
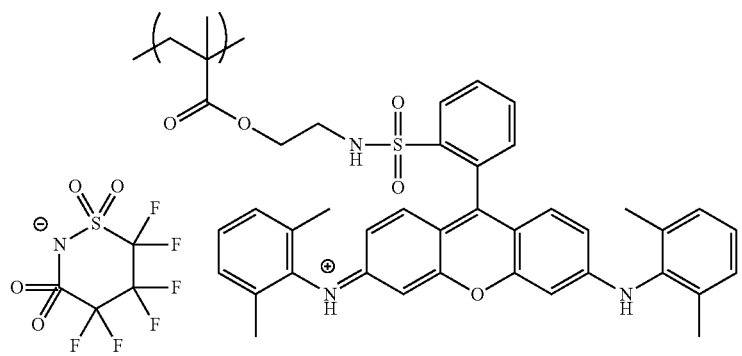
(a-xt-6)
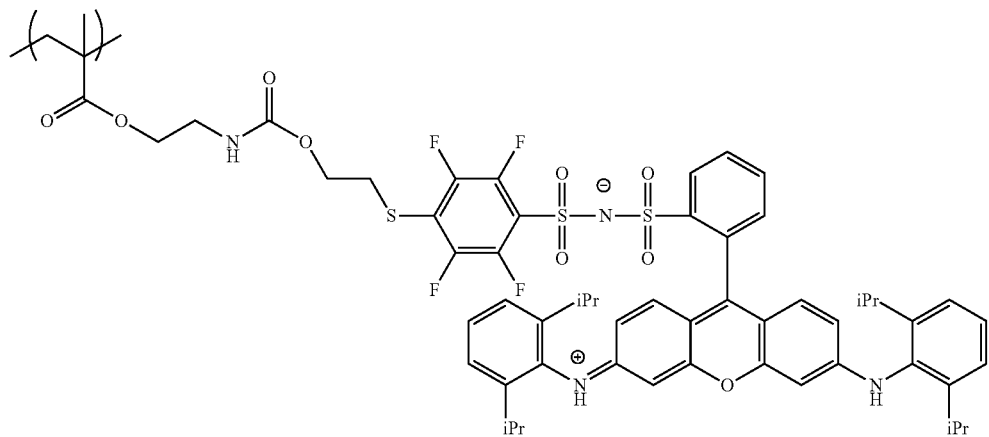
(a-xt-7)
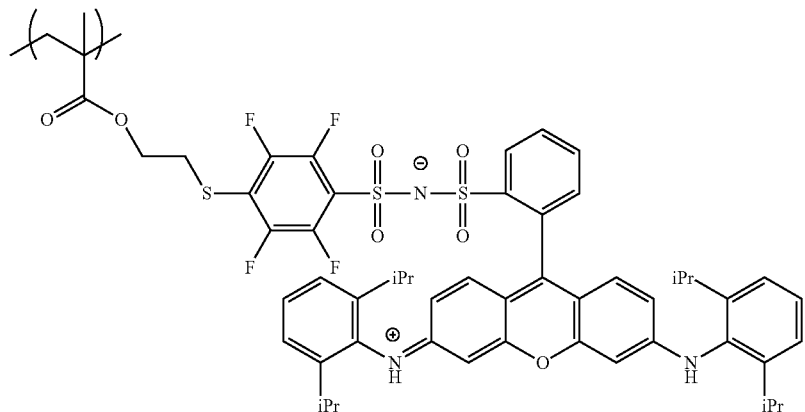

(a-xt-8)
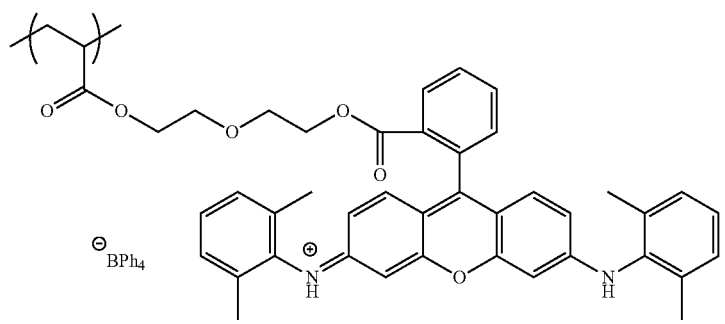
<Repeat Units 2 to 4>
M101
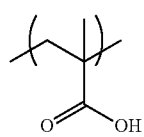
M102
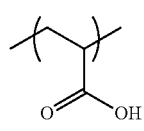
M103
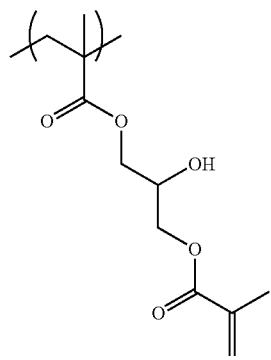
M104
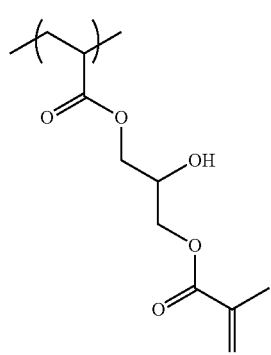
M105
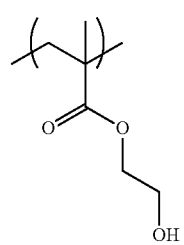
M106
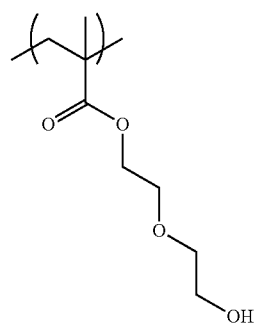
M107
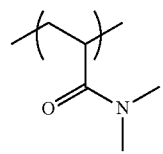

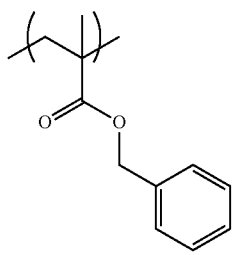
M109
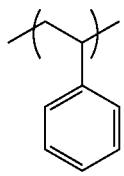
M108
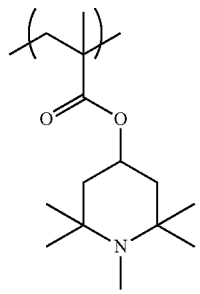
M110
Synthesis Example 17
Synthesis of Dyestuff at
Dyestuff at was synthesized following the scheme shown below.
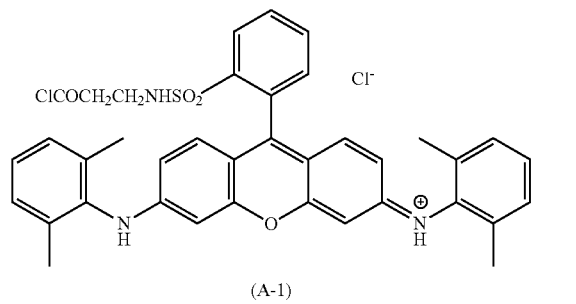
(A-1)
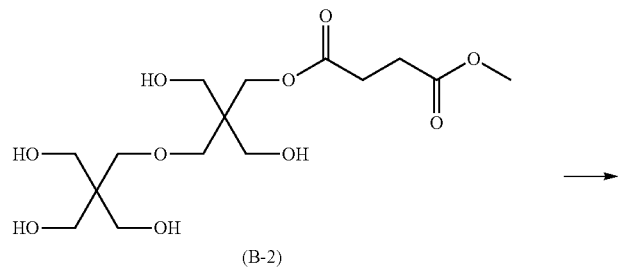
(B-2)
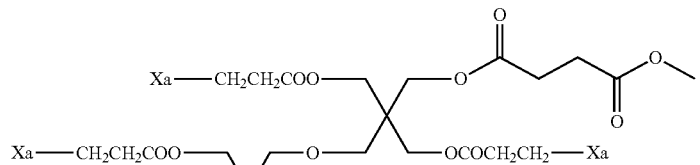
(C-1)
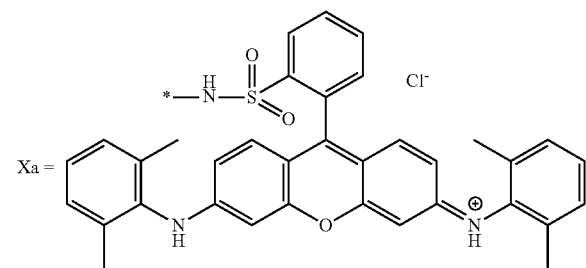

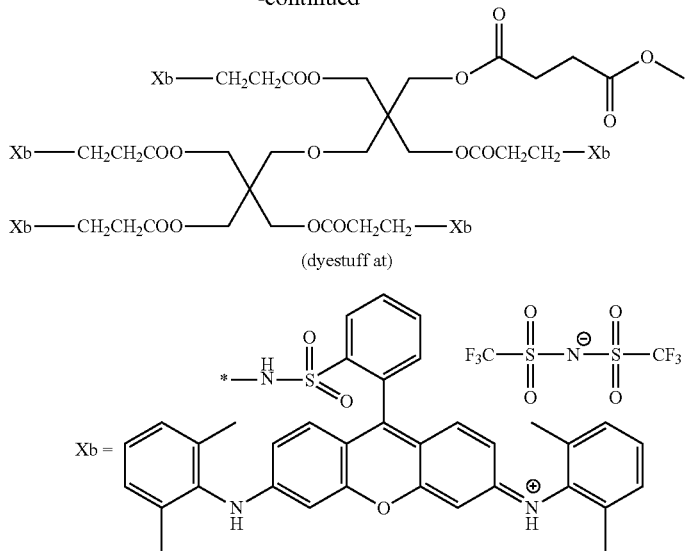

(dyestuff at)

To a solution of 10 g of (A-1) dissolved in 40 ml of chloroform was added 5 g of phosphoryl chloride, and the mixture was heated under reflux for 2 hours, and then 0.7 g of Intermediate (B-2) routinely derived from dipentaerythritol was added. The mixture was further heated under reflux for 2 hours, and then the solution was washed with water, and dried over sodium sulfate and then the solvent was distilled off. The red residue was recrystallized from 100 ml of isopropanol to give 5 g of Intermediate (C-1). Intermediate (C-1) was added to 20 ml of 1N aqueous potassium hydroxide solution, and the mixture was stirred for 1 hour, and then an aqueous solution of bis(trifluoromethylsulfonyl) imide lithium salt was added, and the resulting precipitate was collected by filtration to give 4.5 g of dyestuff at.

Synthesis Example 18

Synthesis of Dyestuff au

Dyestuff au was synthesized following the scheme shown below.

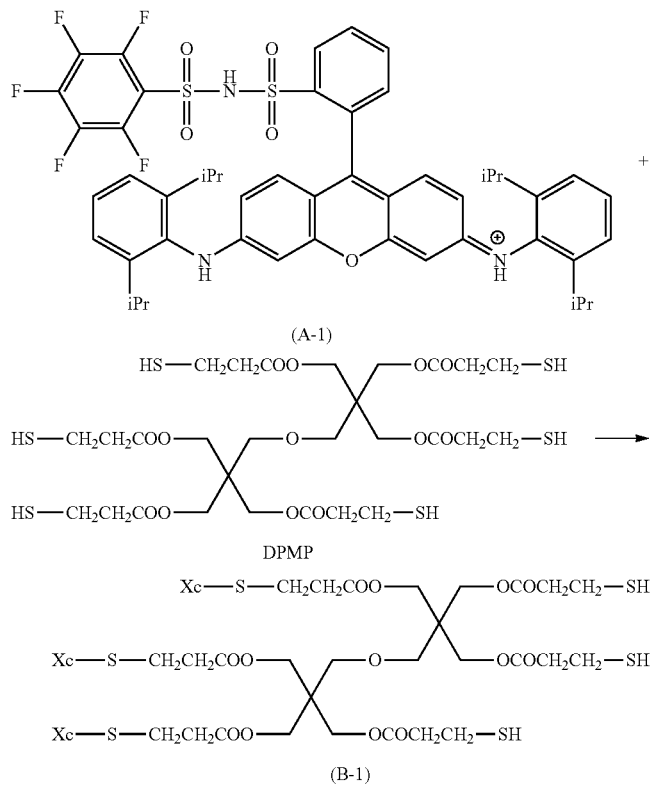

-continued
Xc = 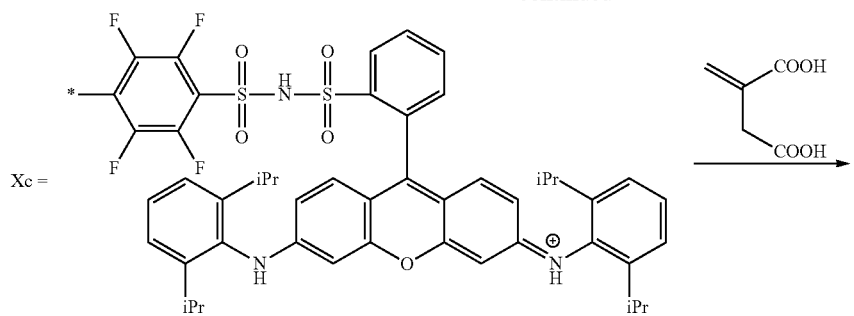
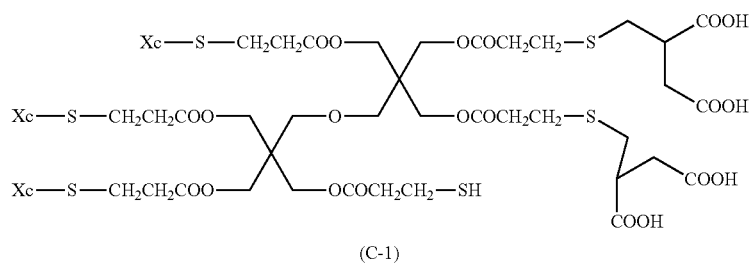
(C-1)
Xc = 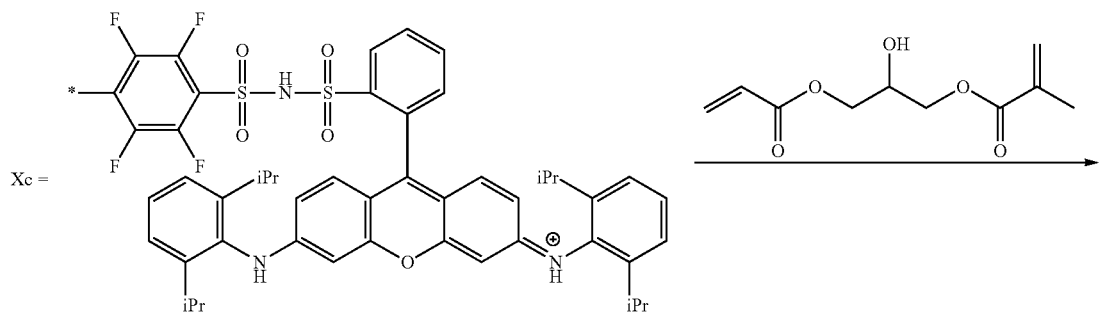
Dyestuff au
Xc = 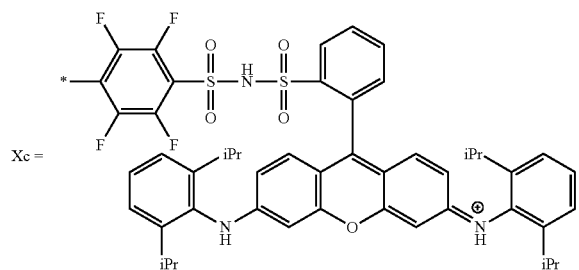

To a solution of 8.8 g of (A-1) and 2.5 g of dipentaerythritol hexakis(3-mercaptopropionate) (DPMP from SC Organic Chemical Co., Ltd.) dissolved in 26 g of N,N-dimethylformamide (DMF) was slowly added dropwise 1.4 g of triethylamine at room temperature. Then, the mixture was stirred at room temperature for 16 hours, and then the reaction solution was added dropwise to a mixed solvent of 150 mL of hexane and 150 mL of ethyl acetate, and the resulting solid was filtered to give 8.5 g of (B-1).

Subsequently, 6.0 g of (B-1) and 0.44 g of itaconic acid were added into 15.0 g of N-methyl-2-pyrrolidone (NMP) and the mixture was stirred at 90° C. in a nitrogen atmosphere to dissolve. To this was added 0.020 g of dimethyl 2,2'-azobis(isobutyrate) (commercially available under the brand name V601 from Wako Pure Chemical Industries, Ltd.), and the mixture was heated with stirring at 90° C. for 2 hours. Further, 0.020 g of V-601 was added, and the mixture was heated with stirring at 90° C. for 2 hours. The resulting reaction solution was added dropwise to a mixed solvent of 100 mL of hexane and 100 mL of ethyl acetate, and the resulting solid was filtered to give 4.5 g of (C-1).

A solution of 4.5 g of (C-1), 0.26 g of 2-hydroxy-3-acryloyloxypropyl methacrylate and 0.02 g of triethylamine dissolved in 11 g of DMF was stirred at room temperature for 16 hours. The resulting reaction solution was added dropwise to a mixed solvent of 75 mL of hexane and 75 mL of ethyl acetate, and the resulting solid was filtered to give 4.0 g of dyestuff au.

Preparation of Pigment Dispersions for Evaluating Color Mixing with Residue on Another Color Preparation of Pigment Dispersion P1: A Dispersion Comprising PR254/PY139

A mixture comprising 9.6 parts of Pigment Red 254, 4.3 parts of Pigment Yellow 139, 6.8 parts of the pigment dispersant BYK-161 (from BYK), and 79.3 parts of propylene glycol methyl ether acetate (hereinafter referred to as "PGMEA") was homogenized/dispersed in a bead mill (zirconia beads having a diameter of 0.3 mm) for 3 hours to prepare a pigment dispersion. Then, the dispersion was further dispersed using the high-pressure homogenizer having a pressure reducing mechanism NANO-3000-10 (from BEE Japan, Inc.) at a pressure of 2000 kg/cm$^3$ and a flow rate of 500 g/min. This dispersion treatment was repeated ten times to give pigment dispersion P1.

Pigment Dispersion P2: A Dispersion Comprising PG36/PG7/PY139

A mixture comprising 5.9 parts of Pigment Green 36, 5.5 parts of Pigment Green 7, 5.1 parts of Pigment Yellow 139, 8.1 parts of the dispersant BYK-161 (from BYK), and 75.4 parts of PGMEA was homogenized/dispersed in a bead mill (zirconia beads having a diameter of 0.3 mm) for 3 hours to prepare a pigment dispersion. Then, the dispersion was further dispersed using the high-pressure homogenizer having a pressure reducing mechanism NANO-3000-10 (from BEE Japan, Inc.) at a pressure of 2000 kg/cm$^3$ and a flow rate of 500 g/min. This dispersion treatment was repeated ten times to give pigment dispersion P2.

Pigment Dispersion P3: A Dispersion Comprising PB15:6/PV23

A mixture comprising 9.5 parts of Pigment Blue 15:6, 2.4 parts of Pigment Violet 23, 5.6 parts of the dispersant BYK-161 (from BYK), and 82.5 parts of PGMEA was homogenized/dispersed in a bead mill (zirconia beads having a diameter of 0.3 mm) for 3 hours to prepare a pigment dispersion. Then, the dispersion was further dispersed using the high-pressure homogenizer having a pressure reducing mechanism NANO-3000-10 (from BEE Japan, Inc.) at a pressure of 2000 kg/cm$^3$ and a flow rate of 500 g/min. This dispersion treatment was repeated ten times to give pigment dispersion P3.

Preparation of Radiation-Sensitive Colored Compositions for Evaluating Color Mixing with Residue on Another Color Preparation of Radiation-Sensitive Colored Composition Red-1

Pigment dispersion P1 obtained as described above and various components were mixed in the proportions shown below and the mixture was stirred to prepare a radiation-sensitive red-colored composition Red-1.

Make-Up of Radiation-Sensitive Colored Composition Red-1

Pigment dispersion P1: 169.74 parts
Alkali-soluble resins 1 (a copolymer of BzMA and MAA having the structure shown below) as a 30% solution in PGMEA: 7.25 parts
Alkali-soluble resin 2 (ACRYCURE RD-F8 from NIPPON SHOKUBAI CO., LTD.): 1.35 parts
A photopolymerizable compound (NK Ester A-DPH-12E from Shin-Nakamura Chemical Co., Ltd.): 3.41 parts
Photoinitiator I-1 (IRGACURE OXE-01 (the structure shown below, from BASF)): 0.98 parts
Surfactant 1 (Megaface F-781 from DIC Corporation, a 0.2% solution in ethyl 3-ethoxypropionate): 4.17 parts
Surfactant 2 (PIONIN D-6112-W (from TAKEMOTO OIL & FAT Co., Ltd.): 1.68 parts
Polymerization inhibitor (p-methoxyphenol, as a 1.0% solution in PGMEA): 0.002 parts
Organic solvent 1 (PGMEA): 4.17 parts
Organic solvent 2 (ethyl 3-ethoxypropionate (hereinafter referred to as "EEP")): 7.24 parts Alkali-Soluble Resin 1

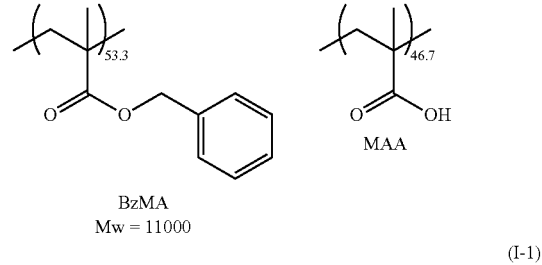

BzMA
Mw = 11000

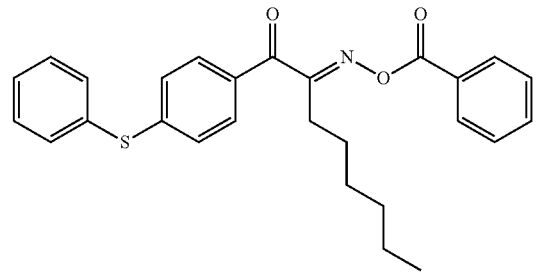

(I-1)

Preparation of Radiation-Sensitive Colored Composition Green-1

A radiation-sensitive green-colored composition Green-1 was prepared in the same manner as described in Preparation of Red-1 except that pigment dispersion P1 was replaced by pigment dispersion P2.

Preparation of Radiation-Sensitive Colored Composition Blue-1

A radiation-sensitive colored composition Blue-1 was prepared in the same manner as described in Preparation of Red-1 except that pigment dispersion P1 was replaced by pigment dispersion P3.

Preparation of Colored Compositions

Use of Low Molecular Weight Dyes

Example 1

Preparation of Pigment Dispersion P4 (C.I. Pigment Blue 15:6 Dispersion))

Pigment dispersion P4 (C.I. Pigment Blue 15:6 dispersion) was prepared as follows:
A mixture comprising 19.4 parts by mass of C.I. Pigment Blue 15:6 (a blue pigment hereinafter also referred to "PB15:6") (average primary particle size 55 nm), 2.95 parts by mass of the dispersant BY-161 (from BYK), 2.95 parts by mass of alkali-soluble resin 1, and 172.3 parts by mass of PGMEA was homogenized/dispersed in a bead mill (zirconia beads having a diameter of 0.3 mm) for 3 hours. Then, the mixture was further dispersed using the high-pressure homogenizer having a pressure reducing mechanism NANO-3000-10 (from BEE Japan, Inc.) at a pressure of 2000 kg/cm$^3$ and a flow rate of 500 g/min. This dispersion treatment was repeated ten times to give a pigment dispersion designated as C.I. Pigment Blue 15:6 dispersion. The average primary particle size of the pigments in the C.I. Pigment Blue 15:6 dispersion thus obtained was 24 nm as determined by dynamic light scattering (Microtrac Nanotrac UPA-EX150 from NIKKISO CO., LTD.).

Preparation of Colored Composition Blue 2

The following components were mixed and dispersed/dissolved to give a colored composition (radiation-sensitive colored composition 1).

Make-Up of Colored Composition 1

Organic solvent (PGMEA): 17.12 parts
Alkali-soluble resin 1 (a copolymer of BzMA and MAA as a 30% solution in PGMEA): 1.23 parts
Alkali-soluble resin 2 (ACRYCURE RD-F8 from NIPPON SHOKUBAI CO., LTD.): 0.23 parts
Photoinitiator I-1 (IRGACURE OXE-01): 0.975 parts
A solution of dyestuff a in cyclohexanone (solids content 12.3%): 24.57 parts
Pigment dispersion P4 (C.I. Pigment Blue 15:6 dispersion as a solution in PGMEA, solids content 12.8%): 51.40 parts
A photopolymerizable compound (NK Ester A-DPH-12E from Shin-Nakamura Chemical Co., Ltd.): 1.31 parts
Polymerization inhibitor (p-methoxyphenol): 0.0007 parts
Fluorosurfactant (F475 from DIC Corporation, a 1% solution in PGMEA): 2.50 parts
Nonionic surfactant (EMULGEN 408 from Kao Corporation): 0.65 parts Examples 2 to 10

Preparation of Pigment Dispersions P5 to P10

The following pigment dispersions were prepared in the same manner as described in "Preparation of C.I. Pigment Blue 15:6 dispersion" in Example 1 except that C.I. Pigment Blue 15:6 used as a blue pigment in "Preparation of C.I. Pigment Blue 15:6 dispersion" in Example 1 was replaced by the pigments shown below.

Pigment for red A (as a dispersion designated "PR254" in the table): pigment dispersion P5
C.I. Pigment Red 254 (PR254) (average primary particle size 26 nm)
Pigment for red B (as a dispersion designated "PR177" in the table): pigment dispersion P6
C.I. Pigment Red 177 (PR177) (average primary particle size 28 nm)
Pigment for green A: pigment dispersion P7
C.I. Pigment Green 36 (PG36) (average primary particle size 25 nm)
Pigment for green B: pigment dispersion P8
C.I. Pigment Green 58 (PG58) (average primary particle size 30 nm)
Pigment for yellow A: pigment dispersion P9
C.I. Pigment Yellow 139 (PY139) (average primary particle size 27 nm)
Pigment for yellow B: pigment dispersion P10
C.I. Pigment Yellow 150 (PY150) (average primary particle size 26 nm)
Pigment for violet A: pigment dispersion P11
C.I. Pigment Violet 23 (PV150) (average primary particle size 27 nm)

Preparation of Colored Compositions

Colored compositions Blue 3 to 10, and Green 2 and 3 were prepared in the same manner as described in "Preparation of colored composition Blue 2" in Example 1 except that the pigment dispersion, dyestuff and nonionic surfactant in Example 1 were changed as shown in the table below. In the table below, dyestuff a is dye monomer M1, dyestuff d is dye monomer M2, and dyestuff f is dye monomer M13.

In the table below, the partial structure of each nonionic surfactant indicates formula (1) or (2) of the nonionic surfactant described above. In the table below, "R$^1$ or R$^2$" indicates R$^1$ or R$^2$ in formula (1) or (2) of the nonionic surfactant described above. In the table below, "n1 or n2" indicates n1 or n2 in formula (1) or (2) of the nonionic surfactant described above. In the table below, "Mw" indicates the weight average molecular weight of the nonionic surfactant described above.

TABLE 4

Radiation-sensitive colored composition

| | Name of composition | Dyestuff | Pigment | Product name | Structure | Nonionic surfactant Partial structure | HLB value | $R^1$ or $R^2$ | n1 or n2 | Mw |
|---|---|---|---|---|---|---|---|---|---|---|
| Example 1 | Blue2 | Dyestuffa | PB15:6 | EMULGEN 408 | Polyoxyethylene oleyl ether | Formula(1) | 11.4 | $C_{18}H_{35}$ | 8 | 1200 |
| Example 2 | Blue3 | Dyestuffa | PB15:6 | EMULGEN409PV | | Formula(1) | 11.9 | $C_{18}H_{35}$ | 9 | 1300 |
| Example 3 | Blue4 | Dyestuffa | PB15:6 | EMULGEN420 | | Formula(1) | 15.3 | $C_{18}H_{35}$ | 20 | 2000 |
| Example 4 | Blue5 | Dyestuffd | PB15:6 | EMULGEN408 | | Formula(1) | 11.4 | $C_{18}H_{35}$ | 8 | 1200 |
| Example 5 | Blue6 | Dyestuffd | PB15:6 | EMULGEN104P | Polyoxy ethylene lauryl ether | Formula(1) | 9.7 | $C_{12}H_{25}$ | 4 | 600 |
| Example 6 | Blue7 | Dyestuffd | PB15:6 | Newcol 564 | Poly oxyethylenenonylphenyl ether | Formula(1) | 12.3 | $C_{15}H_{23}$ | 8 | 1000 |
| Example 7 | Blue8 | Dyestuffd | PB15:6 | Nonion DL-4HN | Polyethyleneglycol dilaurates | Formula(2) | 10.2 | $C_{11}H_{23}$ | 9 | 1300 |
| Example 8 | Blue9 | Dyestuffd | PB15:6 | Uniox GM5IS | Polyoxyethylene glyceryl isostearate | Formula(2) | 11 | $C_{17}H_{35}$ | 5 | 800 |
| Example 9 | Green2 | Dyestufff | PG:58 | EMULGEN 408 | Polyoxyethylene oleyl ether | Formula(1) | 11.7 | $C_{18}H_{35}$ | 8 | 1200 |
| Example 10 | Green3 | Dyestufff | PG:58 | Newcol 1008 | Octaethyleneglycol octyl ether | Formula(1) | 14.6 | $C_8H_{17}$ | 8 | 800 |
| Comparative Example1 | Blue10 | Dyestuffd | PB15:6 | not added | — | — | — | — | — | — |
| Comparative Example2 | Blue11 | Dyestuffa | PB15:6 | EMULGEN 404 | Polyoxyethylene Oleyl Ether | Formula(1) | 7.9 | $C_{18}H_{35}$ | 4 | 800 |
| Comparative Example3 | Blue12 | Dyestuffd | PB15:6 | EMULGEN220 | Polyoxyethylene Cetylether | Formula(1) | 15.7 | $C_{16}H_{33}$ | 20 | 2100 |
| Comparative Example4 | Blue13 | Dyestuffd | PB15:6 | — | Glycerol propoxylate | — | — | 20 | — | 10000 |
| Comparative Example5 | Blue14 | Dyestuffd | PB15:6 | Disperby k-107 | Carboxylic acid ester having OH group | — | — | — | — | 8000 |
| Comparative Example6 | Blue15 | Dyestuffd | PB15:6 | Nonion S-40 | Mono stearic acid polyethylene glycol | Formula(2) | 18.3 | $C_{17}H_{35}$ | 70 | 6000 |

Evaluation

The radiation-sensitive colored compositions of Examples 1 to 10 and Comparative examples 1 to 6 obtained as described above were used to evaluate color mixing with residue.

Preparation of a Primed Glass Wafer

A primed glass wafer used for evaluation was prepared as follows.

(1) Preparation of a Priming Composition

Propylene glycol monomethyl ether acetate (PGMEA): 19.20 parts
Ethyl lactate: 36.67 parts
Binder (a benzyl methacrylate/methacrylic acid/2-hydroxyethyl methacrylate copolymer (molar ratio=60:20:20) as a 41% solution in EL): 30.51 parts
Dipentaerythritol hexaacrylate: 12.20 parts
Polymerization inhibitor (p-methoxyphenol): 0.006 parts
Fluorosurfactant: 0.83 parts
Photoinitiator (TAZ-107 from Midori Kagaku Co., Ltd.): 0.59 parts (2) Preparation of a Primed Glass Wafer The priming composition was uniformly applied on an 8-inch glass wafer using a spin coater to form a coating layer, and the resulting coating layer was heat-treated on a hot plate at 120° C. for 120 seconds. The spin speed of the spin coater was controlled such that the coating layer had a thickness of about 0.5 μm after the heat treatment.

After the heat treatment, the coating layer was further treated in an oven at 220° C. for 1 hour, whereby the coating layer was cured to form a primer layer.

In this manner, a primed glass wafer having a primer layer on an 8-inch glass wafer was obtained.

Evaluation of Color Mixing with Residue

The radiation-sensitive colored compositions described in the table below were used to evaluate color mixing with residue. Evaluation results are shown in the table below.

Each radiation-sensitive colored composition used for forming a colored pattern of a first layer of a color filter was applied in a thickness after drying of 1.0 μm on the primed glass wafer using a spin coater, and heat-treated (prebaked) on a hot plate at 100° C. for 120 seconds.

This was followed by exposure to light having a wavelength of 365 nm at 1000 mJ/cm² through a mask having a pattern of 2 cm×2 cm using the i-line stepper exposure system FPA-3000i5+(from Canon, Inc.).

Then, the glass wafer having the exposed coating layer formed thereon was placed on a horizontal rotary table of a spin/spray developing machine (model DW-30 from CHEMITRONICS CO., LTD.) and developed by the puddle method using a 60% dilution of CD-2000 (from FUJIFILM Electronic Materials Co., Ltd.) at 23° C. for 60 seconds to form a colored pattern on the glass wafer.

The glass wafer having the colored pattern formed thereon was held on the horizontal rotary table by a vacuum chuck, and the glass wafer was spun at 50 rpm by a spinner and simultaneously rinsed with a spray of pure water delivered from an overhead nozzle located on the rotation axis, and then dried by air blowing.

Further, the glass wafer was heat-treated (postbaked) on a hot plate at 200° C. for 480 seconds to give a monocolor filter having the colored pattern of a first layer.

A radiation-sensitive colored composition of a different color from that of the first layer was applied in a thickness after drying of 1.0 µm using a spin coater on the resulting monocolor filter having the colored pattern of the first layer, and heat-treated (prebaked) on a hot plate at 100° C. for 120 seconds to give a multilayer color filter having a radiation-sensitive colored composition layer of a second color (a second layer) formed on the monocolor filter of the first layer.

Then, the resulting multilayer color filter was developed, rinsed and dried in the same manner as described for the formation of the colored pixel of the first layer to remove the radiation-sensitive colored composition layer in uncured regions.

The maximum transmittance was measured using MCPD-3000 (from Otsuka Electronics Co., Ltd.) after the monocolor filter having the colored pixel of the first layer was prepared and after the second layer was removed by development to determine the spectral variation (ΔT % max), whereby the radiation-sensitive colored composition of the second layer left on the colored pixel formed as the first layer was evaluated for color mixing with residue. Smaller variations are more desirable because of a lower likelihood of color mixing with residue. In the rating criteria below, A, B or C is suitable for practical uses. D is unsuitable for practical uses, and E is a very serious level of color mixing with residue on another color.

Rating Criteria

A: ΔT % max<0.5%
B: 0.5%<ΔT % max<1.0%
C: 1.0%<ΔT % max<2.0%
D: 2.0%<ΔT % max<5.0%
E: 5.0%<ΔT % max.

Evaluation of Stability Over Time

The radiation-sensitive colored compositions described in the table below were used to evaluate stability over time. Evaluation results are shown in the table below.

Impurity precipitation after storage at 4° C. for 3 months was visually evaluated according to the following rating criteria.

Rating Criteria

A: No impurities are observed.
B: Impurities are observed, but still suitable for practical uses.
C: Impurities are observed, and unsuitable for practical uses.
D: Much impurities are observed, and unsuitable for practical uses.

TABLE 5

| | | | | | Radiation-sensitive colored composition | | |
|---|---|---|---|---|---|---|---|
| | | | | | | Nonionic surfactant | |
| | Example | Composition name | Dyestuff | Pigment | Product name | Structure | Partial structure |
| Evaluation1 | Example1 | Blue2 | Dyestuff a | PB15:6 | EMULGEN 408 | Polyoxyethylene oleyl | Formula (1) |
| Evaluation2 | Example2 | Blue3 | Dyestuff a | PB15:6 | EMULGEN409PV | ether | Formula (1) |
| Evaluation3 | Example3 | Blue4 | Dyestuff a | PB15:6 | EMULGEN420 | | Formula (1) |
| Evaluation4 | Example4 | Blue5 | Dyestuff d | PB15:6 | EMULGEN 408 | Polyoxyethylene oleyl | Formula (1) |
| Evaluation5 | Example4 | Blue5 | Dyestuff d | PB15:6 | EMULGEN 408 | ether | Formula (1) |
| Evaluation6 | Example4 | Blue5 | Dyestuff d | PB15:6 | EMULGEN 408 | | Formula (1) |
| Evaluation7 | Example5 | Blue6 | Dyestuff d | PB15:6 | EMULGEN104P | Polyoxy ethylene lauryl ether | Formula (1) |
| Evaluation8 | Example6 | Blue7 | Dyestuff d | PB15:6 | Newcol 564 | Poly oxyethylenenonyl phenyl ether | Formula (1) |
| Evaluation9 | Example7 | Blue8 | Dyestuff d | PB15:6 | Nonion DL-4HN | Polyethyleneglycol dilaurates | Formula (2) |
| Evaluation10 | Example8 | Blue9 | Dyestuff d | PB15:6 | Uniox GM5IS | Polyoxyethylene glyceryl isostearate | Formula (1) |
| Evaluation11 | Example9 | Green2 | Dyestuff f | PG:58 | EMULGEN 408 | Polyoxyethylene oleyl ether | Formula (1) |
| Evaluation12 | Example10 | Green3 | Dyestuff f | PG:58 | Newcol 1008 | Octaethyleneglycol octyl | Formula (1) |
| Evaluation13 | Example10 | Green3 | Dyestuff f | PG:58 | Newcol 1008 | ether | Formula (1) |
| Evaluation14 | Example10 | Green3 | Dyestuff f | PG:58 | Newcol 1008 | | Formula (1) |
| Evaluation15 | Comparative Example1 | Blue10 | Dyestuff d | PB15:6 | not added | | — |
| Evaluation16 | Comparative Example1 | Blue10 | Dyestuff d | PB15:6 | not added | | — |
| Evaluation17 | Comparative Example1 | Blue10 | Dyestuff d | PB15:6 | not added | | — |
| Evaluation18 | Comparative Example2 | Blue11 | Dyestuff a | PB15:6 | EMULGEN 404 | Polyoxyethylene Oleyl Ether | Formula (1) |
| Evaluation19 | Comparative Example3 | Blue12 | Dyestuff d | PB15:6 | EMULGEN220 | Polyoxyethylene Cetylether | Formula (1) |
| Evaluation20 | Comparative Example4 | Blue13 | Dyestuff d | PB15:6 | Glycerol propoxylate | Glycerol propoxylate | — |
| Evaluation21 | Comparative Example5 | Blue14 | Dyestuff d | PB15:6 | Disperby k-107 | Carboxylic acid ester having OH group | — |
| Evaluation22 | Comparative Example6 | Blue15 | Dyestuff d | PB15:6 | Nonion S-40 | Mono stearic acid polyethylene glycol | Formula (2) |

TABLE 5-continued

| | | Radiation-sensitive colored composition Nonionic surfactant | | | | Evaluation Result | | |
| --- | --- | --- | --- | --- | --- | --- | --- | --- |
| | | HLB value | $R^1$ or $R^2$ | n1 or n2 | Mw | Mixing with residue First layer | Evaluation | Over time Stability |
| | Evaluation1 | 11.4 | $C_{18}H_{35}$ | 8 | 1200 | Red1 | A | A |
| | Evaluation2 | 11.9 | $C_{18}H_{35}$ | 9 | 1300 | Red1 | A | A |
| | Evaluation3 | 15.3 | $C_{18}H_{35}$ | 20 | 2000 | Red1 | A | A |
| | Evaluation4 | 11.4 | $C_{18}H_{35}$ | 8 | 1200 | Red1 | A | A |
| | Evaluation5 | 11.4 | $C_{18}H_{35}$ | 8 | 1200 | Green1 | A | A |
| | Evaluation6 | 11.4 | $C_{18}H_{35}$ | 8 | 1200 | Green3 | A | A |
| | Evaluation7 | 9.7 | $C_{12}H_{25}$ | 4 | 600 | Red1 | B | A |
| | Evaluation8 | 12.3 | $C_{15}H_{23}$ | 8 | 1000 | Red1 | C | B |
| | Evaluation9 | 10.2 | $C_{11}H_{23}$ | 9 | 1300 | Red1 | C | B |
| | Evaluation10 | 11 | $C_{17}H_{35}$ | 5 | 800 | Red1 | C | A |
| | Evaluation11 | 11.7 | $C_{18}H_{35}$ | 8 | 1200 | Red1 | A | A |
| | Evaluation12 | 14.6 | $C_8H_{17}$ | 8 | 800 | Red1 | B | A |
| | Evaluation13 | 14.6 | $C_8H_{17}$ | 8 | 800 | Blue1 | B | A |
| | Evaluation14 | 14.6 | $C_8H_{17}$ | 8 | 800 | Blue6 | B | A |
| | Evaluation15 | — | — | — | — | Red1 | E | C |
| | Evaluation16 | — | — | — | — | Green1 | E | C |
| | Evaluation17 | — | — | — | — | Green3 | E | C |
| | Evaluation18 | 7.9 | $C_{18}H_{35}$ | 4 | 800 | Red1 | D | B |
| | Evaluation19 | 15.7 | $C_{16}H_{33}$ | 20 | 2100 | Red1 | D | B |
| | Evaluation20 | 20 | — | — | 10000 | Red1 | E | C |
| | Evaluation21 | — | — | — | 8000 | Red1 | E | C |
| | Evaluation22 | 18.3 | $C_{17}H_{35}$ | 70 | 6000 | Red1 | E | C |

The table above shows that the color filters obtained by using the radiation-sensitive colored compositions of the present invention are excellent in preventing color mixing with residue on another color. Further, the color filters obtained by using the radiation-sensitive colored compositions of the present invention were also shown to have high stability over time.

Preparation of Colored Compositions

Use of High Molecular Weight Dyes

Examples 11 to 33 and Comparative Examples 7 to 14

Preparation of Colored Compositions

Colored compositions Blue 16 to 24, Green 4 to 10, and Red 2 to 14 were prepared in the same manner as described in "Preparation of colored composition Blue 2" in Example 1 except that the photoinitiator in Example 1 was replaced by 1-2 (IRGACURE OXE-02 having the structure shown below) and that the pigment dispersion, dyestuff and nonionic surfactant were changed as shown in the table below.

In the table below, the partial structure of each nonionic surfactant indicates formula (1) or (2) of the nonionic surfactant described above. In the table below, "$R^1$ or $R^2$" indicates $R^1$ or $R^2$ in formula (1) or (2) of the nonionic surfactant described above. In the table below, "n1 or n2" indicates n1 or n2 in formula (1) or (2) of the nonionic surfactant described above. In the table below, "Mw" indicates the weight average molecular weight of the nonionic surfactant described above.

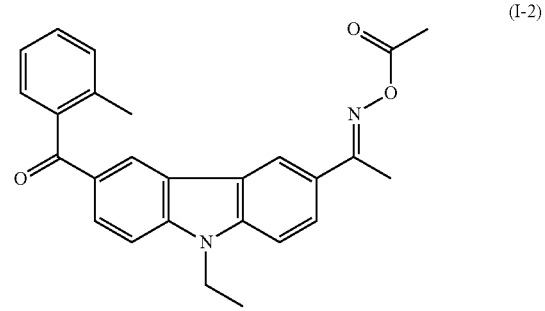 [SMILES: CCn1c2ccc(C(=O)c3ccccc3C)cc2c2cc(/C(C)=N/OC(C)=O)ccc21]

(I-2)

TABLE 6

| | | | | Radiation-sensitive colored composition | | | | | |
| --- | --- | --- | --- | --- | --- | --- | --- | --- | --- |
| | | | | | | Nonionic surfactant | | | |
| | Composition name | Dyestuff | Pigment | Product name | Structure | Partial structure | HLB value | $R^1$ or $R^2$ | n1 or n2 | Mw |
| Example 11 | Blue16 | Dyestuff b | PB15:6 | EMULGEN 408 | Polyoxyethylene oleyl ether | Formula (1) | 11.4 | $C_{18}H_{35}$ | 8 | 1200 |
| Example 12 | Blue17 | Dyestuff c | PB15:6 | EMULGEN 408 | | Formula (1) | 11.4 | $C_{18}H_{35}$ | 8 | 1200 |
| Example 13 | Blue18 | Dyestuff e | PB15:6 | EMULGEN 408 | | Formula (1) | 11.4 | $C_{18}H_{35}$ | 8 | 1200 |
| Example 14 | Red2 | Dyestuff i | PY139 | EMULGEN 408 | | Formula (1) | 11.4 | $C_{18}H_{35}$ | 8 | 1200 |
| Example 15 | Red3 | Dyestuff j | PY139 | EMULGEN 408 | | Formula (1) | 11.4 | $C_{18}H_{35}$ | 8 | 1200 |
| Example 16 | Blue19 | Dyestuff k | PB15:6 | EMULGEN 408 | | Formula (1) | 11.4 | $C_{18}H_{35}$ | 8 | 1200 |
| Example 17 | Blue20 | Dyestuff l | PV23 | EMULGEN 408 | | Formula (1) | 11.4 | $C_{18}H_{35}$ | 8 | 1200 |
| Example 18 | Red4 | Dyestuff m | PY139 | EMULGEN 408 | | Formula (1) | 11.4 | $C_{18}H_{35}$ | 8 | 1200 |
| Example 19 | Green4 | Dyestuff n | PY150 | EMULGEN 408 | | Formula (1) | 11.4 | $C_{18}H_{35}$ | 8 | 1200 |

TABLE 6-continued

Radiation-sensitive colored composition

| | | | | | | Nonionic surfactant | | | | |
|---|---|---|---|---|---|---|---|---|---|---|
| | Composition name | Dyestuff | Pigment | Product name | Structure | Partial structure | HLB value | $R^1$ or $R^2$ | n1 or n2 | Mw |
| Example 20 | Green5 | Dyestuff o | PG36 | EMULGEN 408 | | Formula (1) | 11.4 | $C_{18}H_{35}$ | 8 | 1200 |
| Example 21 | Blue21 | Dyestuff p | PB15:6 | EMULGEN 408 | | Formula (1) | 11.4 | $C_{18}H_{35}$ | 8 | 1200 |
| Example 22 | Red5 | Dyestuff q | PR254 | EMULGEN 408 | | Formula (1) | 11.4 | $C_{18}H_{35}$ | 8 | 1200 |
| Example 23 | Red6 | Dyestuff r | PR177 | EMULGEN 408 | | Formula (1) | 11.4 | $C_{18}H_{35}$ | 8 | 1200 |
| Example 24 | Green6 | Dyestuff s | PG36 | EMULGEN 408 | Polyoxyethylene oleyl ether | Formula (1) | 11.4 | $C_{18}H_{35}$ | 8 | 1200 |
| Example 25 | Green7 | Dyestuff t | PG36 | EMULGEN 408 | | Formula (1) | 11.4 | $C_{18}H_{35}$ | 8 | 1200 |
| Example 26 | Green8 | Dyestuff u | PG58 | EMULGEN 408 | | Formula (1) | 11.4 | $C_{18}H_{35}$ | 8 | 1200 |
| Example 27 | Red7 | Dyestuff i | PY139 | EMULGEN409PV | | Formula (1) | 11.9 | $C_{18}H_{35}$ | 9 | 1300 |
| Example 28 | Red8 | Dyestuff i | PY139 | EMULGEN420 | | Formula (1) | 15.3 | $C_{18}H_{35}$ | 20 | 2000 |
| Example 29 | Blue22 | Dyestuff l | PV23 | EMULGEN104P | Polyoxy ethylene lauryl ether | Formula (1) | 9.7 | $C_{12}H_{25}$ | 4 | 600 |
| Example 30 | Green6 | Dyestuff n | PY150 | Newcol 564 | Poly oxyethylenenonylphenyl ether | Formula (1) | 12.3 | $C_{15}H_{23}$ | 8 | 1000 |
| Example 31 | Green7 | Dyestuff n | PY150 | Nonion DL-4HN | Polyethyleneglycol dilaurates | Formula (2) | 10.2 | $C_{11}H_{23}$ | 9 | 1300 |
| Example 32 | Blue23 | Dyestuff c | PB15:6 | Uniox GM5IS | Polyoxyethylene glyceryl isostearate | Formula (2) | 11 | $C_{17}H_{35}$ | 5 | 800 |
| Example 33 | Green9 | Dyestuff n | PY150 | Newcol 1008 | Octaethyleneglycol octyl ether | Formula (1) | 14.6 | $C_8H_{17}$ | 8 | 800 |
| Comparative Example 7 | Red9 | Dyestuff i | PY139 | not added | — | — | — | — | — | — |
| Comparative Example 8 | Blue24 | Dyestuff c | PB15:6 | not added | — | — | — | — | — | — |
| Comparative Example 9 | Green10 | Dyestuff n | PY150 | not added | — | — | — | — | — | — |
| Comparative Example 10 | Red10 | Dyestuff i | PY139 | EMULGEN 404 | Polyoxyethylene Oleyl Ether | Formula (1) | 7.9 | $C_{18}H_{35}$ | 4 | 800 |
| Comparative Example 11 | Red11 | Dyestuff i | PY139 | EMULGEN220 | Polyoxyethylene Cetylether | Formula (1) | 15.7 | $C_{16}H_{33}$ | 20 | 2100 |
| Comparative Example 12 | Red12 | Dyestuff i | PY139 | Glycerol propoxylate | Glycerol propoxylate | — | 20 | — | — | 10000 |
| Comparative Example 13 | Red13 | Dyestuff i | PY139 | Disperby k-107 | Carboxylic acid ester having OH group | — | — | — | — | 8000 |
| Comparative Example 14 | Red14 | Dyestuff i | PY139 | Nonion S-40 | Mono stearic acid polyethylene glycol | Formula (2) | 18.3 | $C_{17}H_{35}$ | 70 | 6000 |

Evaluation

The radiation-sensitive colored compositions of Examples 11 to 33 and Comparative examples 7 to 14 obtained as described above were used to perform Evaluations 23 to 59 of color mixing with residue in the same manner as described for Evaluations 1 to 22. The results are shown in the table below.

TABLE 7

Radiation-sensitive colored composition

| | | | | | | Nonionic surfactant | | |
|---|---|---|---|---|---|---|---|---|
| | Example | Composition name | Dyestuff | Pigment | Product name | Structure | | Partial structure |
| Evaluation23 | Example 11 | Blue16 | Dyestuff b | PB15:6 | EMULGEN 408 | Polyoxyethylene oleyl ether | | Formula (1) |
| Evaluation24 | Example 12 | Blue17 | Dyestuff c | PB15:6 | EMULGEN 408 | | | Formula (1) |
| Evaluation25 | Example 12 | Blue17 | Dyestuff c | PB15:6 | EMULGEN 408 | | | Formula (1) |
| Evaluation26 | Example 12 | Blue17 | Dyestuff c | PB15:6 | EMULGEN 408 | | | Formula (1) |
| Evaluation27 | Example 12 | Blue17 | Dyestuff c | PB15:6 | EMULGEN 408 | | | Formula (1) |
| Evaluation28 | Example 13 | Blue18 | Dyestuff e | PB15:6 | EMULGEN 408 | | | Formula (1) |
| Evaluation29 | Example 14 | Red2 | Dyestuff i | PY139 | EMULGEN 408 | | | Formula (1) |
| Evaluation30 | Example 14 | Red2 | Dyestuff i | PY139 | EMULGEN 408 | | | Formula (1) |
| Evaluation31 | Example 14 | Red2 | Dyestuff i | PY139 | EMULGEN 408 | | | Formula (1) |
| Evaluation32 | Example 14 | Red2 | Dyestuff i | PY139 | EMULGEN 408 | | | Formula (1) |
| Evaluation33 | Example 15 | Red3 | Dyestuff j | PY139 | EMULGEN 408 | | | Formula (1) |
| Evaluation34 | Example 16 | Blue19 | Dyestuff k | PB15:6 | EMULGEN 408 | | | Formula (1) |
| Evaluation35 | Example 17 | Blue20 | Dyestuff l | PV23 | EMULGEN 408 | | | Formula (1) |
| Evaluation36 | Example 18 | Red4 | Dyestuff m | PY139 | EMULGEN 408 | | | Formula (1) |
| Evaluation37 | Example 19 | Green4 | Dyestuff n | PY150 | EMULGEN 408 | | | Formula (1) |
| Evaluation38 | Example 20 | Green5 | Dyestuff o | PG36 | EMULGEN 408 | Polyoxyethylene oleyl ether | | Formula (1) |
| Evaluation39 | Example 21 | Blue21 | Dyestuff p | PB15:6 | EMULGEN 408 | | | Formula (1) |
| Evaluation40 | Example 22 | Red5 | Dyestuff q | PR254 | EMULGEN 408 | | | Formula (1) |
| Evaluation41 | Example 23 | Red6 | Dyestuff r | PR177 | EMULGEN 408 | | | Formula (1) |

TABLE 7-continued

| | | | | | | | |
|---|---|---|---|---|---|---|---|
| Evaluation42 | Example 24 | Green6 | Dyestuff s | PG36 | EMULGEN 408 | | Formula (1) |
| Evaluation43 | Example 25 | Green7 | Dyestuff t | PG36 | EMULGEN 408 | | Formula (1) |
| Evaluation44 | Example 26 | Green8 | Dyestuff u | PG58 | EMULGEN 408 | | Formula (1) |
| Evaluation45 | Example 27 | Red7 | Dyestuff i | PY139 | EMULGEN409PV | | Formula (1) |
| Evaluation46 | Example 28 | Red8 | Dyestuff i | PY139 | EMULGEN420 | | Formula (1) |
| Evaluation47 | Example 29 | Blue22 | Dyestuff l | PV23 | EMULGEN104P | Polyoxy ethylene lauryl ether | Formula (1) |
| Evaluation48 | Example 30 | Green6 | Dyestuff n | PY150 | Newcol 564 | Poly oxyethylenenonylphenyl ether | Formula (1) |
| Evaluation49 | Example 31 | Green7 | Dyestuff n | PY150 | Nonion DL-4HN | Polyethyleneglycol dilaurates | Formula (2) |
| Evaluation50 | Example 32 | Blue23 | Dyestuff c | PB15:6 | Uniox GM5IS | Polyoxyethylene glyceryl isostearate | Formula (2) |
| Evaluation51 | Example 33 | Green9 | Dyestuff n | PY150 | Newcol 1008 | Octaethyleneglycol octyl ether | Formula (1) |
| Evaluation52 | Comparative Example7 | Red9 | Dyestuff i | PY139 | not added | — | — |
| Evaluation53 | Comparative Example8 | Blue24 | Dyestuff c | PB15:6 | not added | — | — |
| Evaluation54 | Comparative Example9 | Green10 | Dyestuff n | PY150 | not added | — | — |
| Evaluation55 | Comparative Example10 | Red10 | Dyestuff i | PY139 | EMULGEN 404 | Polyoxyethylene Oleyl Ether | Formula (1) |
| Evaluation56 | Comparative Example11 | Red11 | Dyestuff i | PY139 | EMULGEN220 | Polyoxyethylene Cetylether | Formula (1) |
| Evaluation57 | Comparative Example12 | Red12 | Dyestuff i | PY139 | — | Glycerol propoxylate | — |
| Evaluation58 | Comparative Example13 | Red13 | Dyestuff i | PY139 | Disperby k-107 | Carboxylic acid ester having OH group | — |
| Evaluation59 | Comparative Example14 | Red14 | Dyestuff i | PY139 | Nonion S-40 | Mono stearic acid polyethylene glycol | Formula (2) |

| | Radiation-sensitive colored composition Nonionic surfactant | | | | Evaluation Result | | |
|---|---|---|---|---|---|---|---|
| | HLB value | $R^1$ or $R^2$ | $n1$ or $n2$ | Mw | Mixing with residue First layer | Evaluation | Over time Stability |
| Evaluation23 | 11.4 | $C_{18}H_{35}$ | 8 | 1200 | Red1 | A | A |
| Evaluation24 | 11.4 | $C_{18}H_{35}$ | 8 | 1200 | Red1 | A | A |
| Evaluation25 | 11.4 | $C_{18}H_{35}$ | 8 | 1200 | Red2 | A | A |
| Evaluation26 | 11.4 | $C_{18}H_{35}$ | 8 | 1200 | Green1 | A | A |
| Evaluation27 | 11.4 | $C_{18}H_{35}$ | 8 | 1200 | Green9 | A | A |
| Evaluation28 | 11.4 | $C_{18}H_{35}$ | 8 | 1200 | Red1 | A | A |
| Evaluation29 | 11.4 | $C_{18}H_{35}$ | 8 | 1200 | Green1 | A | A |
| Evaluation30 | 11.4 | $C_{18}H_{35}$ | 8 | 1200 | Green9 | A | A |
| Evaluation31 | 11.4 | $C_{18}H_{35}$ | 8 | 1200 | Blue1 | A | A |
| Evaluation32 | 11.4 | $C_{18}H_{35}$ | 8 | 1200 | Blue12 | A | A |
| Evaluation33 | 11.4 | $C_{18}H_{35}$ | 8 | 1200 | Green1 | A | A |
| Evaluation34 | 11.4 | $C_{18}H_{35}$ | 8 | 1200 | Red1 | A | A |
| Evaluation35 | 11.4 | $C_{18}H_{35}$ | 8 | 1200 | Red1 | A | A |
| Evaluation36 | 11.4 | $C_{18}H_{35}$ | 8 | 1200 | Green1 | A | A |
| Evaluation37 | 11.4 | $C_{18}H_{35}$ | 8 | 1200 | Blue1 | A | A |
| Evaluation38 | 11.4 | $C_{18}H_{35}$ | 8 | 1200 | Blue1 | A | A |
| Evaluation39 | 11.4 | $C_{18}H_{35}$ | 8 | 1200 | Red1 | A | A |
| Evaluation40 | 11.4 | $C_{18}H_{35}$ | 8 | 1200 | Green1 | A | A |
| Evaluation41 | 11.4 | $C_{18}H_{35}$ | 8 | 1200 | Green1 | A | A |
| Evaluation42 | 11.4 | $C_{18}H_{35}$ | 8 | 1200 | Blue1 | A | A |
| Evaluation43 | 11.4 | $C_{18}H_{35}$ | 8 | 1200 | Blue1 | A | A |
| Evaluation44 | 11.4 | $C_{18}H_{35}$ | 8 | 1200 | Blue1 | A | A |
| Evaluation45 | 11.9 | $C_{18}H_{35}$ | 9 | 1300 | Green1 | A | A |
| Evaluation46 | 15.3 | $C_{18}H_{35}$ | 20 | 2000 | Green1 | A | A |
| Evaluation47 | 9.7 | $C_{12}H_{25}$ | 4 | 600 | Red1 | B | A |
| Evaluation48 | 12.3 | $C_{15}H_{23}$ | 8 | 1000 | Blue1 | C | B |
| Evaluation49 | 10.2 | $C_{11}H_{23}$ | 9 | 1300 | Blue1 | C | B |
| Evaluation50 | 11 | $C_{17}H_{35}$ | 5 | 800 | Red1 | C | A |
| Evaluation51 | 14.6 | $C_8H_{17}$ | 8 | 800 | Blue1 | B | A |
| Evaluation52 | — | — | — | — | Green1 | E | D |
| Evaluation53 | — | — | — | — | Red1 | E | D |
| Evaluation54 | — | — | — | — | Blue1 | E | D |
| Evaluation55 | 7.9 | $C_{18}H_{35}$ | 4 | 800 | Green1 | D | D |
| Evaluation56 | 15.7 | $C_{16}H_{33}$ | 20 | 2100 | Green1 | D | D |
| Evaluation57 | 20 | — | — | 10000 | Green1 | E | D |
| Evaluation58 | — | — | — | 8000 | Green1 | E | D |
| Evaluation59 | 18.3 | $C_{17}H_{35}$ | 70 | 6000 | Green1 | E | D |

The table above shows that the color filters obtained by using the radiation-sensitive colored compositions of the present invention are excellent in preventing color mixing with residue on another color. Further, the color filters obtained by using the radiation-sensitive colored compositions of the present invention were also shown to have high stability over time.

Preparation of Colored Compositions

Use of Low Molecular Weight Dyes 2

Example 34

Preparation of Colored Composition Blue 25

The following components were mixed and dispersed/dissolved to give colored composition Blue 25.
Organic solvent (PGMEA): 17.12 parts
Alkali-soluble resin J1 (a copolymer of BzMA and MAA as a 30% solution in PGMEA): 1.23 parts
Alkali-soluble resin J2: 0.23 parts
Photoinitiator 1-3 (IRGACURE 379): 0.975 parts
A solution of dyestuff aa in cyclohexanone (solids content 12.3%): 24.57 parts
Pigment dispersion P4 (C.I. Pigment Blue 15:6 dispersion as a solution in PGMEA, solids content 12.8%): 51.40 parts
A photopolymerizable compound (KAYARAD DPHA from Nippon Kayaku Co., Ltd.): 1.31 parts
Polymerization inhibitor (p-methoxyphenol): 0.0007 parts
Fluorosurfactant (F475 from DIC Corporation, a 1% solution in PGMEA): 2.50 parts
Nonionic surfactant (EMULGEN 408 from Kao Corporation): 0.65 parts.

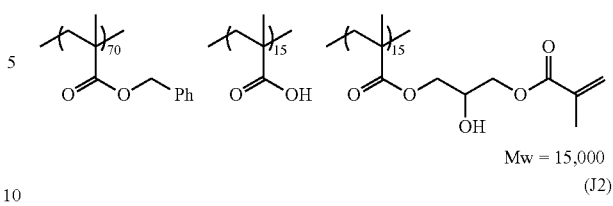

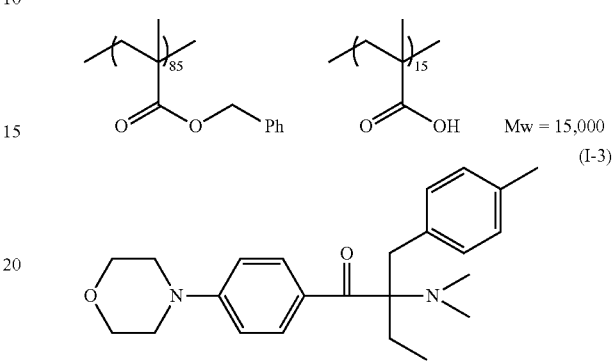

Examples 35 to 42 and Comparative Examples 15 to 20

Colored compositions Blue 26 to 39 were prepared in the same manner as described in "Preparation of colored composition Blue 2" in Example 34 except that the pigment dispersion, dyestuff and nonionic surfactant in Example 34 were changed as shown in the table below.

TABLE 8

| | | | | | Radiation-sensitive colored composition | | | | | |
|---|---|---|---|---|---|---|---|---|---|---|
| | | | | | Nonionic surfactant | | | | | |
| | Composition name | Dyestuff | Pigment | Product name | Structure | Partial structure | HLB value | $R^1$ or $R^2$ | n1 or n2 | Mw |
| Example 34 | Blue25 | Dyestuff aa | PB15:6 | EMULGEN 408 | Polyoxyethylene oleyl ether | Formula (1) | 11.4 | $C_{18}H_{35}$ | 8 | 1200 |
| Example 35 | Blue26 | Dyestuff ak | PB15:6 | EMULGEN 408 | | Formula (1) | 11.4 | $C_{18}H_{35}$ | 8 | 1200 |
| Example 36 | Blue27 | Dyestuff ab | PB15:6 | EMULGEN409PV | | Formula (1) | 11.9 | $C_{18}H_{35}$ | 9 | 1300 |
| Example 37 | Blue28 | Dyestuff ac | PB15:6 | EMULGEN420 | | Formula (1) | 15.3 | $C_{18}H_{35}$ | 20 | 2000 |
| Example 38 | Blue29 | Dyestuff af | PB15:6 | EMULGEN 408 | | Formula (1) | 11.4 | $C_{18}H_{35}$ | 8 | 1200 |
| Example 39 | Blue30 | Dyestuff ag | PB15:6 | EMULGEN104P | Polyoxy ethylene lauryl ether | Formula (1) | 9.7 | $C_{12}H_{25}$ | 4 | 600 |
| Example 40 | Blue31 | Dyestuff ah | PB15:6 | Newcol 564 | Poly oxyethylenenonylphenyl ether | Formula (1) | 12.3 | $C_{15}H_{23}$ | 8 | 1000 |
| Example 41 | Blue32 | Dyestuff ai | PB15:6 | Nonion DL-4HN | Polyethyleneglycol dilaurates | Formula (2) | 10.2 | $C_{11}H_{23}$ | 9 | 1300 |
| Example 42 | Blue33 | Dyestuff aj | PB15:6 | Uniox GM5IS | Polyoxyethylene glyceryl isostearate | Formula (2) | 11.0 | $C_{17}H_{35}$ | 5 | 800 |
| Comparative Example 15 | Blue34 | Dyestuff af | PB15:6 | Not added | — | — | — | — | — | — |
| Comparative Example 16 | Blue35 | Dyestuff aa | PB15:6 | EMULGEN 404 | Polyoxyethylene Oleyl Ether | Formula (1) | 7.9 | $C_{18}H_{35}$ | 4 | 800 |
| Comparative Example 17 | Blue36 | Dyestuff af | PB15:6 | EMULGEN220 | Polyoxyethylene Cetylether | Formula (1) | 15.7 | $C_{16}H_{35}$ | 20 | 2100 |
| Comparative Example 18 | Blue37 | Dyestuff af | PB15:6 | — | Glycerol propoxylate | — | 20.0 | — | — | 10000 |
| Comparative Example 19 | Blue38 | Dyestuff af | PB15:6 | Disperby k-107 | Carboxylic acid ester having OH roup | — | — | — | — | 8000 |
| Comparative Example 20 | Blue39 | Dyestuff af | PB15:6 | Nonion S-40 | Mono stearic acid polyethylene lycol | Formula (2) | 18.3 | $C_{17}H_{35}$ | 70 | 6000 |

Evaluation

The radiation-sensitive colored compositions of Examples 34 to 42 and Comparative examples 15 to 20 obtained as described above were used to perform Evaluations 23 to 59 of color mixing with residue in the same manner as described for Evaluations 1 to 22. The results are shown in the table below.

TABLE 9

| | | Composition name | Dyestuff | Pigment | Nonionic surfactant Product name | Structure | Partial structure |
|---|---|---|---|---|---|---|---|
| Evaluation 60 | Example 34 | Blue25 | Dyestuff aa | PB15:6 | EMULGEN 408 | Polyoxyethylene oleyl ether | Formula(1) |
| Evaluation 61 | Example 35 | Blue26 | Dyestuff ak | PB15:6 | EMULGEN 408 | ether | Formula(1) |
| Evaluation 62 | Example 36 | Blue27 | Dyestuff ab | PB15:6 | EMULGEN409PV | | Formula(1) |
| Evaluation 63 | Example 37 | Blue28 | Dyestuff ac | PB15:6 | EMULGEN 420 | | Formula(1) |
| Evaluation 64 | Example 38 | Blue29 | Dyestuff af | PB15:6 | EMULGEN 408 | Polyoxyethylene oleyl ether | Formula(1) |
| Evaluation 65 | Example 38 | Blue29 | Dyestuff af | PB15:6 | EMULGEN 408 | | Formula(1) |
| Evaluation 66 | Example 38 | Blue29 | Dyestuff af | PB15:6 | EMULGEN 408 | | Formula(1) |
| Evaluation 67 | Example 39 | Blue30 | Dyestuff ag | PB15:6 | EMULGEN104P | Polyoxy ethylene lauryl ether | Formula(1) |
| Evaluation 68 | Example 40 | Blue31 | Dyestuff ah | PB15:6 | Newcol 564 | Poly oxyethylenenonylphenyl ether | Formula(1) |
| Evaluation 69 | Example 41 | Blue32 | Dyestuff ai | PB15:6 | Nonion DL-4HN | Polyethyleneglycol dilaurates | Formula(2) |
| Evaluation 70 | Example 42 | Blue33 | Dyestuff aj | PB15:6 | Uniox GM5IS | Polyoxyethylene glyceryl isostearate | Formula(1) |
| Evaluation 71 | Comparative Example 15 | Blue34 | Dyestuff af | PB15:6 | Not added | | — |
| Evaluation 72 | Comparative Example 15 | Blue34 | Dyestuff af | PB15:6 | Not added | | — |
| Evaluation 73 | Comparative Example 15 | Blue34 | Dyestuff af | PB15:6 | Not added | | — |
| Evaluation 74 | Comparative Example 16 | Blue35 | Dyestuff aa | PB15:6 | EMULGEN404 | Polyoxyethylene Oleyl Ether | Formula(1) |
| Evaluation 75 | Comparative Example 17 | Blue36 | Dyestuff af | PB15:6 | EMULGEN220 | Polyoxyethylene Cetylether | Formula(1) |
| Evaluation 76 | Comparative Example 18 | Blue37 | Dyestuff af | PB15:6 | — | Glycerol propoxylate | — |
| Evaluation 77 | Comparative Example 19 | Blue38 | Dyestuff af | PB15:6 | Disperby k-107 | Carboxylic acid ester having OH group | — |
| Evaluation 78 | Comparative Example 20 | Blue39 | Dyestuff af | PB15:6 | Nonion S-40 | Mono stearic acid polyethylene glycol | Formula(2) |

| | Radiation-sensitive colored composition Nonionic surfactant | | | | Evaluation Result | |
|---|---|---|---|---|---|---|
| | HLB value | $R^1$ or $R^2$ | $n1$ or $n2$ | Mw | Mixing with residue First layer / Evaluation | Stability over time |
| Evaluation 60 | 11.4 | $C_{18}H_{35}$ | 8 | 1200 | Red1 / A | A |
| Evaluation 61 | 11.4 | $C_{18}H_{35}$ | 8 | 1200 | Red1 / A | A |
| Evaluation 62 | 11.9 | $C_{18}H_{35}$ | 9 | 1300 | Red1 / A | A |
| Evaluation 63 | 15.3 | $C_{18}H_{35}$ | 20 | 2000 | Red1 / A | A |
| Evaluation 64 | 11.4 | $C_{18}H_{35}$ | 8 | 1200 | Red1 / A | A |
| Evaluation 65 | 11.4 | $C_{18}H_{35}$ | 8 | 1200 | Green1 / A | A |
| Evaluation 66 | 11.4 | $C_{18}H_{35}$ | 8 | 1200 | Green3 / A | A |
| Evaluation 67 | 9.7 | $C_{12}H_{25}$ | 4 | 600 | Red1 / B | A |
| Evaluation 68 | 12.3 | $C_{15}H_{23}$ | 8 | 1000 | Red1 / C | B |
| Evaluation 69 | 10.2 | $C_{11}H_{23}$ | 9 | 1300 | Red1 / C | B |
| Evaluation 70 | 11 | $C_{17}H_{35}$ | 5 | 800 | Red1 / C | A |
| Evaluation 71 | — | — | — | — | Red1 / E | C |
| Evaluation 72 | — | — | — | — | Green1 / E | C |
| Evaluation 73 | — | — | — | — | Green3 / E | C |
| Evaluation 74 | 7.9 | $C_{18}H_{35}$ | 4 | 800 | Red1 / D | B |
| Evaluation 75 | 15.7 | $C_{16}H_{33}$ | 20 | 2100 | Red1 / D | B |
| Evaluation 76 | 20 | — | — | 10000 | Red1 / E | C |
| Evaluation 77 | — | — | — | 8000 | Red1 / E | C |
| Evaluation 78 | 18.3 | $C_{17}H_{35}$ | 70 | 6000 | Red1 / E | C |

The table above shows that the color filters obtained by using the radiation-sensitive colored compositions of the present invention are excellent in preventing color mixing with residue on another color. Further, the color filters obtained by using the radiation-sensitive colored compositions of the present invention were also shown to have high stability over time.

Preparation of Colored Compositions

Use of High Molecular Weight Dyes 2

Example 43

Preparation of Colored Composition Blue 40

The following components were mixed and dispersed/dissolved to give colored composition Blue 40.
Organic solvent (PGMEA): 17.12 parts
Alkali-soluble resin 1 (a copolymer of BzMA and MAA as a 30% solution in PGMEA): 1.23 parts
Alkali-soluble resin 2 (ACRYCURE RD-F8 from NIPPON SHOKUBAI CO., LTD.): 0.23 parts
Photoinitiator 1-4: 0.975 parts
A solution of dyestuff ae in cyclohexanone (solids content 12.3%): 24.57 parts
Pigment dispersion P4 (C.I. Pigment Blue 15:6 dispersion as a solution in PGMEA, solids content 12.8%): 51.40 parts
A photopolymerizable compound (ARONIX TO2349 from Toagosei Co., Ltd.): 1.31 parts
Polymerization inhibitor (p-methoxyphenol): 0.0007 parts
Fluorosurfactant (F475 from DIC Corporation, a 1% solution in PGMEA): 2.50 parts
Nonionic surfactant (EMULGEN 408 from Kao Corporation): 0.65 parts
Alkali-Soluble Resin 1

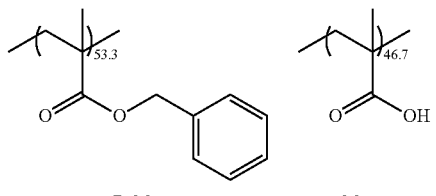

BzMA    MAA
Mw = 11000

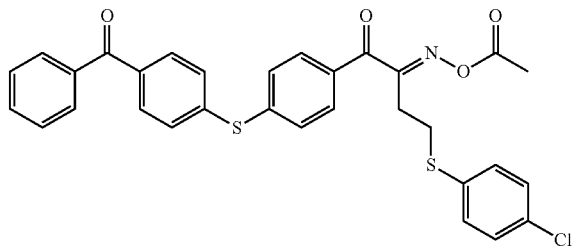

(I-4)

Examples 44 to 53 and Comparative Example 21

Colored compositions Blue 41 to 51 (Examples 44 to 53 and Comparative example 21) were prepared in the same manner as described in "Preparation of colored composition Blue 40" in Example 34 except that the pigment dispersion, dyestuff and nonionic surfactant in Example 34 were changed as shown in the table below.

TABLE 10

| | | | | | Radiation-sensitive colored composition | | | | | |
|---|---|---|---|---|---|---|---|---|---|---|
| | | | | | | Nonionic surfactant | | | | |
| | Composition name | Dyestuff | Pigment | Product name | Structure | Partial structure | HLB value | $R^1$ or $R^2$ | n1 or n2 | Mw |
| Example 43 | Blue40 | Dyestuff ae | PB15:6 | EMULGEN 408 | Polyoxyethylene oleyl ether | Formula(1) | 11.4 | $C_{18}H_{35}$ | 8 | 1200 |
| Example 44 | Blue41 | Dyestuff al | PB15:6 | EMULGEN 408 | | Formula(1) | 11.4 | $C_{18}H_{35}$ | 8 | 1200 |
| Example 45 | Blue42 | Dyestuff am | PB15:6 | EMULGEN 408 | | Formula(1) | 11.4 | $C_{18}H_{35}$ | 8 | 1200 |
| Example 46 | Blue43 | Dyestuff an | PB15:6 | EMULGEN 408 | | Formula(1) | 11.4 | $C_{18}H_{35}$ | 8 | 1200 |
| Example 47 | Blue44 | Dyestuff ao | PB15:6 | EMULGEN 408 | | Formula(1) | 11.4 | $C_{18}H_{35}$ | 8 | 1200 |
| Example 48 | Blue45 | Dyestuff ap | PB15:6 | EMULGEN 408 | | Formula(1) | 11.4 | $C_{18}H_{35}$ | 8 | 1200 |
| Example 49 | Blue46 | Dyestuff aq | PB15:6 | EMULGEN 408 | | Formula(1) | 11.4 | $C_{18}H_{35}$ | 8 | 1200 |
| Example 50 | Blue47 | Dyestuff ar | PB15:6 | EMULGEN104P | Polyoxy ethylene lauryl ether | Formula(1) | 9.7 | $C_{12}H_{25}$ | 4 | 600 |
| Example 51 | Blue48 | Dyestuff at | PB15:6 | Nonion DL-4HN | Polyethyleneglycol dilaurates | Formula(2) | 10.2 | $C_{11}H_{23}$ | 9 | 1300 |
| Example 52 | Blue49 | Dyestuff au | PB15:6 | Uniox GM5IS | Polyoxyethylene glyceryl isostearate | Formula(2) | 11 | $C_{17}H_{35}$ | 5 | 800 |
| Example 53 | Blue50 | Dyestuff ae | PB15:6 | Newcol 1008 | Octaethyleneglycol octyl ether | Formula(1) | 14.6 | $C_8H_{17}$ | 8 | 800 |
| Comparative Example 21 | Blue51 | Dyestuff al | PB15:6 | Not added | — | — | — | — | — | — |

Evaluation

The radiation-sensitive colored compositions of Examples 43 to 53 and Comparative example 21 obtained as described above were used to perform. Evaluations 79 to 96 of color mixing with residue in the same manner as described for Evaluations 1 to 22. The results are shown in the table below.

Example 100

Preparation of a Full Color Filter for Solid-State Image Sensors

The radiation-sensitive colored composition for green prepared in Example 33 was used to form a Bayer array of green pixels in an island pattern of 1.0×1.0 μm, then the

TABLE 11

| | | | | | Radiation-sensitive colored composition | | |
|---|---|---|---|---|---|---|---|
| | | | | | | Nonionic surfactant | |
| | Example | Composition name | Dyestuff | Pigment | Product name | Structure | Partial structure |
| Evaluation 79 | Example 43 | Blue40 | Dyestuff ae | PB15:6 | EMULGEN 408 | Polyoxyethylene oleyl ether | Formula(1) |
| Evaluation 80 | Example 44 | Blue41 | Dyestuff al | PB15:6 | EMULGEN 408 | | Formula(1) |
| Evaluation 81 | Example 44 | Blue41 | Dyestuff al | PB15:6 | EMULGEN 408 | | Formula(1) |
| Evaluation 82 | Example 44 | Blue41 | Dyestuff al | PB15:6 | EMULGEN 408 | | Formula(1) |
| Evaluation 83 | Example 44 | Blue41 | Dyestuff al | PB15:6 | EMULGEN 408 | | Formula(1) |
| Evaluation 84 | Example 45 | Blue42 | Dyestuff am | PB15:6 | EMULGEN 408 | | Formula(1) |
| Evaluation 85 | Example 46 | Blue43 | Dyestuff an | PB15:6 | EMULGEN 408 | | Formula(1) |
| Evaluation 86 | Example 47 | Blue44 | Dyestuff ao | PB15:6 | EMULGEN 408 | | Formula(1) |
| Evaluation 87 | Example 48 | Blue45 | Dyestuff ap | PB15:6 | EMULGEN 408 | | Formula(1) |
| Evaluation 88 | Example 49 | Blue46 | Dyestuff aq | PB15:6 | EMULGEN 408 | | Formula(1) |
| Evaluation 89 | Example 50 | Blue47 | Dyestuff ar | PB15:6 | EMULGEN104P | Polyoxy ethylene lauryl ether | Formula(1) |
| Evaluation 90 | Example 51 | Blue48 | Dyestuff at | PB15:6 | Nonion DL-4HN | Polyethyleneglycol dilaurates | Formula(2) |
| Evaluation 91 | Example 52 | Blue49 | Dyestuff au | PB15:6 | Uniox GM5IS | Polyoxyethylene glyceryl isostearate | Formula(2) |
| Evaluation 92 | Example 53 | Blue50 | Dyestuff al | PB15:6 | Newcol 1008 | Octaethyleneglycol octyl ether | Formula(1) |
| Evaluation 93 | Comparative Example 21 | Blue51 | Dyestuff al | PB15:6 | Not added | — | — |
| Evaluation 94 | Comparative Example 21 | Blue51 | Dyestuff al | PB15:6 | Not added | — | — |
| Evaluation 95 | Comparative Example 21 | Blue51 | Dyestuff al | PB15:6 | Not added | — | — |
| Evaluation 96 | Comparative Example 21 | Blue51 | Dyestuff al | PB15:6 | Not added | — | — |

| | Radiation-sensitive colored composition Nonionic surfactant | | | | Evaluation Result | | |
|---|---|---|---|---|---|---|---|
| | HLB value | $R^1$ or $R^2$ | n1 or n2 | Mw | Mixing with residue | | Stability over time |
| | | | | | First layer | Evaluation | |
| Evaluation 79 | 11.4 | $C_{18}H_{35}$ | 8 | 1200 | Red1 | A | A |
| Evaluation 80 | 11.4 | $C_{18}H_{35}$ | 8 | 1200 | Red1 | A | A |
| Evaluation 81 | 11.4 | $C_{18}H_{35}$ | 8 | 1200 | Red2 | A | A |
| Evaluation 82 | 11.4 | $C_{18}H_{35}$ | 8 | 1200 | Green1 | A | A |
| Evaluation 83 | 11.4 | $C_{18}H_{35}$ | 8 | 1200 | Green9 | A | A |
| Evaluation 84 | 11.4 | $C_{18}H_{35}$ | 8 | 1200 | Red1 | A | A |
| Evaluation 85 | 11.4 | $C_{18}H_{35}$ | 8 | 1200 | Red1 | A | A |
| Evaluation 86 | 11.4 | $C_{18}H_{35}$ | 8 | 1200 | Red1 | A | A |
| Evaluation 87 | 11.4 | $C_{18}H_{35}$ | 8 | 1200 | Red1 | A | A |
| Evaluation 88 | 11.4 | $C_{18}H_{35}$ | 8 | 1200 | Red1 | A | A |
| Evaluation 89 | 9.7 | $C_{12}H_{25}$ | 4 | 600 | Red1 | B | A |
| Evaluation 90 | 10.2 | $C_{11}H_{23}$ | 9 | 1300 | Red1 | C | B |
| Evaluation 91 | 11 | $C_{17}H_{35}$ | 5 | 800 | Red1 | C | A |
| Evaluation 92 | 14.6 | $C_8H_{17}$ | 8 | 800 | Red1 | B | A |
| Evaluation 93 | — | — | — | — | Red1 | E | D |
| Evaluation 94 | — | — | — | — | Red2 | E | D |
| Evaluation 95 | — | — | — | — | Green1 | E | D |
| Evaluation 96 | — | — | — | — | Green9 | E | D |

The table above shows that the color filters obtained by using the radiation-sensitive colored compositions of the present invention are excellent in preventing color mixing with residue on another color. Further, the color filters obtained by using the radiation-sensitive colored compositions of the present invention were also shown to have high stability over time.

radiation-sensitive colored composition for red prepared in Example 14 was used to form red pixels in an island pattern of 1.0×1.0 μm, and then the radiation-sensitive colored composition for blue prepared in Example 12 was used to form blue pixels in an island pattern of 1.0×1.0 μm in the vacant cells, thereby preparing a color filter for solid-state image sensors in light shield regions.

Evaluation

Solid-state image sensors incorporating the resulting full color filter for solid-state image sensors were found to provide high resolution and excellent color separation.

Example 101

Preparation of a Color Filter for Liquid Crystal Display Devices

The radiation-sensitive colored composition for red prepared in Example 22 was used to form a red (R)-colored pattern of 80×80 μm on a black matrix. Then, the radiation-sensitive colored composition for green prepared in Example 9 and the radiation-sensitive colored composition for blue prepared in Example 8 were used to successively form a green (G)-colored pattern and a blue (B)-colored pattern in the same manner, whereby a color filter for liquid crystal display devices was prepared.

Evaluation

Liquid crystal display devices were constructed by combining the full color filter with ITO transparent electrodes, an alignment layer and the like. The radiation-sensitive colored compositions of the present invention exhibit highly uniform coated surfaces and the resulting color filter has a good pattern shape so that the liquid crystal display devices incorporating the color filter were found to provide high quality images free from defects.

DESCRIPTION OF THE REFERENCE NUMERALS

100: Substrate;
101, 102, 103: Pixel;
104: Residue.

What is claimed is:

1. A radiation-sensitive colored composition comprising: a dyestuff, a photopolymerizable compound, a photoinitiator, and a nonionic surfactant containing a partial structure represented by formula (1) or (2) and having a weight average molecular weight of 2500 or less and an HLB value of 9.2 to 15.5 as determined by Griffin's method;

(1)

(2)

wherein $R^1$ and $R^2$ each independently represent a hydrocarbon group containing 8 or more carbon atoms, and n1 and n2 each independently represent 4 to 25,
wherein an amount of the dyestuff contained in the radiation-sensitive colored composition is 10 to 70% by mass based on the total solids of the radiation-sensitive colored composition.

2. The radiation-sensitive colored composition according to claim 1, wherein the nonionic surfactant is a compound represented by formula (3) below:

(3)

wherein $R^3$ represents an alkyl or alkenyl group containing 8 or more carbon atoms, and n3 represents 4 to 25.

3. The radiation-sensitive colored composition according to claim 1, wherein the nonionic surfactant is a compound represented by formula (4) below:

(4)

wherein $R^4$ represents an alkyl or alkenyl group containing 15 to 19 carbon atoms, and n4 represents 4 to 25.

4. The radiation-sensitive colored composition according to claim 3, wherein the dyestuff has a weight average molecular weight of 5000 or more.

5. The radiation-sensitive colored composition according to claim 3, which comprises a colorant including the dyestuff in a concentration of 50% by mass or more, relative to the total solids of the radiation-sensitive colored composition.

6. The radiation-sensitive colored composition according to claim 3, wherein the dye contains a partial structure derived from a dye selected from dipyrromethene dyes, azo dyes, anthraquinone dyes, triphenylmethane dyes, xanthene dyes, cyanine dyes, squarylium dyes, quinophthalone dyes, phthalocyanine dyes and subphthalocyanine dyes.

7. The radiation-sensitive colored composition according to claim 3, further comprising a pigment.

8. The radiation-sensitive colored composition according to claim 1, wherein the dyestuff has a weight average molecular weight of 5000 or more.

9. The radiation-sensitive colored composition according to claim 1, which comprises a colorant including the dyestuff in a concentration of 50% by mass or more, relative to the total solids of the radiation-sensitive colored composition.

10. The radiation-sensitive colored composition according to claim 1, wherein the dye contains a partial structure derived from a dye selected from dipyrromethene dyes, azo dyes, anthraquinone dyes, triphenylmethane dyes, xanthene dyes, cyanine dyes, squarylium dyes, quinophthalone dyes, phthalocyanine dyes and subphthalocyanine dyes.

11. The radiation-sensitive colored composition according to claim 1, further comprising a pigment.

12. The radiation-sensitive colored composition according to claim 1, further comprising an alkali-soluble resin.

13. The radiation-sensitive colored composition according to claim 1, suitable for forming a colored layer of a color filter.

14. The radiation-sensitive colored composition according to claim 1, wherein the photoinitiator is an oxime compound.

15. A cured colored film obtainable by curing the radiation-sensitive colored composition according to claim 1.

16. A color filter comprising the cured colored film according to claim 15.

17. The color filter according to claim 16, wherein the cured colored film has a thickness of 0.2 to 1.5 μm.

18. A solid-state image sensor comprising the color filter according to claim 16.

19. An image display device comprising the color filter according to claim 16.

20. A method for forming a colored pattern, comprising applying the radiation-sensitive colored composition according to claim 1 on a support to form a radiation-sensitive colored composition layer; exposing the radiation-sensitive colored composition layer in a pattern; and developing unexposed regions to remove unexposed area, thereby forming a colored pattern.

21. A method for manufacturing a color filter, comprising applying the radiation-sensitive colored composition according to claim 1 on a support to form a radiation-sensitive colored composition layer; exposing the radiation-sensitive colored composition layer in a pattern; and developing unexposed regions to remove unexposed area, thereby forming a colored pattern.

22. The radiation-sensitive colored composition according to claim 1, wherein the amount of the dyestuff contained in the radiation-sensitive colored composition is 10 to 50% by mass based on the total solids of the radiation-sensitive colored composition.

23. The radiation-sensitive colored composition according to claim 1, the amount of the dyestuff contained in the radiation-sensitive colored composition is 15 to 30% by mass based on the total solids of the radiation-sensitive colored composition.

* * * * *